(12) United States Patent
Kimura

(10) Patent No.: US 9,280,931 B2
(45) Date of Patent: Mar. 8, 2016

(54) SEMICONDUCTOR DEVICE

(71) Applicant: Semiconductor Energy Laboratory Co., Ltd., Atsugi-shi, Kanagawa-ken (JP)

(72) Inventor: Hajime Kimura, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 758 days.

(21) Appl. No.: 13/650,939

(22) Filed: Oct. 12, 2012

(65) Prior Publication Data

US 2013/0092930 A1 Apr. 18, 2013

(30) Foreign Application Priority Data

Oct. 18, 2011 (JP) ................................. 2011-228418
Nov. 30, 2011 (JP) ................................. 2011-261317

(51) Int. Cl.
*G06F 3/038* (2013.01)
*G09G 5/00* (2006.01)
*G09G 3/32* (2006.01)
*H01L 27/146* (2006.01)
(Continued)

(52) U.S. Cl.
CPC ................ *G09G 3/3233* (2013.01); *G09G 3/30* (2013.01); *G09G 3/32* (2013.01); *G09G 3/3291* (2013.01); *G09G 2300/0819* (2013.01); *G09G 2300/0852* (2013.01); *G09G 2300/0861* (2013.01); *G09G 2310/0262* (2013.01); *H01L 27/1225* (2013.01); *H01L 27/14609* (2013.01); *H01L 27/3262* (2013.01); *H01L 27/3276* (2013.01)

(58) Field of Classification Search
USPC .................................................. 315/160–176
See application file for complete search history.

(56) References Cited

U.S. PATENT DOCUMENTS 5,528,032 A 6/1996 Uchiyama
6,909,242 B2 6/2005 Kimura
(Continued)

FOREIGN PATENT DOCUMENTS

CN 101093642 A 12/2007
CN 101198200 A 6/2008
(Continued)

OTHER PUBLICATIONS

International Search Report, PCT Application No. PCT/JP2012/076561, dated Nov. 13, 2012, 3 pages.
(Continued)

*Primary Examiner* — Brandon S Cole
(74) *Attorney, Agent, or Firm* — Fish & Richardson P.C.

(57) ABSTRACT

A semiconductor device that is less influenced by variations in characteristics between transistors or variations in a load, and is efficient even for normally-on transistors is provided. The semiconductor device includes at least a transistor, two wirings, three switches, and two capacitors. A first switch controls conduction between a first wiring and each of a first electrode of a first capacitor and a first electrode of a second capacitor. A second electrode of the first capacitor is connected to a gate of the transistor. A second switch controls conduction between the gate and a second wiring. A second electrode of the second capacitor is connected to one of a source and a drain of the transistor. A third switch controls conduction between the one of the source and the drain and each of the first electrode of the first capacitor and the first electrode of the second capacitor.

42 Claims, 91 Drawing Sheets

(51) Int. Cl.
  *H01L 27/32* (2006.01)
  *H01L 27/12* (2006.01)
  *G09G 3/30* (2006.01)

(56) References Cited

U.S. PATENT DOCUMENTS

| | | | |
|---|---|---|---|
| 7,046,240 B2 | 5/2006 | Kimura | |
| 7,253,665 B2 | 8/2007 | Kimura | |
| 7,317,429 B2 | 1/2008 | Shirasaki et al. | |
| 7,345,657 B2 | 3/2008 | Kimura | |
| 7,378,882 B2 | 5/2008 | Kimura | |
| 7,429,985 B2 | 9/2008 | Kimura et al. | |
| 7,456,810 B2 | 11/2008 | Kimura | |
| 7,463,223 B2 | 12/2008 | Kimura | |
| 7,554,362 B2 | 6/2009 | Kimura | |
| 7,671,826 B2 | 3/2010 | Kimura | |
| 7,679,585 B2 | 3/2010 | Kimura | |
| 7,692,610 B2 | 4/2010 | Kimura | |
| 7,755,617 B2 | 7/2010 | Miyazawa | |
| 7,817,117 B2 | 10/2010 | Kimura | |
| 7,859,488 B2 | 12/2010 | Kimura | |
| 8,242,986 B2 | 8/2012 | Kimura | |
| 8,710,749 B2 * | 4/2014 | Kimura | G09G 3/3233 315/169.3 |
| 8,803,768 B2 * | 8/2014 | Kimura | G09G 3/3233 345/76 |
| 2003/0112208 A1 * | 6/2003 | Okabe | G09G 3/3233 345/82 |
| 2006/0208977 A1 | 9/2006 | Kimura | |
| 2007/0085847 A1 * | 4/2007 | Shishido | G09G 3/3233 345/204 |
| 2007/0120785 A1 * | 5/2007 | Kimura | G09G 3/3233 345/82 |
| 2007/0126664 A1 | 6/2007 | Kimura | |
| 2007/0126668 A1 | 6/2007 | Kimura | |
| 2007/0290954 A1 | 12/2007 | Miyazawa | |
| 2008/0225061 A1 | 9/2008 | Kimura et al. | |
| 2009/0051674 A1 | 2/2009 | Kimura et al. | |
| 2010/0171685 A1 | 7/2010 | Kimura | |
| 2010/0220117 A1 | 9/2010 | Kimura | |
| 2012/0248435 A1 | 10/2012 | Koyama | |
| 2012/0287025 A1 | 11/2012 | Inoue | |
| 2013/0003269 A1 | 1/2013 | Kimura | |
| 2013/0021316 A1 | 1/2013 | Inoue | |
| 2013/0032806 A1 | 2/2013 | Kimura | |
| 2013/0063041 A1 | 3/2013 | Kimura | |

FOREIGN PATENT DOCUMENTS

| | | |
|---|---|---|
| EP | 1 918 904 A2 | 5/2008 |
| JP | 06-275697 A | 9/1994 |
| JP | 2003-195810 A | 7/2003 |
| JP | 2006-023515 A | 1/2006 |
| JP | 2007-179030 A | 7/2007 |
| JP | 2007-334178 A | 12/2007 |
| JP | 2008-134625 A | 6/2008 |
| KR | 2007-0057042 A | 6/2007 |
| KR | 2007-0120450 A | 12/2007 |
| KR | 2008-0037538 A | 4/2008 |

OTHER PUBLICATIONS

Written Opinion, PCT Application No. PCT/JP2012/076561, dated Nov. 13, 2012, 4 pages.

* cited by examiner

SEMICONDUCTOR DEVICE

TECHNICAL FIELD

The present invention relates to a semiconductor device, a light-emitting device, or a display device. Alternatively, the present invention relates to a method for driving or manufacturing the device. An example of the semiconductor device is a semiconductor device including, for example, an active element such as a transistor. An example of the light-emitting device is a light-emitting device including a light-emitting element such as an electroluminescent element (hereinafter also called EL element). An example of the display device is a display device including a light-emitting element, such as an EL element, or a display element. The present invention relates particularly to the semiconductor device, the light-emitting device, or the display device in which the influence of variations in characteristics between transistors is reduced, or to a method for driving the device.

BACKGROUND ART

Since display devices using light-emitting elements have high visibility, are suitable for reduction in thickness, and do not have limitations on viewing angles, they have attracted attention as display devices which can take the place of CRTs (cathode ray tubes) or liquid crystal display devices. Specifically proposed structures of active matrix display devices using light-emitting elements are different depending on manufacturers. However, in general, at least a light emitting element, a transistor (a switching transistor) which controls input of video signals to pixels, and a transistor (a driving transistor) which controls value of current supplied to the light-emitting elements are provided for each pixel.

For example, when all the transistors in pixels have the same conductivity type, it is possible to omit some of steps for fabricating the transistors, for example, a step of adding an impurity element imparting one conductivity type to a semiconductor film. Patent Document 1 discloses a display device in which transistors included in pixels are all n-channel transistors.

REFERENCE

[Patent Document 1] Japanese Published Patent Application No. 2003-195810

DISCLOSURE OF INVENTION

In a semiconductor device such as a light-emitting device or a display device, drain current of a transistor is supplied to a light-emitting element; thus, when characteristics and the like of transistors vary among pixels, the luminance of display elements such as light-emitting elements varies correspondingly. Thus, in order to improve the quality of a semiconductor device, it is important to propose a pixel structure in which the amount of drain current of a transistor can be corrected in anticipation of variations in threshold voltage, for example.

In view of the above problem, it is an object of one aspect of the present invention to provide a semiconductor device, a light-emitting device, or a display device that is less influenced by variations in characteristics of transistors. It is an object of one aspect of the present invention to provide a semiconductor device, a light-emitting device, or a display device that is less influenced by degradation of characteristics of a transistor. It is an object of one aspect of the present invention to provide a semiconductor device, a light-emitting device, or a display device in which variations in luminance due to variations in threshold voltage of transistors are reduced. It is an object of one aspect of the present invention to provide a semiconductor device, a light-emitting device, or a display device in which variations in luminance due to variations in mobility of transistors are reduced. It is an object of one aspect of the present invention to provide a semiconductor device, a light-emitting device, or a display device that correctly operates even when using a normally-off transistor. It is an object of one aspect of the present invention to provide a semiconductor device, a light-emitting device, or a display device in which the threshold voltage of a transistor can be obtained even when the transistor is a normally-off transistor. It is an object of one aspect of the present invention to provide a semiconductor device, a light-emitting device, or a display device that displays high-quality images. It is an object of one aspect of the present invention to provide a semiconductor device, a light-emitting device, or a display device that displays images with little unevenness. It is an object of one aspect of the present invention to provide a semiconductor device, a light-emitting device, or a display device in which a desired circuit can be formed with a small number of transistors. It is an object of one aspect of the present invention to provide a semiconductor device, a light-emitting device, or a display device in which a desired circuit can be formed with a small number of wirings. It is an object of one aspect of the present invention to provide a semiconductor device, a light-emitting device, or a display device that is less influenced by degradation of a light-emitting element. It is an object of one aspect of the present invention to provide a semiconductor device, a light-emitting device, or a display device that is manufactured in a small number of steps.

Note that the description of these objects does not impede the existence of other objects. In one aspect of the present invention, there is no need to achieve all the objects. Other objects will be apparent and can be derived from the description of the specification, the drawings, the claims, and the like.

A semiconductor device according to one aspect of the present invention includes at least a transistor, a first wiring, a second wiring, a first switch, a second switch, a third switch, a first capacitor, and a second capacitor. The first switch has a function of selecting conduction or non-conduction between the first wiring and one electrode of a pair of electrodes of the first capacitor. The one electrode of the pair of electrodes of the first capacitor is electrically connected to one electrode of a pair of electrodes of the second capacitor. The other electrode of the pair of electrodes of the first capacitor is electrically connected to a gate of the transistor. The other electrode of the pair of electrodes of the second capacitor is electrically connected to one of a source and a drain of the transistor. The second switch has a function of selecting conduction or non-conduction between the second wiring and the gate of the transistor. The third switch has a function of selecting conduction or non-conduction between the one electrode of the pair of electrodes of the first capacitor and the one of the source and the drain of the transistor.

In the semiconductor device with the above structure, voltage applied between the source and the gate of the transistor (hereinafter also referred to as the driving transistor) can be corrected in anticipation of variations in threshold voltage. Thus, the drain current of the transistor can be corrected. Further, the drain current can be supplied to the load.

A semiconductor device according to one aspect of the present invention includes at least a transistor, a load, a first wiring, a second wiring, a first switch, a second switch, a third switch, a first capacitor, and a second capacitor. The first switch has a function of selecting conduction or non-conduction between the first wiring and one electrode of a pair of electrodes of the first capacitor. The one electrode of the pair of electrodes of the first capacitor is electrically connected to one electrode of a pair of electrodes of the second capacitor. The other electrode of the pair of electrodes of the first capacitor is electrically connected to a gate of the transistor. The other electrode of the pair of electrodes of the second capacitor is electrically connected to the load and one of a source and a drain of the transistor. The second switch has a function of selecting conduction or non-conduction between the second wiring and the gate of the transistor. The third switch has a function of selecting conduction or non-conduction between the one electrode of the pair of electrodes of the first capacitor and the one of the source and the drain of the transistor.

In the semiconductor device with the above structure, voltage applied between the source and the gate of the transistor (hereinafter also referred to as the driving transistor) can be corrected in anticipation of variations in threshold voltage. Thus, the drain current of the transistor can be corrected. Further, the drain current can be supplied to the load.

A given element or circuit can be used as the load. For example, a light-emitting element such as an EL element can be used as the load. A light-emitting element such as an EL element emits light at luminance that is proportional to the amount of current flowing between an anode and a cathode of the light-emitting element.

In the case where a light-emitting element is used as the load, a structure of Type A or Type B, for example, can be employed.

(Type A)

In the semiconductor device according to one aspect of the present invention, one of the source and the drain of the transistor (the driving transistor) can be electrically connected to the anode of the light-emitting element. In that case, the transistor is an n-channel transistor. In the semiconductor device according to one aspect of the present invention, the semiconductor device includes a unit (e.g., a driver circuit) having a function of controlling the potential of the first wiring. The unit (the driver circuit) controls the potential of the first wiring so that a period during which the potential of the first wiring is equal to or lower than the potential of the cathode of the light-emitting element is provided.

(Type B)

In the semiconductor device according to one aspect of the present invention, one of the source and the drain of the transistor (the driving transistor) can be electrically connected to the cathode of the light-emitting element. In that case, the transistor is a p-channel transistor. In the semiconductor device according to one aspect of the present invention, the semiconductor device includes a unit (e.g., a driver circuit) having a function of controlling the potential of the first wiring. The unit (the driver circuit) controls the potential of the first wiring so that a period during which the potential of the first wiring is equal to or higher than the potential of the anode of the light-emitting element is provided.

Each of the first to third switches can be a transistor. The transistor can have the same conductivity type as the driving transistor.

The semiconductor device according to one aspect of the present invention can be formed using a transistor whose channel formation region includes an oxide semiconductor layer. Alternatively, the semiconductor device can be formed using a transistor whose channel formation region includes single crystal silicon. Alternatively, the semiconductor device can be formed using a transistor whose channel formation region includes polycrystalline silicon. Alternatively, the semiconductor device can be formed using a transistor whose channel formation region includes amorphous silicon.

In other words, transistors with a variety of structures can be used as a transistor, without limitation to a certain type. For example, a transistor including single-crystal silicon or a thin film transistor (TFT) including a non-single-crystal semiconductor film typified by amorphous silicon, polycrystalline silicon, microcrystalline (also referred to as microcrystal, nanocrystal, or semi-amorphous) silicon, or the like can be used as a transistor.

Note that for example, a transistor including a compound semiconductor (e.g., SiGe, GaAs, and the like), an oxide semiconductor (e.g., ZnO, InGaZnO, indium zinc oxide, ITO (indium tin oxide), SnO, TiO, and AlZnSnO (AZTO), and InSnZnO), or the like; a thin film transistor obtained by thinning such a compound semiconductor or an oxide semiconductor; or the like can be used as a transistor. Thus, manufacturing temperature can be lowered and for example, such a transistor can be formed at room temperature. Accordingly, the transistor can be formed directly on a substrate having low heat resistance, such as a plastic substrate or a film substrate. Note that such a compound semiconductor or an oxide semiconductor can be used not only for a channel portion of the transistor but also for other applications. For example, such a compound semiconductor or an oxide semiconductor can be used for a wiring, a resistor, a pixel electrode, a light-transmitting electrode, or the like. Since such an element can be formed at the same time as the transistor, cost can be reduced.

Note that for example, a transistor or the like including an organic semiconductor or a carbon nanotube can be used as a transistor.

Note that a transistor with a multi-gate structure having two or more gate electrodes can be used. With the multi-gate structure, channel formation regions are connected in series; accordingly, a plurality of transistors are connected in series. Thus, with the multi-gate structure, the amount of off-state current can be reduced and the withstand voltage (reliability) of the transistor can be increased. Alternatively, a transistor with the multi-gate structure can have a flat slope of voltage-current characteristics such that drain-source current does not change much even if drain-source voltage changes when the transistor operates in a saturation region. By utilizing the flat slope of the voltage-current characteristics, an ideal current source circuit or an active load with extremely high resistance can be achieved. Consequently, a differential circuit, a current mirror circuit, or the like having excellent properties can be fabricated.

For example, it is possible to use a transistor in which gate electrodes are provided above and below a channel. The structure where the gate electrodes are provided above and below the channel is substantially equivalent to a circuit structure in which a plurality of transistors are connected in parallel. Thus, the area of the channel region is increased, so that the current value can be increased. Alternatively, by employing the structure where gate electrodes are provided above and below the channel, a depletion layer is easily formed; thus, the subthreshold swing (S value) can be reduced.

For example, it is possible to use a transistor with a structure where a gate electrode is formed above or below a channel, a staggered structure, an inverted staggered structure, a structure where a channel is divided into a plurality of regions, a structure where channels are connected in parallel or in series, or the like.

Note that for example, a transistor with a structure where an LDD region is provided can be used as a transistor. By providing the LDD region, the amount of off-state current can be reduced or the withstand voltage of the transistor can be increased (reliability can be improved). Alternatively, by providing the LDD region, drain-source current does not fluctuate very much even when drain-source voltage fluctuates when the transistor operates in the saturation region, so that a flat slope of voltage-current characteristics can be obtained.

The invention excluding content that is not specified in the drawings and texts in this specification can be constructed. Alternatively, when the range of a value (e.g., the maximum and minimum values) is described, the range may be freely narrowed or a value in the range may be excluded, so that the invention can be specified by a range part of which is excluded. In this manner, it is possible to specify the scope of the present invention so that a conventional technology is excluded, for example.

As a specific example, assuming that a circuit including first to fifth transistors is illustrated in a circuit diagram, the invention can be defined as the circuit that does not include a sixth transistor. Alternatively, the invention can be defined as the circuit that does not include a capacitor. Further, the invention can be constructed by specifying that the circuit does not include a sixth transistor with a particular connection. Alternatively, the invention can be constructed by specifying that the circuit does not include a capacitor with a particular connection. For example, the invention can be defined by specifying that the circuit does not include a sixth transistor whose gate is connected to a gate of the third transistor. Alternatively, for example, the invention can be defined by specifying that the circuit does not include a capacitor whose first electrode is connected to the gate of the third transistor.

As another specific example, when the expression "a voltage preferably ranges from 3 V to 10 V" is used to describe a given value, the invention can be defined, for example, by excluding the case where the voltage is higher than or equal to −2 V and lower than or equal to 1 V. Alternatively, for example, the invention can be defined by excluding the case where the voltage is higher than or equal to 13 V. Note that for example, it can be specified that the voltage is higher than or equal to 5 V and lower than or equal to 8 V in the invention. Moreover, it can be specified, in the invention, that the voltage is approximately 9 V or that the voltage is higher than or equal to 3 V and lower than 9 V and higher than 9 V and lower than or equal to 10 V As another specific example, when the expression "a voltage is preferably 10 V" is used to describe a given value, the invention can be defined, for example, by excluding the case where the voltage is higher than or equal to −2 V and lower than or equal to 1 V. Alternatively, for example, the invention can be defined by excluding the case where the voltage is higher than or equal to 13 V.

As another specific example, when the expression "a film is an insulating film" is used to describe properties of a material, the invention can be defined, for example, by excluding the case where the insulating film is an organic insulating film. Alternatively, for example, the invention can be defined by excluding the case where the insulating film is an inorganic insulating film.

As another specific example, when the expression "a film is provided between A and B" is used to describe a layered structure, the invention can be defined, for example, by excluding the case where the film is a stack of four or more layers. Alternatively, for example, the invention can be defined by excluding the case where a conductive film is provided between A and the film.

In one aspect of the present invention, it is possible to determine voltage applied between a source and a gate of a driving transistor depending on the threshold voltage of the driving transistor. Thus, it is possible to provide a semiconductor device, a light-emitting device, or a display device that is less influenced by variations in characteristics of transistors. It is possible to provide a semiconductor device, a light-emitting device, or a display device that is less influenced by degradation of characteristics of a transistor. It is possible to provide a semiconductor device, a light-emitting device, or a display device in which variations in luminance due to variations in threshold voltage of driving transistors are reduced. It is possible to provide a semiconductor device, a light-emitting device, or a display device in which variations in luminance due to variations in mobility of driving transistors are reduced. It is possible to provide a semiconductor device, a light-emitting device, or a display device that correctly operates even when using a normally-off transistor. It is possible to provide a semiconductor device, a light-emitting device, or a display device that can obtain the threshold voltage of a normally-off transistor. It is possible to provide a semiconductor device, a light-emitting device, or a display device that displays high-quality images. It is possible to provide a semiconductor device, a light-emitting device, or a display device that displays images with little unevenness. It is possible to provide a semiconductor device, a light-emitting device, or a display device in which a desired circuit can be formed with a small number of transistors. It is possible to provide a semiconductor device, a light-emitting device, or a display device in which a desired circuit can be formed with a small number of wirings. It is possible to provide a semiconductor device, a light-emitting device, or a display device that is less influenced by degradation of a light-emitting element. It is possible to provide a semiconductor device, a light-emitting device, or a display device that is manufactured in a small number of steps.

BEST MODE FOR CARRYING OUT THE INVENTION

Figure 1A:
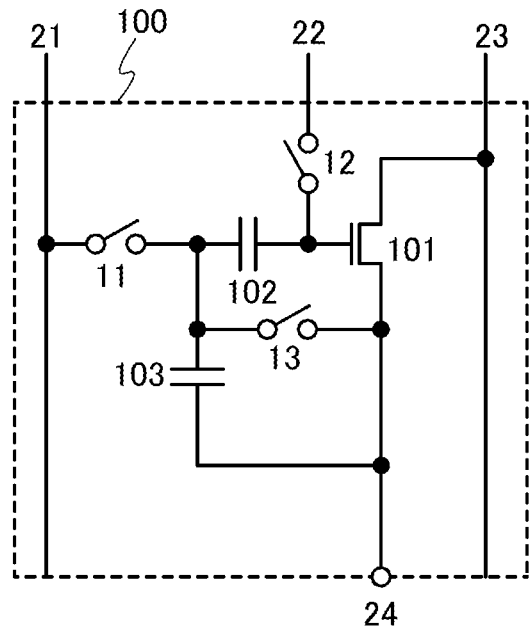
FIGS. 1A to 1D each illustrate the structure of a semiconductor device.

Embodiments of the present invention will be hereinafter described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be limited to the descriptions of the embodiments below. In structures given below, the same portions or portions having similar functions are denoted by the same reference numerals in different drawings, and explanation thereof will not be repeated.

Note that what is described in one embodiment (or part of the content) can be applied to, combined with, or replaced with different content (or part thereof) in the embodiment and/or content (or part thereof) described in another embodiment or other embodiments.

Note that the structure illustrated in a diagram (or part thereof) in one embodiment can be combined with the structure of another part of the diagram, the structure illustrated in a different diagram (or part thereof) in the embodiment, and/or the structure illustrated in a diagram (or part thereof)) in another embodiment or other embodiments.

Note that the size, thickness, and regions in the drawings are exaggerated for clarity in some cases. Thus, one aspect of the embodiment of the present invention is not limited to such scales. Alternatively, drawings schematically illustrate an ideal example. Thus, one aspect of the embodiment of the present invention is not limited to shapes illustrated in the drawings and can include variations in shape due to a fabrication technique or dimensional deviation, for example.

Note that an explicit description "X and Y are connected" indicates the case where X and Y are electrically connected, the case where X and Y are functionally connected, and the case where X and Y are directly connected. Here, each of X and Y denotes an object (e.g., a device, an element, a circuit, a wiring, an electrode, a terminal, a conductive film, a layer, a display element, a light-emitting element, or a load). Accordingly, a connection relation other than those shown in drawings and texts is also included without limitation to a predetermined connection relation, for example, the connection relation shown in the drawings and the texts.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a DC-DC converter, a step-up DC-DC converter, or a step-down DC-DC converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generator circuit; a memory circuit; and/or a control circuit) can be connected between X and Y. When a signal output from X is transmitted to Y, it can be said that X and Y are functionally connected even if another circuit is provided between X and Y.

Note that an explicit description "X and Y are connected" means that X and Y are electrically connected, X and Y are functionally connected, and X and Y are directly connected. That is, the explicit description "X and Y are electrically connected" is the same as an explicit simple expression "X and Y are connected".

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that it might be possible for those skilled in the art to constitute one aspect of the invention even when portions to which all terminals of an active element (e.g., a transistor or a diode), a passive element (e.g., a capacitor or a resistor), or the like are connected are not specified. In other words, even when such portions are not specified, one aspect of the present invention can be clear and it can be determined that one aspect of the present invention is disclosed in this specification and the like in some cases. In particular, in the case where the number of portions to which the terminal is connected may be plural, it is not necessary to specify the portions to which the terminal is connected. Therefore, it might be possible to constitute one aspect of the invention by specifying portions to which only some of terminals of an active element (e.g., a transistor or a diode), a passive element (e.g., a capacitor or a resistor), or the like are connected.

Note that it might be possible for those skilled in the art to specify the invention when at least where a circuit is to be connected ("connection point") is specified. Alternatively, it might be possible for those skilled in the art to specify the invention when at least a function of a circuit is specified. In other words, when a function of a circuit is specified, one aspect of the present invention can be clear and it can be determined that one aspect of the present invention is disclosed in this specification and the like in some cases. Therefore, when a connection point of a circuit is specified, the circuit is disclosed as one aspect of the invention even if a function is not specified, and one aspect of the invention can be constructed. Alternatively, when a function of a circuit is specified, the circuit is disclosed as one aspect of the invention even if a connection point is not specified, and one aspect of the invention can be constructed.

Note that various people can implement one aspect of the embodiment of the present invention. However, different people may be involved in the implementation of the invention. For example, in the case of a transmission/reception system, the following case is possible: Company A manufactures and sells transmitting devices, and Company B manufactures and sells receiving devices. As another example, in the case of a light-emitting device including a TFT and a light-emitting element, the following case is possible: Company A manufactures and sells semiconductor devices including TFTs, and Company B purchases the semiconductor devices, provides light-emitting elements for the semiconductor devices, and completes light-emitting devices.

In such a case, one aspect of the invention can be constituted so that a patent infringement can be claimed against each of Company A and Company B. That is, one aspect of the invention with which a patent infringement suit can be filed against Company A or Company B is clear and can be regarded as being disclosed in this specification or the like. For example, in the case of a transmission/reception system, one aspect of the invention can be constituted by only a transmitting device and one aspect of the invention can be constituted by only a receiving device. Those embodiments of the invention are clear and can be regarded as being disclosed in this specification or the like. As another example, in the case of a light-emitting device including a TFT and a light-emitting element, one aspect of the invention can be constituted by only a semiconductor device including a TFT, and one aspect of the invention can be constituted by only a light-emitting device including a TFT and a light-emitting element. Those embodiments of the invention are clear and can be regarded as being disclosed in this specification or the like.

(Embodiment 1)

One aspect of the present invention can be used not only as a pixel including a light-emitting element but also as a variety of circuits. For example, it can be used as either an analog circuit or a circuit functioning as a current source. First, in this embodiment, examples of a basic principle of a circuit disclosed in the present invention are described.

A semiconductor device according to one aspect of the present invention includes at least, for example, a transistor and an element having a function of releasing an electric charge stored between a gate and a source of the transistor while the potential of the gate is fixed. With this element, the semiconductor device according to one aspect of the present invention can correct variations in drain current due to the threshold voltage, mobility, or the like of the transistor.

A circuit 100 in FIG. 1A is a semiconductor device according to one aspect of the present invention. The circuit 100 includes a switch 11, a switch 12, a switch 13, a transistor 101, a capacitor 102, and a capacitor 103. Note that FIG. 1A shows the case where the transistor 101 is an n-channel transistor.

Specifically, in FIG. 1A, the switch 11 has a function of controlling the conduction between a wiring 21 and one electrode (terminal) of the capacitor 102 or 103. The switch 12 has a function of controlling the conduction between a wiring 22 and the other electrode (terminal) of the capacitor 102 and between the wiring 22 and a gate of the transistor 101. The switch 13 has a function of controlling the conduction between one of a source and a drain of the transistor 101 or the other electrode (terminal) of the capacitor 103 and the one electrode of the capacitor 102 or 103. The other of the source and the drain of the transistor 101 is connected to a wiring 23. The one of the source and the drain of the transistor 101 or the other electrode (terminal) of the capacitor 103 is connected to a wiring 24.

Note that the terms "source" (source terminal, source region, or source electrode) and "drain" (drain terminal, drain region, or drain electrode) of a transistor interchange with each other depending on the polarity of the transistor or the levels of potentials applied to the source and the drain. In general, as for a source and a drain in an n-channel transistor, one to which a lower potential is applied is called a source, and one to which a higher potential is applied is called a drain. Further, as for a source and a drain in a p-channel transistor, one to which a lower potential is supplied is called a drain, and one to which a higher potential is supplied is called a source. In this specification, although connection relation of the transistor is described assuming that the source and the drain are fixed in some cases for convenience, actually, the names of the source and the drain interchange with each other depending on the relation of the potentials. Thus, a portion which serves as a source or a portion which serves as a drain is not referred to as a source or a drain in some cases. In that case, one of the source and the drain might be referred to as a first terminal, a first electrode, or a first region, and the other of the source and the drain might be referred to as a second terminal, a second electrode, or a second region, for example.

Note that a switch is an element having a function of operating by switching conduction and non-conduction between its terminals and a function of determining whether or not current flows between them. Alternatively, the switch has a function of selecting and changing a current path. For example, the switch has a function of determining whether current can flow through a path 1 or a path 2 and switching the paths. For example, an electrical switch or a mechanical switch can be used as the switch. Specifically, the switch may be formed using a transistor, a diode, or a switch formed by a micro electro mechanical system (MEMS) technology, such as a digital micromirror device (DMD). Alternatively, the switch may be a logic circuit in which transistors are combined. In the case of employing a transistor as the switch, there is no particular limitation on the polarity (conductivity type) of the transistor. Note that a transistor with small off-state current is preferably used and the polarity of the transistor is preferably selected in accordance with an input potential.

Examples of the transistor with small off-state current are a transistor provided with an LDD region, a transistor with a multi-gate structure, and a transistor whose channel formation region contains an oxide semiconductor. In the case where a combination of transistors operates as a switch, a complementary switch may be employed by using both an n-channel transistor and a p-channel transistor. A complementary switch achieves appropriate operation even when a potential input to the switch is changed relative to an output potential.

Note that, when a transistor is used as a switch, the switch includes an input terminal (one of a source and a drain), an output terminal (the other of the source and the drain), and a terminal for controlling conduction (gate) in some cases. On the other hand, when a diode is used as a switch, the switch does not have a terminal for controlling conduction in some cases. Therefore, when a diode is used as a switch, the number of wirings for controlling terminals can be reduced as compared to the case of using a transistor.

Note that, for example, a transistor with a structure where gates are provided above and below a channel formation region can be used as a transistor. By providing the gates above and below a semiconductor film, a circuit structure where a plurality of transistors is connected in parallel is provided. Thus, a channel formation region is increased, so that the amount of current can be increased. By employing the structure where the gates are provided above and below the channel formation region, a depletion layer is easily formed; thus, subthreshold swing (S value) can be improved.

Note that, for example, a transistor with a structure where a source electrode or a drain electrode overlaps with a channel formation region (or part thereof) can be used as a transistor. By employing the structure where the source electrode or the drain electrode overlaps with the channel formation region (or part thereof), unstable operation due to electric charge accumulated in part of the channel formation region can be prevented.

Note that the capacitor 102 or 103 may have a structure where an insulating film or an organic film is sandwiched between wirings, semiconductor layers, electrodes, or the like, for example.

Figure 1B:
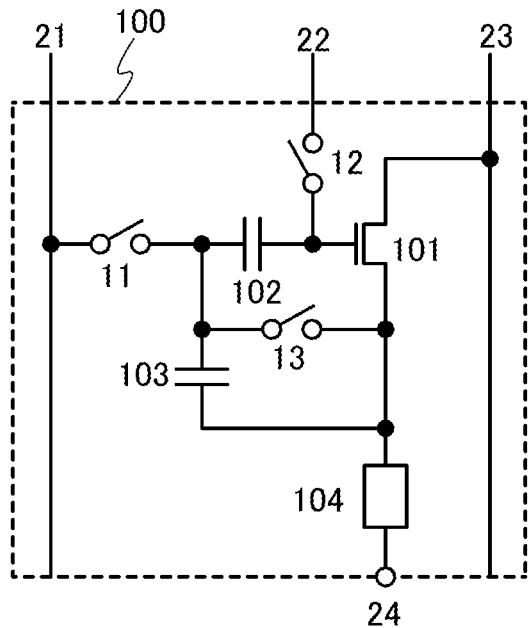

Note that the circuit 100 in FIG. 1A may include a load 104 as illustrated in FIG. 1B. In the circuit 100 in FIG. 1B, the load 104 is connected between one of the source and the drain of the transistor 101 or the other electrode of the capacitor 103 and the wiring 24.

Note that, in this specification, a load means an object having a rectifying property, an object having capacitance, an object having resistance, a circuit including a switch, a current source circuit, or the like. For example, a load having a rectifying property has current-voltage characteristics showing different resistance values depending on the direction of an applied bias, and has an electric property which allows most current to flow only in one direction. Specifically, the load 104 may be a display element (e.g., a liquid crystal element and an EL element), a light-emitting element (an EL (electroluminescence) element, e.g., an EL element containing organic and inorganic materials, an organic EL element, or an inorganic EL element), and an LED (e.g., a white LED, a red LED, a green LED, or a blue LED), a transistor (a transistor which emits light in accordance with the amount of current), an electron emitter, a part of a display element or a light-emitting element (e.g., a pixel electrode, an anode, and a cathode), or the like.

Figure 1C:
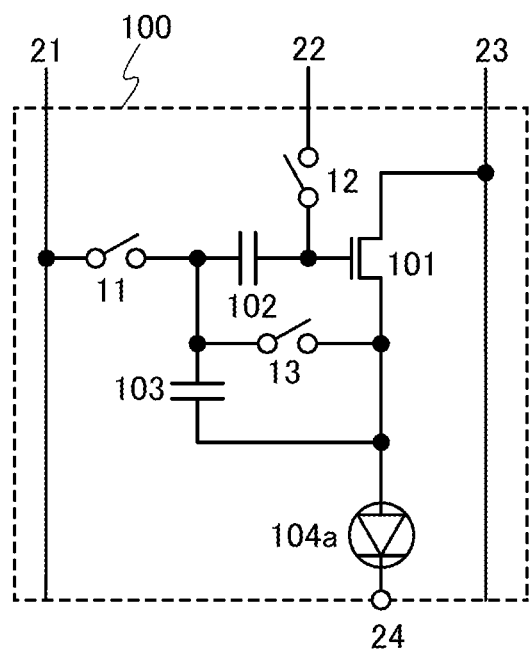

FIG. 1C illustrates the structure of a circuit 100 which uses a light-emitting element 104a as the load 104. FIG. 1C illustrates the case where an anode of the light-emitting element 104a is connected to one of the source and the drain of the transistor 101 or the other electrode of the capacitor 103, and a cathode of the light-emitting element 104a is connected to the wiring 24.

Figure 1D:
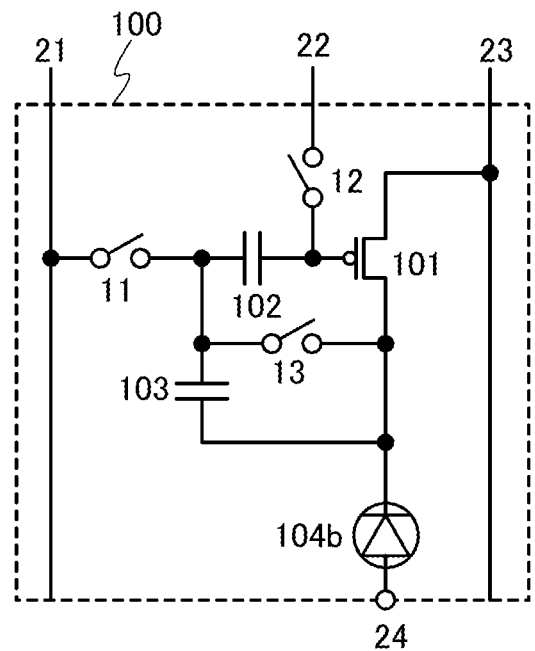
Figure 2A:
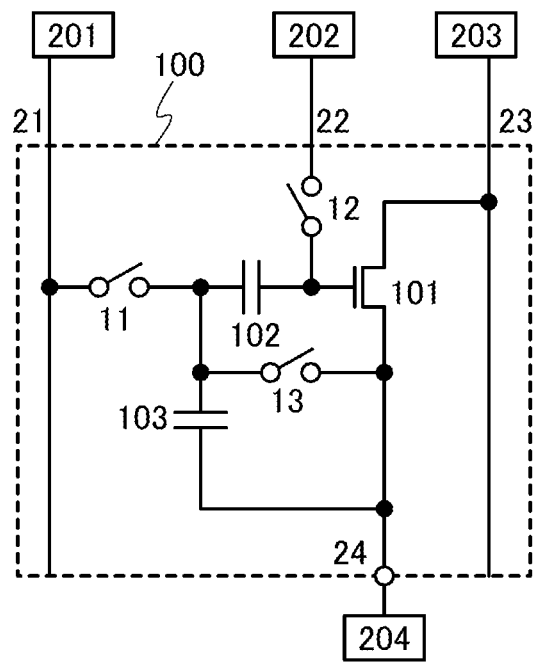
FIGS. 2A to 2D each illustrate the structure of a semiconductor device.
Figure 2B:
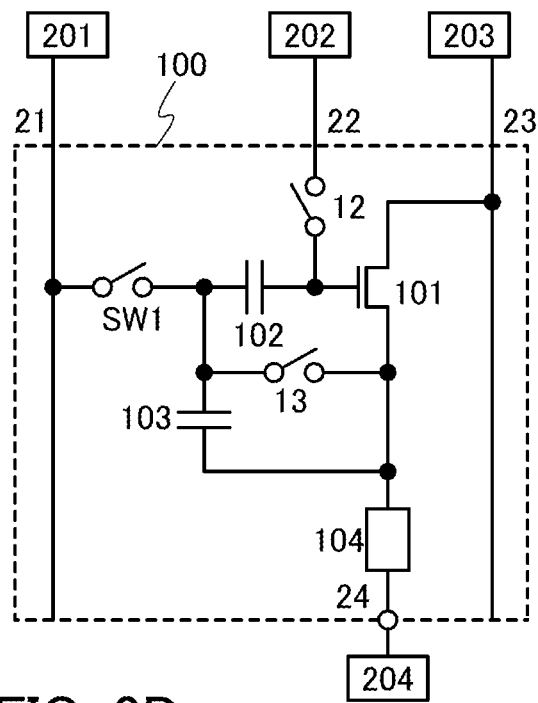
Figure 2C:
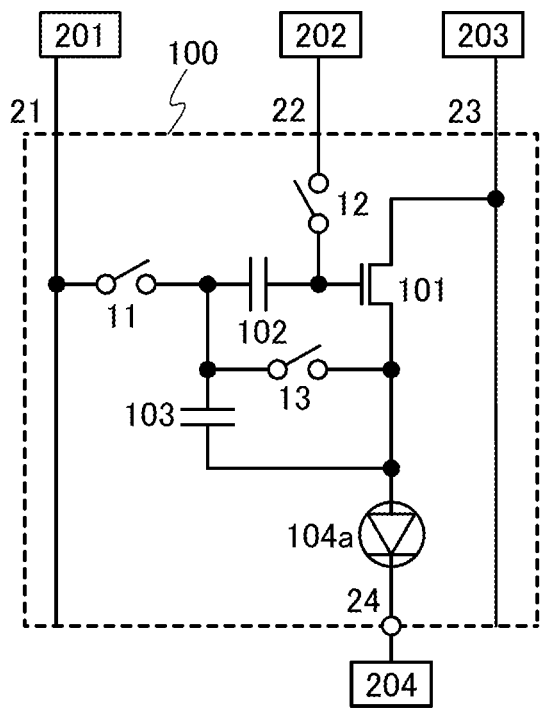
Figure 2D:
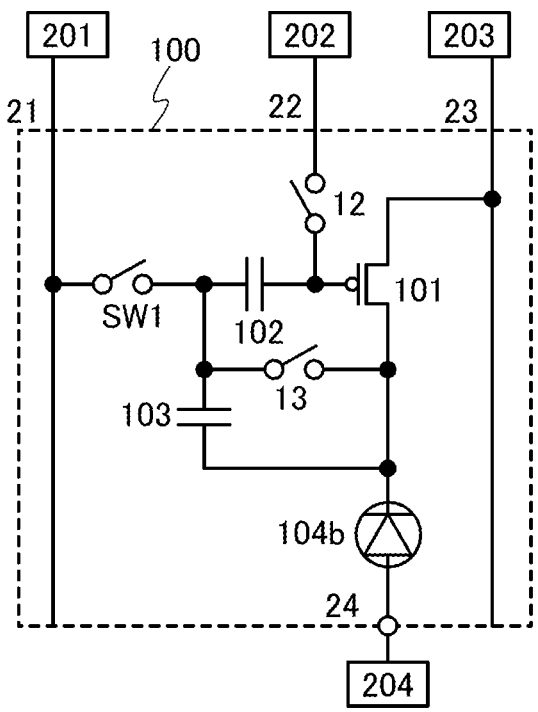

FIG. 1D illustrates the structure of a circuit 100 which uses a light-emitting element 104b as the load 104. FIG. 1D illustrates the case where a cathode of the light-emitting element 104b is connected to one of the source and the drain of the transistor 101 or the other electrode of the capacitor 103, and an anode of the light-emitting element 104b is connected to the wiring 24. Note that FIG. 1D shows the case where the transistor 101 is a p-channel transistor.

A semiconductor device according to one aspect of the present invention may include, for example, any circuit that supplies a constant voltage or a signal to the circuit 100, as well as any of the circuits 100 illustrated in FIGS. 1A to 1D.

Semiconductor devices illustrated in FIGS. 2A to 2D include, in addition to the circuits 100 in FIGS. 1A to 1D, a circuit 201 having a function of supplying a constant voltage or a signal to the wiring 21, a circuit 202 having a function of supplying a constant voltage or a signal to the wiring 22, a circuit 203 having a function of supplying a constant voltage or a signal to the wiring 23, and a circuit 204 having a function of supplying a constant voltage or a signal to the wiring 24.

Specifically, the circuit 201 has a function of supplying a potential Vi1 or a potential Vsig to the wiring 21. An example of the circuit 201 is a source driver (a signal line driver circuit). Accordingly, the wiring 21 has a function of transmitting or supplying the potential Vi1 and/or the potential Vsig. The wiring 21 functions as a video signal line. Alternatively, the wiring 21 functions as an initialization line.

The potential Vi1 is a potential for initializing the potential of each node in the circuit 100, for example. Alternatively, the potential Vi1 is a potential for supplying electric charge to the capacitor 102, for example. Alternatively, the potential Vi1 is a potential for turning on the transistor 101, for example. Note that the potential Vi1 is preferably constant; however, one aspect of the embodiment of the present invention is not limited thereto. The potential Vi1 may vary like a pulse signal.

Note that, as an example, the potential Vi1 is supplied to the circuit 100 before the potential Vsig is supplied to the circuit 100.

The potential Vsig is a potential for controlling the amount of the drain current of the transistor 101. In the case of the semiconductor device illustrated in FIG. 2B, the drain current is supplied to the load 104. In the case of the semiconductor device illustrated in FIG. 2C, the drain current is supplied to the light-emitting element 104a. In the case of the semiconductor device illustrated in FIG. 2D, the drain current is supplied to the light-emitting element 104b. For example, when the drain current of the transistor 101 is kept at a constant value, the level of the potential Vsig is set constant. In contrast, for example, when the drain current of the transistor 101 is not set at a constant value, the level of the potential Vsig is changed with time. As an example, the potential Vsig is a video signal and/or an analog signal. However, one aspect of the embodiment of the present invention is not limited to this; the potential Vsig may be a constant potential.

The circuit 202 has a function of supplying a potential Vi2 to the wiring 22. An example of the circuit 202 is a power supply circuit. Accordingly, the wiring 22 has a function of transmitting or supplying the potential Vi2. Alternatively, the wiring 22 functions as an initialization line. Note that the potential of the wiring 22 is preferably constant; however, one aspect of the embodiment of the present invention is not limited thereto. The potential of the wiring 22 may vary like a pulse signal.

The potential Vi2 is a potential for initializing the potential of each node (particularly the gate of the transistor 101) in the circuit 100. In the case in FIG. 2C, the potential Vi2 is preferably lower than or equal to the potential of the wiring 24. Thus, current flowing to the light-emitting element 104a can be reduced. In the case in FIG. 2D, the potential Vi2 is preferably higher than or equal to the potential of the wiring 24. Thus, current flowing to the light-emitting element 104b can be reduced. However, the potential of the potential Vi2 is not limited to this. Note that the potential Vi2 is preferably constant; however, one aspect of the embodiment of the present invention is not limited thereto. The potential Vi2 may vary like a pulse signal.

Note that the wiring 22 may be connected to another wiring or a wiring included in another circuit 100. Thus, the number of wirings can be reduced.

The circuit 203 has a function of supplying a supply voltage (a high supply potential or a low supply potential), e.g., a potential VDD or a potential VSS to the wiring 23. Alternatively, the circuit 203 has a function of supplying a signal to the wiring 23. Examples of the circuit 203 are a power supply circuit, a pulse output circuit, and a gate driver circuit. Accordingly, the wiring 23 has a function of transmitting or supplying a power supply potential or a signal. Alternatively, the wiring 23 has a function of supplying current to the transistor 101. Alternatively, the wiring 23 has a function of supplying current to the load 104. The wiring 23 functions as a power supply line. Alternatively, the wiring 23 functions as a current supply line. Note that the potential of the wiring 23 is preferably constant; however, one aspect of the embodiment of the present invention is not limited thereto. The potential of the wiring 23 may vary like a pulse signal. For example, the potential of the wiring 23 may be a potential at which not only forward bias voltage but also reverse bias voltage is applied to the load 104.

The circuit 204 has a function of supplying, for example, a supply voltage (a low supply potential or a high supply potential), e.g., a potential Vcat to the wiring 24. An example of the circuit 204 is a power supply circuit. Accordingly, the wiring 24 has a function of transmitting or supplying a power supply potential. Alternatively, the wiring 24 has a function of supplying current to the load 104. Alternatively, the wiring 24 has a function of supplying current to the transistor 101. The wiring 24 functions as a common line. Alternatively, the wiring 24 functions as a negative line. Alternatively, the wiring 24 functions as a positive line. Note that the potential of the wiring 24 is preferably constant; however, one aspect of the embodiment of the present invention is not limited thereto. The potential of the wiring 24 may vary like a pulse signal. For example, the potential of the wiring 24 may be a potential at which not only forward bias voltage but also reverse bias voltage is applied to the load 104.

A difference between the potential VDD and the potential Vcat determines the direction of the drain current of the transistor 101. For example, when the potential VDD is higher than the potential Vcat, current flows from the wiring 23 to the wiring 24. When the potential of the wiring 23 is equal to the potential VSS and lower than the potential Vcat, current flows from the wiring 24 to the wiring 23.

Note that in FIGS. 2A to 2D, the semiconductor devices each include, in addition to the circuit 100, the circuits 201, 202, 203, and 204, as an example. However, a semiconductor device according to one aspect of the present invention does not necessarily include all of the circuits 201, 202, 203, and 204, and may include only one or some of these circuits.

The transistor 101 functions as at least a current source, for example. Accordingly, for example, the transistor 101 has a function of supplying substantially constant current even when the level of voltage applied across both ends (between the source and the drain) of the transistor 101 is changed. Alternatively, for example, the transistor 101 has a function of supplying substantially constant current to the load 104 even when the potential of the load 104 is changed. Alternatively, for example, the transistor 101 has a function of supplying substantially constant current even when the potential of the wiring 23 is changed.

Note that one aspect of the embodiment of the present invention is not limited to this; the transistor 101 does not necessarily function as a current source. For example, the transistor 101 may function as a switch.

Note that there is a voltage source as a power source different from a current source. The voltage source has a function of supplying constant voltage even when current flowing through a circuit connected to the voltage source is changed. Accordingly, the voltage source and the current source each have a function of supplying voltage and current. However, the function of the voltage source and the function of the current source are different in what is supplied at a constant level even when one factor is changed. The current source has a function of supplying constant current event when voltage across both ends is changed. The voltage source has a function of supplying constant voltage even when current is changed.

Note that FIGS. 1A to 1D and the like each illustrate a circuit structure example; thus, a transistor can be additionally provided. In contrast, for each node in FIGS. 1A to 1D and the like, it is possible not to provide an additional transistor, switch, passive element, or the like. For example, it is possible not to provide an additional transistor that is directly connected to a node where terminals of switches are connected to each other, a node where terminals of a transistor are connected to each other, and/or a node where terminals of a load are connected to each other. Accordingly, for example, it is possible to directly connect only the transistor 101 to a node where the load 104, the transistor 101, the capacitor 103, and the switch 13 are connected to each other, and it is possible not to directly connect another transistor to the node.

Thus, a circuit can be formed with a small number of transistors in the case where an additional transistor is not provided.

Note that in the circuits 100 in FIGS. 1A to 1D and FIGS. 2A to 2D, the switch 11, the switch 12, and the switch 13 may be transistors.

Figure 3A:
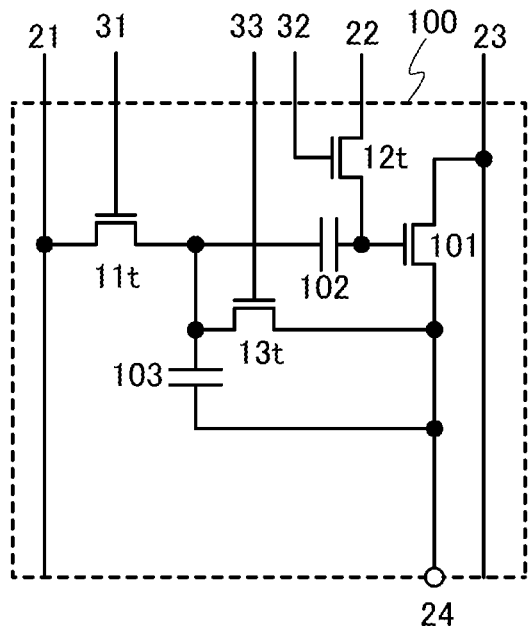
FIGS. 3A to 3D each illustrate the structure of a semiconductor device.
Figure 3B:
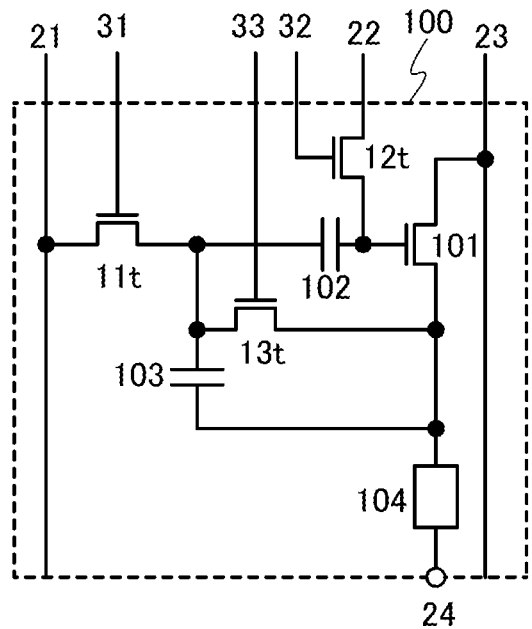
Figure 3C:
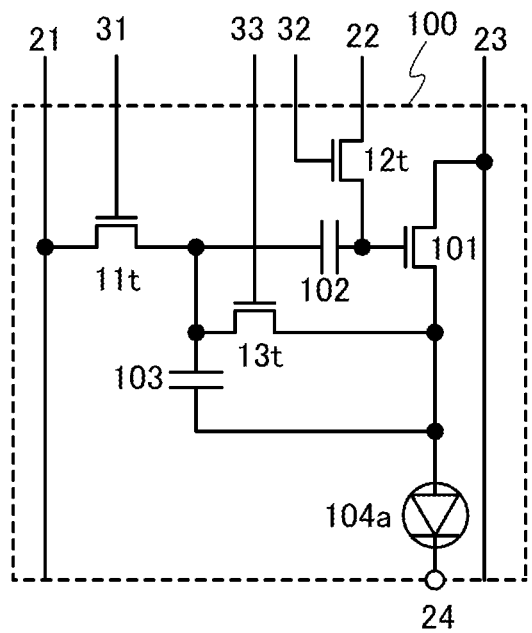
Figure 3D:
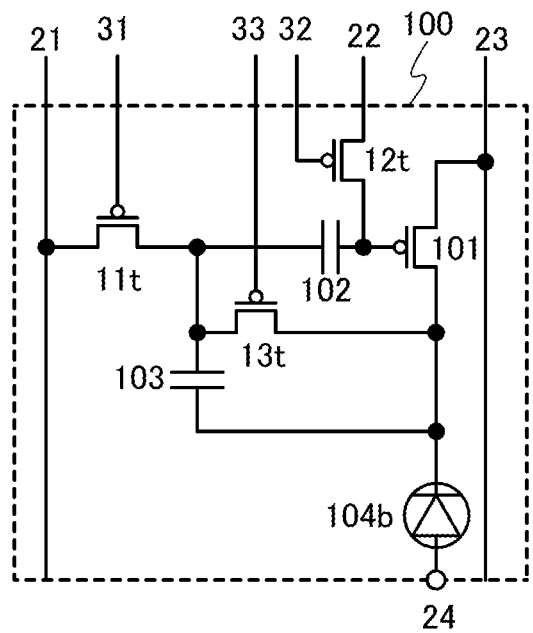
Figure 4A:
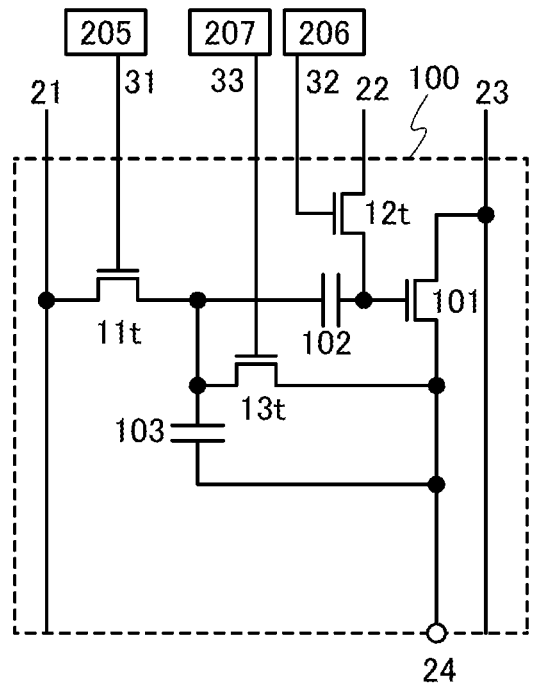
FIGS. 4A to 4D each illustrate the structure of a semiconductor device.
Figure 4B:
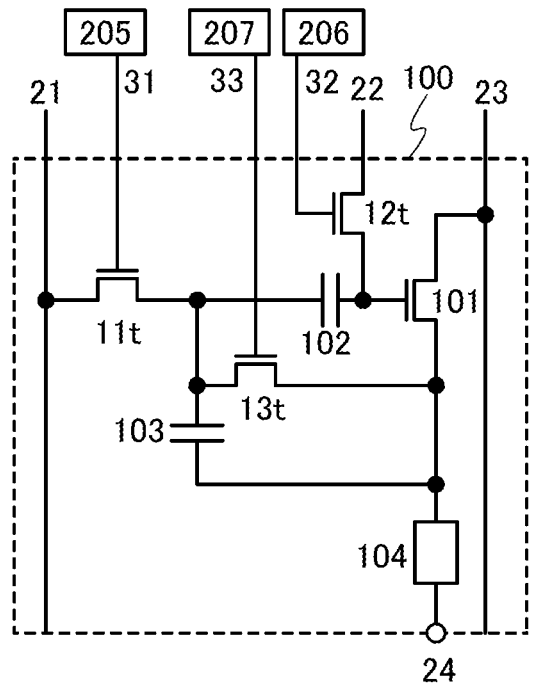
Figure 4C:
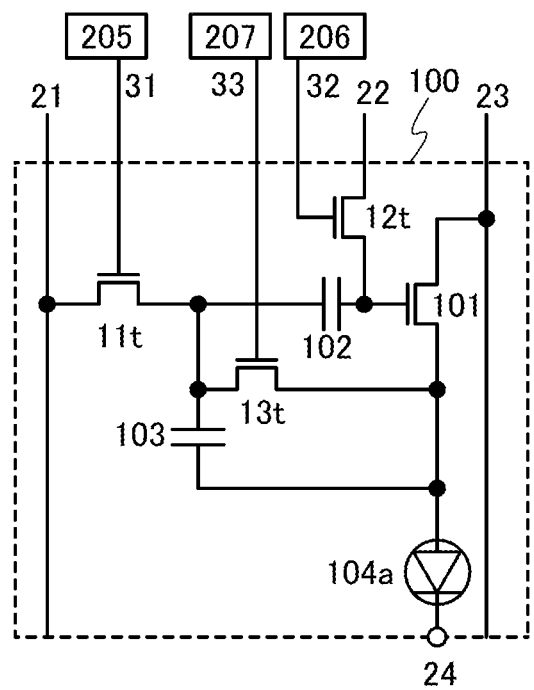
Figure 4D:
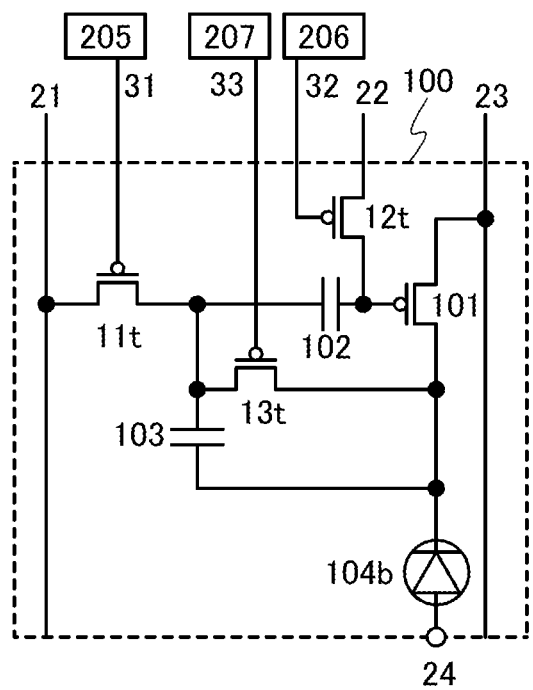

FIGS. 3A to 3D illustrate the structures of circuits 100 which correspond to the circuits 100 in FIGS. 1A to 1D each using a transistor 11t as the switch 11, a transistor 12t as the switch 12, and a transistor 13t as the switch 13. FIGS. 3A to 3C illustrate the case where the transistor 11t, the transistor 12t, and the transistor 13t are all n-channel transistors. FIG. 3D illustrates the case where the transistor 11t, the transistor 12t, and the transistor 13t are all p-channel transistors. When the transistor 11t, the transistor 12t, and the transistor 13t have the same polarity, these transistors can be manufactured in fewer steps. However, one aspect of the embodiment of the present invention is not limited to this; these transistors may have different polarities.

Note that in FIGS. 3A to 3D, a gate of the transistor 11t is connected to a wiring 31. The transistor 11t is turned on or off in response to the potential supplied to the wiring 31. A gate of the transistor 12t is connected to a wiring 32. The transistor 12t is turned on or off in response to the potential supplied to the wiring 32. A gate of the transistor 13t is connected to a wiring 33. The transistor 13t is turned on or off in response to the potential supplied to the wiring 33. Therefore, it is preferable that the potentials of the wirings 31 to 33 be pulsed potentials and not constant; however, one aspect of the embodiment of the present invention is not limited to this. Alternatively, the wirings 31 to 33 each function as a gate signal line (a gate line), a selection signal line, or a scan line.

Note that at least two of these wirings 31 to 33 can be connected to each other. Alternatively, at least one of these wirings 31 to 33 can be connected to at least one of the wirings 31 to 33 in another circuit 100.

A semiconductor device according to one aspect of the present invention may include, for example, any circuit that supplies a constant voltage or a signal to the circuit 100, as well as any of the circuits 100 illustrated in FIGS. 3A to 3D.

Semiconductor devices illustrated in FIGS. 4A to 4D include, in addition to the circuits 100 in FIGS. 3A to 3D, a circuit 205 having a function of supplying a constant voltage or a signal to the wiring 31, a circuit 206 having a function of supplying a constant voltage or a signal to the wiring 32, and a circuit 207 having a function of supplying a constant voltage or a signal to the wiring 33. Examples of the circuits 205, 206, and 207 include gate drivers (scan line driver circuits).

Note that the circuits 201, 202, 203, 204, 205, 206, and 207 may be the same circuit or different circuits.

Note that in FIGS. 4A to 4D, the semiconductor devices each include, in addition to the circuit 100, the circuits 205, 206, and 207, as an example. However, a semiconductor device according to one aspect of the present invention does not necessarily include all of the circuits 205, 206, and 207, and may include only one or some of these circuits.

Figure 37A:
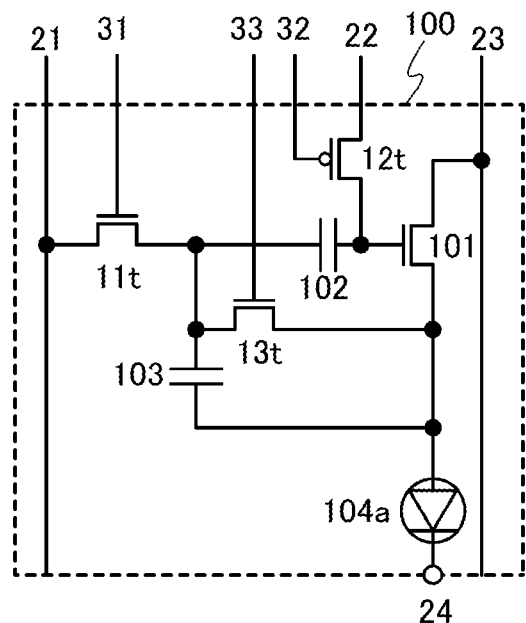
FIGS. 37A to 37D each illustrate the structure of a semiconductor device.
Figure 37B:
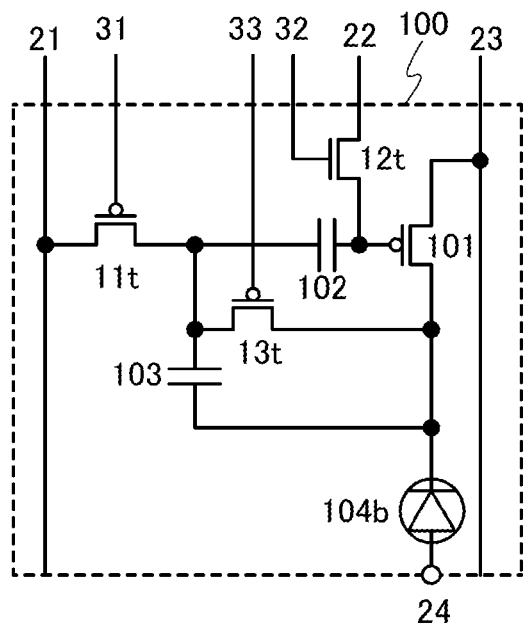

FIG. 37A illustrates the structure of a circuit 100 corresponding to the circuit 100 in FIG. 3C, in which the transistors 101, 11t, and 13t are n-channel transistors and the transistor 12t is a p-channel transistor. FIG. 37B illustrates the structure of a circuit 100 corresponding to the circuit 100 in FIG. 3D, in which the transistors 101, 11t, and 13t are p-channel transistors and the transistor 12t is an n-channel transistor. As described above, transistors of a variety of polarities can be used.

A semiconductor device according to one aspect of the present invention may include, for example, any circuit that supplies a constant voltage or a signal to the circuit 100, as well as any of the circuits 100 illustrated in FIGS. 37A and 37B.

Figure 37C:
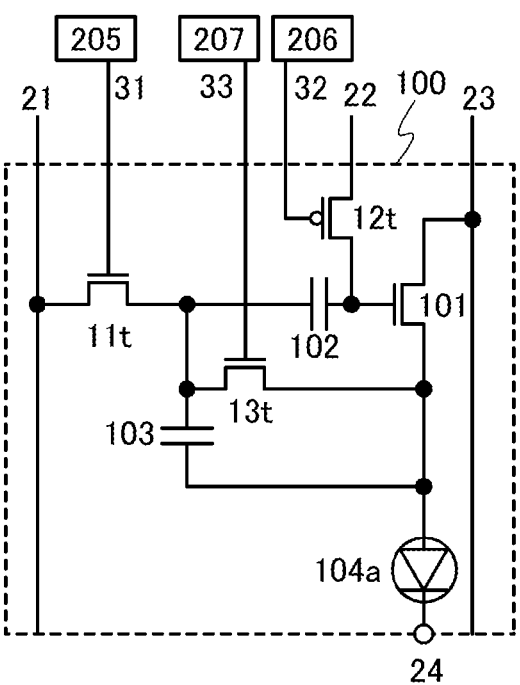
Figure 37D:
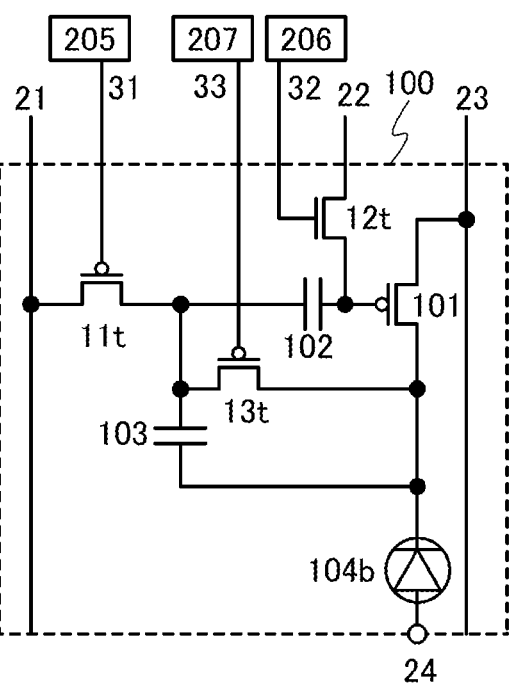

Semiconductor devices illustrated in FIGS. 37C and 37D include, in addition to the circuits 100 in FIGS. 37A and 37B, a circuit 205 having a function of supplying a constant voltage or a signal to the wiring 31, a circuit 206 having a function of supplying a constant voltage or a signal to the wiring 32, and a circuit 207 having a function of supplying a constant voltage or a signal to the wiring 33.

Note that in FIGS. 37C and 37D, the semiconductor devices each include, in addition to the circuit 100, the circuits 205, 206, and 207, as an example. However, a semiconductor device according to one aspect of the present invention does not necessarily include all of the circuits 205, 206, and 207, and may include only one or some of these circuits.

In many cases, the transistor 101 operates in a saturation region when current flows therethrough. Therefore, in FIGS. 3A to 3D, FIGS. 4A to 4D, and FIGS. 37A to 37D, the transistor 101 preferably has a longer channel length or gate length than the transistor 11t, the transistor 12t, and/or the transistor 13t. When the channel length or the gate length is increased, characteristics in a saturation region have a flat slope; accordingly, a kink effect can be reduced. The channel length or gate length of the transistor 101 is preferably 5 or more times, further preferably 10 or more times that of the transistor 11t, the transistor 12t, and/or the transistor 13t. As an example, the channel length or gate length of the transistor 101 is preferably 10 μm or more, more preferably 20 μm or more. Alternatively, the channel width or gate width of the transistor 101 is larger than that of the transistor 11t, the transistor 12t, and/or the transistor 13t, so that much current flows through the transistor 101 even in a saturation region. The channel width or the gate width of the transistor 101 is preferably 5 or more times, further preferably 10 or more times that of the transistor 11t, the transistor 12t, and/or the transistor 13t. The channel width or the gate width of the transistor 101 is preferably 20 μm or more, more preferably 30 μm or more. Note that one aspect of an embodiment of the present invention is not limited thereto.

The following describes the operation of a semiconductor device according to one aspect of the present invention, taking the circuit 100 illustrated in FIG. 1C as an example.

The operation of the circuit 100 illustrated in FIG. 1C can be mainly divided into a first operation, a second operation, a third operation, a fourth operation, and a fifth operation. Note that one aspect of an embodiment of the present invention is not limited thereto, and another operation can be added or part of the operation can be omitted.

Figure 5A:
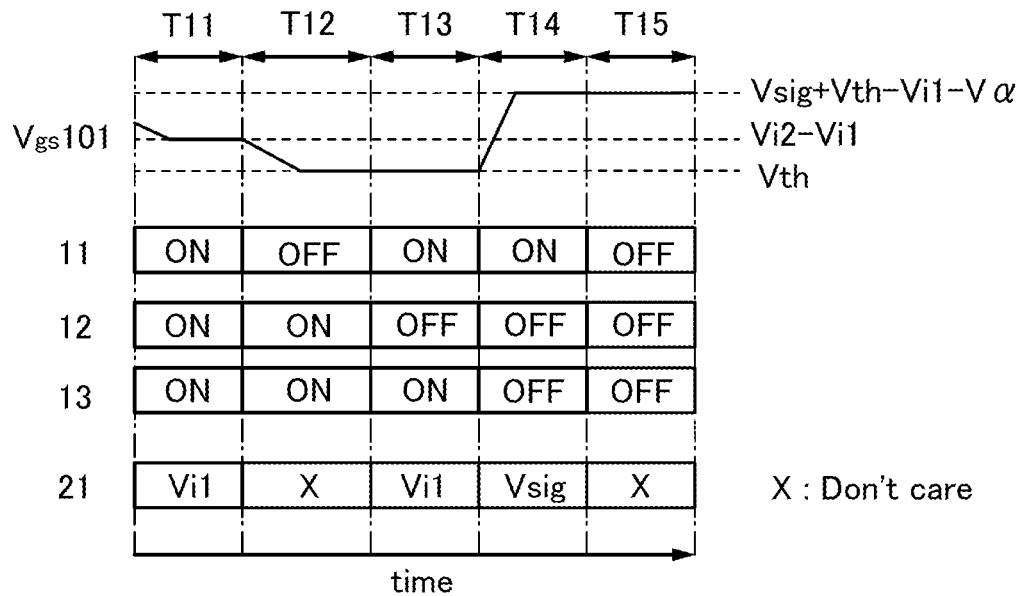
FIG. 5A is a timing chart, and FIGS. 5B and 5C each illustrate the operation of a semiconductor device.

FIG. 5A is an example of a timing chart showing the operations of the switch 11, the switch 12, and the switch 13, the potential of the wiring 21, and the gate-source voltage of the transistor 101 (Vgs101) in the circuit 100 illustrated in FIG. 1C.

Figure 5B:
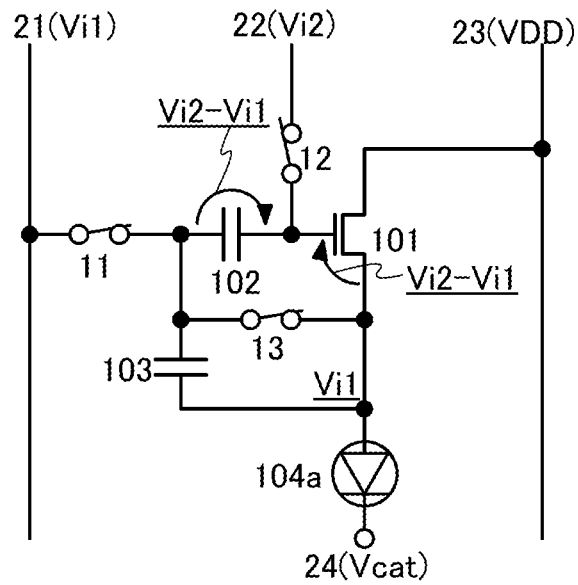

First, the first operation in the period T11 is described. In the period T11, as illustrated in FIG. 5A, the switch 11, the switch 12, and the switch 13 are on. Further, the potential Vi1 is supplied to the wiring 21. Thus, in the period T11, as illustrated in FIG. 5B, the voltage Vi2−Vi1 is applied to the capacitor 102, the potential of the anode of the light-emitting element 104a becomes the potential Vi1, and the gate-source voltage Vgs101 of the transistor 101 becomes the voltage Vi2−Vi1. In other words, the transistor 101 and the capacitor 102 are initialized.

Note that in the circuit 100 in FIG. 1C, the potential Vi2 is preferably higher than the sum of the potential Vi1 and the threshold voltage Vth of the transistor 101. In other words, the potential Vi2 and the potential Vi1 are preferably potentials with which the transistor 101 is turned on. Moreover, the sum of the potential Vi1 and a threshold voltage Vthe of the light-emitting element 104a (a voltage at which the light-emitting element 104a starts to emit light) is preferably lower than the potential Vcat. For example, the potential Vi1 is preferably lower than or equal to the potential Vcat. When the potential Vi1 is lower than the potential Vcat, the light-emitting element 104a is reverse-biased, so that degradation of the light-emitting element 104a can be reduced or a short-circuited portion can be repaired. Further, a value obtained by subtracting the threshold voltage Vthe of the light-emitting element 104a from the potential Vi2 is preferably lower than the potential Vcat. Note that, as an example, the threshold voltage Vthe is hereinafter assumed to be 0.

Figure 5C:
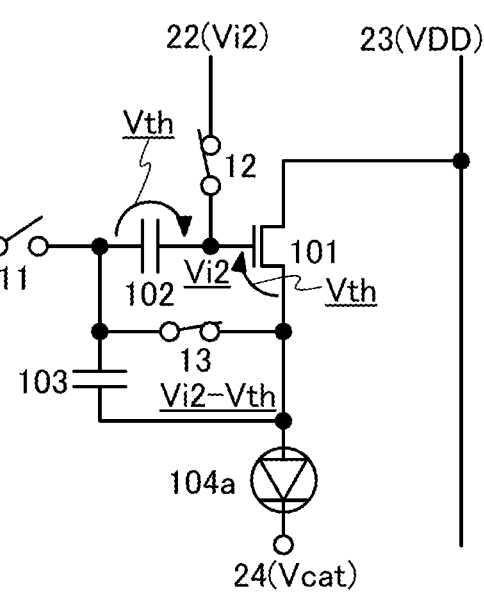

Next, the second operation in the period T12 is described. In the period T12, as illustrated in FIG. 5A, the switch 11 is off, and the switch 12 and the switch 13 are on. When the switch 11 is turned off, electric charge accumulated in the capacitor 102 is released through the transistor 101, and the potential of the source of the transistor 101 is raised. Then, when the transistor 101 is turned off, the release of the electric charge from the capacitor 102 is stopped. The threshold voltage Vth of the transistor 101 is eventually held in the capacitor 102. Thus, in the period T12, as illustrated in FIG. 5C, the threshold voltage Vth is held in the capacitor 102, the potential of the anode of the light-emitting element 104a becomes the potential Vi2−Vth, and the gate-source voltage Vgs101 of the transistor 101 becomes the threshold voltage Vth. That is, the threshold voltage Vth of the transistor 101 can be acquired.

Note that in some cases, it takes a very long time for Vgs101 to be equal to the threshold voltage Vth of the transistor 101. Accordingly, in many cases, an operation is performed while Vgs101 is not completely lowered to the threshold voltage Vth. That is, in many cases, the period T12 is terminated while Vgs101 is slightly higher than the threshold voltage Vth. In other words, at the termination of the period T12, Vgs101 becomes voltage based on the threshold voltage.

Note that the second operation can be performed regardless of whether the threshold voltage Vth of the transistor 101 is positive voltage or negative voltage. This is because the potential of the source of the transistor 101 can be raised until the transistor 101 is turned off. In other words, when the potential of the source of the transistor 101 becomes higher than potential of the gate of the transistor 101, the transistor 101 can be eventually turned off and Vgs101 can become Vth. Thus, the second operation can be performed without problems regardless of whether the transistor 101 is an enhancement (normally-off) transistor or a depletion (normally-on) transistor.

Note that when the potential of the anode of the light-emitting element 104a becomes high, it is preferable that current does not flow to the light-emitting element 104a. For this purpose, the potential Vi2 is preferably a low potential so that current does not flow to the light-emitting element 104a. Note that one aspect of an embodiment of the present invention is not limited thereto. If it is possible not to supply current to the light-emitting element 104a when a switch provided in series with the light-emitting element 104a is turned off, the potential Vi2 may be at a high value.

Figure 6A:
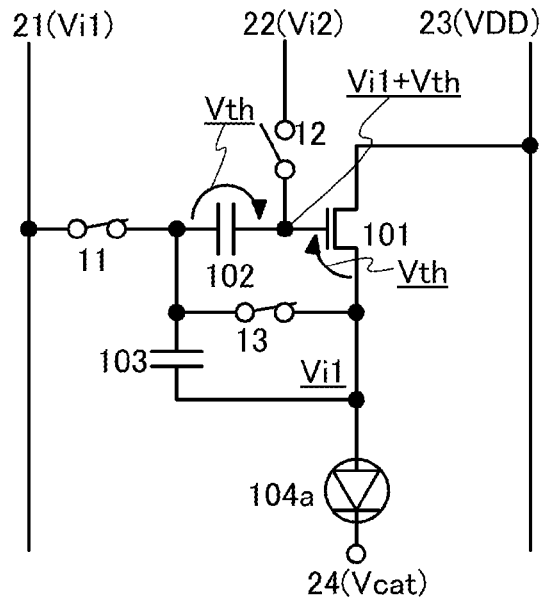
FIGS. 6A to 6C each illustrate the operation of a semiconductor device.

Next, the third operation in the period T13 is described. In the period T13, as illustrated in FIG. 5A, the switch 11 and the switch 13 are on, and the switch 12 is off. In addition, as an example, the potential Vi1 is supplied to the wiring 21. Thus, in the period T13, as illustrated in FIG. 6A, the threshold voltage Vth (the voltage based on Vth) is held in the capacitor 102, the potential of the anode of the light-emitting element 104a becomes the potential Vi1, the potential of the gate of the transistor 101 becomes the potential Vi1+Vth (or the voltage based on Vth), and the gate-source voltage Vgs101 of the transistor 101 becomes the voltage Vth (or the voltage based on Vth). Thus, the potential of the anode of the light-emitting element 104a or the potential of the source of the transistor 101 can be initialized.

Note that the third operation is not necessarily performed; the fourth operation described below may be performed after the second operation.

Note that the potential of the wiring 21 in the period T13 is not limited to the potential Vi1, and may be another potential (e.g., a potential Vi3). However, when the potential of the wiring 21 in the period T13 is the potential Vi1, the structure of the circuit 201 can be simplified. In the case where a plurality of circuits 100 is connected to the wiring 21, when the potential of the wiring 21 is the potential Vi1, one circuit 100 performs the operation of the period T11, and another circuit 100 performs the operation of the period T13, resulting in efficient use of operation period.

Figure 6B:
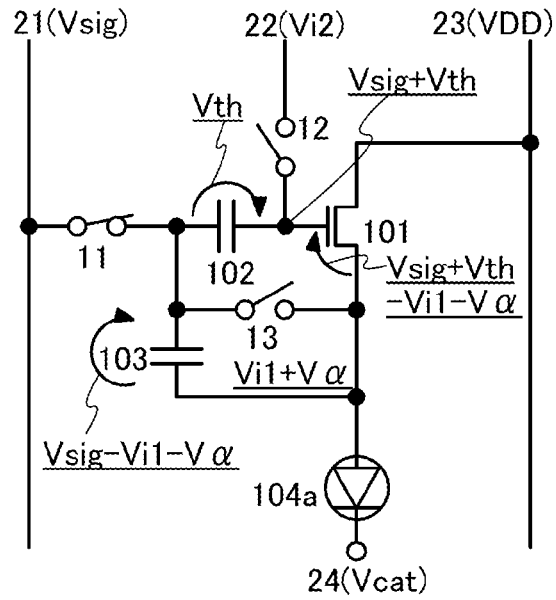

Next, the fourth operation in the period T14 is described. In the period T14, as illustrated in FIG. 5A, the switch 11 is on, and the switch 12 and the switch 13 are off. In addition, the potential Vsig is supplied to the wiring 21. Thus, in the period T14, as illustrated in FIG. 6B, the threshold voltage Vth (or the voltage based on Vth) is held in the capacitor 102, a voltage Vsig−Vi1−Vα is held in the capacitor 103, the potential of the anode of the light-emitting element 104a becomes a potential Vi1+Vα, the potential of the gate of the transistor 101 becomes the potential Vsig+Vth, and the gate-source voltage Vgs101 of the transistor 101 becomes a voltage Vsig+Vth−Vi1−Vα. Thus, the potential Vsig can be supplied to the capacitor 103. Alternatively, the sum of the voltage across the capacitor 102 and the voltage across the capacitor 103 can be equal to the gate-source voltage of the transistor 101.

Note that the potential Vα in the fourth operation varies when the anode of the light-emitting element 104a enters into an electrically floating state. The value of the potential Vα depends on the ratio between the capacitance of the light-emitting element 104a and the capacitance of the capacitor 102 and capacitor 103 if the transistor 101 is off. However, depending on the level of the potential Vsig, the transistor 101 might be turned on and electric charge flows into the anode of the light-emitting element 104a through the transistor 101. Thus, the value of the potential Vα depends not only on the capacitance ratio but also on the electric charge flowing into the anode of the light-emitting element 104a.

Here, in order that the gate-source voltage Vgs may be close to an ideal value, i.e., the voltage Vsig+Vth−Vi1, the circuit is preferably designed to reduce the potential Vα. Specifically, if the capacitance of the light-emitting element 104a is sufficiently greater than those of the capacitor 102 and the capacitor 103, the gate-source voltage Vgs can be close to the ideal value.

Therefore, the capacitance of the capacitor 103 is preferably lower than the parasitic capacitance of the load 104 (the light-emitting element 104a), more preferably ½ or less, still more preferably ⅕ or less of the capacitance of the load 104. Alternatively, the area of the electrodes of the capacitor 103 is preferably smaller than the area of the electrodes of the load 104 (the light-emitting element 104a), more preferably ½ or less of the area of the electrodes of the load 104, still more preferably ⅕ or less of the area of the electrodes of the load 104. Note that one aspect of an embodiment of the present invention is not limited thereto.

In order that the gate-source voltage Vgs101 may be close to an ideal value, it is preferable to reduce electric charge Q flowing into the anode of the light-emitting element 104a. To reduce the electric charge Q, the period T14 is preferably as short as possible. Note that as described above, if the potential Vsig is supplied to the wiring 21 in advance in the period T13, the potential of the gate of the transistor 101 can be set close to the potential Vsig+Vth in a short time after the switch 11 is turned on in the period T14. This is preferable because this shortens the period T14, and thus reduces the electric charge Q.

Therefore, the length of the period T14 is preferably smaller than that of the period T11, the period T12, and/or the period T13. The length of the period T13 is preferably ⅔ or less, more preferably ½ or less of the period T11, the period T12, and/or the period T13. Note that one aspect of an embodiment of the present invention is not limited thereto.

Note that the electric charge Q is preferably low as described above; however, in the case where variations in mobility between the transistors 101 are significant, the electric charge Q may produce the effect of suppressing such variations in mobility. The reason will be described below.

The electric charge Q is the amount of electric charge which flows from the drain to the source of the transistor 101 in the period T14. Accordingly, the electric charge Q is increased as the mobility of the transistor 101 increases. As the electric charge Q is increased, the gate-source voltage Vgs 101 of the transistor 101 at the time when the light-emitting element 104a emits light is reduced. In other words, as the mobility of the transistor 101 increases, correction is made by the electric charge Q so that the value of current supplied to the light-emitting element 104a may be small, whereas, as the mobility of the transistor 101 decreases, correction is made by the electric charge Q so that the value of current supplied to the light-emitting element 104a may not be so small. Thus, variations in mobility can be suppressed by the electric charge Q.

Note that the capacitance of the capacitor 102 is preferably higher than the parasitic capacitance of the gate of the transistor 101, more preferably 2 or more times the parasitic capacitance of the gate of the transistor 101, still more preferably 5 or more times the parasitic capacitance of the gate of the transistor 101. Alternatively, the area of the electrodes of the capacitor 102 is preferably larger than the area of a channel region of the transistor 101, more preferably 2 or more times the area of the channel region of the transistor 101, still more preferably 5 or more times the area of the channel region of the transistor 101. Alternatively, the area of the electrodes of the capacitor 102 is preferably larger than the area of the gate electrode of the transistor 101, more preferably 2 or more times the area of the gate electrode of the transistor 101, still more preferably 5 or more times the area of the gate electrode of the transistor 101. Accordingly, when the potential Vsig is input and voltage is divided by the capacitor 102 and the gate capacitance of the transistor, a decrease in voltage of the capacitor 102 can be reduced. Note that one aspect of the embodiment of the present invention is not limited thereto.

Note that the capacitance of the capacitor 102 is preferably equal to or higher than the capacitance of the capacitor 103. The difference between the capacitance of the capacitor 102 and the capacitance of the capacitor 103 is preferably ±20% or lower, more preferably ±10% or lower. Alternatively, the area of the electrodes of the capacitor 102 is preferably equal to or larger than the area of the electrodes of the capacitor 103. Accordingly, the semiconductor device can perform optimum operation without changing the layout area. Note that one aspect of the embodiment of the present invention is not limited thereto.

Figure 6C:
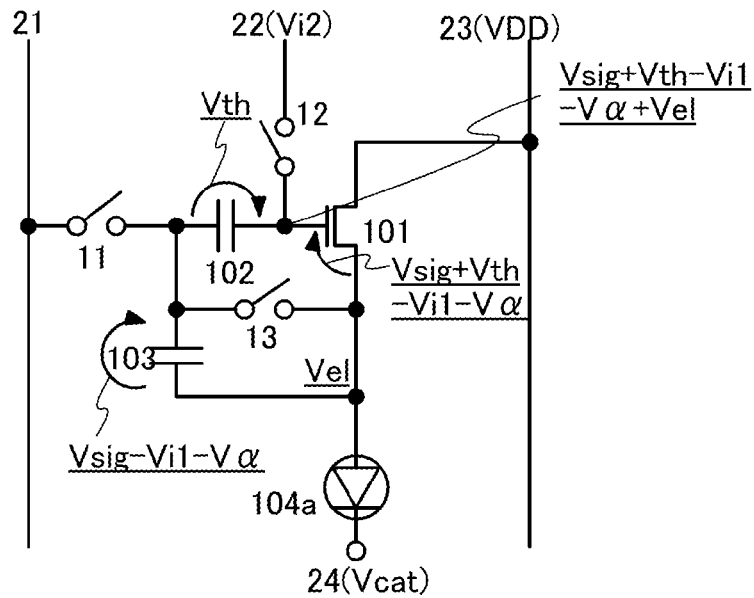
Figure 7A:
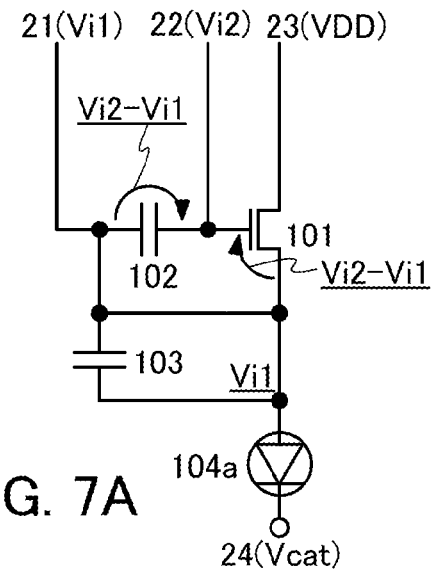
FIGS. 7A to 7E each illustrate the operation of a semiconductor device.
Figure 7B:
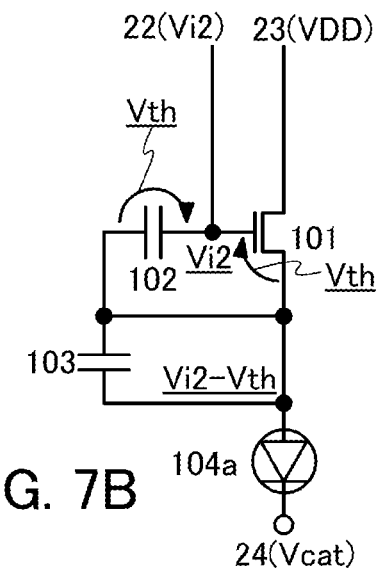
Figure 7C:
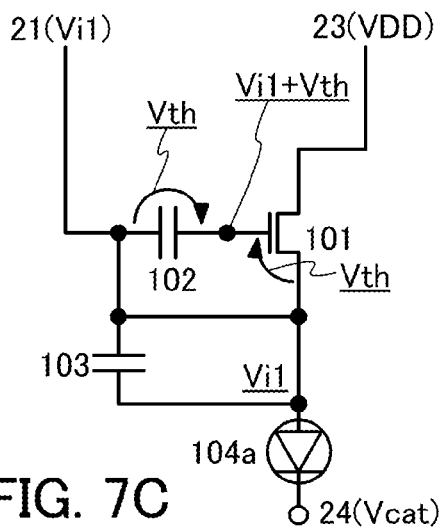
Figure 7D:
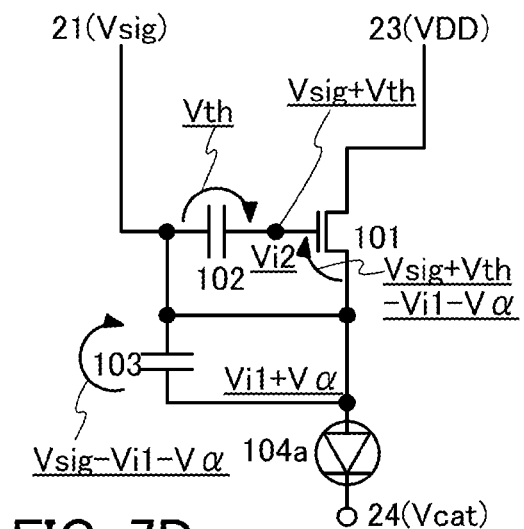
Figure 7E:
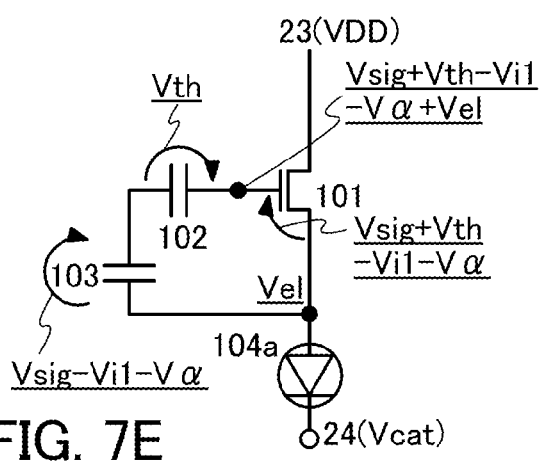

The fifth operation in the period T15 is described. In the period T15, as illustrated in FIG. 5A, the switch 11, the switch 12, and the switch 13 are off. Thus, in the period T15, as illustrated in FIG. 6C, the threshold voltage Vth is held in the capacitor 102, the voltage Vsig−Vi1−Vα is held in the capacitor 103, the potential of the anode of the light-emitting element 104a becomes the potential Ve1, the potential of the gate of the transistor 101 becomes the potential Vsig+Vth−Vi1−Vα+Ve1 and the gate-source voltage Vgs101 of the transistor 101 becomes the voltage Vsig+Vth−Vi1−Vα. Thus, current based on the potential Vsig can flow to the light-emitting element 104a, so that the light-emitting element 104a can emit light at luminance based on the potential Vsig.

Note that the potential Ve1 occurs when current is fed to the light-emitting element 104a through the transistor 101. Specifically, the potential Ve1 is between the potential VDD and the potential Vcat.

In the fifth operation, the gate-source voltage Vgs101 of the transistor 101 can be set to the voltage Vsig+Vth−Vi1−Vα by taking the threshold voltage Vth of the transistor 101 into consideration. Consequently, variations in threshold voltage Vth between the transistors 101 can be prevented from adversely affecting the value of a current supplied to the light-emitting elements 104a. Alternatively, even if the transistor 101 deteriorates and the threshold voltage Vth is changed, the change in the threshold voltage Vth can be prevented from adversely affecting the value of a current supplied to the light-emitting element 104a. Therefore, high-quality images with less unevenness can be displayed.

Similarly, the gate-source voltage Vgs101 of the transistor 101 can be set to the voltage Vsig+Vth−Vi1−Vα, which is a value unrelated to Ve1. Consequently, variations in volt-ampere characteristic between the light-emitting elements 104a can be prevented from adversely affecting the value of a current supplied to the light-emitting elements 104a. Alternatively, even if the light-emitting element 104a deteriorates and the volt-ampere characteristic of the light-emitting element 104a and hence Ve1 are changed, this change can be prevented from adversely affecting the value of a current supplied to the light-emitting element 104a. Therefore, high-quality images with less unevenness can be displayed.

Note that in part of the period in the fifth operation, the transistor 101 can be forcibly turned off so that the light-emitting element 104a does not emit light. In other words, a non-lighting period can be provided. For example, by turning on the switch 12, the transistor 101 can be turned off.

For a semiconductor device according to one aspect of the present invention, the gate of the transistor 101 is held at the potential Vi2 in the second operation. By the operation, even when the transistor 101 is a normally on transistor, in other words, even when the threshold voltage Vthn is negative, electric charge accumulated in the capacitor 102 until the potential of the source of the transistor 101 gets higher than the potential Vi2 of the gate of the transistor 101 can be released. Accordingly, in a semiconductor device according to one aspect of the present invention, even when the transistor 101 is a normally on transistor, in the fifth operation, the gate-source voltage Vgs 101 of the transistor 101 can be set to a value obtained by taking the threshold voltage Vth of the transistor 101 into consideration.

FIGS. 7A to 7E are schematic views illustrating the circuit 100 in the periods T11 to T15. For a semiconductor device according to one aspect of the present invention, the circuit 100 is set in states illustrated in FIGS. 7A to 7E in the respective periods. Therefore, a semiconductor device according to one aspect of the present invention is not limited to the circuits 100 with the structures illustrated in FIGS. 1A to 1D, FIGS. 2A to 2D, FIGS. 3A to 3D, and FIGS. 4A to 4D. For a semiconductor device according to one aspect of the present invention, the placement or number of switches and the number of wirings supplying the potentials can be changed as appropriate such that the circuit 100 is set in the states illustrated in FIGS. 7A to 7E.

For a semiconductor device according to one aspect of the present invention, the circuit 100 in FIG. 1B may further include a capacitor 105 connected to the load 104. Similarly, for a semiconductor device according to one aspect of the present invention, the circuit 100 in FIG. 1C may further include a capacitor 105 connected to the light-emitting element 104a. Similarly, for a semiconductor device according to one aspect of the present invention, the circuit 100 in FIG. 1D may further include a capacitor 105 connected to the light-emitting element 104b.

Figure 8A:
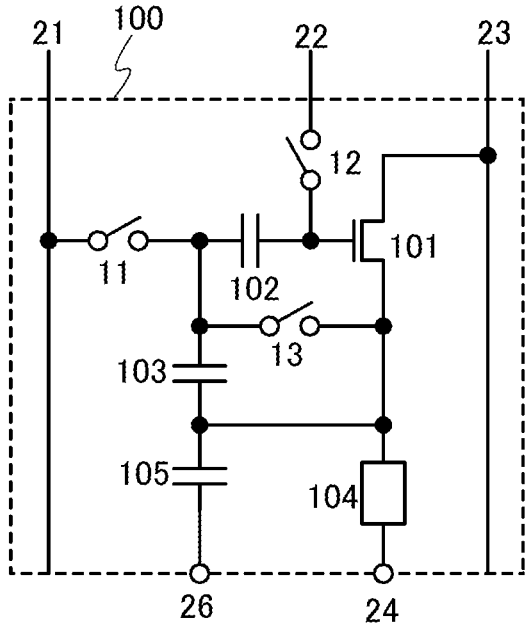
FIGS. 8A to 8D each illustrate the structure of a semiconductor device.

A semiconductor device in FIG. 8A corresponds to the circuit 100 in FIG. 1B further including a capacitor 105 connected to the load 104. Specifically, one electrode of the capacitor 105 is connected to the other electrode of the capacitor 103 and one of a source and a drain of the transistor 101. The other electrode of the capacitor 105 is connected to the wiring 26. Note that although FIG. 8A shows the case where the circuit 100 includes the load 104 as an example, the light-emitting element 104a or the light-emitting element 104b may be used instead of the load 104 in FIG. 8A.

Note that the wiring 26 may be connected to a variety of wirings. For example, the wiring 26 may be connected to the wiring 22, the wiring 23, the wiring 24, a wiring in another circuit 100, a scan line, a gate line, a wiring connected to the gate of a transistor, or the like. Thus, the number of wirings can be reduced.

Figure 8B:
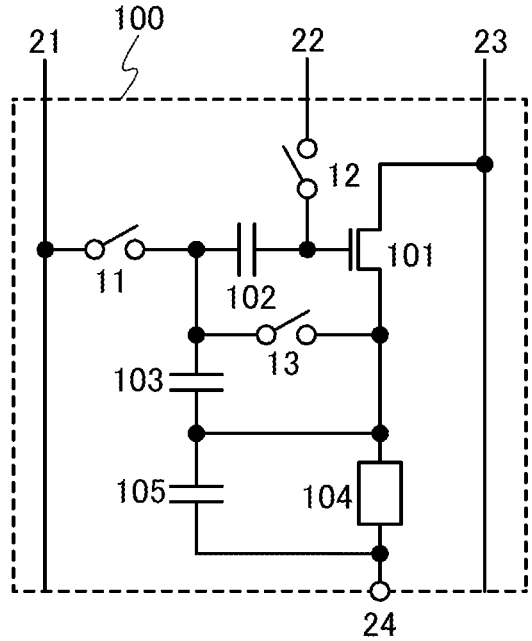

A semiconductor device in FIG. 8B corresponds to the circuit 100 in FIG. 8A, in which the wiring 26 is connected to the wiring 24. Note that although FIG. 8B shows the case where the circuit 100 includes the load 104 as an example, the light-emitting element 104a or the light-emitting element 104b may be used instead of the load 104 in FIG. 8B. When the wiring 26 is connected to the wiring 24, the number of wirings 26 can be reduced.

Figure 8C:
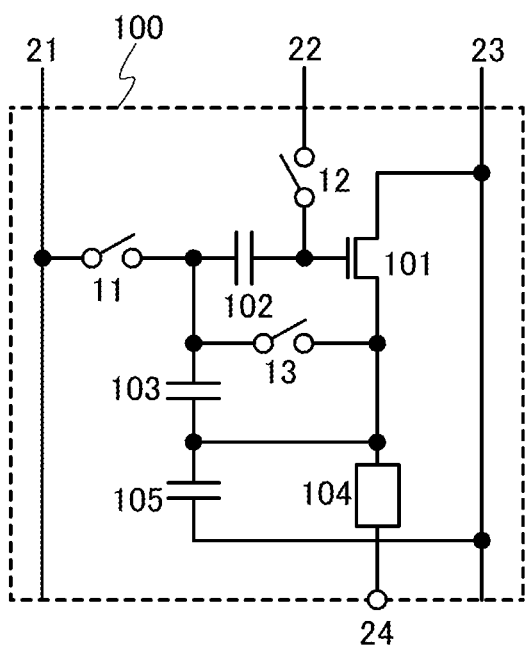

A semiconductor device in FIG. 8C corresponds to the circuit 100 in FIG. 8A, in which the wiring 26 is connected to the wiring 23. Note that although FIG. 8C shows the case where the circuit 100 includes the load 104 as an example, the light-emitting element 104a or the light-emitting element 104b may be used instead of the load 104 in FIG. 8C. When the wiring 26 is connected to the wiring 23, the number of wirings 26 can be reduced.

Figure 8D:
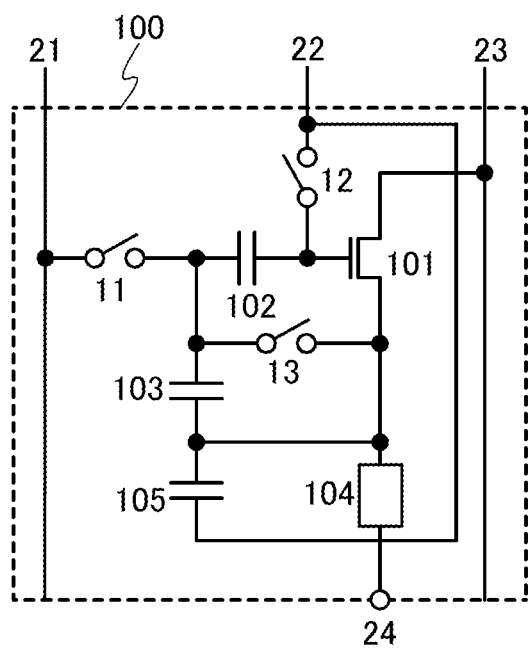
Figure 9A:
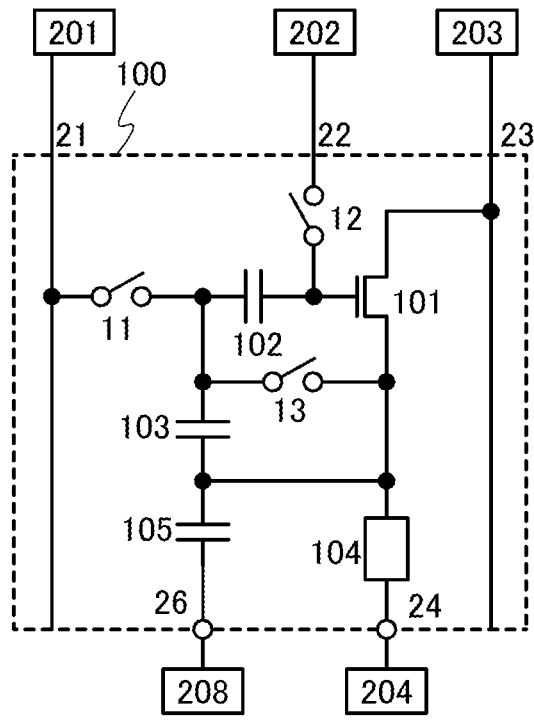
FIGS. 9A to 9D each illustrate the structure of a semiconductor device.
Figure 9B:
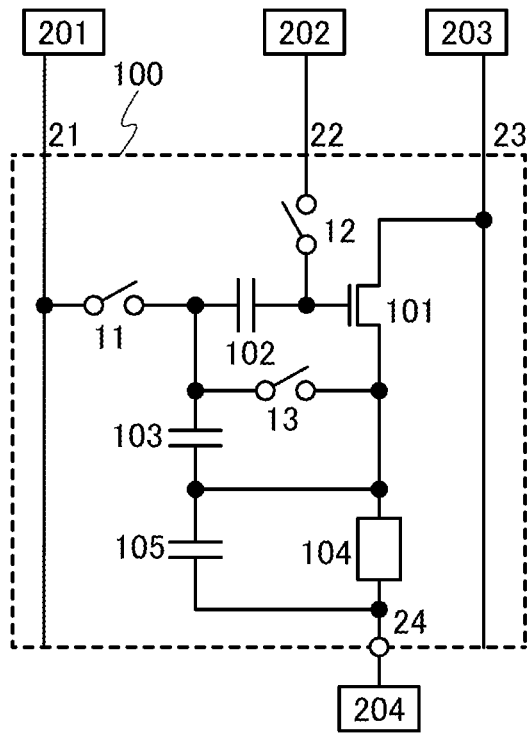
Figure 9C:
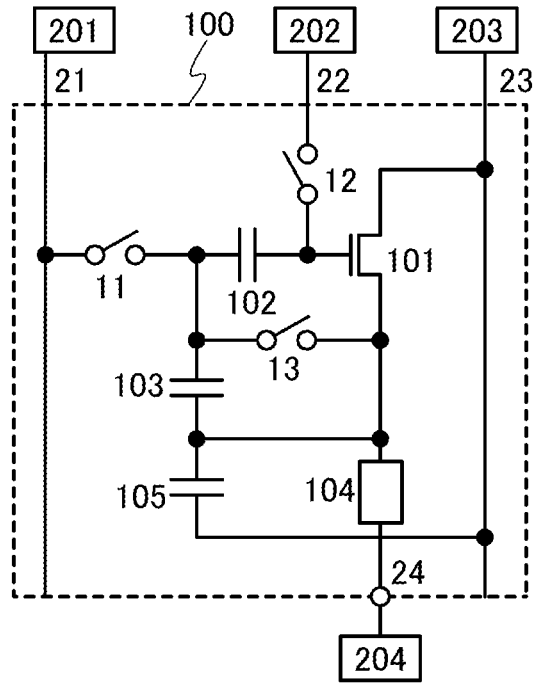
Figure 9D:
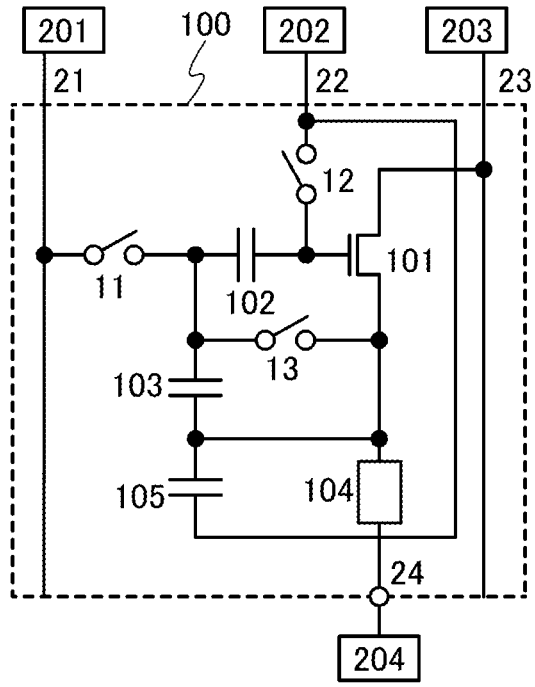

A semiconductor device in FIG. 8D corresponds to the circuit 100 in FIG. 8A, in which the wiring 26 is connected to the wiring 22. Note that although FIG. 8D shows the case where the circuit 100 includes the load 104 as an example, the light-emitting element 104a or the light-emitting element 104b may be used instead of the load 104 in FIG. 8D. When the wiring 26 is connected to the wiring 22, the number of wirings 26 can be reduced.

When the capacitor 105 connected to the load 104, the light-emitting element 104a, or the light-emitting element 104b is added to the circuit 100, in the third operation and the fourth operation described in this embodiment, fluctuations in electric charge at one of the source and the drain of the transistor 101 can be suppressed, so that the voltage Vα can be reduced. Thus, the gate-source voltage Vgs can be close to an ideal value, i.e., the voltage Vsig+Vth−Vi1, so that current supplied to the load 104, the light-emitting element 104a, or the light-emitting element 104b can be set closer to a value that reflects accurately the voltage Vsig.

Alternatively, the capacitance of the capacitor 105 is adjusted as appropriate, so that the amount of change in potential due to the electric charge Q in the period T14 can be adjusted. Thus, variations in mobility can be reduced more appropriately.

Note that the area of the electrodes of the capacitor 105 is preferably smaller than the area of the electrodes of the load 104 (the light-emitting element 104a), more preferably ½ or less of the area of the electrodes of the load 104, still more preferably ⅓ or less of the area of the electrodes of the load 104. Alternatively, the capacitance of the capacitor 105 is preferably lower than the capacitance of the load 104 (the light-emitting element 104a), more preferably ½ or less, still more preferably ⅓ or less of the capacitance of the load 104. Accordingly, optimum operation can be performed without changing the layout area. Note that one aspect of the embodiment of the present invention is not limited thereto.

Note that the total area of the electrodes of the capacitor 105 and the electrodes of the load 104 (the light-emitting element 104a) is preferably larger than the area of the electrodes of the capacitor 103, more preferably 2 or more times, still more preferably 5 or more times the area of the electrodes of the capacitor 103. Alternatively, the total capacitance of the capacitor 105 and the load 104 (the light-emitting element 104a) is preferably higher than the capacitance of the capacitor 103, more preferably 2 or more times, still more preferably 5 or more times the capacitance of the capacitor 103. Accordingly, when voltage is divided by the load 104 (the light-emitting element 104a) and each of the capacitors 103 and 105, higher voltage can be applied to the capacitor 103. Note that one aspect of the embodiment of the present invention is not limited thereto.

Note that the area of the electrodes of the capacitor 105 is preferably smaller than the area of the electrodes of the capacitor 102 or 103 (the light-emitting element 104a), more preferably ½ or less of the area of the electrodes of the capacitor 102 or 103, still more preferably ⅓ or less of the area of the electrodes of the capacitor 102 or 103. Alternatively, the capacitance of the capacitor 105 is preferably lower than the capacitance of the capacitor 102 or 103 (the light-emitting element 104a), more preferably ½ or less, still more preferably ⅓ or less of the capacitance of the capacitor 102 or 103. Accordingly, optimum operation can be performed without changing the layout area. Note that one aspect of the embodiment of the present invention is not limited thereto.

A semiconductor device according to one aspect of the present invention may include, for example, any circuit that supplies a constant voltage or a signal to the circuit 100, as well as any of the circuits 100 illustrated in FIGS. 8A to 8D.

Semiconductor devices illustrated in FIGS. 9A to 9D include, in addition to the circuits 100 in FIGS. 8A to 8D, a circuit 201 having a function of supplying a constant voltage or a signal to the wiring 21, a circuit 202 having a function of supplying a constant voltage or a signal to the wiring 22, a circuit 203 having a function of supplying a constant voltage or a signal to the wiring 23, and a circuit 204 having a function of supplying a constant voltage or a signal to the wiring 24. The circuit 100 in FIG. 9A further includes a circuit 208 having a function of supplying a constant voltage or a signal to the wiring 26. An example of the circuit 208 is a power supply circuit. Accordingly, the wiring 26 has a function of transmitting or supplying a predetermined potential. Alternatively, the wiring 26 functions as a capacitance wiring. Note that the potential of the wiring 26 is preferably constant; however, one aspect of the embodiment of the present invention is not limited thereto. The potential of the wiring 26 may vary like a pulse signal.

Any of the circuits 100 in FIGS. 1B to 1D and FIGS. 8B to 8D may be used as a pixel of a display device. In the case where pixels for a plurality of hues are provided in the display device, the transistors 101 of pixels for different hues may differ in the ratio between the channel width and the channel length. Similarly, the capacitors 105 of pixels for different hues may differ in capacitance.

Figure 10A:
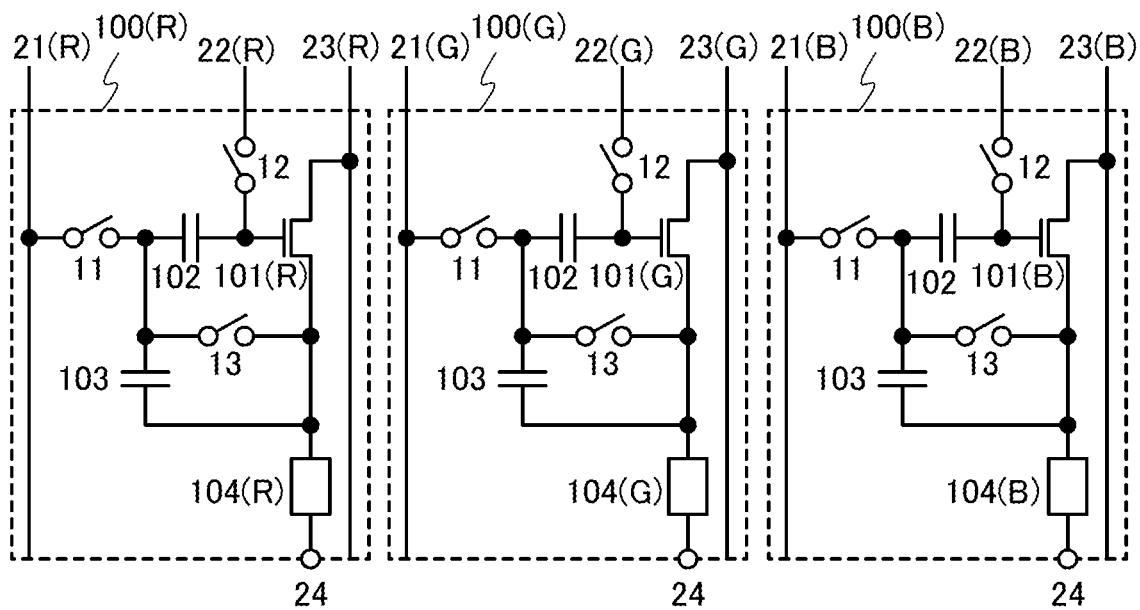
FIGS. 10A and 10B each illustrate the structure of a semiconductor device.

FIG. 10A illustrates the case where the circuit 100 in FIG. 1B is used as a pixel of a display device. In FIG. 10A, a circuit 100(R) corresponds to a pixel for red (R); a circuit 100(G), a pixel for green (G); a circuit 100(B), a pixel for blue (B). In one aspect of the present invention, at least one of a transistor 101(R) in the circuit 100(R), a transistor 101(G) in the circuit 100(G), and a transistor 101(B) in the circuit 100B may differ from the others in the ratio between the channel width and the channel length. With the above structure, currents supplied to a load 104(R) in the circuit 100(R), a load 104(G) in the circuit 100(G), and a load 104(B) in the circuit 100(B) can be set at different values. As an example, the ratio between the channel width and the channel length of the transistor 101 in a pixel for a second color is preferably 1.2 times or more, more preferably 1.5 times or more the ratio between the channel width and the channel length of the transistor 101 in a pixel for a first color. In addition, the ratio between the channel width and the channel length of the transistor 101 in a pixel for a third color is preferably 1.5 times or more, more preferably two times or more the ratio between the channel width and the channel length of the transistor 101 in a pixel for the first color. Note that one aspect of the embodiment of the present invention is not limited thereto.

Figure 10B:
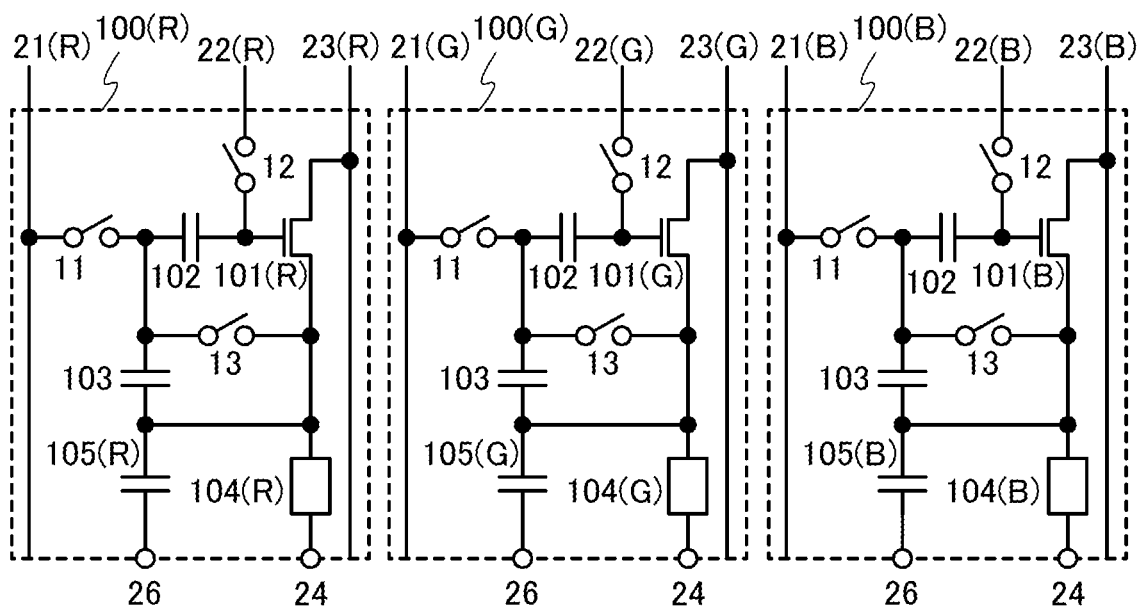

FIG. 10B illustrates the case where the circuit 100 in FIG. 8A is used as a pixel of a display device. In FIG. 10B, as in FIG. 10A, at least one of a transistor 101(R) in the circuit 100(R), a transistor 101(G) in the circuit 100(G), and a transistor 101(B) in the circuit 100B may differ from the others in the ratio between the channel width and the channel length. With the above structure, currents supplied to a load 104(R) in the circuit 100(R), a load 104(G) in the circuit 100(G), a load 104(B) in the circuit 100(B) can be set at different values.

In FIG. 10B, at least one of the capacitor 105(R) in the circuit 100(R), the capacitor 105(G) in the circuit 100(G), and the capacitor 105(B) in the circuit 100(B) may differ from the others in the capacitance. As an example, the capacitance of the capacitor 105 in a pixel for the second color is preferably 1.2 times or more, more preferably 1.5 times or more the capacitance of the capacitor 105 in a pixel for the first color. In addition, the capacitance of the capacitor 105 in a pixel for the third color is preferably 1.5 times or more, more preferably two times or more the capacitance of the capacitor 105 in a pixel for the first color. Note that one aspect of the embodiment of the present invention is not limited thereto.

FIGS. 10A and 10B illustrate the case where the circuit 100(R) includes the load 104(R), the circuit 100(G) includes the load 104(G), and the circuit 100(B) includes the load 104(B); however, in FIG. 10A or 10B, the light-emitting element 104a or 104b of an appropriate hue may be used instead of the load 104(R), the load 104(G), or the load 104(B).

FIG. 10B illustrates the case where the circuit 100 in FIG. 8A is used as a pixel of a display device; however, each of the circuits 100 in FIGS. 8B to 8D may be used as a pixel of a display device.

Figure 11A:
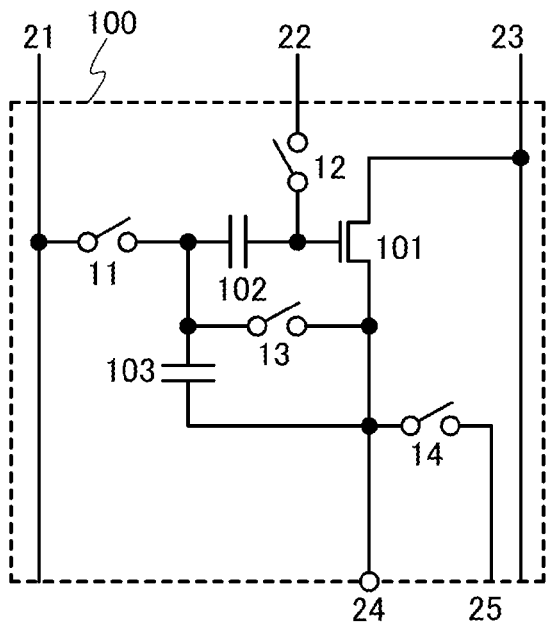
FIGS. 11A to 11D each illustrate the structure of a semiconductor device.

A circuit 100 in FIG. 11A is a semiconductor device according to one aspect of the present invention. The circuit 100 includes a switch 11, a switch 12, a switch 13, a switch 14, a transistor 101, a capacitor 102, and a capacitor 103. Note that FIG. 11A shows the case where the transistor 101 is an n-channel transistor. The structure in FIG. 11A corresponds to the structure in FIG. 1A, to which the switch 14 is added. Therefore, the description for FIG. 1A may apply to FIG. 11A.

Specifically, in FIG. 11A, the switch 11 has a function of controlling the conduction between a wiring 21 and one electrode of the capacitor 102 or one electrode of the capacitor 103. The switch 12 has a function of controlling the conduction between a wiring 22 and the other electrode of the capacitor 102 and between the wiring 22 and a gate of the transistor 101. The switch 13 has a function of controlling the conduction between one of a source and a drain of the transistor 101 or the other electrode of the capacitor 103 and the one electrode of the capacitor 102 or the one electrode of the capacitor 103. The switch 14 has a function of controlling the conduction between the one of the source and the drain of the transistor 101 or the other electrode of the capacitor 103 and the wiring 25. The other of the source and the drain of the transistor 101 is connected to a wiring 23. The one of the source and the drain of the transistor 101 and the other electrode of the capacitor 103 is connected to a wiring 24.

Figure 11B:
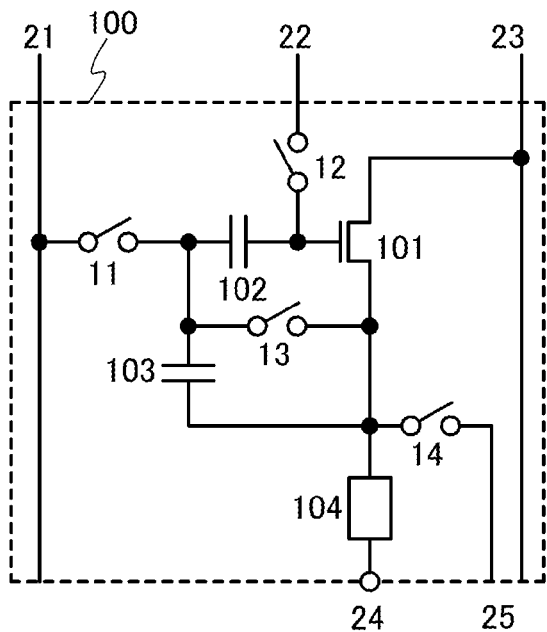

Note that the circuit 100 in FIG. 11A may include a load 104 as illustrated in FIG. 11B. In the circuit 100 in FIG. 11B, the load 104 is connected between the one of the source and the drain of the transistor 101 or the other electrode of the capacitor 103 and the wiring 24.

Figure 11C:
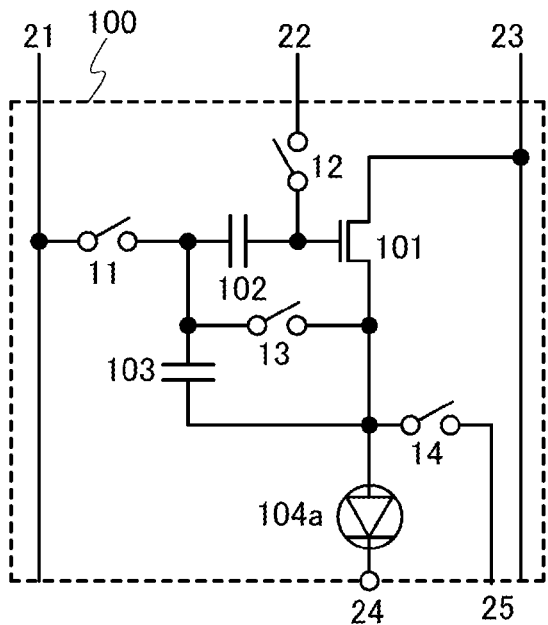

FIG. 11C illustrates the structure of a circuit 100 which uses a light-emitting element 104a as the load 104. FIG. 11C illustrates the case where an anode of the light-emitting element 104a is connected to the one of the source and the drain of the transistor 101 and the other electrode of the capacitor 103, and a cathode of the light-emitting element 104a is connected to the wiring 24.

Figure 11D:
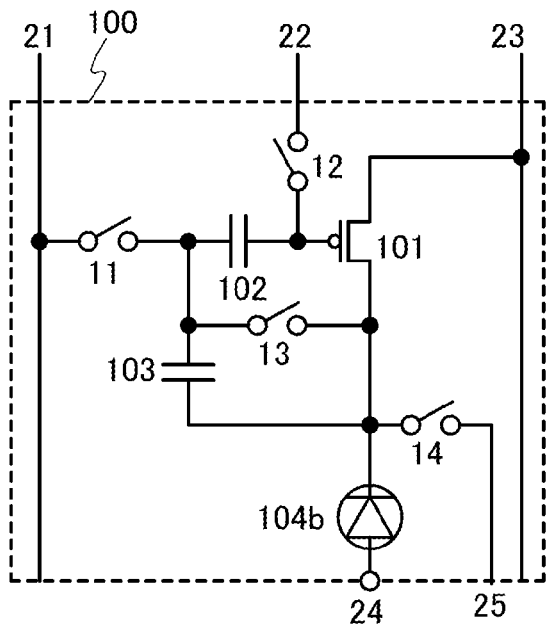
Figure 12A:
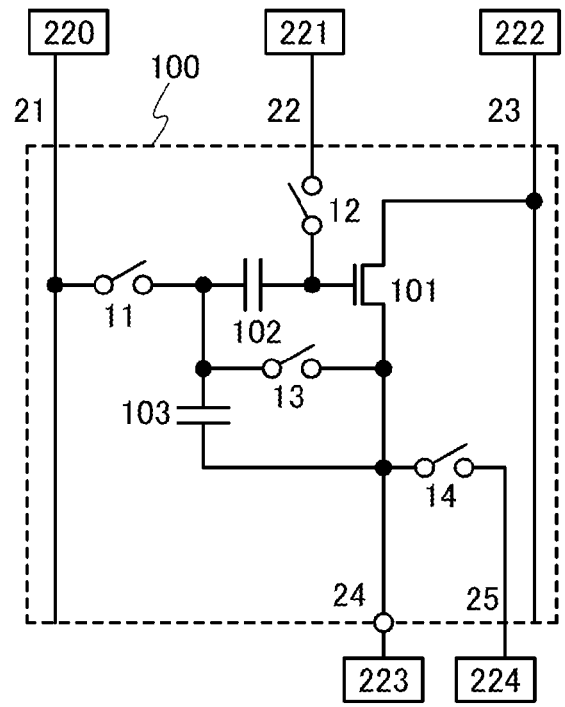
FIGS. 12A to 12D each illustrate the structure of a semiconductor device.
Figure 12B:
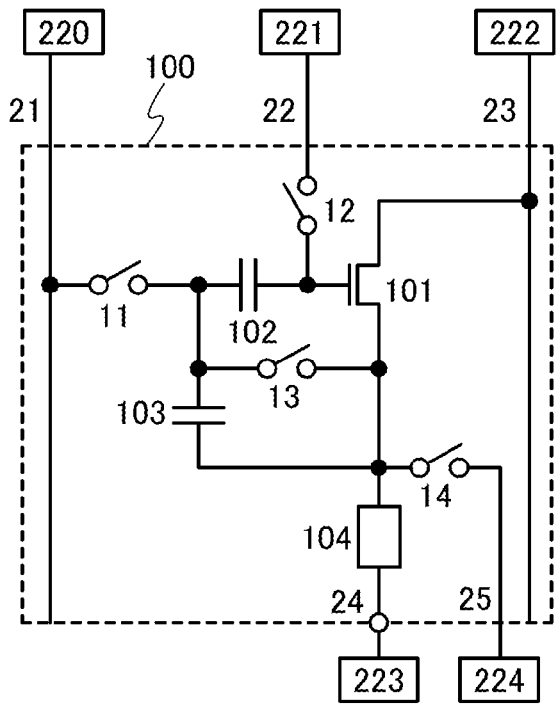
Figure 12C:
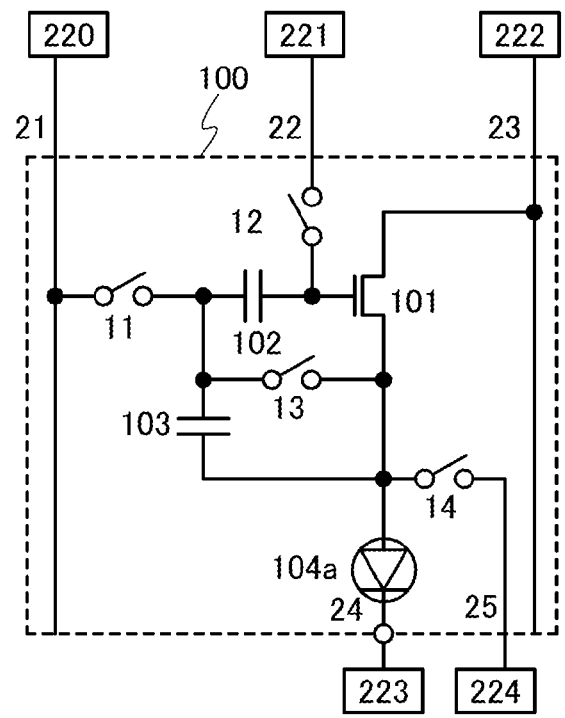
Figure 12D:
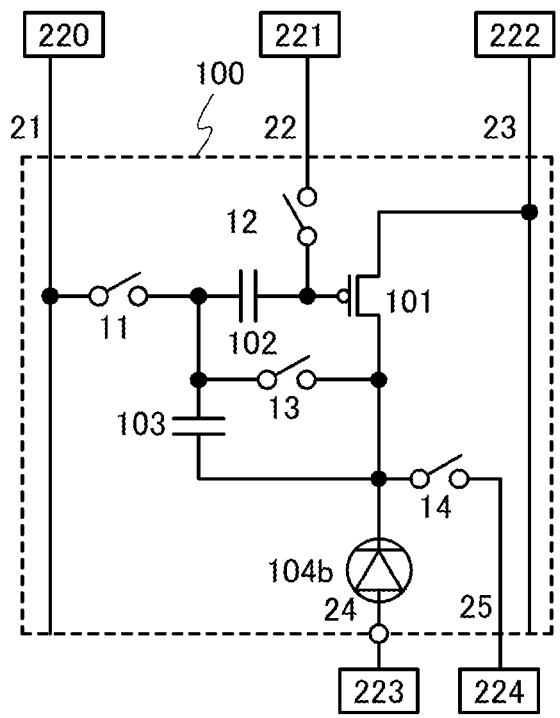

FIG. 11D illustrates the structure of a circuit 100 which uses a light-emitting element 104b as the load 104. FIG. 11D illustrates the case where a cathode of the light-emitting element 104b is connected to the one of the source and the drain of the transistor 101 or the other electrode of the capacitor 103, and an anode of the light-emitting element 104b is connected to the wiring 24. Note that FIG. 11D shows the case where the transistor 101 is a p-channel transistor.

A semiconductor device according to one aspect of the present invention may include, for example, any circuit that supplies a constant voltage or a signal to the circuit 100, as well as any of the circuits 100 illustrated in FIGS. 11A to 11D.

Semiconductor devices illustrated in FIGS. 12A to 12D include, in addition to the circuits 100 in FIGS. 11A to 11D, a circuit 220 having a function of supplying a constant voltage or a signal to the wiring 21, a circuit 221 having a function of supplying a constant voltage or a signal to the wiring 22, a circuit 222 having a function of supplying a constant voltage or a signal to the wiring 23, a circuit 223 having a function of supplying a constant voltage or a signal to the wiring 24, and a circuit 224 having a function of supplying a constant voltage or a signal to the wiring 25.

Specifically, the circuit 220 has a function of supplying a potential Vsig to the wiring 21. An example of the circuit 220 is a source driver (a signal line driver circuit). Accordingly, the wiring 21 has a function of transmitting or supplying the potential Vsig. The wiring 21 functions as a video signal line.

The circuit 221 has a function of supplying a potential Vi2 to the wiring 22. An example of the circuit 221 is a power supply circuit. Accordingly, the wiring 22 has a function of transmitting or supplying the potential Vi2. Alternatively, the wiring 22 functions as an initialization line. Note that the potential of the wiring 22 is preferably constant; however, one aspect of the embodiment of the present invention is not limited thereto. The potential of the wiring 22 may vary like a pulse signal.

The circuit 222 has a function of supplying, for example, a supply voltage (a high supply potential or a low supply potential), e.g., a potential VDD or a potential VSS to the wiring 23. An example of the circuit 222 is a power supply circuit. Accordingly, the wiring 23 has a function of transmitting or supplying a power supply potential. Alternatively, the wiring 23 has a function of supplying current to the transistor 101. Alternatively, the wiring 23 has a function of supplying current to the load 104. The wiring 23 functions as a power supply line. Alternatively, the wiring 23 functions as a current supply line. Note that the potential of the wiring 23 is preferably constant; however, one aspect of the embodiment of the present invention is not limited thereto. The potential of the wiring 23 may vary like a pulse signal. For example, the potential of the wiring 23 may be a potential at which not only forward bias voltage but also reverse bias voltage is applied to the load 104.

The circuit 223 has a function of supplying, for example, a supply voltage (a low supply potential or a high supply potential), e.g., a potential Vcat to the wiring 24. An example of the circuit 223 is a power supply circuit. Accordingly, the wiring 24 has a function of transmitting or supplying a power supply potential. Alternatively, the wiring 24 has a function of supplying current to the load 104. Alternatively, the wiring 24 has a function of supplying current to the transistor 101. The wiring 24 functions as a common line. Alternatively, the wiring 24 functions as a negative line. Alternatively, the wiring 24 functions as a positive line. Note that the potential of the wiring 24 is preferably constant; however, one aspect of the embodiment of the present invention is not limited thereto. The potential of the wiring 24 may vary like a pulse signal. For example, the potential of the wiring 24 may be a potential at which not only forward bias voltage but also reverse bias voltage is applied to the load 104.

The circuit 224 has a function of supplying a potential Vi1 to the wiring 25. An example of the circuit 224 is a power supply circuit. Accordingly, the wiring 25 has a function of transmitting or supplying the potential Vi1. Alternatively, the wiring 25 functions as an initialization line. Note that the potential of the wiring 25 is preferably constant; however, one aspect of the embodiment of the present invention is not limited thereto. The potential of the wiring 25 may vary like a pulse signal.

Note that in FIGS. 12A to 12D, the semiconductor devices each include, in addition to the circuit 100, the circuits 220, 221, 222, 223, and 224, as an example. However, a semiconductor device according to one aspect of the present invention does not necessarily include all of the circuits 220, 221, 222, 223, and 224, and may include only one or some of these circuits.

Note that in the circuits 100 in FIGS. 11A to 11D and FIGS. 12A to 12D, as an example, the switch 11, the switch 12, the switch 13, and the switch 14 may be transistors.

FIGS. 13A to 13D illustrate the structures of circuits 100 which correspond to the circuits 100 in FIGS. 11A to 11D each using a transistor 11t as the switch 11, a transistor 12t as the switch 12, a transistor 13t as the switch 13, and a transistor 14t as the switch 14. FIGS. 13A to 13D illustrate the case where the transistor 11t, the transistor 12t, the transistor 13t, and the transistor 14t are all n-channel transistors. When the transistor 11t, the transistor 12t, the transistor 13t, and the transistor 14t have the same polarity, these transistors can be manufactured in fewer steps. However, one aspect of the embodiment of the present invention is not limited to this; these transistors may have different polarities.

Note that in FIGS. 13A to 13D, a gate of the transistor 11t is connected to a wiring 31. The transistor 11t is turned on or off in response to the potential supplied to the wiring 31. A gate of the transistor 12t is connected to a wiring 32. The transistor 12t is turned on or off in response to the potential supplied to the wiring 32. A gate of the transistor 13t is connected to a wiring 33. The transistor 13t is turned on or off in response to the potential supplied to the wiring 33. A gate of the transistor 14t is connected to a wiring 34. The transistor 14t is turned on or off in response to the potential supplied to the wiring 34. Therefore, it is preferable that the potentials of the wirings 31 to 34 be pulsed potentials and not constant; however, one aspect of the embodiment of the present invention is not limited to this. Alternatively, the wirings 31 to 34 each function as a gate signal line, selection signal line, or a scan line.

Note that at least two of these wirings 31 to 34 can be connected to each other. Alternatively, at least one of these wirings 31 to 34 can be connected to at least one of the wirings 31 to 34 in another circuit 100.

A semiconductor device according to one aspect of the present invention may include, for example, any circuit that supplies a constant voltage or a signal to the circuit 100, as well as any of the circuits 100 illustrated in FIGS. 13A to 13D.

Semiconductor devices illustrated in FIGS. 14A to 14D include, in addition to the circuits 100 in FIGS. 13A to 13D, a circuit 230 having a function of supplying a constant voltage or a signal to the wiring 31, a circuit 231 having a function of supplying a constant voltage or a signal to the wiring 32, a circuit 232 having a function of supplying a constant voltage or a signal to the wiring 33, and a circuit 233 having a function of supplying a constant voltage or a signal to the wiring 34. Examples of the circuits 230, 231, 232, and 233 include gate drivers (scan line driver circuits).

Figure 14A:
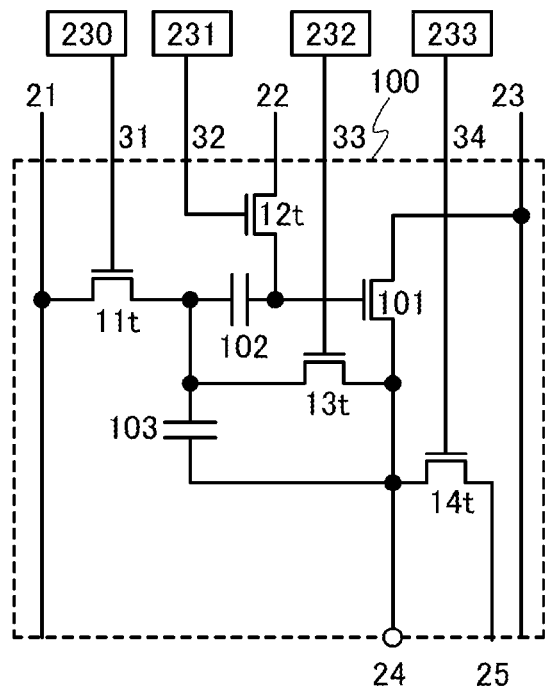
FIGS. 14A to 14D each illustrate the structure of a semiconductor device.
Figure 14B:
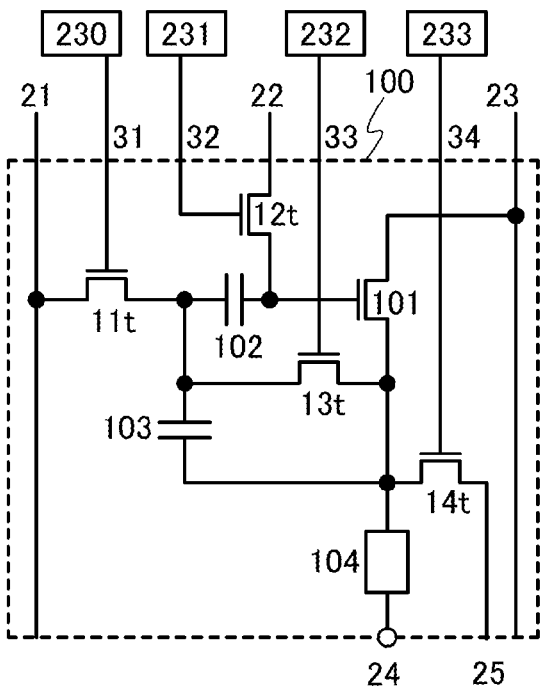
Figure 14C:
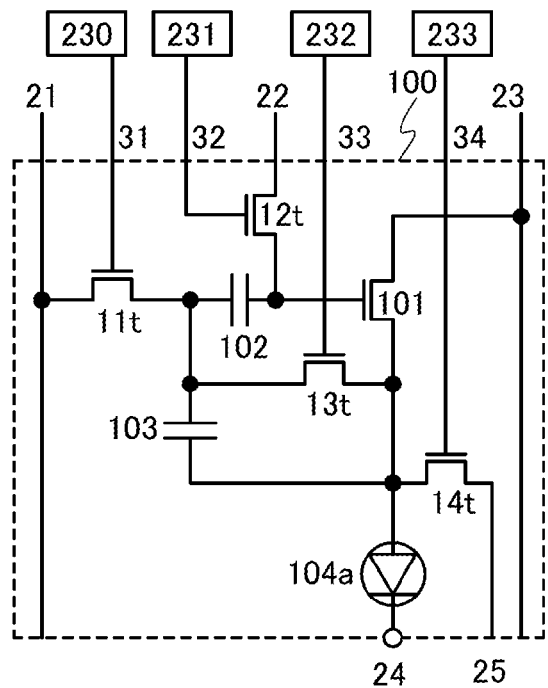
Figure 14D:
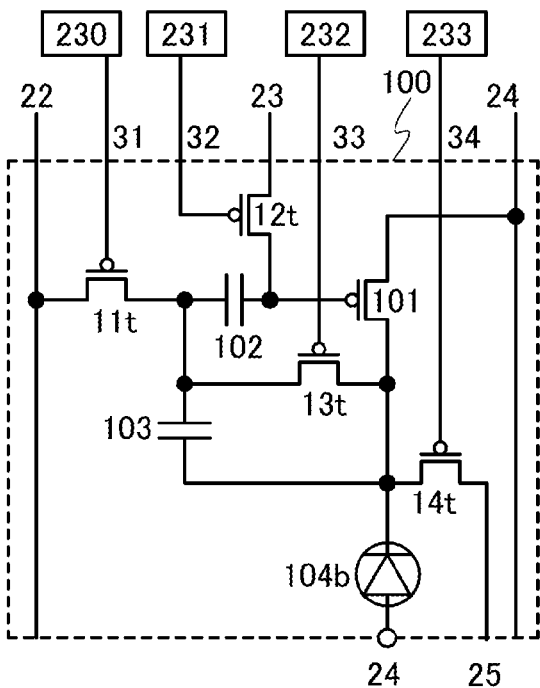
Figure 15A:
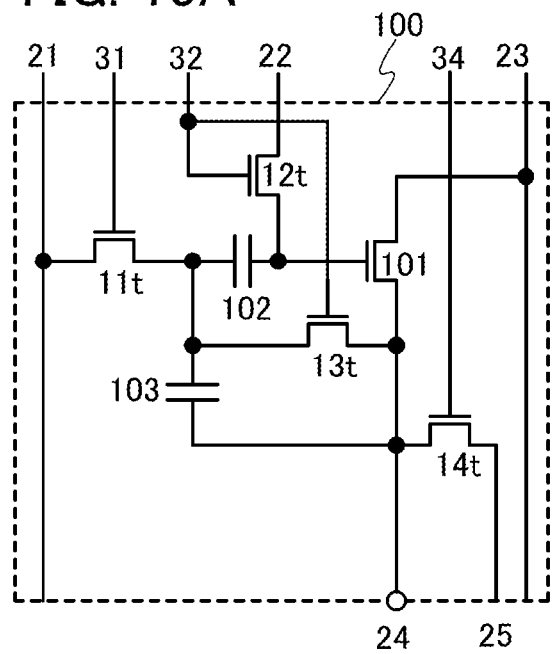
FIGS. 15A to 15D each illustrate the structure of a semiconductor device.
Figure 15B:
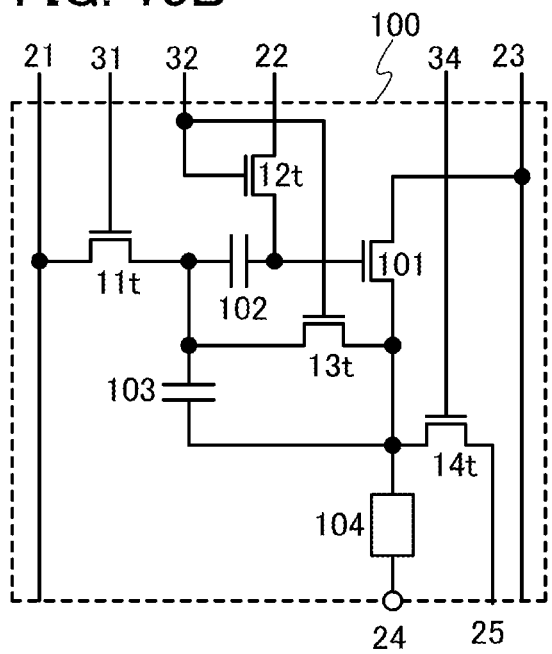
Figure 15C:
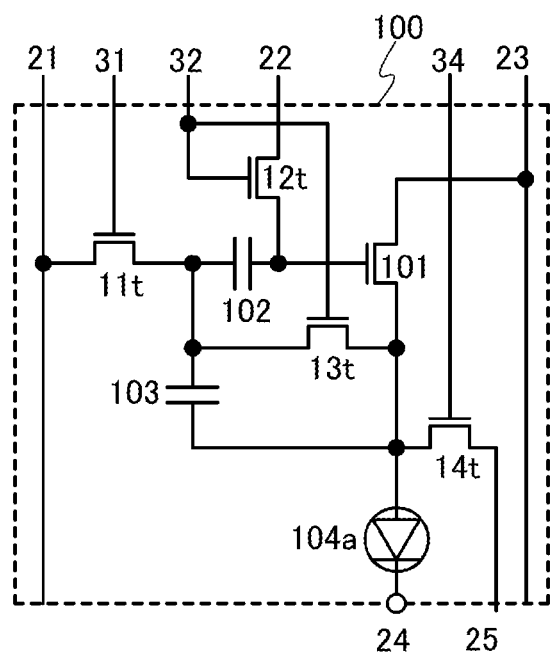
Figure 15D:
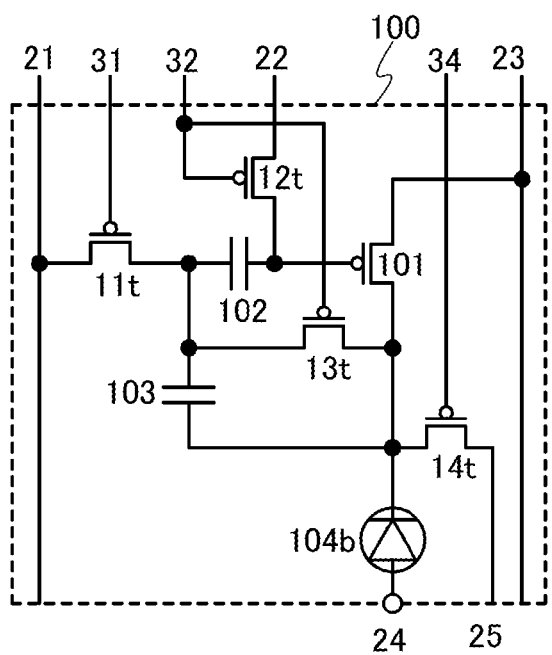

Note that in FIGS. 14C and 14D, the semiconductor devices each include, in addition to the circuit 100, the circuits 230, 231, 232, and 233, as an example. However, a semiconductor device according to one aspect of the present invention does not necessarily include all of the circuits 230, 231, 232, and 233, and may include only one or some of these circuits.

Note that the circuits 220, 221, 222, 223, 224, 230, 231, 232, and 233 may be the same circuit or different circuits.

Figure 13A:
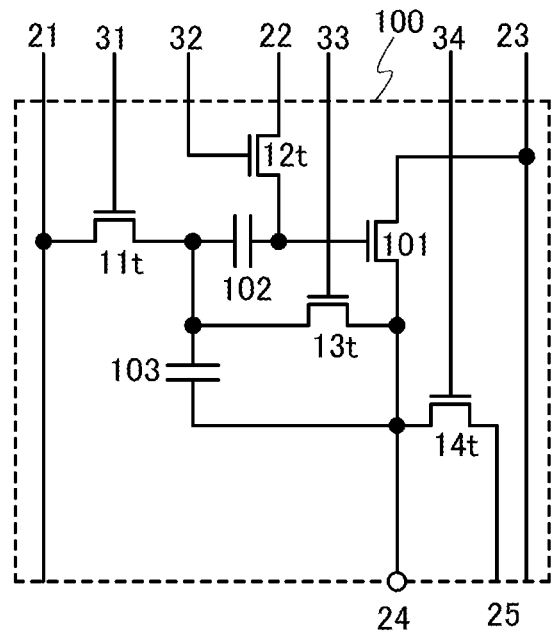
FIGS. 13A to 13D each illustrate the structure of a semiconductor device.
Figure 13B:
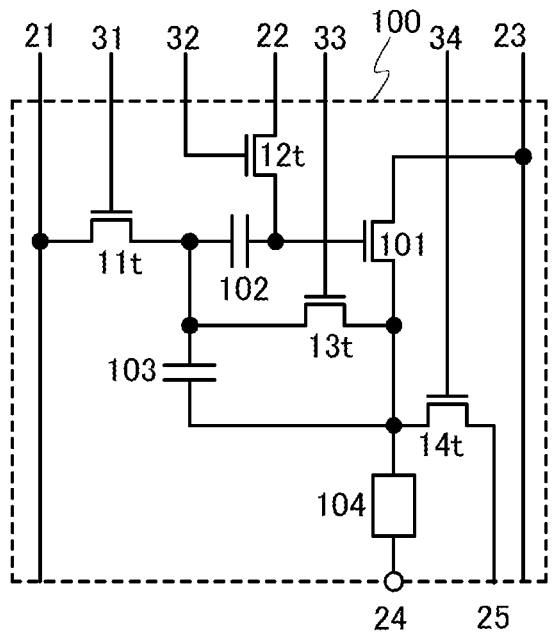
Figure 13C:
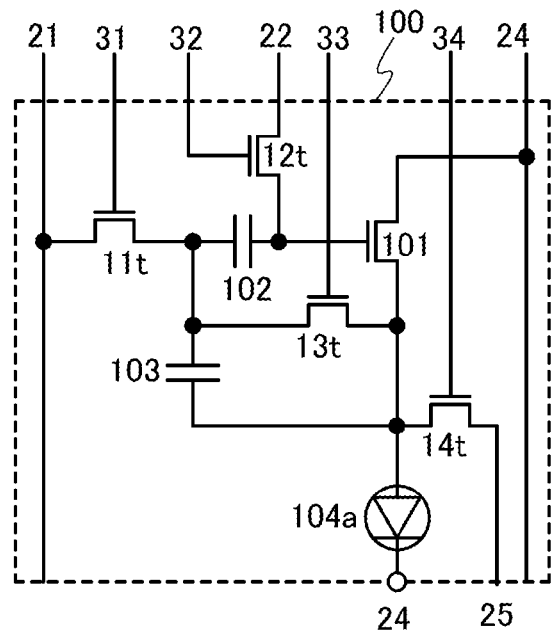
Figure 38A:
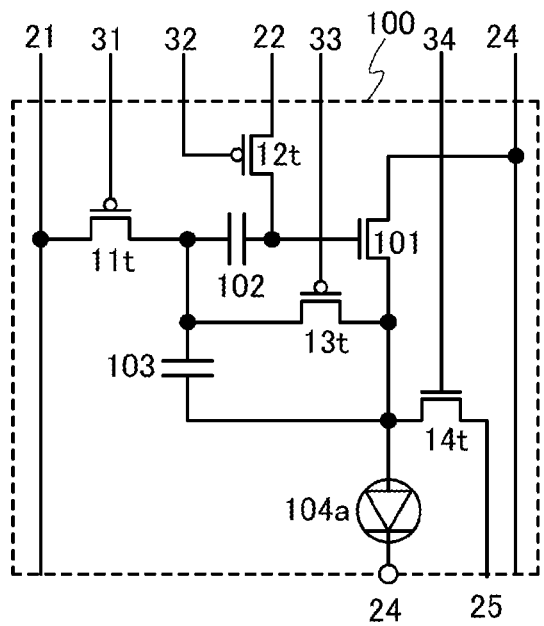
FIGS. 38A to 38D each illustrate the structure of a semiconductor device.
Figure 38B:
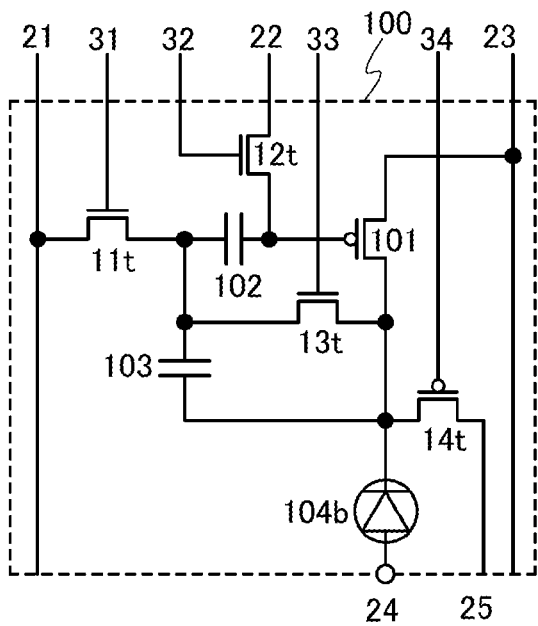

FIG. 38A illustrates the structure of a circuit 100 corresponding to the circuit 100 in FIG. 13C, in which the transistors 101 and 14t are n-channel transistors and the transistors 11t, 12t, and 13t are p-channel transistors. FIG. 38B illustrates the structure of a circuit 100 corresponding to the circuit 100 in FIG. 13D, in which the transistors 101 and 14t are p-channel transistors and the transistors 11t, 12t, and 13t are p-channel transistors.

A semiconductor device according to one aspect of the present invention may include, for example, any circuit that supplies a constant voltage or a signal to the circuit 100, as well as any of the circuits 100 illustrated in FIGS. 38A and 38B.

Figure 38C:
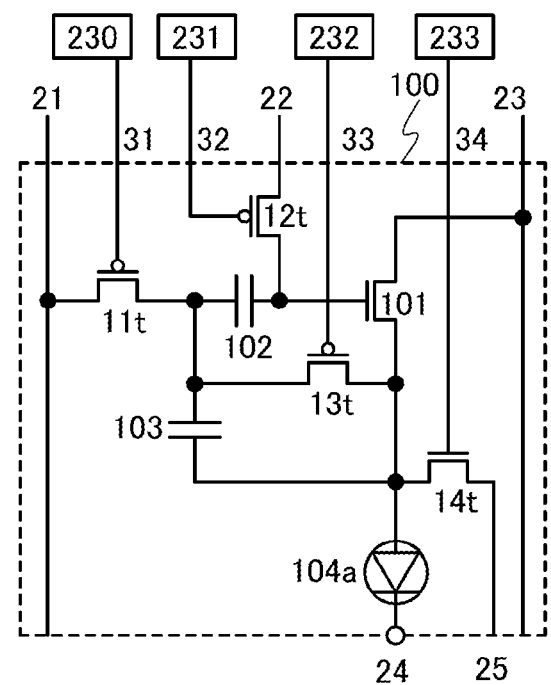
Figure 38D:
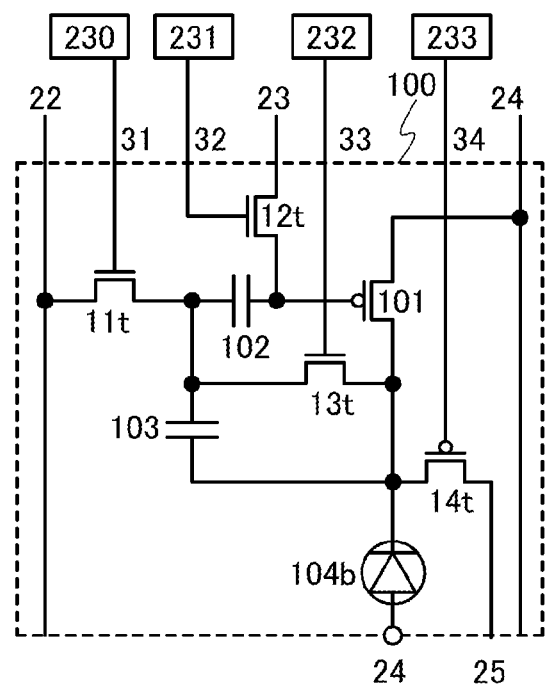

Semiconductor devices illustrated in FIGS. 38C and 38D include, in addition to the circuits 100 in FIGS. 38A and 38B, a circuit 230 having a function of supplying a constant voltage or a signal to the wiring 31, a circuit 231 having a function of supplying a constant voltage or a signal to the wiring 32, a circuit 232 having a function of supplying a constant voltage or a signal to the wiring 33, and a circuit 233 having a function of supplying a constant voltage or a signal to the wiring 34.

Note that in FIGS. 38C and 38D, the semiconductor devices each include, in addition to the circuit 100, the circuits 230, 231, 232, and 233, as an example. However, a semiconductor device according to one aspect of the present invention does not necessarily include all of the circuits 230, 231, 232, and 233, and may include only one or some of these circuits.

In many cases, the transistor 101 operates in a saturation region when current flows therethrough. Therefore, in FIGS. 13A to 13D, FIGS. 14A to 14D, and FIGS. 38A to 38D, the transistor 101 preferably has a longer channel length or gate length than the transistor 11t, the transistor 12t, the transistor 13t and/or the transistor 14t. The channel length or gate length of the transistor 101 is preferably 5 or more times, further preferably 10 or more times that of the transistor 11t, the transistor 12t, the transistor 13t and/or the transistor 14t. As an example, the channel length or gate length of the transistor 101 is preferably 10 µm or more, more preferably 20 µm or more. When the channel length or the gate length is increased, characteristics in a saturation region have a flat slope; accordingly, a kink effect can be reduced. Alternatively, the channel width or gate width of the transistor 101 is larger than that of the transistor 11t, the transistor 12t, the transistor 13t and/or the transistor 14t, so that much current flows through the transistor 101 even in a saturation region. The channel width or the gate width of the transistor 101 is preferably 5 or more times, further preferably 10 or more times that of the transistor 11t, the transistor 12t, the transistor 13t and/or the transistor 14t. The channel width or the gate width of the transistor 101 is preferably 20 µm or more, more preferably 30 µm or more. Note that one aspect of an embodiment of the present invention is not limited thereto.

In the semiconductor devices in FIGS. 13A to 13D and FIGS. 38A and 38B, both of the gates of the transistors 12t and 13t may be connected to one wiring. FIGS. 15A to 15D show semiconductor devices corresponding to those in FIGS. 13A to 13D, in which the gates of the transistors 12t and 13t are connected to the wiring 32, as an example. The transistors 12t and 13t are turned on or off in response to the potential supplied to the wiring 32.

A semiconductor device according to one aspect of the present invention may include, for example, any circuit that supplies a constant voltage or a signal to the circuit 100, as well as any of the circuits 100 illustrated in FIGS. 15A to 15D.

Semiconductor devices illustrated in FIGS. 16A to 16D include, in addition to the circuits 100 in FIGS. 15A to 15D, a circuit 230 having a function of supplying a constant voltage or a signal to the wiring 31, a circuit 231 having a function of supplying a constant voltage or a signal to the wiring 32, and a circuit 233 having a function of supplying a constant voltage or a signal to the wiring 34.

Note that in FIGS. 16A to 16D, the semiconductor devices each include, in addition to the circuit 100, the circuits 230, 231, and 233, as an example. However, a semiconductor device according to one aspect of the present invention does not necessarily include all of the circuits 230, 231, and 233, and may include only one or some of these circuits.

Figure 16A:
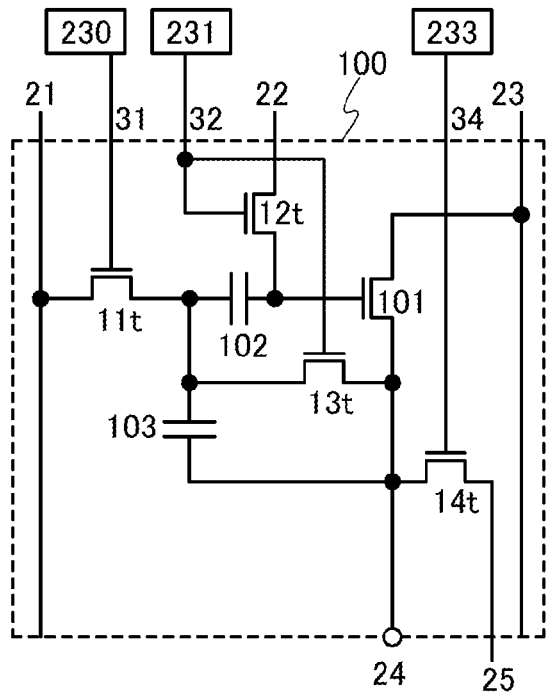
FIGS. 16A to 16D each illustrate the structure of a semiconductor device.
Figure 16B:
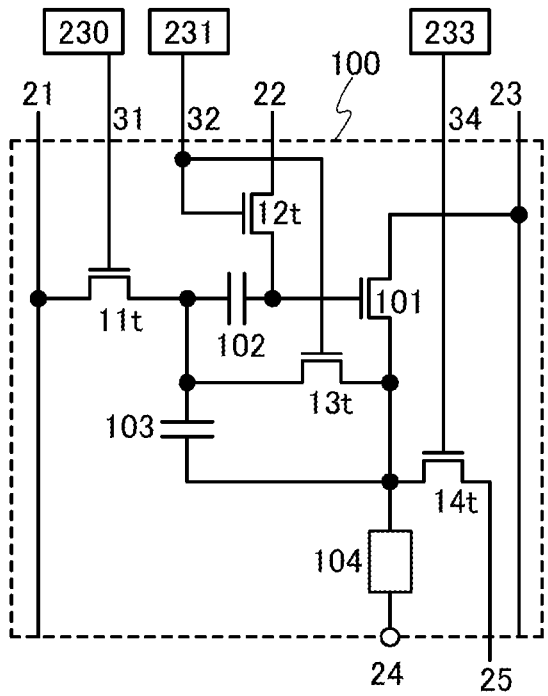
Figure 16C:
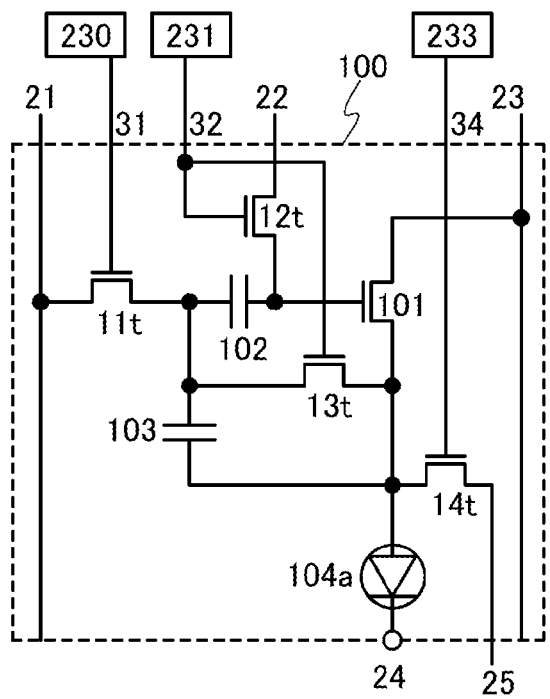
Figure 16D:
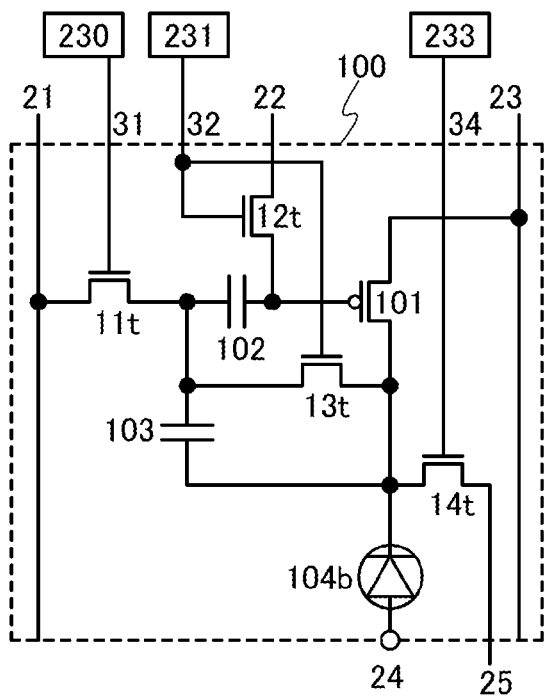
Figure 42A:
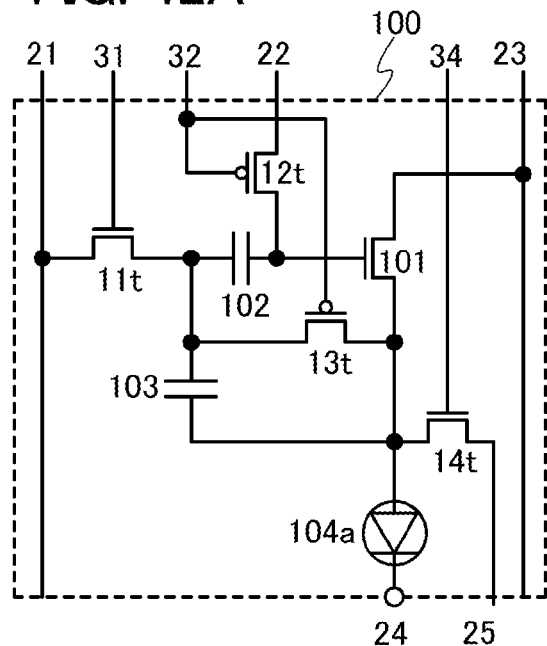
FIGS. 42A to 42D each illustrate the structure of a semiconductor device.
Figure 42B:
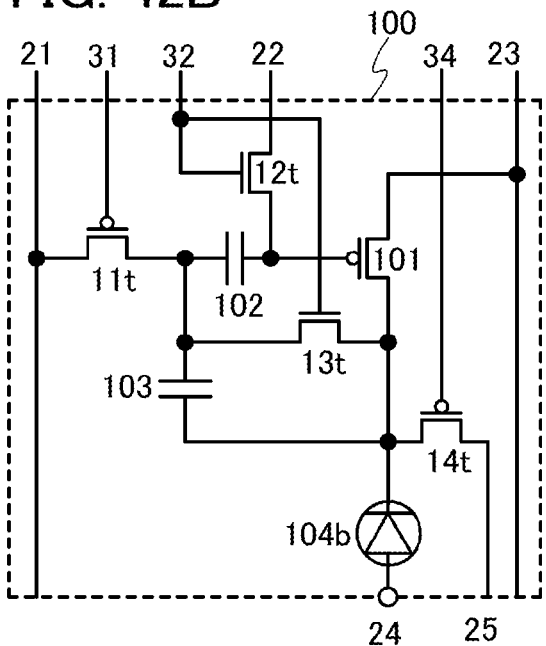

FIG. 42A illustrates the structure of a circuit 100 corresponding to the circuit 100 in FIG. 16C, in which the transistors 101, 11*t*, and 14*t* are n-channel transistors and the transistors 12*t* and 13*t* are p-channel transistors. FIG. 42B illustrates the structure of a circuit 100 corresponding to the circuit 100 in FIG. 16D, in which the transistors 101, 11*t*, and 14*t* are p-channel transistors and the transistors 12*t* and 13*t* are n-channel transistors.

A semiconductor device according to one aspect of the present invention may include, for example, any circuit that supplies a constant voltage or a signal to the circuit 100, as well as any of the circuits 100 illustrated in FIGS. 42A and 42B.

Figure 42C:
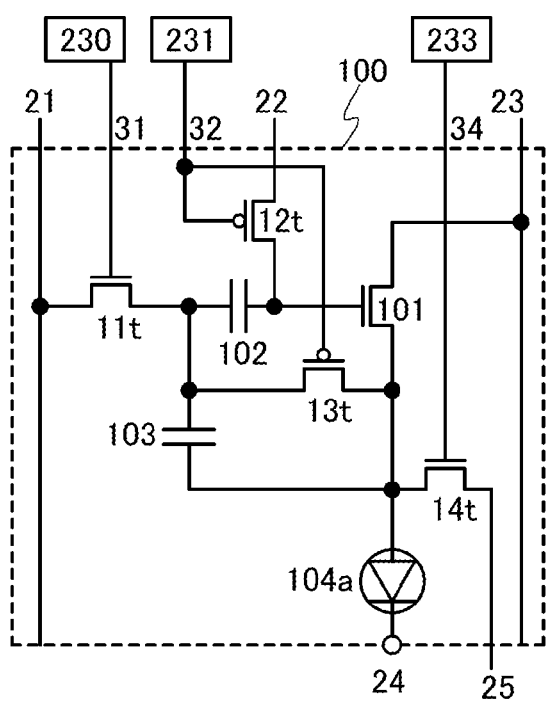
Figure 42D:
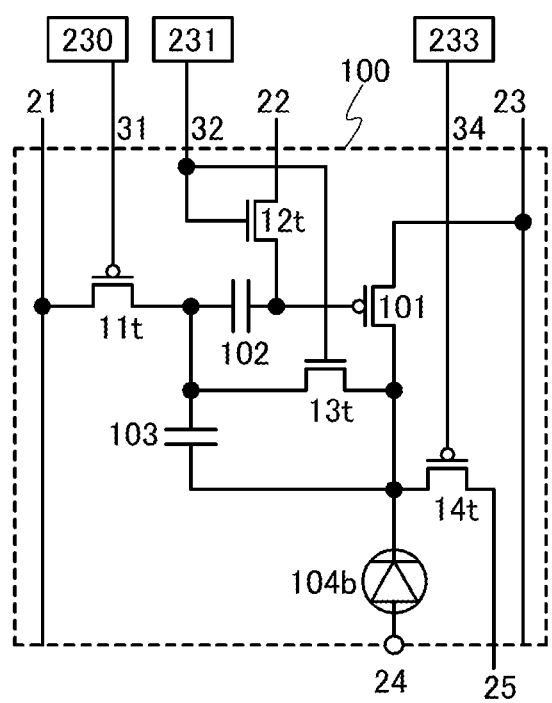

Semiconductor devices illustrated in FIGS. 42C and 42D include, in addition to the circuits 100 in FIGS. 42A and 42B, a circuit 230 having a function of supplying a constant voltage or a signal to the wiring 31, a circuit 231 having a function of supplying a constant voltage or a signal to the wiring 32, and a circuit 233 having a function of supplying a constant voltage or a signal to the wiring 34. Examples of the circuits 230, 231, and 233 include gate drivers (scan line driver circuits).

Note that in FIGS. 42C and 42D, the semiconductor devices each include, in addition to the circuit 100, the circuits 230, 231, and 233, as an example. However, a semiconductor device according to one aspect of the present invention does not necessarily include all of the circuits 230, 231, and 233, and may include only one or some of these circuits.

Figure 39:
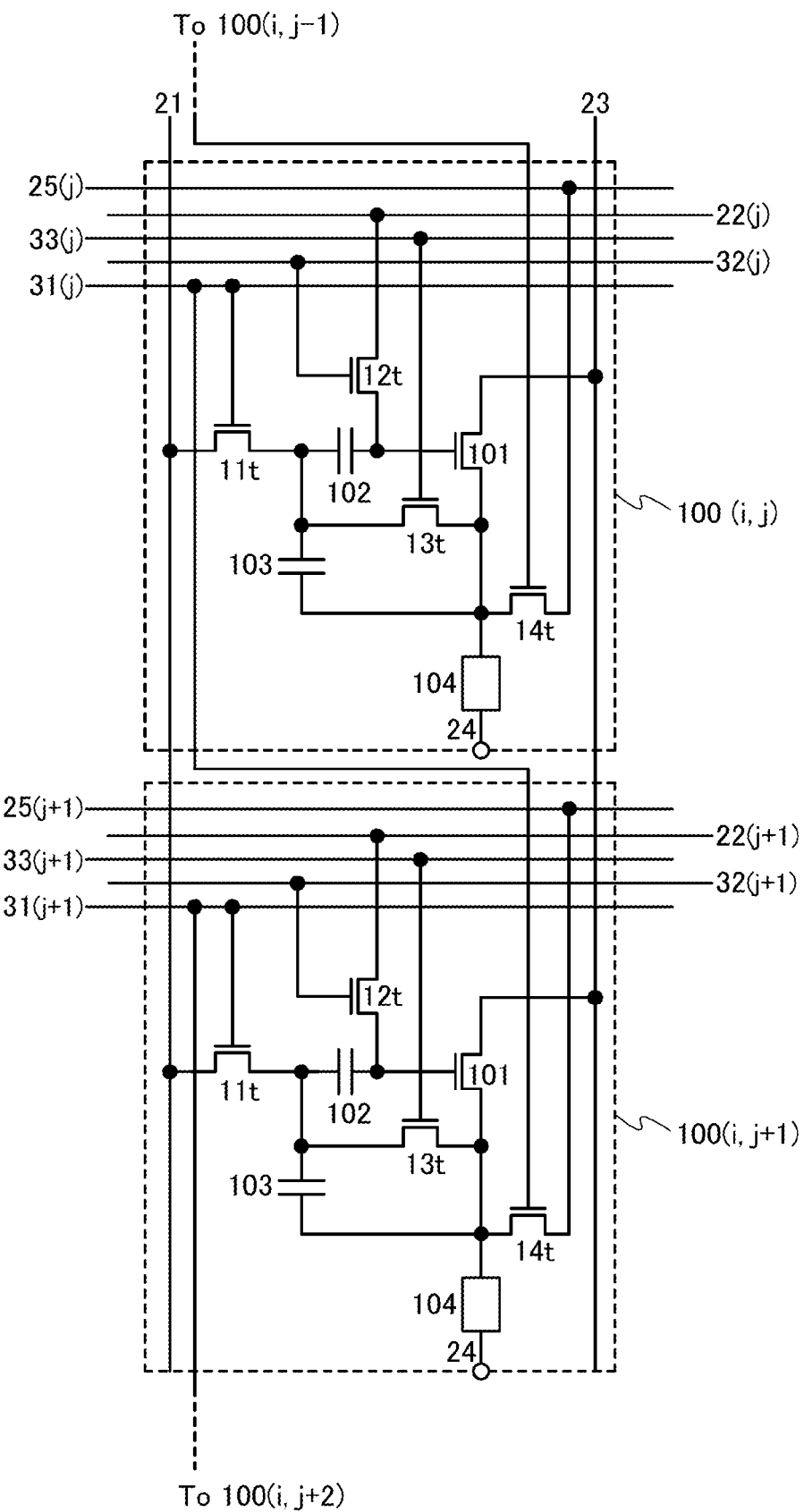
FIG. 39 illustrates the structure of a semiconductor device.

For the semiconductor devices illustrated in FIGS. 13A to 13D, in adjacent circuits 100, a gate of one transistor may be connected to a gate of another transistor. For example, a gate of a transistor 11*t* may be connected to a gate of a transistor 14*t*. FIG. 39 illustrates the case where a gate of a transistor 11*t* in a circuit 100(*i, j*) in the i-th column and the j-th row, and a gate of a transistor 14*t* in a circuit 100(i, j+1) in the i-th column and the (j+1)th row are connected to a wiring 31(*j*) in the j-th row.

Figure 40:
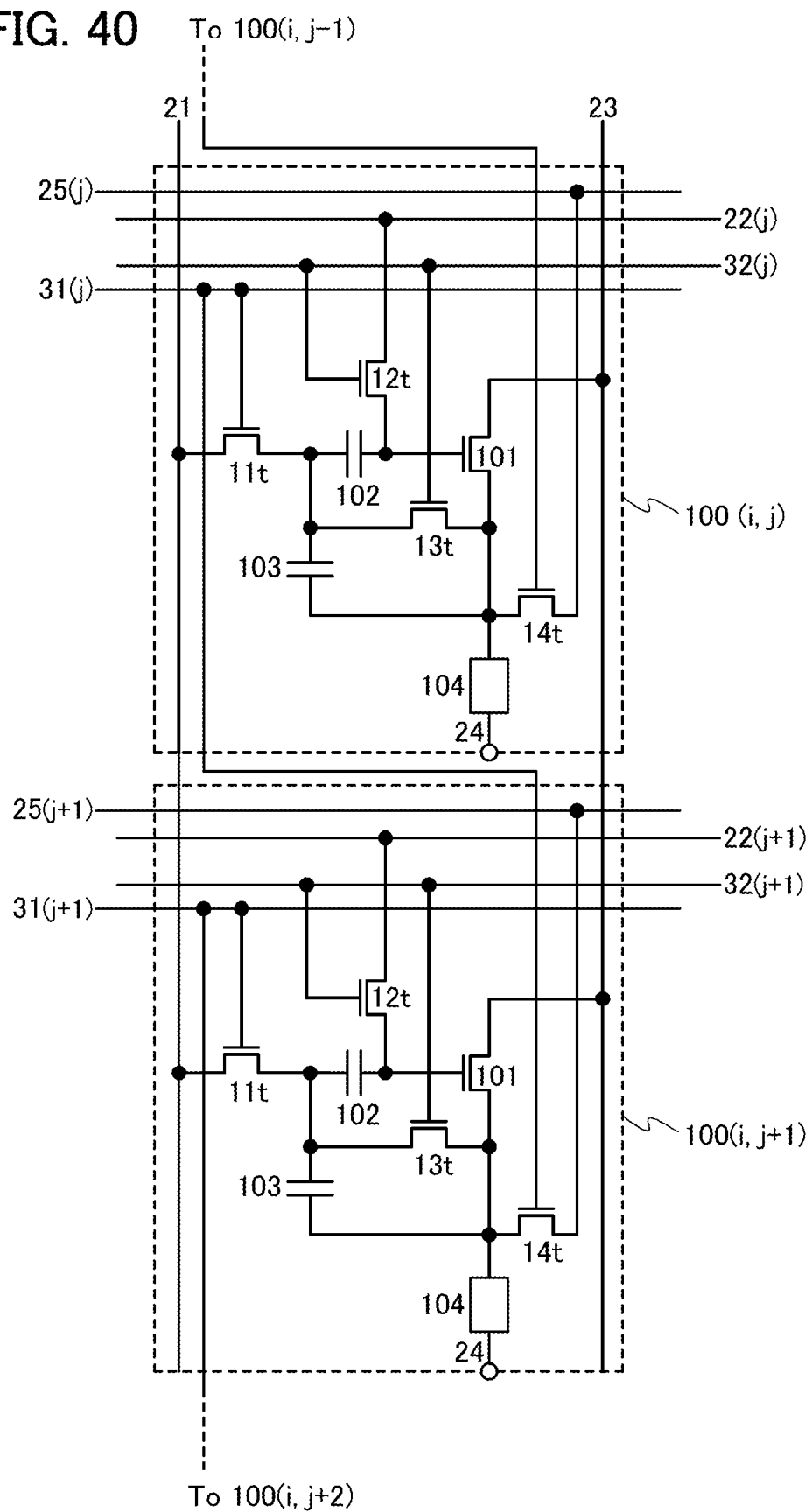
FIG. 40 illustrates the structure of a semiconductor device.

For the semiconductor devices illustrated in FIGS. 15A to 15D, in adjacent circuits 100, a gate of one transistor may be connected to a gate of another transistor. For example, a gate of a transistor 11*t* may be connected to a gate of a transistor 14*t*. FIG. 40 illustrates the case where a gate of a transistor 11*t* in a circuit 100(*i, j*) in the i-th column and the j-th row, and a gate of a transistor 14*t* in a circuit 100(i, j+1) in the i-th column and the (j+1)th row are connected to a wiring 31(*j*) in the j-th row.

FIG. 39 and FIG. 40 each illustrate the case where a gate of a transistor 11*t* in a circuit 100(*i, j*) in the i-th column and the j-th row, and a gate of a transistor 14*t* in a circuit 100(i, j+1) in the i-th column and the (j+1)th row are connected to a wiring 31(*j*) in the j-th row. However, one aspect of the present invention is not limited to this structure. For example, in the case of the semiconductor devices illustrated in FIGS. 14A to 14D and FIGS. 38C and 38D, the circuit 230 may supply a potential to a wiring 31(*j*) in the j-th row and to a wiring 34(j+1) in the (j+1)th row.

Figure 41:
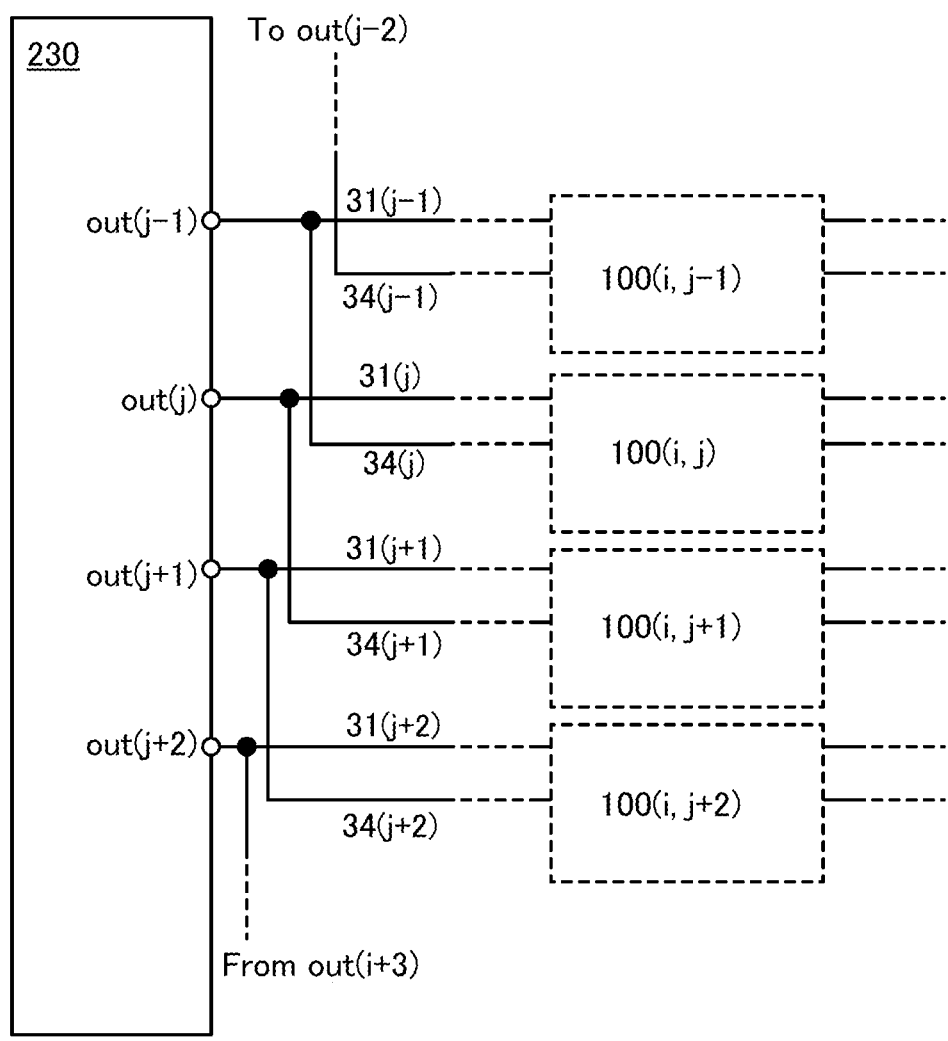
FIG. 41 illustrates the structure of a semiconductor device.

FIG. 41 illustrates the case where the circuit 230 supplies a potential to the wiring 31 and the wiring 34. Specifically, in FIG. 41, a potential from a j-th output terminal out(j) of the circuit 230, is supplied to the wiring 31(*j*) in the j-th row and to the wiring 34(*j*+1) in the (j+1)th row. In other words, for example, wirings in different rows are connected to each other between a scan line driver circuit and a pixel region.

The following describes the operation of one aspect of a semiconductor device according to the present invention, taking a circuit 100 illustrated in FIG. 11C as an example.

The operation of the circuit 100 illustrated in FIG. 11C can be mainly divided into a first operation, a second operation, a third operation, and a fourth operation. Note that one aspect of an embodiment of the present invention is not limited thereto, and another operation can be added or part of the operation can be omitted.

Note that the circuit in FIG. 11C corresponds to the circuit in FIG. 1C to which a switch 14 is added; therefore, the third operation (the period T13) shown in FIG. 6A can be omitted.

Figure 17A:
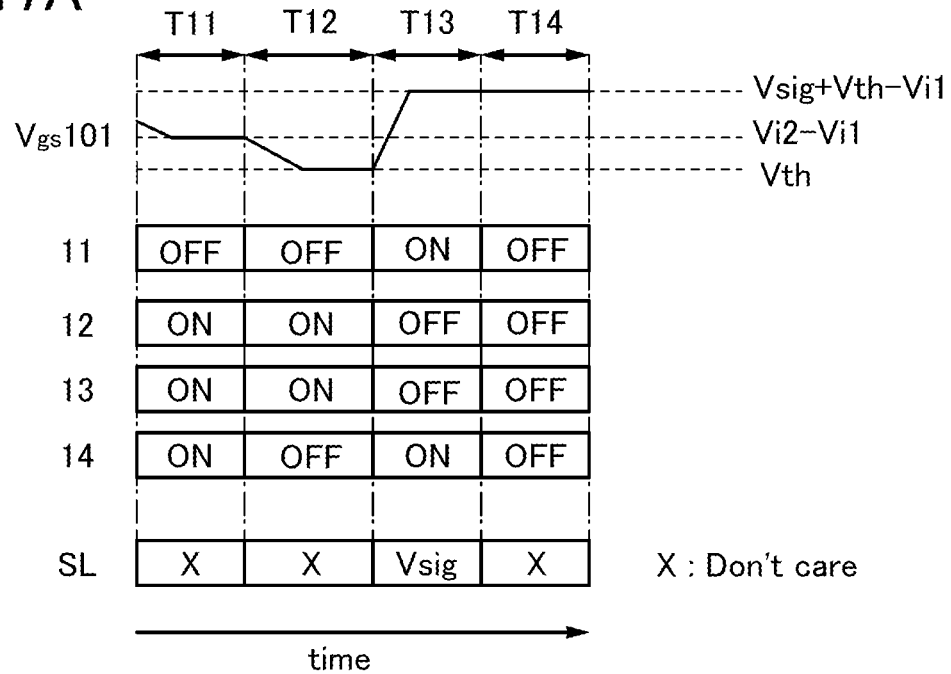
FIG. 17A is a timing chart, and FIGS. 17B and 17C each illustrate the operation of a semiconductor device.

FIG. 17A is an example of a timing chart showing the operations of the switch 11, the switch 12, the switch 13, and the switch 14, the potential of the wiring 21, and the gate-source voltage of the transistor 101 (Vgs101) in the circuit 100 illustrated in FIG. 11C.

Figure 17B:
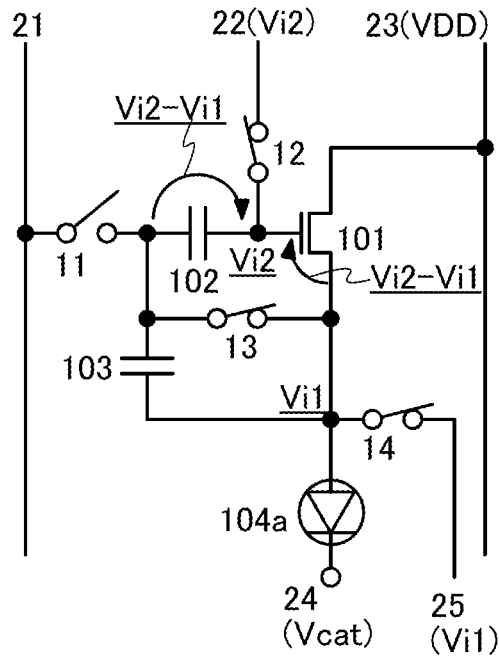

First, the first operation in the period T11 is described. In the period T11, as illustrated in FIG. 17A, the switch 11 is off, and the switch 12, the switch 13, and the switch 14 are on. Thus, in the period T11, as illustrated in FIG. 17B, the voltage Vi2−Vi1 is supplied to the capacitor 102, the potential of the anode of the light-emitting element 104*a* becomes the potential Vi1, and the gate-source voltage Vgs101 of the transistor 101 becomes the voltage Vi2−Vi1. In other words, the transistor 101 and the capacitor 102 are initialized.

Note that in the case where the potential of the wiring 21 does not cause an adverse effect, the switch 11 may be on. In that case, the switch 14 may be off.

Note that the switch 13 may be off.

Figure 17C:
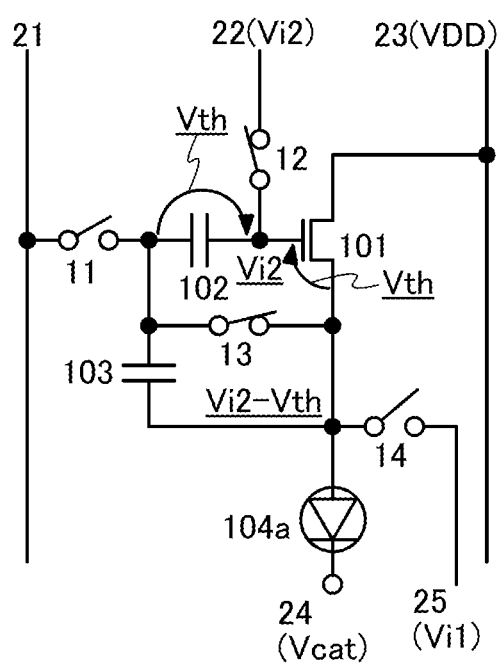

Next, the second operation in the period T12 is described. In the period T12, as illustrated in FIG. 17A, the switch 11 and the switch 14 are off, and the switch 12 and the switch 13 are on. When the switch 11 and the switch 14 are off, electric charge accumulated in the capacitor 102 is released through the transistor 101, and the potential of the source of the transistor 101 is raised. Then, when the transistor 101 is turned off, the release of the electric charge from the capacitor 102 is stopped. The threshold voltage Vth of the transistor 101 is eventually held in the capacitor 102. Thus, in the period T12, as illustrated in FIG. 17C, the threshold voltage Vth is held in the capacitor 102, the potential of the anode of the light-emitting element 104*a* becomes the potential Vi2−Vth, and the gate-source voltage Vgs101 of the transistor 101 becomes the threshold voltage Vth. That is, the threshold voltage Vth of the transistor 101 can be acquired.

Note that in some cases, it takes a very long time for Vgs101 to be equal to the threshold voltage Vth of the transistor 101. Accordingly, in many cases, an operation is performed while Vgs101 is not completely lowered to the threshold voltage Vth. That is, in many cases, the period T12 is terminated while Vgs101 is slightly higher than the threshold voltage Vth. In other words, at the termination of the period T12, Vgs101 becomes voltage based on the threshold voltage.

Note that the second operation can be performed regardless of whether the threshold voltage Vth of the transistor 101 is positive voltage or negative voltage. This is because the potential of the source of the transistor 101 can be raised until the transistor 101 is turned off. In other words, when the potential of the source of the transistor 101 becomes higher than potential of the gate of the transistor 101, the transistor 101 can be eventually turned off and Vgs101 can become Vth. Thus, the second operation can be performed without problems regardless of whether the transistor 101 is an enhancement (normally-off) transistor or a depletion (normally-on) transistor.

Note that when the potential of the anode of the light-emitting element 104a becomes high, it is preferable that current does not flow to the light-emitting element 104a. For this purpose, the potential Vi2 is preferably a low potential so that current does not flow to the light-emitting element 104a. Note that one aspect of an embodiment of the present invention is not limited thereto. If it is possible not to supply current to the light-emitting element 104a when a switch provided in series with the light-emitting element 104a is turned off, the potential Vi2 may be a high potential.

Figure 18A:
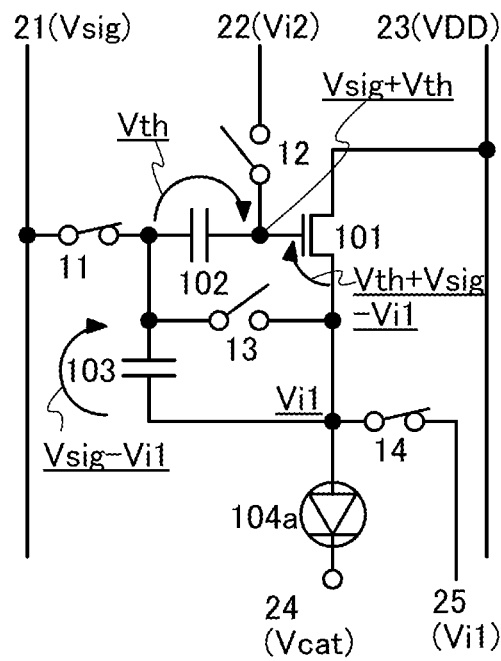
FIGS. 18A and 18B each illustrate the operation of a semiconductor device.

Next, the third operation in the period T13 is described. In the period T13, as illustrated in FIG. 17A, the switch 11 and the switch 14 are on, and the switch 12 and the switch 13 are off. In addition, the potential Vsig is supplied to the wiring 21. Thus, in the period T13, as illustrated in FIG. 18A, the threshold voltage Vth (or the voltage based on Vth) is held in the capacitor 102, a voltage Vsig−Vi1 is held in the capacitor 103, the potential of the anode of the light-emitting element 104a becomes a potential Vi1, the potential of the gate of the transistor 101 becomes the potential Vsig+Vth, and the gate-source voltage Vgs101 of the transistor 101 becomes a voltage Vsig+Vth−Vi1. Thus, the potential Vsig can be supplied to the capacitor 103. Alternatively, the sum of the voltage across the capacitor 102 and the voltage across the capacitor 103 can be equal to the gate-source voltage of the transistor 101.

Note that in that case, the switch 14 can be turned off.

Figure 18B:
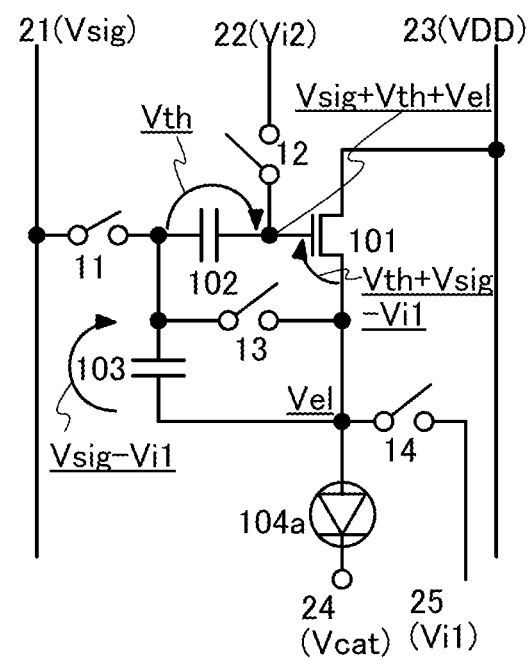
Figure 19A:
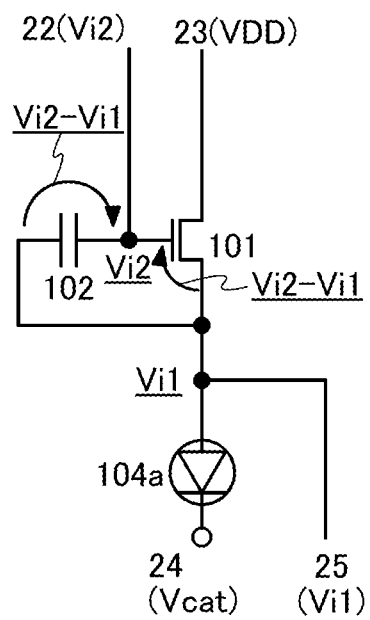
FIGS. 19A to 19D each illustrate the operation of a semiconductor device.
Figure 19B:
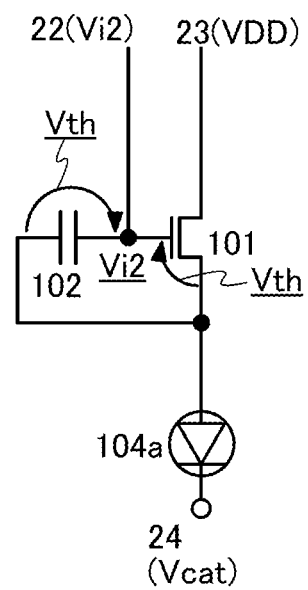
Figure 19C:
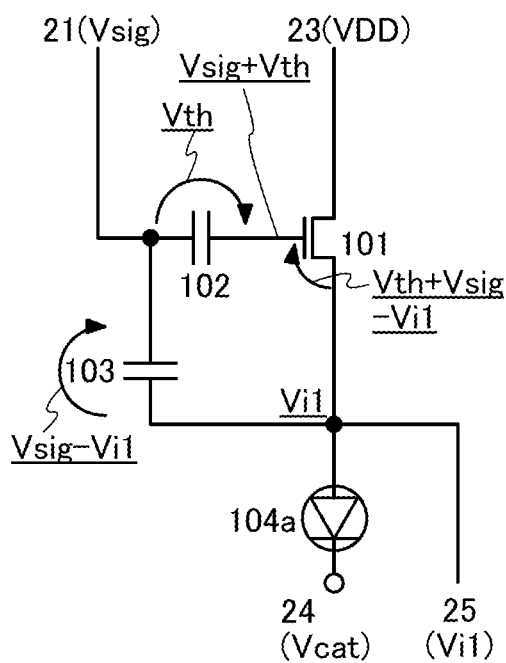
Figure 19D:
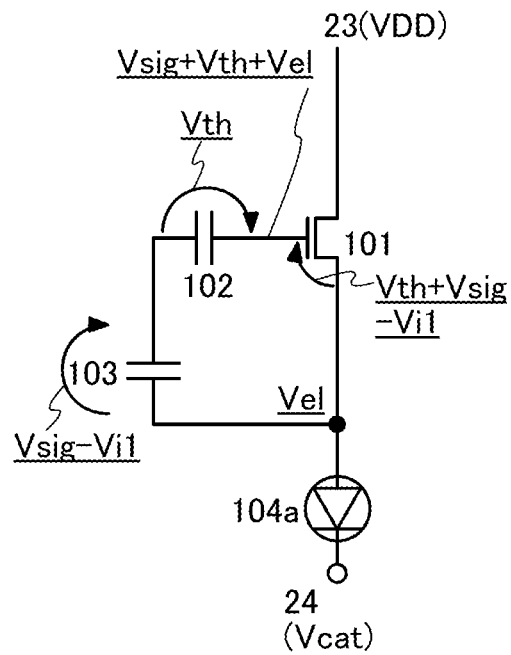

The fourth operation in the period T14 is described. In the period T14, as illustrated in FIG. 17A, the switch 11, the switch 12, the switch 13, and the switch 14 are off. Thus, in the period T14, as illustrated in FIG. 18B, the threshold voltage Vth is held in the capacitor 102, the voltage Vsig−Vi1 is held in the capacitor 103, the potential of the anode of the light-emitting element 104a becomes the potential Ve1, the potential of the gate of the transistor 101 becomes the potential Vsig+Vth+Ve1 and the gate-source voltage Vgs101 of the transistor 101 becomes the voltage Vsig+Vth−Vi1. Thus, current based on the potential Vsig can flow to the light-emitting element 104a, so that the light-emitting element 104a can emit light at luminance based on the potential Vsig.

In the fourth operation, the gate-source voltage Vgs101 of the transistor 101 can be set to Vsig+Vth−Vi1 by taking the threshold voltage Vth of the transistor 101 into consideration. Consequently, variations in threshold voltage Vth between the transistors 101 can be prevented from adversely affecting the value of a current supplied to the light-emitting elements 104a. Alternatively, even if the transistor 101 deteriorates and the threshold voltage Vth is changed, the change in the threshold voltage Vth can be prevented from adversely affecting the value of a current supplied to the light-emitting element 104a. Therefore, high-quality images with less unevenness can be displayed.

Similarly, the gate-source voltage Vgs101 of the transistor 101 can be set to the voltage Vsig+Vth−Vi1, which is a value unrelated to Ve1. Consequently, variations in volt-ampere characteristic between the light-emitting elements 104a can be prevented from adversely affecting the value of a current supplied to the light-emitting elements 104a. Alternatively, even if the light-emitting element 104a deteriorates and the volt-ampere characteristic of the light-emitting element 104a and hence Ve1 are changed, this change can be prevented from adversely affecting the value of a current supplied to the light-emitting element 104a. Therefore, high-quality images with less unevenness can be displayed.

Note that in part of the period in the fourth operation, the transistor 101 can be forcibly turned off or current cannot be supplied to the light-emitting element 104a so that the light-emitting element 104a does not emit light. In other words, a non-lighting period can be provided. For example, by turning on the switch 12, the transistor 101 can be turned off. Alternatively, by turning on the switch 14, current cannot be supplied to the light-emitting element 104a.

For a semiconductor device according to one aspect of the present invention, the gate of the transistor 101 is held at the potential Vi2 in the second operation. By the operation, even when the transistor 101 is a normally on transistor, in other words, even when the threshold voltage Vthn is negative, electric charge accumulated in the capacitor 102 until the potential of the source of the transistor 101 gets higher than the potential Vi2 of the gate of the transistor 101 can be released. Accordingly, in a semiconductor device according to one aspect of the present invention, even when the transistor 101 is a normally on transistor, in the fourth operation, the gate-source voltage Vgs 101 of the transistor 101 can be set to a value obtained by taking the threshold voltage Vth of the transistor 101 into consideration.

The capacitance of the capacitor 103 is preferably lower than the parasitic capacitance of the load 104 (the light-emitting element 104a), more preferably ½ or less, still more preferably ⅕ or less of the capacitance of the load 104. Alternatively, the area of the electrodes of the capacitor 103 is preferably smaller than the area of the electrodes of the load 104 (the light-emitting element 104a), more preferably ½ or less of the area of the electrodes of the load 104, still more preferably ⅕ or less of the area of the electrodes of the load 104. Note that one aspect of an embodiment of the present invention is not limited thereto.

Note that the capacitance of the capacitor 102 is preferably higher than the parasitic capacitance of the gate of the transistor 101, more preferably 2 or more times the parasitic capacitance of the gate of the transistor 101, still more preferably 5 or more times the parasitic capacitance of the gate of the transistor 101. Alternatively, the area of the electrodes of the capacitor 102 is preferably larger than the area of a channel region of the transistor 101, more preferably 2 or more times the area of the channel region of the transistor 101, still more preferably 5 or more times the area of the channel region of the transistor 101. Alternatively, the area of the electrodes of the capacitor 102 is preferably larger than the area of the gate electrode of the transistor 101, more preferably 2 or more times the area of the gate electrode of the transistor 101, still more preferably 5 or more times the area of the gate electrode of the transistor 101. Accordingly, when the potential Vsig is input and voltage is divided by the capacitor 102 and the gate capacitance of the transistor, a decrease in voltage of the capacitor 102 can be reduced. Note that one aspect of the embodiment of the present invention is not limited thereto.

Note that the capacitance of the capacitor 102 is preferably equal to or higher than the capacitance of the capacitor 103. The difference between the capacitance of the capacitor 102 and the capacitance of the capacitor 103 is preferably ±20% or lower, more preferably ±10% or lower. Alternatively, the area of the electrodes of the capacitor 102 is preferably equal to or larger than the area of the electrodes of the capacitor 103. Accordingly, the semiconductor device can perform optimum operation without changing the layout area. Note that one aspect of the embodiment of the present invention is not limited thereto.

FIGS. 19A to 19D are schematic views illustrating the circuit 100 in the periods T11 to T14. For a semiconductor device according to one aspect of the present invention, the circuit 100 is set in states illustrated in FIGS. 19A to 19D in the respective periods. Therefore, a semiconductor device according to one aspect of the present invention is not limited to the circuits 100 with the structures illustrated in FIGS. 11A to 11D, FIGS. 12A to 12D, FIGS. 13A to 13D, FIGS. 14A to 14D, FIGS. 15A to 15D, and FIGS. 16A to 16D. For a semiconductor device according to one aspect of the present invention, the placement or number of switches and the number of wirings supplying the potentials can be changed as appropriate such that the circuit 100 is set in the states illustrated in FIGS. 19A to 19D.

Note that the period T16 during which the sixth operation is performed may be provided after the period T13 during which the third operation is performed and before the period T14 during which the fourth operation is performed.

Figure 20A:
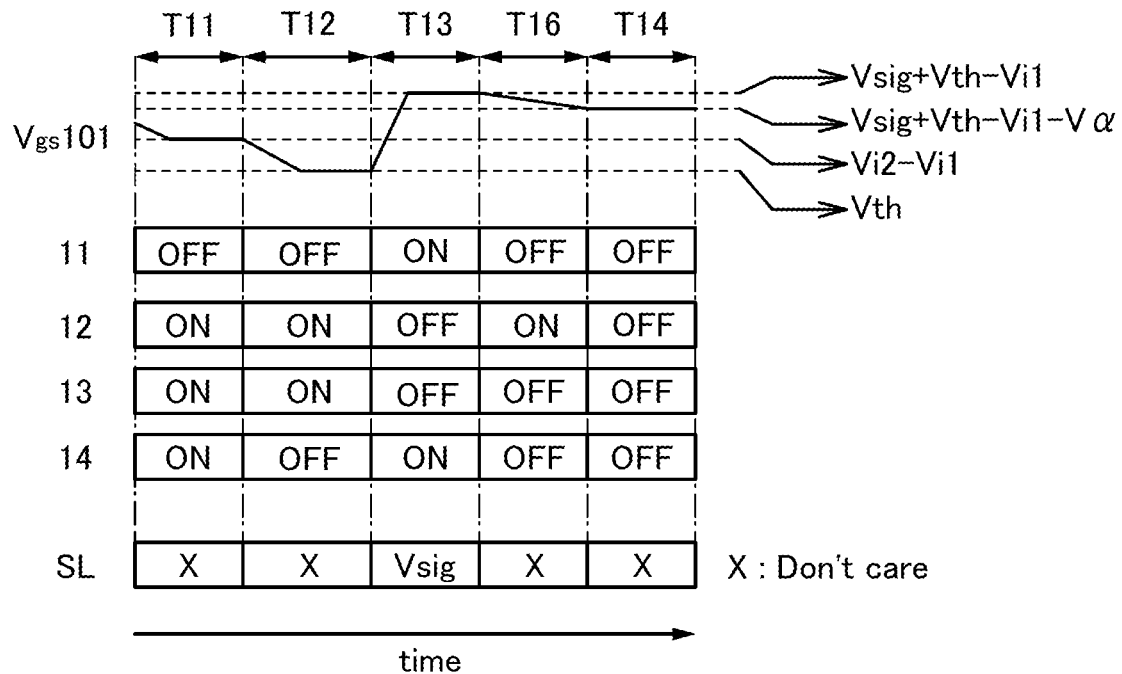
FIG. 20A is a timing chart.

FIG. 20A is an example of a timing chart including the period T16, showing the operations of the switch 11, the switch 12, the switch 13, and the switch 14, the potential of the wiring 21, and the gate-source voltage of the transistor 101 (Vgs101) in the circuit 100 illustrated in FIG. 11C.

The timing chart in FIG. 20A differs from the timing chart in FIG. 17A in that the period T16 is provided between the period T13 and the period T14.

Figure 20B:
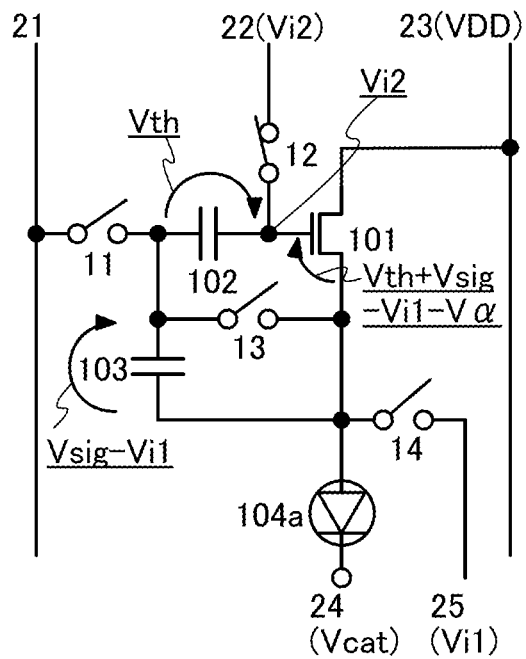
FIG. 20B illustrates the operation of a semiconductor device.

The sixth operation in the period T16 is described. In the period T16, as illustrated in FIG. 20A, the switch 12 is on, and the switch 11, the switch 13, and the switch 14 are off. Thus, in the period T16, as illustrated in FIG. 20B, the gate-source voltage Vgs101 of the transistor 101 becomes the voltage Vsig+Vth−Vi1−Vα.

The potential Vα in the sixth operation fluctuates when the anode of the light-emitting element 104a is electrically floating (in a floating state). The value of the potential Vα depends on the ratio between the capacitance of the light-emitting element 104a and the capacitance of the capacitor 102 and capacitor 103 if the transistor 101 is off. However, the transistor 101 might be turned on depending on the value of the potential Vsig, and electric charge flows into the anode of the light-emitting element 104a through the transistor 101. Thus, the value of the potential Vα depends on not only the capacitance ratio but also electric charge flowing into the anode of the light-emitting element 104a.

The electric charge Q may produce the effect of suppressing such variations in mobility. The reason will be described below.

The electric charge Q is the amount of electric charge which flows from the drain to the source of the transistor 101 in the period T16. Accordingly, the electric charge Q is increased as the mobility of the transistor 101 increases. As the electric charge Q is increased, the gate-source voltage Vgs 101 of the transistor 101 at the time when the light-emitting element 104a emits light is reduced. In other words, as the mobility of the transistor 101 increases, correction is made by the electric charge Q so that the value of current supplied to the light-emitting element 104a may be small, whereas, as the mobility of the transistor 101 decreases, correction is made by the electric charge Q so that the value of current supplied to the light-emitting element 104a may not be so small. Thus, variations in mobility can be suppressed by the electric charge Q.

In the period 14 after the period T16, the gate-source voltage Vgs101 of the transistor 101 becomes the voltage Vsig+Vth−Vi1−Vα. Thus, for the transistor 101, the gate-source voltage can be set to a value by taking the threshold voltage Vth and the mobility into consideration.

For a semiconductor device according to one aspect of the present invention, as in FIGS. 8A to 8D, the circuit 100 in FIG. 11B may further include a capacitor 105 connected to the load 104. Similarly, for a semiconductor device according to one aspect of the present invention, the circuit 100 in FIG. 11C may further include a capacitor 105 connected to the light-emitting element 104a. Similarly, for a semiconductor device according to one aspect of the present invention, the circuit 100 in FIG. 11D may further include a capacitor 105 connected to the light-emitting element 104b.

Figure 21A:
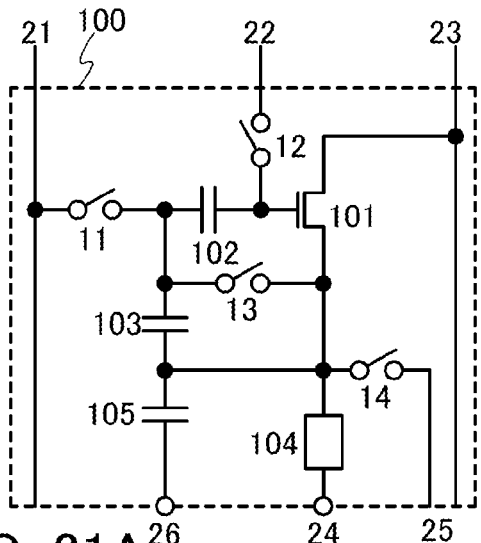
FIGS. 21A to 21E each illustrate the structure of a semiconductor device.

A semiconductor device in FIG. 21A corresponds to the circuit 100 in FIG. 11B further including a capacitor 105 connected to the load 104. Specifically, one electrode of the capacitor 105 is connected to the other electrode of the capacitor 103 and the one of a source and a drain of the transistor 101. The other electrode of the capacitor 105 is connected to the wiring 26. Note that although FIG. 21A shows the case where the circuit 100 includes the load 104 as an example, the light-emitting element 104a or the light-emitting element 104b may be used instead of the load 104 in FIG. 21A.

Note that the wiring 26 may be connected to a variety of wirings. For example, the wiring 26 may be connected to the wiring 22, the wiring 23, the wiring 24, the wiring 25, a wiring in another circuit 100, a scan line, a gate line, a wiring connected to the gate of a transistor, or the like. Thus, the number of wirings can be reduced.

Figure 21B:
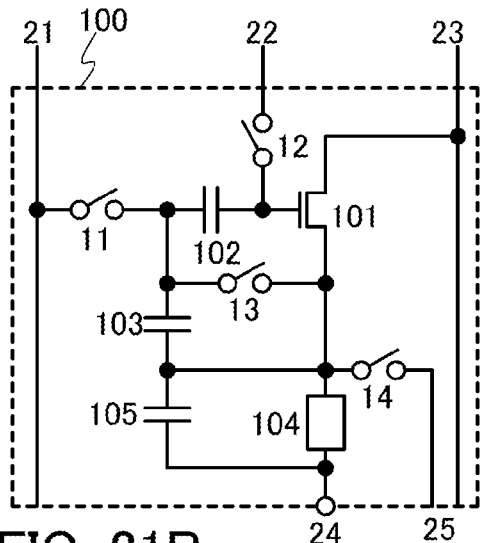

A semiconductor device in FIG. 21B corresponds to the circuit 100 in FIG. 21A, in which the wiring 26 is connected to the wiring 24. Note that although FIG. 21B shows the case where the circuit 100 includes the load 104 as an example, the light-emitting element 104a or the light-emitting element 104b may be used instead of the load 104 in FIG. 21B. When the wiring 26 is connected to the wiring 24, the number of wirings 26 can be reduced.

Figure 21C:
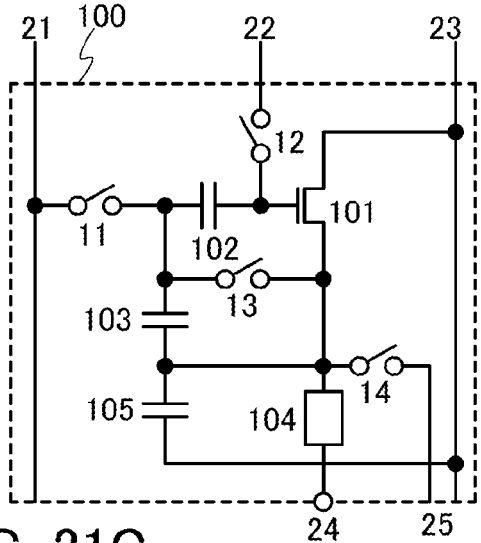

A semiconductor device in FIG. 21C corresponds to the circuit 100 in FIG. 21A, in which the wiring 26 is connected to the wiring 23. Note that although FIG. 21C shows the case where the circuit 100 includes the load 104 as an example, the light-emitting element 104a or the light-emitting element 104b may be used instead of the load 104 in FIG. 21C. When the wiring 26 is connected to the wiring 23, the number of wirings 26 can be reduced.

Figure 21D:
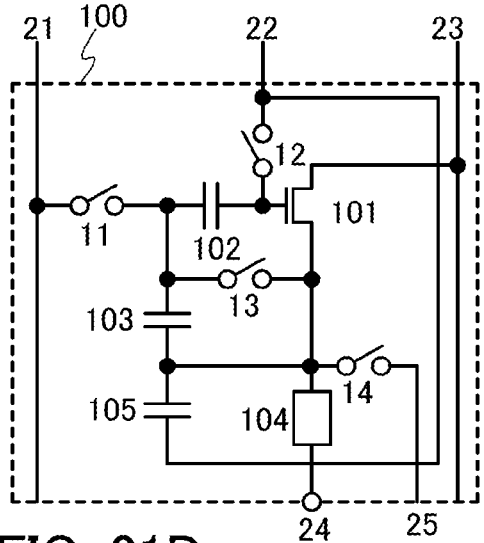

A semiconductor device in FIG. 21D corresponds to the circuit 100 in FIG. 21A, in which the wiring 26 is connected to the wiring 22. Note that although FIG. 21D shows the case where the circuit 100 includes the load 104 as an example, the light-emitting element 104a or the light-emitting element 104b may be used instead of the load 104 in FIG. 21D. When the wiring 26 is connected to the wiring 22, the number of wirings 26 can be reduced.

Figure 21E:
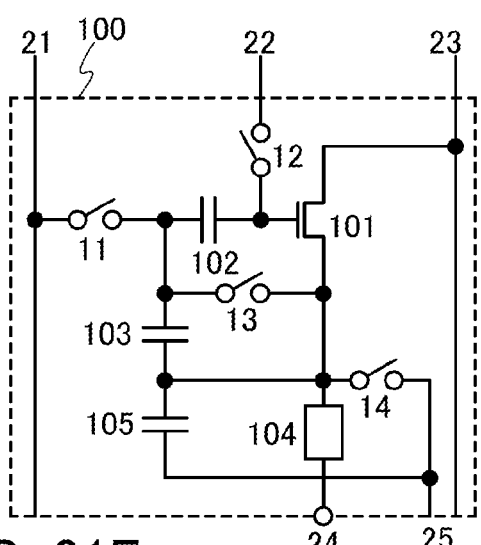
Figure 22A:
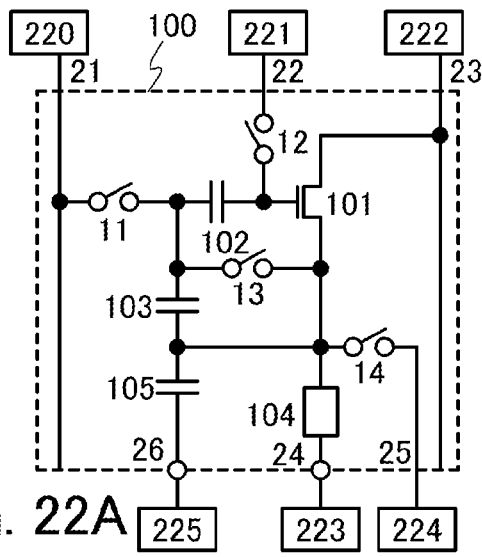
FIGS. 22A to 22E each illustrate the structure of a semiconductor device.
Figure 22B:
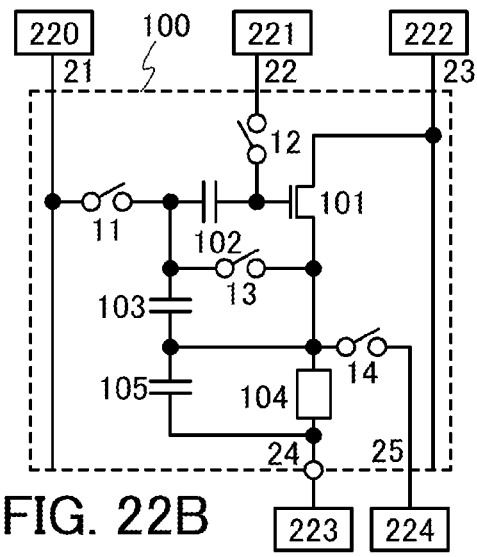
Figure 22C:
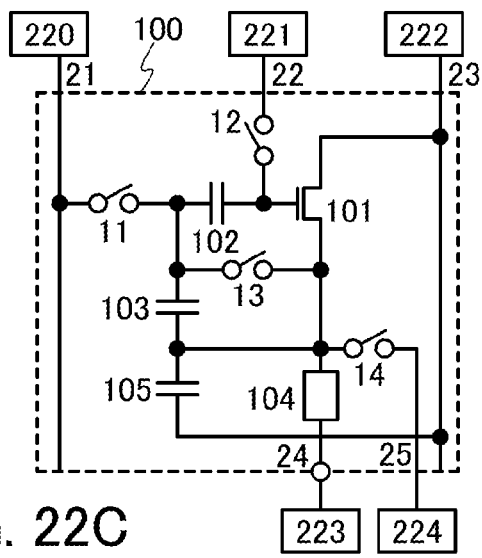
Figure 22D:
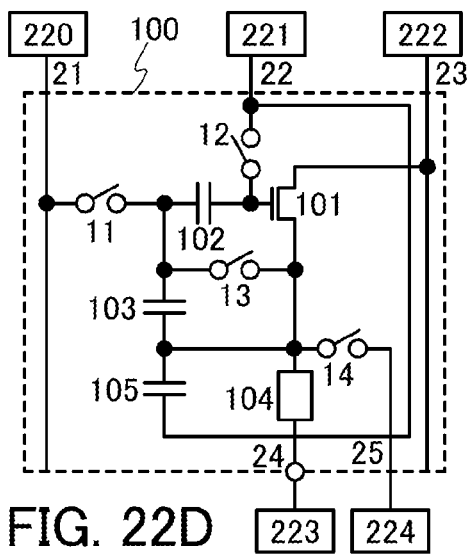
Figure 22E:
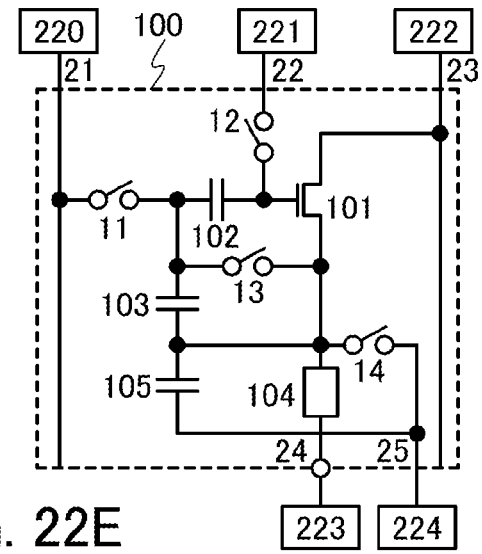

A semiconductor device in FIG. 21E corresponds to the circuit 100 in FIG. 21A, in which the wiring 26 is connected to the wiring 25. Note that although FIG. 21E shows the case where the circuit 100 includes the load 104 as an example, the light-emitting element 104a or the light-emitting element 104b may be used instead of the load 104 in FIG. 21E. When the wiring 26 is connected to the wiring 25, the number of wirings 26 can be reduced.

When the capacitor 105 connected in parallel to the load 104, the light-emitting element 104a or the light-emitting element 104b is added to the circuit 100, in the sixth operation and the fourth operation described in the above embodiment, fluctuations in electric charge at the one of the source and the drain of the transistor 101 can be suppressed, so that a voltage Vα can be reduced. Thus, the gate-source voltage Vgs can be close to an ideal value, i.e., the voltage Vsig+Vth−Vi1, so that current supplied to the load 104, the light-emitting element 104a, or the light-emitting element 104b can be set to a value closer to that reflects accurately the voltage Vsig.

Alternatively, the capacitance of the capacitor 105 is adjusted as appropriate, so that the amount of change in potential due to the electric charge Q in the period T16 can be adjusted. Thus, variations in mobility can be reduced more appropriately.

Note that the area of the electrodes of the capacitor 105 is preferably smaller than the area of the electrodes of the load 104 (the light-emitting element 104a), more preferably ½ or less of the area of the electrodes of the load 104, still more preferably ⅓ or less of the area of the electrodes of the load 104. Alternatively, the capacitance of the capacitor 105 is preferably lower than the capacitance of the load 104 (the light-emitting element 104a), more preferably ½ or less, still more preferably ⅓ or less of the capacitance of the load 104. Accordingly, optimum operation can be performed without changing the layout area. Note that one aspect of the embodiment of the present invention is not limited thereto.

Note that the total area of the electrodes of the capacitor 105 and the electrodes of the load 104 (the light-emitting element 104a) is preferably larger than the area of the electrodes of the capacitor 103, more preferably 2 or more times, still more preferably 5 or more times the area of the electrodes of the capacitor 103. Alternatively, the total capacitance of the capacitor 105 and the load 104 (the light-emitting element 104a) is preferably higher than the capacitance of the capacitor 103, more preferably 2 or more times, still more preferably 5 or more times the capacitance of the capacitor 103. Accordingly, when voltage is divided by the load 104 (the light-emitting element 104a) and each of the capacitors 103 and 105, higher voltage can be applied to the capacitor 103. Note that one aspect of the embodiment of the present invention is not limited thereto.

Note that the area of the electrodes of the capacitor 105 is preferably smaller than the area of the electrodes of the capacitor 102 or 103 (the light-emitting element 104a), more preferably ½ or less of the area of the electrodes of the capacitor 102 or 103, still more preferably ⅓ or less of the area of the electrodes of the capacitor 102 or 103. Alternatively, the capacitance of the capacitor 105 is preferably lower than the capacitance of the capacitor 102 or 103 (the light-emitting element 104a), more preferably ½ or less, still more preferably ⅓ or less of the capacitance of the capacitor 102 or 103. Accordingly, optimum operation can be performed without changing the layout area. Note that one aspect of the embodiment of the present invention is not limited thereto.

Note that the wiring 25 may be connected to a variety of wirings. For example, the wiring 25 may be connected to the wiring 22, the wiring 24, the wiring 26, a wiring in another circuit 100, a scan line, a gate line, a wiring connected to the gate of a transistor, or the like. Thus, the number of wirings can be reduced.

A semiconductor device according to one aspect of the present invention may include, for example, any circuit that supplies a constant voltage or a signal to the circuit 100, as well as any of the circuits 100 illustrated in FIGS. 21A to 21D.

Semiconductor devices illustrated in FIGS. 22A to 22D include, in addition to the circuits 100 in FIGS. 21A to 21D, a circuit 220 having a function of supplying a constant voltage or a signal to the wiring 21, a circuit 221 having a function of supplying a constant voltage or a signal to the wiring 22, a circuit 222 having a function of supplying a constant voltage or a signal to the wiring 23, a circuit 223 having a function of supplying a constant voltage or a signal to the wiring 24, and a circuit 224 having a function of supplying a constant voltage or a signal to the wiring 25. The circuit 100 in FIG. 22A further includes a circuit 225 having a function of supplying a fixed voltage or signal to the wiring 26.

Any of the circuits 100 in FIGS. 11B to 11D and FIGS. 21B to 21D may be used as a pixel of a display device. In the case where pixels for a plurality of hues are provided in the display device, the transistors 101 of pixels for different hues may differ in the ratio between the channel width and the channel length. Similarly, the capacitors 105 of pixels for different hues may differ in capacitance.

Figure 23A:
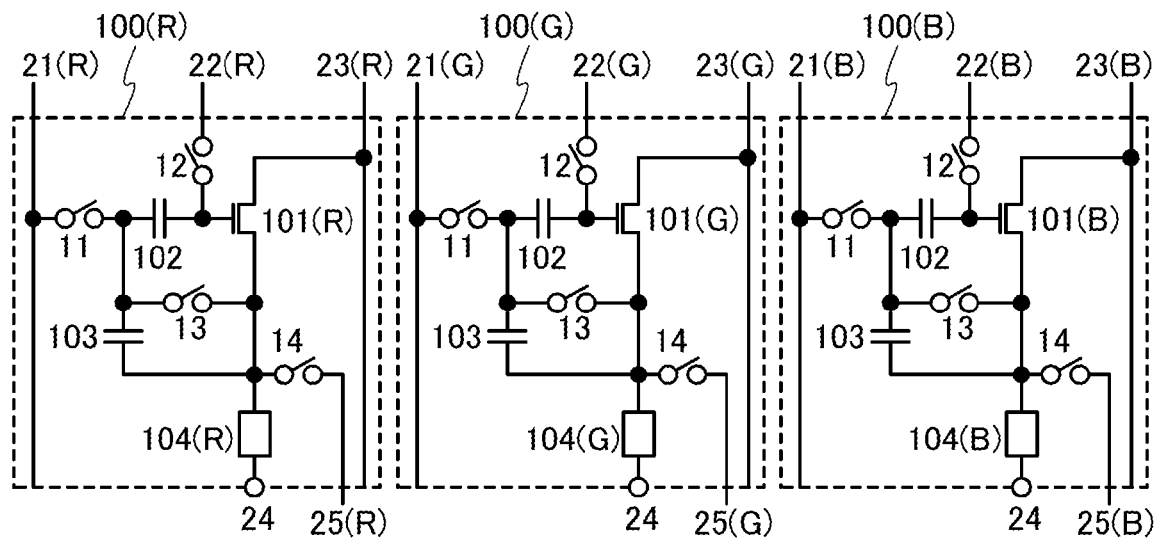
FIGS. 23A and 23B each illustrate the structure of a semiconductor device.

FIG. 23A illustrates the case where the circuit 100 in FIG. 11B is used as a pixel of a display device. In FIG. 23A, a circuit 100(R) corresponds to a pixel for red (R); a circuit 100(G), a pixel for green (G); a circuit 100(B), a pixel for blue (B). In one aspect of the present invention, at least one of a transistor 101(R) in the circuit 100(R), a transistor 101(G) in the circuit 100(G), and a transistor 101(B) in the circuit 100B may differ from the others in the ratio between the channel width and the channel length. With the above structure, currents supplied to a load 104(R) in the circuit 100(R), a load 104(G) in the circuit 100(G), a load 104(B) in the circuit 100(B) can be set at different values.

Figure 23B:
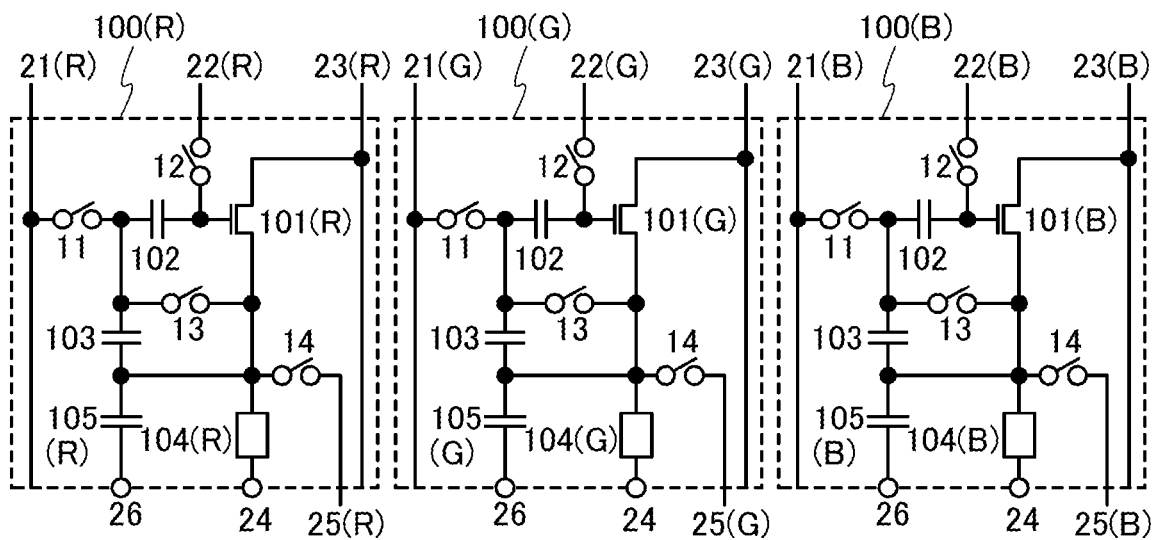

FIG. 23B illustrates the case where the circuit 100 in FIG. 21A is used as a pixel of a display device, as an example. In FIG. 23B, as in FIG. 23A, at least one of a transistor 101(R) in the circuit 100(R), a transistor 101(G) in the circuit 100(G), and a transistor 101(B) in the circuit 100B may differ from the others in the ratio between the channel width and the channel length. With the above structure, currents supplied to a load 104(R) in the circuit 100(R), a load 104(G) in the circuit 100(G), a load 104(B) in the circuit 100(B) can be set at different values.

In FIG. 23B, at least one of the capacitor 105(R) in the circuit 100(R), the capacitor 105(G) in the circuit 100(G), and the capacitor 105(B) in the circuit 100(B) may differ from the others in the capacitance.

FIGS. 23A and 23B illustrate the case where the circuit 100(R) includes the load 104(R), the circuit 100(G) includes the load 104(G), and the circuit 100(B) includes the load 104(B); however, in FIG. 23A or 23B, the light-emitting element 104a or 104b of an appropriate hue may be used instead of the load 104(R), the load 104(G), or the load 104(B).

FIG. 23B illustrates the case where the circuit 100 in FIG. 21A is used as a pixel of a display device; however, each of the circuits 100 in FIGS. 21B to 21E may be used as a pixel of a display device.

Note that variation in the threshold voltage or the like of the transistor 101 is corrected in this embodiment, but one aspect of an embodiment of the present invention is not limited thereto. For example, the circuit can operate to supply current to the load 104 without the operation for correcting variations in threshold voltage.

In this embodiment, an example of a basic principle is described. Thus, part or the whole of this embodiment can be freely combined with, applied to, or replaced with part or the whole of another embodiment.

(Embodiment 2)

In this embodiment, structure examples of the circuit 100 that is a semiconductor device according to one aspect of the present invention are described. In this embodiment, a switch is added to the circuit described in Embodiment 1 or the method for driving the circuit described in Embodiment 1 is partly changed. Thus, the contents described in Embodiment 1 can also be applied to this embodiment.

FIGS. 24A to 24D each illustrate a structure example of a circuit 100. The circuits 100 in FIGS. 24A to 24D correspond respectively to the circuits 100 in FIGS. 1A to 1D to which a switch 914 is added. The switch 914 has a function of controlling conduction between the other of the source and the drain of a transistor 101 and the wiring 23. Alternatively, the switch 914 has a function of controlling conduction between the wiring 23 and the wiring 24. Alternatively, the switch 914 has a function of preventing current from flowing into the capacitor 103. Alternatively, the switch 914 has a function of preventing current from flowing into the capacitor 102. Alternatively, the switch 914 has a function of preventing current from flowing into the load 104.

A semiconductor device according to one aspect of the present invention may include, for example, any circuit that supplies a constant voltage or a signal to the circuit 100, as well as any of the circuits 100 illustrated in FIGS. 24A to 24D.

Semiconductor devices illustrated in FIGS. 25A to 25D include, in addition to the circuits 100 in FIGS. 24A to 24D, a circuit 201 having a function of supplying a constant voltage or a signal to the wiring 21, a circuit 202 having a function of supplying a constant voltage or a signal to the wiring 22, a circuit 203 having a function of supplying a constant voltage or a signal to the wiring 23, and a circuit 204 having a function of supplying a constant voltage or a signal to the wiring 24.

Note that in the circuits 100 in FIGS. 24A to 24D and FIGS. 25A to 25D, as an example, the switch 11, the switch 12, the switch 13, and the switch 914 may be transistors.

Figure 86:
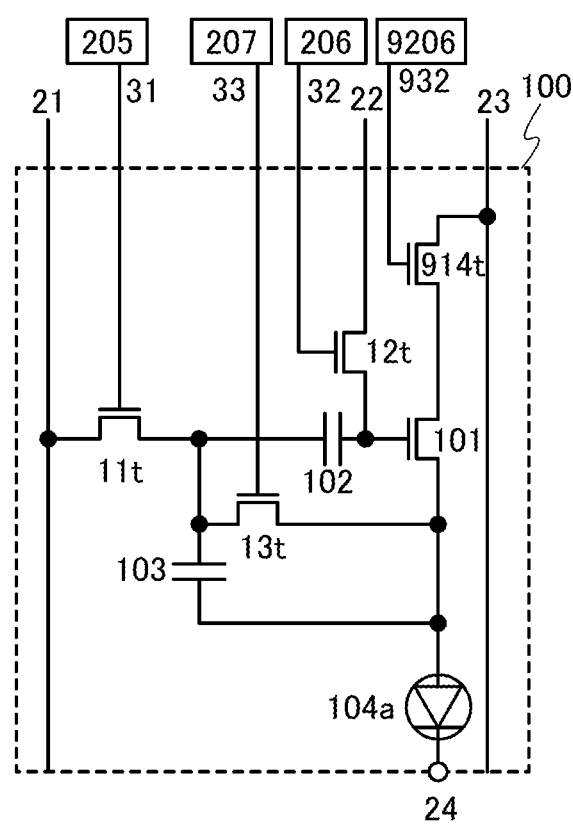
FIG. 86 illustrates the structure of a semiconductor device.
Figure 87A:
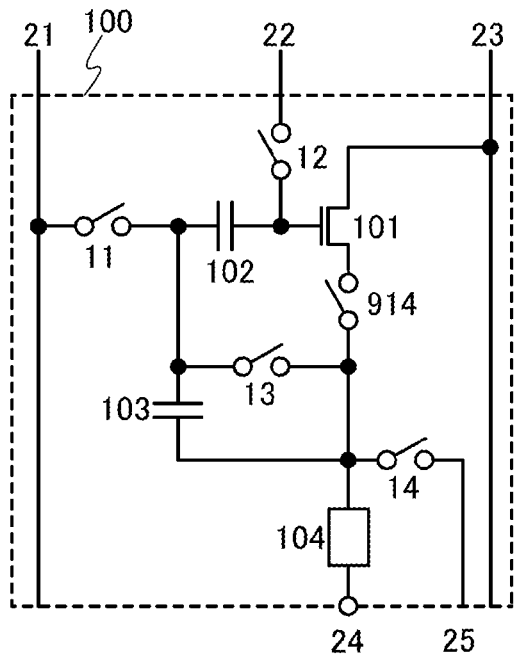
FIGS. 87A to 87D each illustrate the structure of a semiconductor device.
Figure 87B:
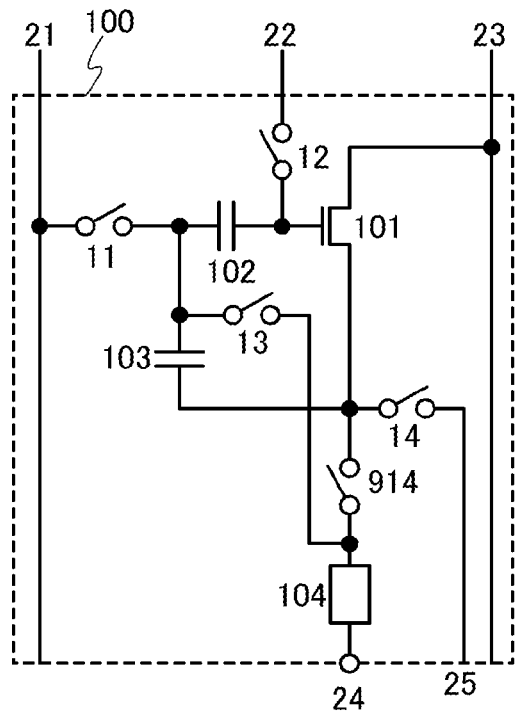
Figure 87C:
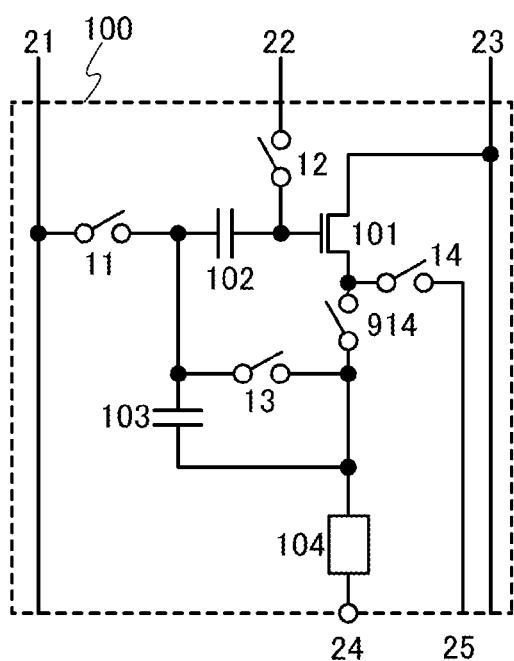
Figure 87D:
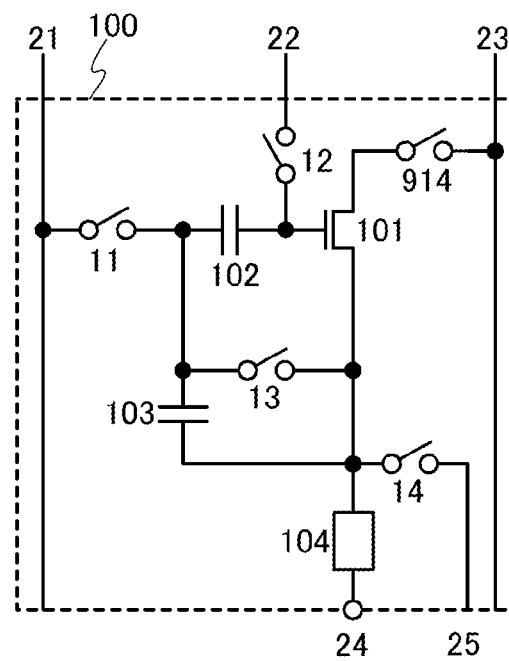

Note that for example, as illustrated in FIG. 86, when the switch 914 is a transistor 914*t*, a gate of the transistor 914*t* may be connected to a wiring 932, and the wiring 932 may be connected to a circuit 9206 having a function of supplying a constant voltage or a signal. An example of the circuit 9206 is a gate driver (a scan line driver circuit).

Note that at least two of the wirings 31 to 33 and the wiring 932 can be connected to each other. Alternatively, at least one of the wirings 31 to 33 and the wiring 932 can be connected to at least one of the wirings 31 to 33 and the wiring 932 in another circuit 100.

The circuits 100 in FIGS. 24A to 24D and FIGS. 25A and 25D can operate in the same way as the circuits 100 in FIGS. 1A to 1D and FIGS. 2A to 2D. Note that, as an example, in the circuits 100 in FIGS. 24A to 24D and FIGS. 25A and 25D, the switch 914 is preferably on in the periods T11 to T13 and the period T15, and off in the period T14 (these periods are described with reference to FIGS. 5A to 5C and FIGS. 6A to 6C). Thus, in the period T14, electric charge can be prevented from leaking into the light-emitting element 104*a* and the like through the transistor 101. Note that one aspect of the embodiment of the present invention is not limited thereto.

Alternatively, in the period T13, the switch 914 may be off. In that case, current does not flow into the transistor 101, facilitating control of the potentials of the nodes in the circuit 100, such as the gate and the source of the transistor 101.

Alternatively, in the period T11, the switch 914 may be off. In that case, current does not flow into the transistor 101, facilitating control of the potentials of the nodes in the circuit 100, such as the gate and the source of the transistor 101.

Alternatively, the switch 914 is also turned off in a part of the period T15. This prevents current from flowing into the light-emitting element 104*a* and the like, thereby providing a non-lighting period.

Figure 24A:
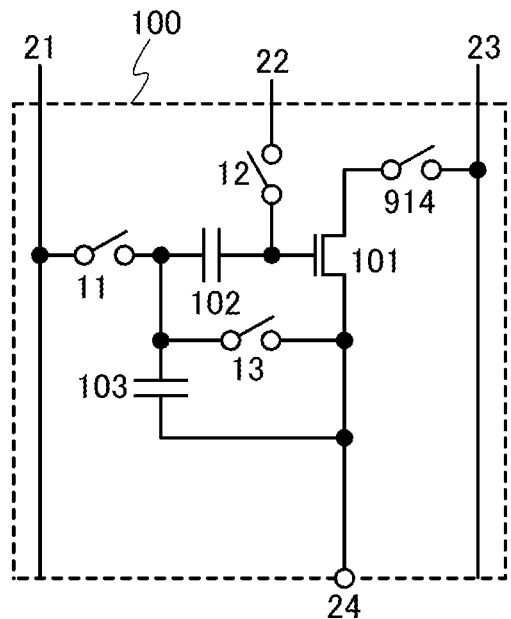
FIGS. 24A to 24D each illustrate the structure of a semiconductor device.
Figure 24B:
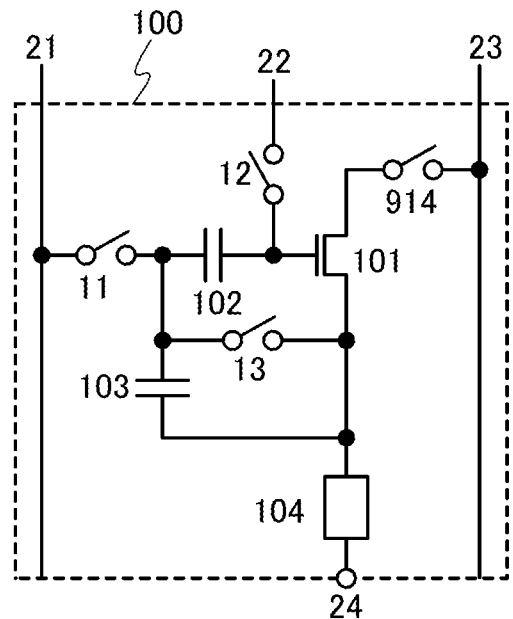
Figure 24C:
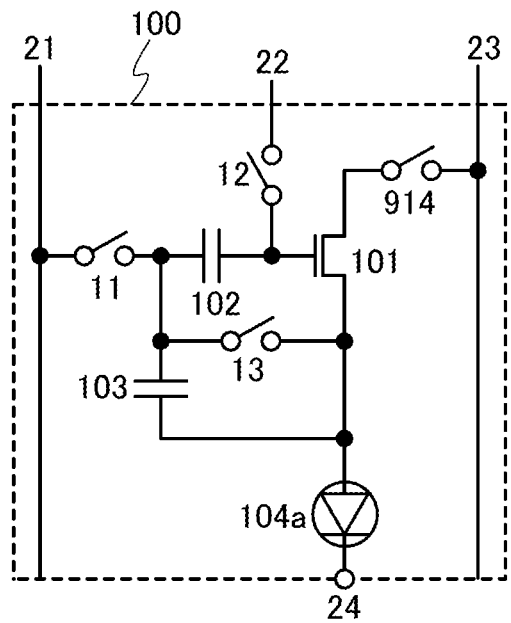
Figure 24D:
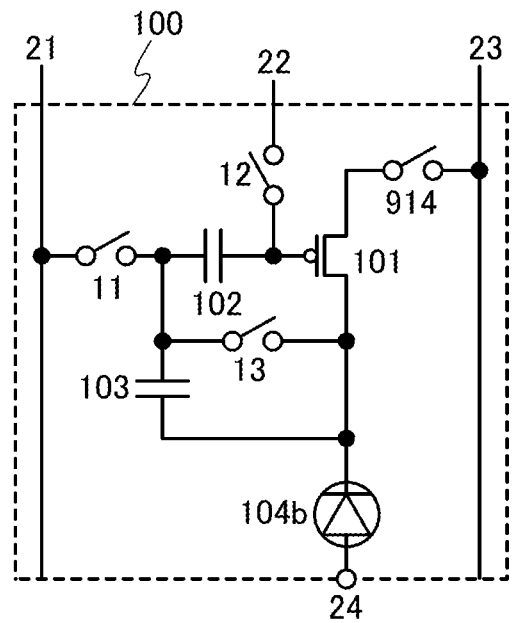
Figure 25A:
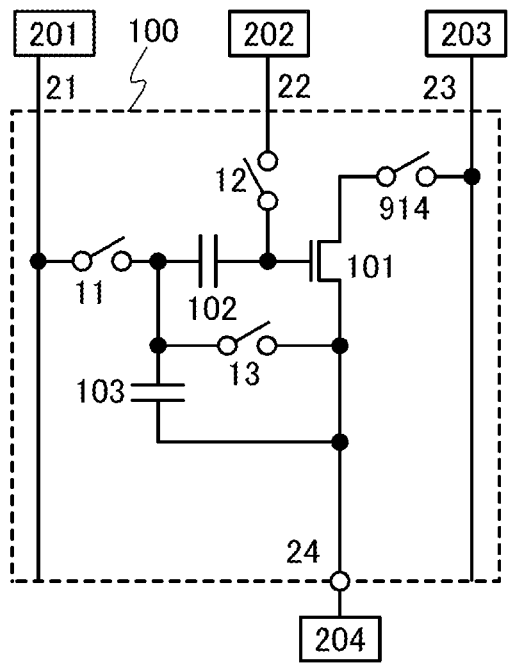
FIGS. 25A to 25D each illustrate the structure of a semiconductor device.
Figure 25B:
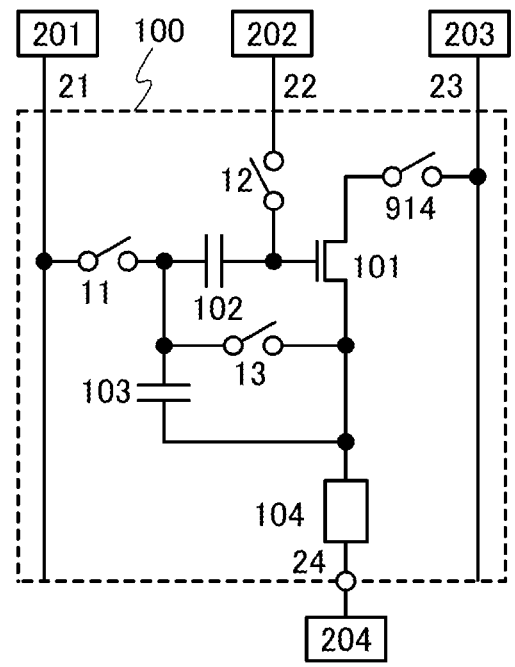

Note that the circuits 100 in FIG. 24B and FIG. 25B may each further include a capacitor 105 connected to the load 104 as in FIGS. 8A to 8D, FIGS. 9A to 9D, and FIG. 10B. Similarly, the circuits 100 in FIG. 24C and FIG. 25C may each further include a capacitor 105 connected to the light-emitting element 104*a*. Similarly, the circuits 100 in FIG. 24D and FIG. 25D may each further include a capacitor 105 connected to the light-emitting element 104*b*. Specifically, one electrode of the capacitor 105 is connected to the other electrode of the capacitor 103 and the one of a source and a drain of the transistor 101. The other electrode of the capacitor 105 is connected to a wiring 26, 24, 23, or 22 which is additionally provided.

Figure 25C:
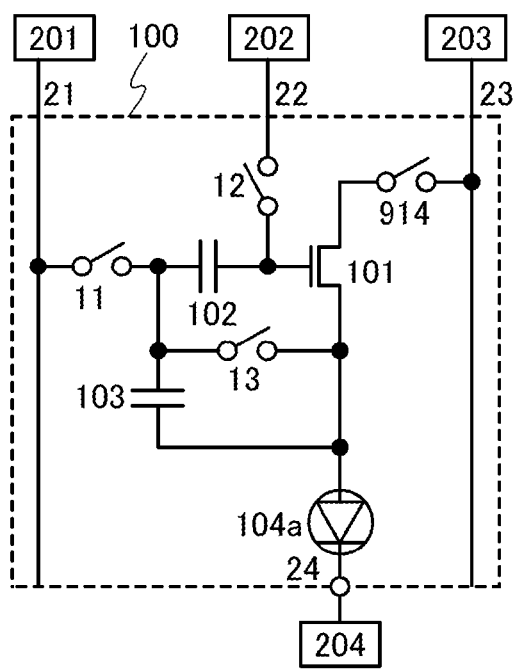
Figure 25D:
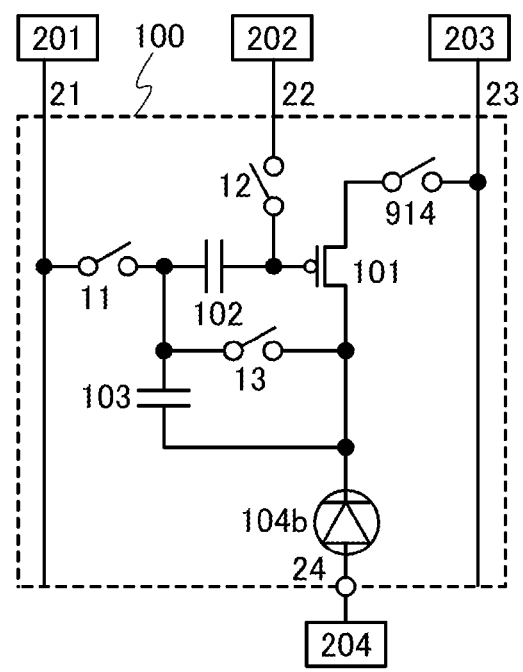

Any of the circuits 100 in FIGS. 24B to 24D and the circuits corresponding to the circuits 100 in FIGS. 25B to 25D, to which the capacitors 105 are added may be used as a pixel of a display device. In the case where pixels for a plurality of hues are provided in the display device, the transistors 101 of pixels for different hues may differ in the ratio between the channel width and the channel length.

Note that the position of the switch 914 may be different from the position in FIGS. 24A to 24D and FIGS. 25A to 25D. Specifically, for example, the switch 914 can be provided at the position at which the switch 914 can control conduction between the wiring 23 and the wiring 24. FIGS. 26A to 26D each illustrate a structure example of a circuit 100, as an example. The circuits 100 in FIGS. 26A to 26D correspond respectively to the circuits 100 in FIGS. 1A to 1D to which a switch 914 is added. The switch 914 has a function of controlling conduction between the one of a source and a drain of the transistor 101 and the other electrode of the capacitor 103. In addition, when the switch 13 is on, the switch 914 has a function of controlling conduction between one of the source and the drain of the transistor 101 and the one electrode of the capacitor 102 and conduction between one of a source and a drain of the transistor 101 and the one electrode of the capacitor 103.

A semiconductor device according to one aspect of the present invention may include, for example, any circuit that supplies a constant voltage or a signal to the circuit 100, as well as any of the circuits 100 illustrated in FIGS. 26A to 26D.

Semiconductor devices illustrated in FIGS. 27A to 27D include, in addition to the circuits 100 in FIGS. 26A to 26D, a circuit 201 having a function of supplying a constant voltage or a signal to the wiring 21, a circuit 202 having a function of supplying a constant voltage or a signal to the wiring 22, a circuit 203 having a function of supplying a constant voltage or a signal to the wiring 23, and a circuit 204 having a function of supplying a constant voltage or a signal to the wiring 24.

Note that in the circuits 100 in FIGS. 26A to 26D and FIGS. 27A to 27D, as an example, the switch 11, the switch 12, the switch 13, and the switch 914 may be transistors.

The circuits 100 in FIGS. 26A to 26D and FIGS. 27A to 27D can operate in the same way as the circuits 100 in FIGS. 1A to 1D, FIGS. 2A to 2D, FIGS. 24A to 24D, or FIGS. 25A to 25D.

Figure 26A:
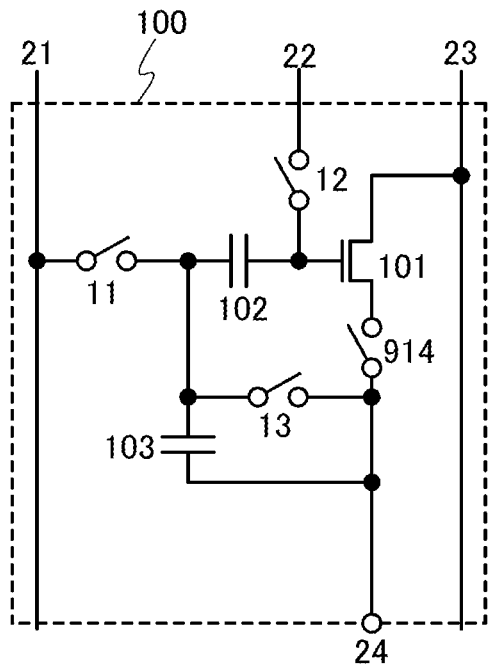
FIGS. 26A to 26D each illustrate the structure of a semiconductor device.
Figure 26B:
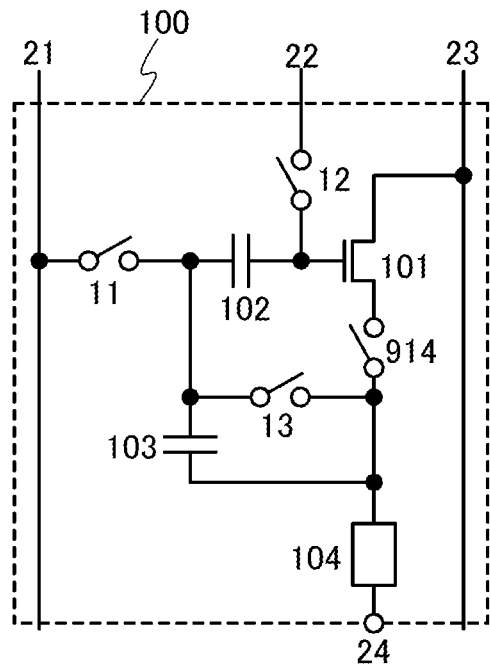
Figure 26C:
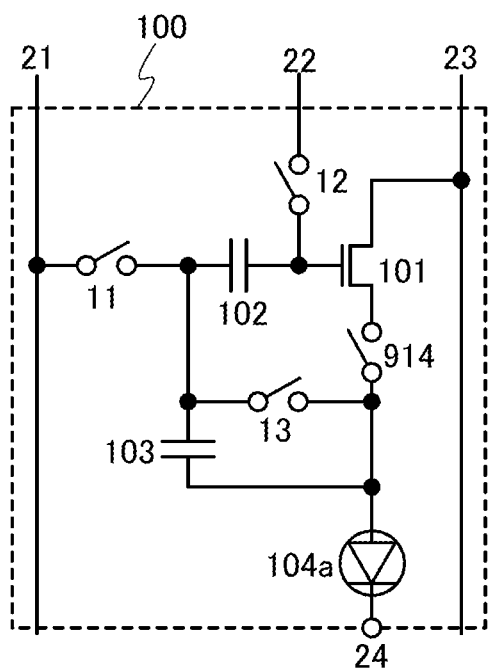
Figure 26D:
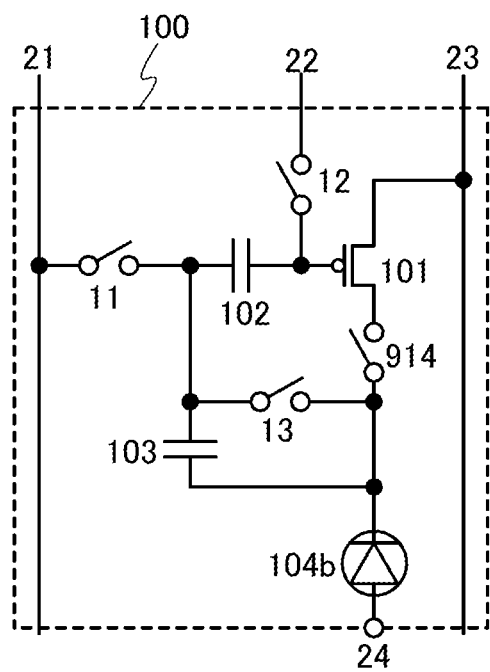
Figure 27A:
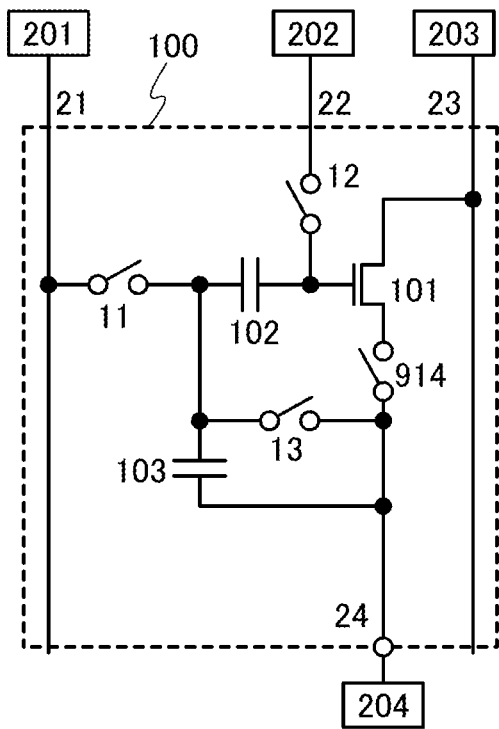
FIGS. 27A to 27D each illustrate the structure of a semiconductor device.
Figure 27B:
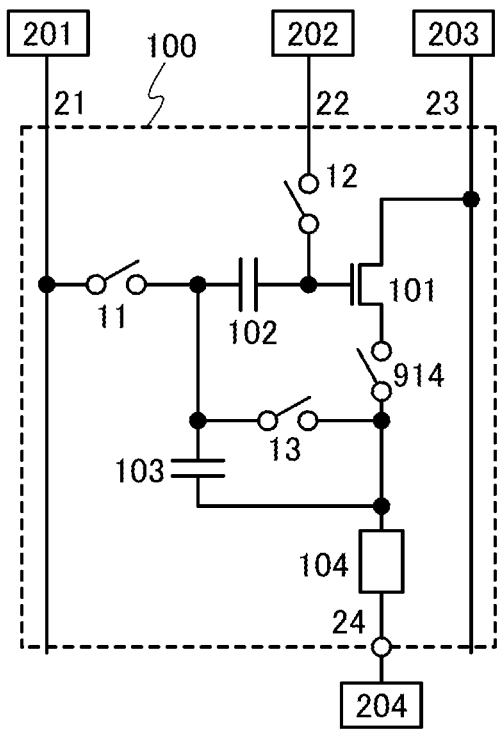

Note that the circuits 100 in FIG. 26B and FIG. 27B may each further include a capacitor 105 connected to the load 104 as in FIGS. 8A to 8D, FIGS. 9A to 9D, and FIG. 10B. Similarly, the circuits 100 in FIG. 26C and FIG. 26C may each further include a capacitor 105 connected to the light-emitting element 104*a*. Similarly, the circuits 100 in FIG. 26D and FIG. 27D may each further include a capacitor 105 connected to the light-emitting element 104*b*. Specifically, one electrode of the capacitor 105 is connected to the other electrode of the capacitor 103. Further, the switch 914 controls conduction between the one electrode of the capacitor 105 and the one of the source and the drain of the transistor 101. The other electrode of the capacitor 105 is connected to a wiring 26, 24, 23, or 22 which is additionally provided.

Figure 27C:
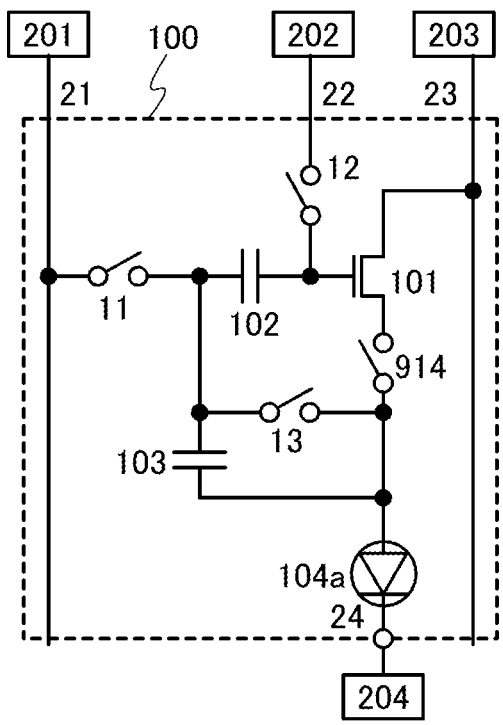
Figure 27D:
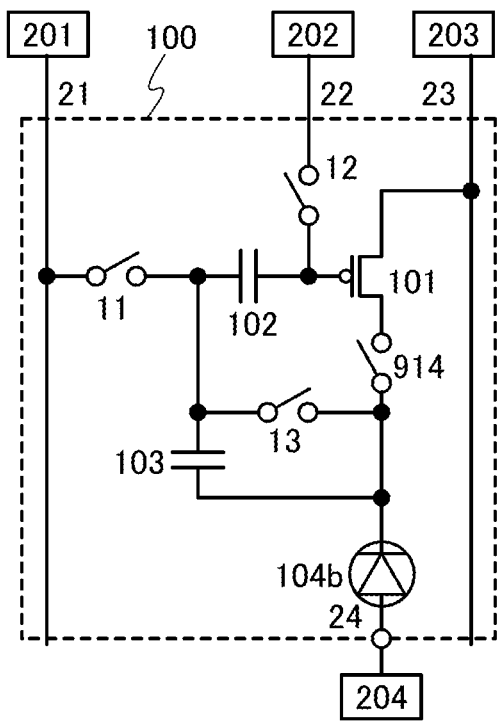

Any of the circuits 100 in FIGS. 26B to 26D and the circuits corresponding to the circuits 100 in FIGS. 27B to 27D to which the capacitor 105 is added may be used as a pixel of a display device. In the case where pixels for a plurality of hues are provided in the display device, the transistors 101 of pixels for different hues may differ in the ratio between the channel width and the channel length.

Note that the position of the switch 914 may be different from the position in FIGS. 24A to 24D, FIGS. 25A to 25D, FIGS. 26A to 26D, and FIGS. 27A to 27D. FIGS. 28A to 28D each illustrate a structure example of a circuit 100, as an example. The circuits 100 in FIGS. 28A to 28D correspond respectively to the circuits 100 in FIGS. 1A to 1D to which a switch 914 is added. The switch 914 has a function of controlling conduction between the one of a source and a drain of a transistor 101 and the other electrode of the capacitor 103. In addition, when the switch 13 is on, the switch 914 has a function of controlling conduction between the one electrode of the capacitor 103 and the other electrode of the capacitor 103, and conduction between the one electrode of the capacitor 102 and the other electrode of the capacitor 103.

A semiconductor device according to one aspect of the present invention may include, for example, any circuit that supplies a constant voltage or a signal to the circuit 100, as well as any of the circuits 100 illustrated in FIGS. 28A to 28D.

Semiconductor devices illustrated in FIGS. 29A to 29D include, in addition to the circuits 100 in FIGS. 28A to 28D, a circuit 201 having a function of supplying a constant voltage or a signal to the wiring 21, a circuit 202 having a function of supplying a constant voltage or a signal to the wiring 22, a circuit 203 having a function of supplying a constant voltage or a signal to the wiring 23, and a circuit 204 having a function of supplying a constant voltage or a signal to the wiring 24.

Note that in the circuits 100 in FIGS. 28A to 28D and FIGS. 29A to 29D, as an example, the switch 11, the switch 12, the switch 13, and the switch 914 may be transistors.

The circuits 100 in FIGS. 28A to 28D and FIGS. 29A to 29D can operate in the same way as the circuits 100 in FIGS. 1A to 1D, FIGS. 2A to 2D, FIGS. 24A to 24D, FIGS. 25A to 25D, FIGS. 26A to 26D, and FIGS. 27A to 27D. Note that, as an example, in the circuits 100 in FIGS. 28A to 28D and FIGS. 29A to 29D, the switch 914 is preferably on in the periods T11 to T13 and the period T15 shown in FIGS. 5A to 5C and FIGS. 6A to 6C, and off in the period T14. Thus, in the period T14, electric charge can be prevented from leaking into the light-emitting element 104a and the like through the transistor 101. Note that one aspect of the embodiment of the present invention is not limited thereto.

Alternatively, in the period T11, the switch 914 may be off. Thus, current does not flow into the transistor 101, facilitating control of potential.

Alternatively, the switch 914 is also turned off in a part of the period T15. This prevents current from flowing into the light-emitting element 104a and the like, thereby providing a non-lighting period.

In the period T12, the switch 914 may be turned off. Turing off the switch 914 in the period T12 makes it possible to keep the anode of the light-emitting element 104a at the potential Vi1 in the period T12. Therefore, the fourth operation in the period T14 can be performed after termination of the second operation in the period T12 without the period T13, that is, without the third operation.

Figure 28A:
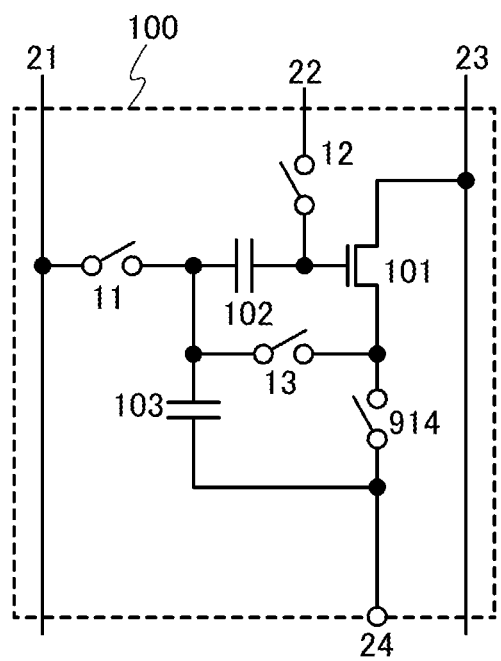
FIGS. 28A to 28D each illustrate the structure of a semiconductor device.
Figure 28B:
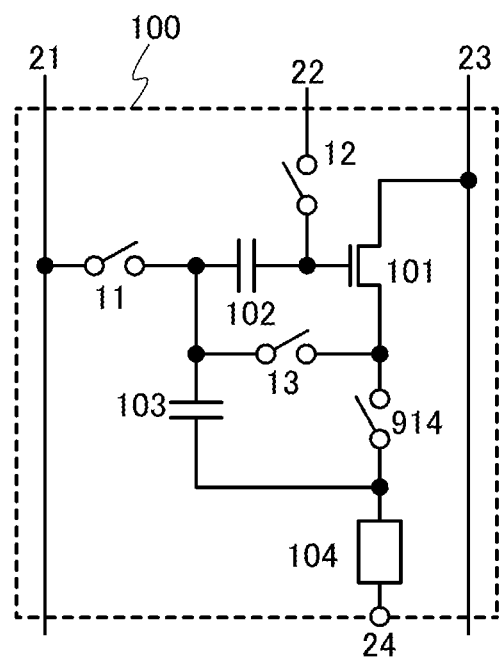
Figure 28C:
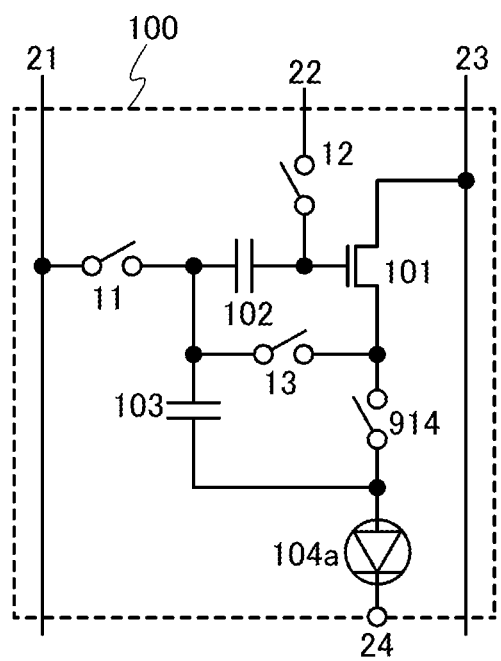
Figure 28D:
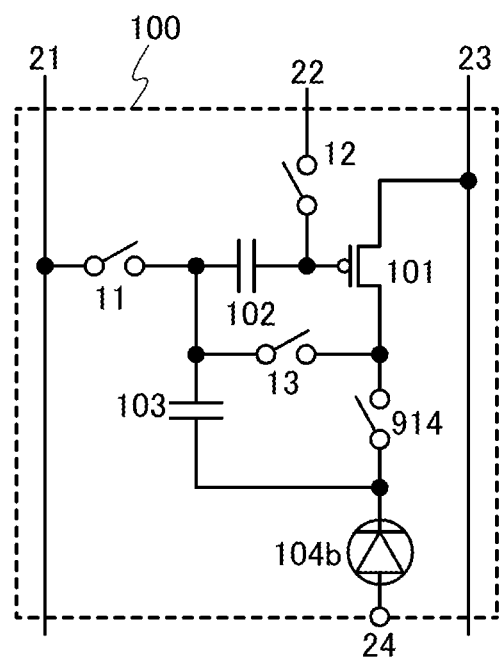
Figure 29A:
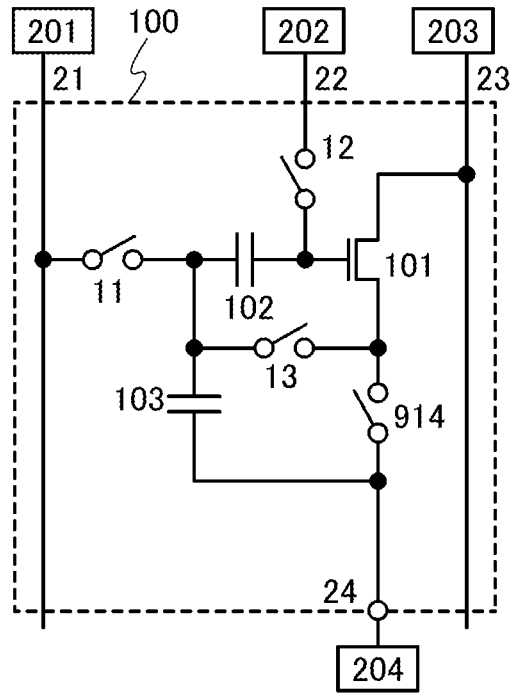
FIGS. 29A to 29D each illustrate the structure of a semiconductor device.
Figure 29B:
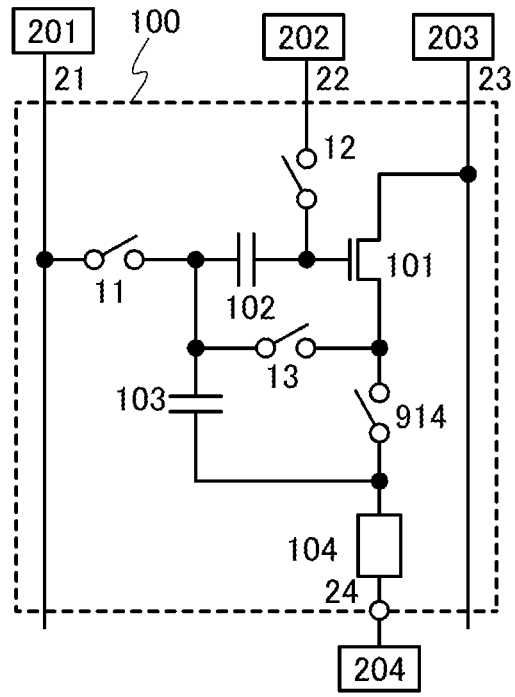

Note that the circuits 100 in FIG. 28B and FIG. 29B may each further include a capacitor 105 connected to the load 104 as in FIGS. 8A to 8D, FIGS. 9A to 9D, FIG. 10B, and the like. Similarly, the circuits 100 in FIG. 28C and FIG. 29C may each further include a capacitor 105 connected to the light-emitting element 104a. Similarly, the circuits 100 in FIG. 28D and FIG. 29D may each further include a capacitor 105 connected to the light-emitting element 104b. Specifically, one electrode of the capacitor 105 is connected to the other electrode of the capacitor 103. Further, the switch 914 controls conduction between the one electrode of the capacitor 105 and the one of a source and a drain of the transistor 101.

The other electrode of the capacitor 105 is connected to a wiring 26, 24, 23, or 22 which is additionally provided.

Figure 29C:
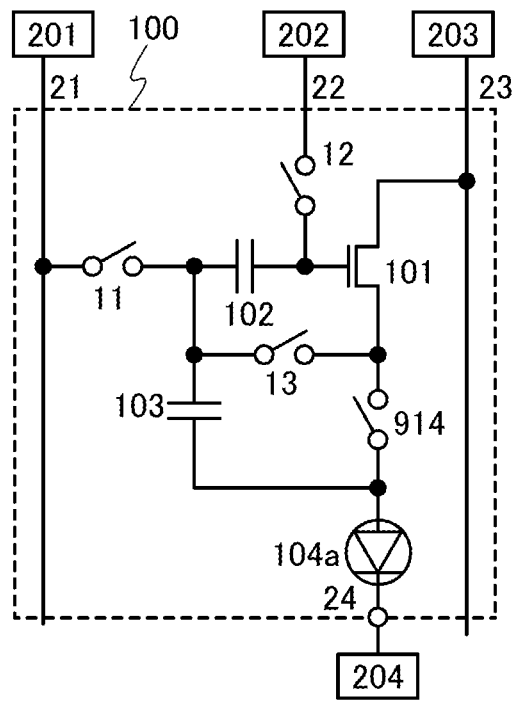
Figure 29D:
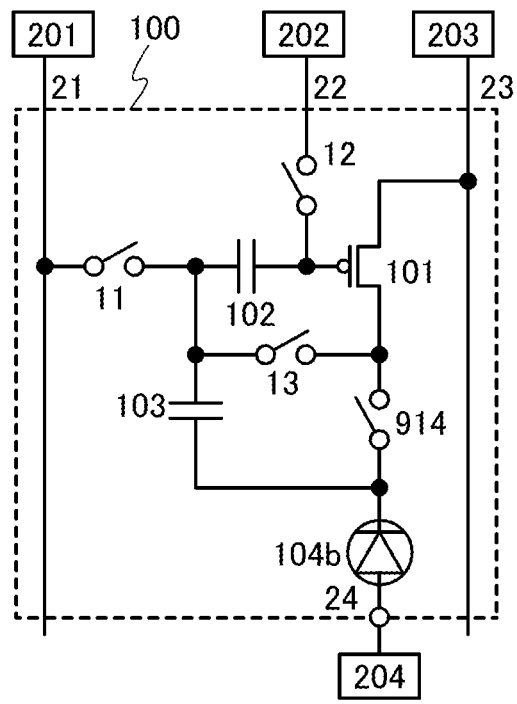

Any of the circuits 100 in FIGS. 28B to 28D and the circuits corresponding to the circuits 100 in FIGS. 29B to 29D to which the capacitor 105 is added may be used as a pixel of a display device. In the case where pixels for a plurality of hues are provided in the display device, the transistors 101 of pixels for different hues may differ in the ratio between the channel width and the channel length.

Figure 30A:
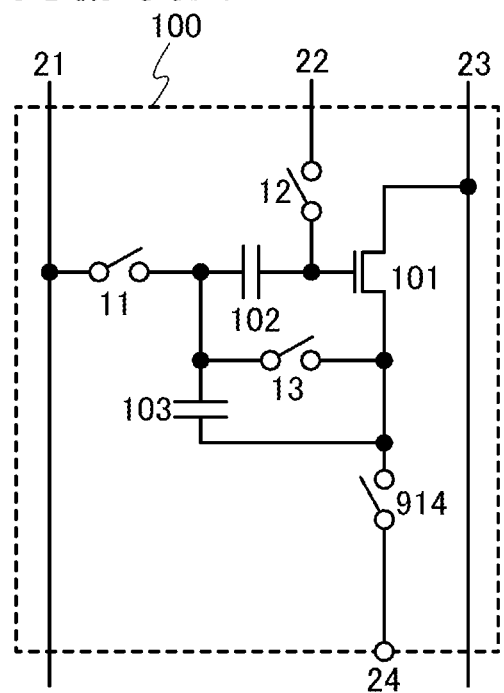
FIGS. 30A to 30D each illustrate the structure of a semiconductor device.
Figure 30B:
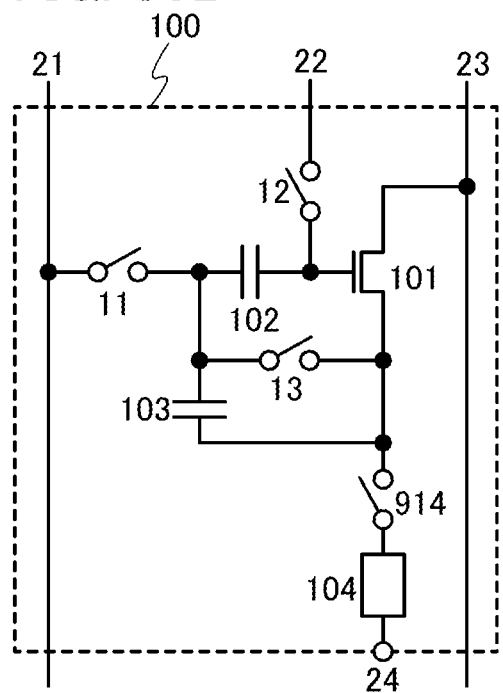
Figure 30C:
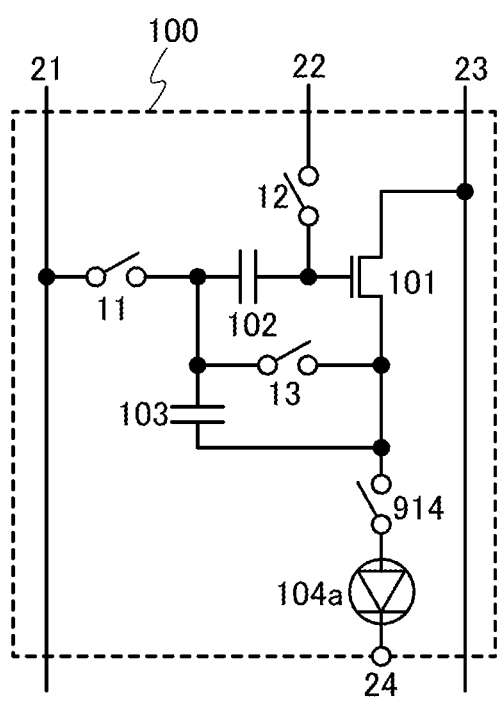
Figure 30D:
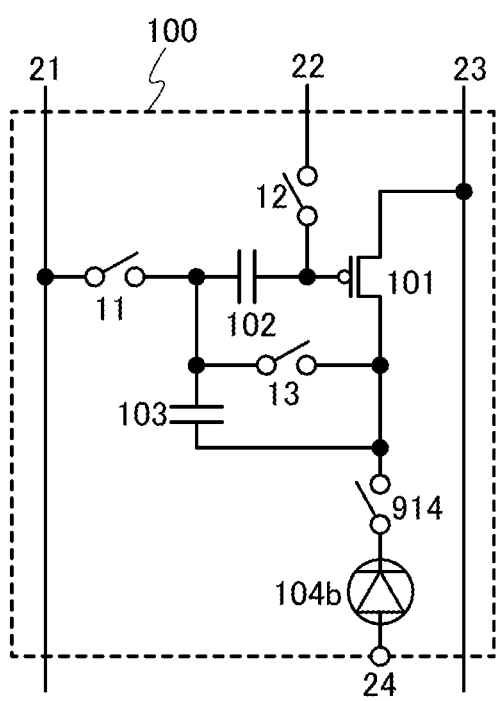

Note that the position of the switch 914 may be different from that in FIGS. 24A to 24D, FIGS. 25A to 25D, FIGS. 26A to 26D, FIGS. 27A to 27D, FIGS. 28A to 28D, and FIGS. 29A to 29D. FIGS. 30A to 30D each illustrate a structure example of a circuit 100, as an example. The circuits 100 in FIGS. 30A to 30D correspond respectively to the circuits 100 in FIGS. 1A to 1D to which a switch 914 is added. In FIG. 30A, the switch 914 has a function of controlling conduction between the one of a source and a drain of a transistor 101 and the wiring 24, and conduction between the other electrode of the capacitor 103 and the wiring 24. In FIG. 30B, the switch 914 has a function of controlling conduction between the one of a source and a drain of a transistor 101 and a load 104, and conduction between the other electrode of the capacitor 103 and the load 104. In FIG. 30C, the switch 914 has a function of controlling conduction between the one of a source and a drain of a transistor 101 and an anode of a light-emitting element 104a, and conduction between the other electrode of the capacitor 103 and the anode of the light-emitting element 104a. In FIG. 30D, the switch 914 has a function of controlling conduction between the one of a source and a drain of a transistor 101 and a cathode of a light-emitting element 104b, and conduction between the other electrode of the capacitor 103 the cathode of the light-emitting element 104b.

A semiconductor device according to one aspect of the present invention may include, for example, any circuit that supplies a constant voltage or a signal to the circuit 100, as well as any of the circuits 100 illustrated in FIGS. 30A to 30D.

Semiconductor devices illustrated in FIGS. 31A to 31D include, in addition to the circuits 100 in FIGS. 30A to 30D, a circuit 201 having a function of supplying a constant voltage or a signal to the wiring 21, a circuit 202 having a function of supplying a constant voltage or a signal to the wiring 22, a circuit 203 having a function of supplying a constant voltage or a signal to the wiring 23, and a circuit 204 having a function of supplying a constant voltage or a signal to the wiring 24.

Note that in the circuits 100 in FIGS. 30A to 30D and FIGS. 31A to 31D, as an example, the switch 11, the switch 12, the switch 13, and the switch 914 may be transistors.

The circuits 100 in FIGS. 30A to 30D and FIGS. 31A to 31D can operate in a similar way to the circuits 100 in FIGS. 1A to 1D, FIGS. 2A to 2D, FIGS. 24A to 24D, FIGS. 25A to 25D, FIGS. 26A to 26D, FIGS. 27A to 27D, FIGS. 28A to 28D, and FIGS. 29A to 29D. Note that, as an example, in the circuits 100 in FIGS. 30A to 30D and FIGS. 31A to 31D, the switch 914 is preferably on in the period T11 and the periods T13 to T15 shown in FIGS. 5A to 5C and FIGS. 6A to 6C, and off in the period T12. Note that one aspect of the embodiment of the present invention is not limited thereto. Therefore, turning off the switch 914 in the period T12 makes it possible to keep the anode of the light-emitting element 104a at the potential Vi1 in the period T12. Therefore, the fourth operation in the period T14 can be performed after termination of the second operation in the period T12 without the period T13, that is, without the third operation. Note that one aspect of the embodiment of the present invention is not limited thereto.

Alternatively, in the period T11, the switch 914 may be off. Thus, current does not flow into the light-emitting element 104a and the like, so that the potential Vi2 of the wiring 22 may be at a high value.

Alternatively, in the period T12, the switch 914 may be off. Thus, current does not flow into the light-emitting element 104a and the like, so that the potential Vi2 of the wiring 22 may be at a high value.

Alternatively, the switch 914 is also turned off in a part of the period T15. This prevents current from flowing into the light-emitting element 104a and the like, thereby providing a non-lighting period.

Figure 31A:
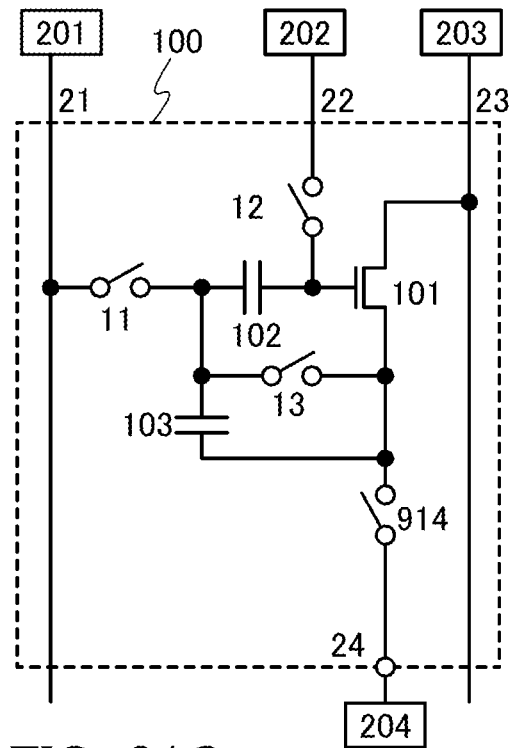
FIGS. 31A to 31D each illustrate the structure of a semiconductor device.
Figure 31B:
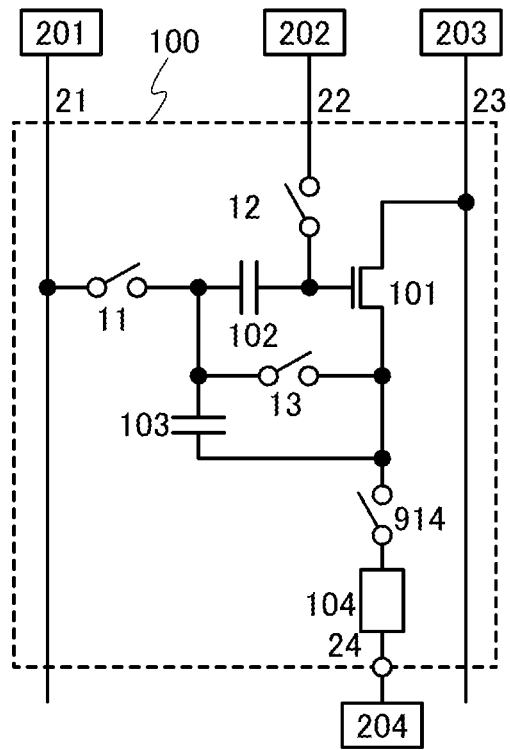

Note that the circuits 100 in FIG. 30B and FIG. 31B may each further include a capacitor 105 connected to the load 104 as in FIGS. 8A to 8D, FIGS. 9A to 9D, FIG. 10B, FIGS. 21A to 21E, and FIGS. 22A to 22E. Similarly, the circuits 100 in FIG. 30C and FIG. 31C may each further include a capacitor 105 connected to the light-emitting element 104a. Similarly, the circuits 100 in FIG. 30D and FIG. 31D may each further include a capacitor 105 connected to the light-emitting element 104b. Specifically, one electrode of the capacitor 105 is connected to the other electrode of the capacitor 103 and the one of a source and a drain of the transistor 101. The other electrode of the capacitor 105 is connected to a wiring 26, 24, 23, or 22 which is additionally provided.

Figure 31C:
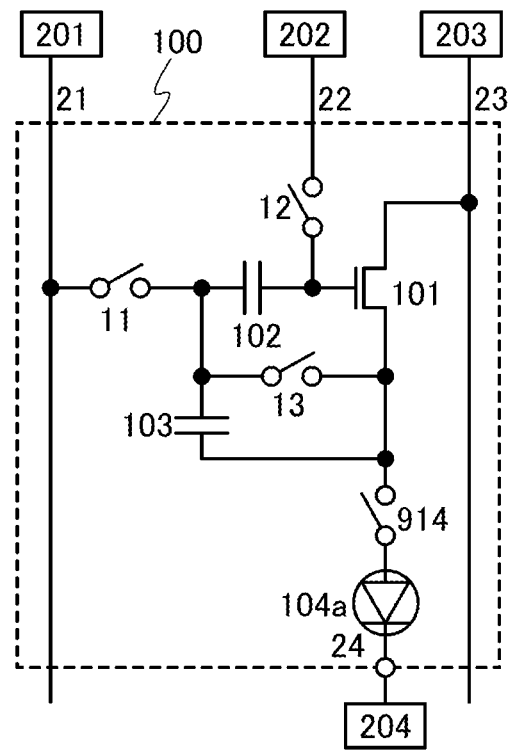
Figure 31D:
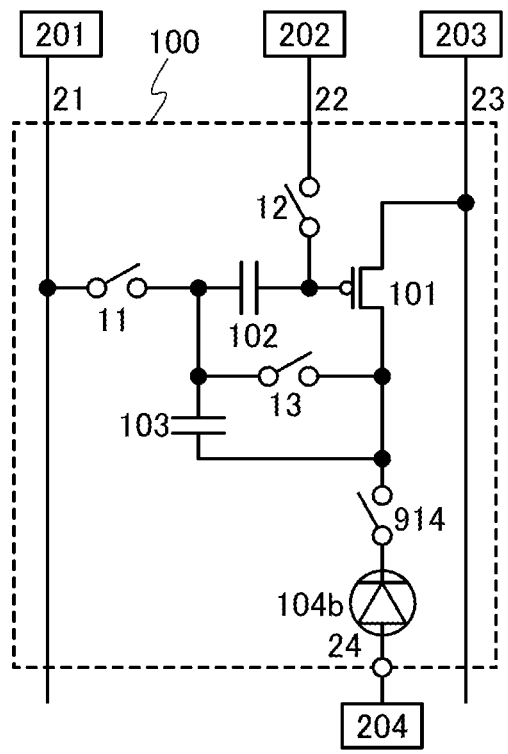

Any of the circuits 100 in FIGS. 30B to 30D and the circuits corresponding to the circuits 100 in FIGS. 31B to 31D to which the capacitor 105 is added may be used as a pixel of a display device. In the case where pixels for a plurality of hues are provided in the display device, the transistors 101 of pixels for different hues may differ in the ratio between the channel width and the channel length.

Note that FIGS. 24A to 24D, FIGS. 25A to 25D, FIGS. 26A to 26D, FIGS. 27A to 27D, FIGS. 28A to 28D, FIGS. 29A to 29D, FIGS. 30A to 30D, and FIGS. 31A to 31D illustrate circuits corresponding to the circuits in FIGS. 1A to 1D and the like, to which the switch 914 is added; however, circuits to which the switch 914 is added are not limited to those in FIGS. 1A to 1D and the like. The circuits in the figures other than FIGS. 1A to 1D may include the switch 914 like the circuits in FIGS. 24A to 24D, FIGS. 25A to 25D, FIGS. 26A to 26D, FIGS. 27A to 27D, FIGS. 28A to 28D, FIGS. 29A to 29D, FIGS. 30A to 30D, and FIGS. 31A to 31D. For example, the circuits in FIGS. 11A to 11D, to which the switch 14 is added, may additionally include the switch 914 like the circuits in FIGS. 24A to 24D, FIGS. 25A to 25D, FIGS. 26A to 26D, FIGS. 27A to 27D, FIGS. 28A to 28D, FIGS. 29A to 29D, FIGS. 30A to 30D, and FIGS. 31A to 31D. An example of such a case is illustrated in FIGS. 87A to 87D.

The following shows an example of the case where the circuits in FIGS. 1A to 1D and FIGS. 11A to 11D employ a driving method different from those shown in FIGS. 5A to 5C, FIGS. 17A to 17C, and the like. When such a driving method is employed, pixels are preferably connected to each other with a wiring 23 in the row direction rather than the column direction. FIGS. 34A to 34D illustrate an example of arrangement of the circuits 100 illustrated in FIGS. 1A to 1D. FIGS. 34A to 34D each illustrate an example of the case where a plurality of circuits 100 connected to different wirings 21 is connected to a common wiring 23. In other words, the wiring 23 intersects the wirings 21.

Figure 34A:
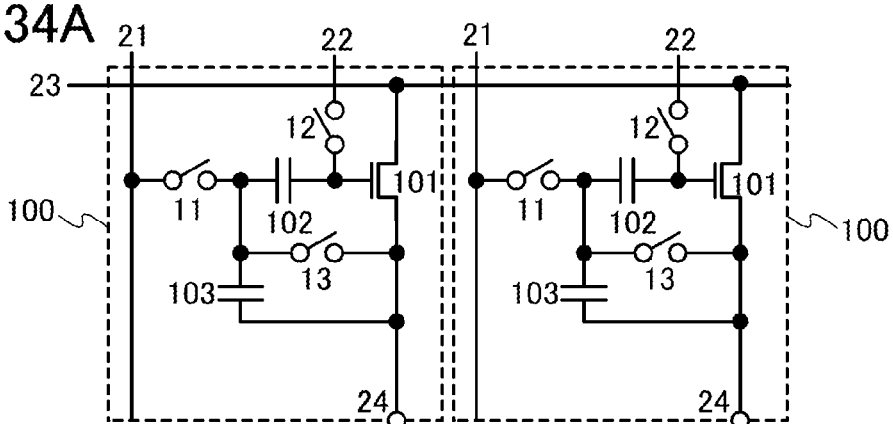
FIGS. 34A to 34D each illustrate the structure of a semiconductor device.
Figure 34B:
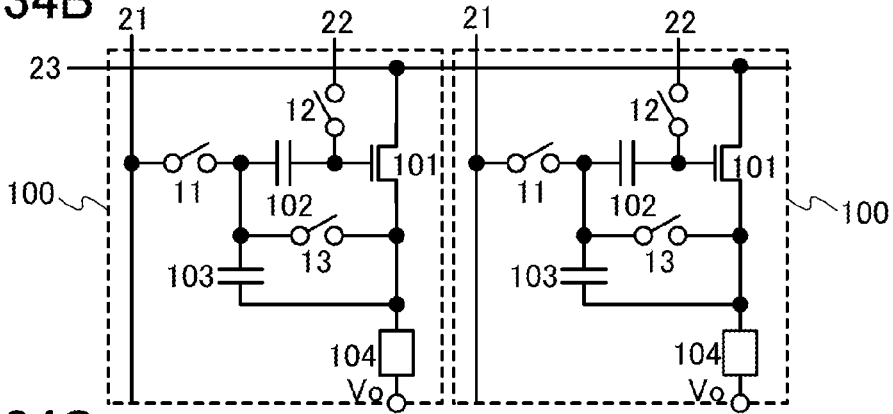
Figure 34C:
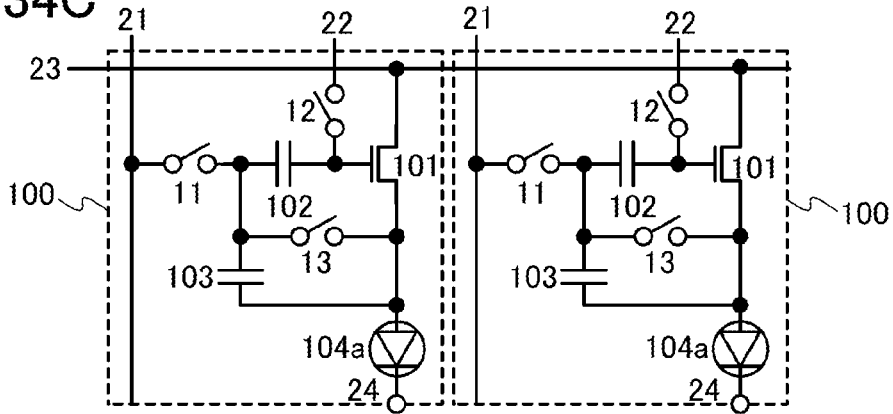
Figure 34D:
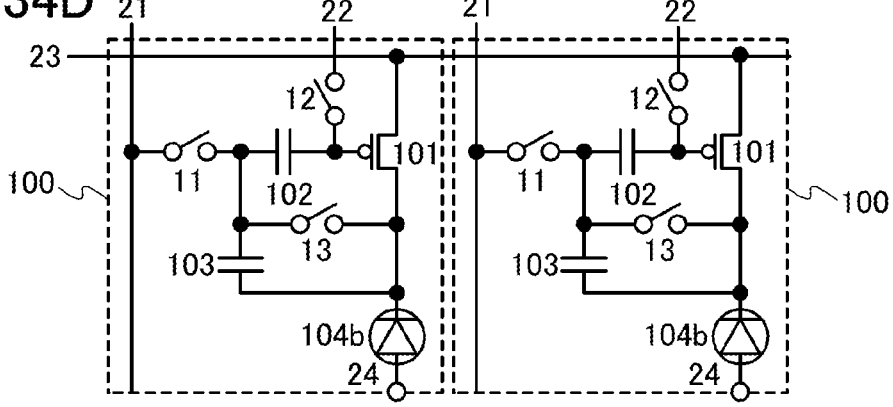

An example of operation according to one aspect of the semiconductor device of the present invention is described using the circuit 100 in FIG. 34C as an example. For this operation, in the first operation in FIG. 5B or FIG. 17B, when the voltage Vi2−Vi1 is supplied to the capacitor 102 and the gate-source voltage Vgs101 of the transistor 101 becomes the voltage Vi2−Vi1, the potential Vi1 is supplied not through the wiring 21 or the switch 14 but through the wiring 23. Therefore the description for FIGS. 5A to 5C or FIGS. 17A to 17C can apply to one aspect of the semiconductor device of the present invention.

The operation of the circuit 100 illustrated in FIG. 34C can be mainly divided into a first operation, a second operation, a third operation, a fourth operation, and a fifth operation. Note that one aspect of an embodiment of the present invention is not limited thereto, and another operation can be added or part of the operation can be omitted.

Figure 35A:
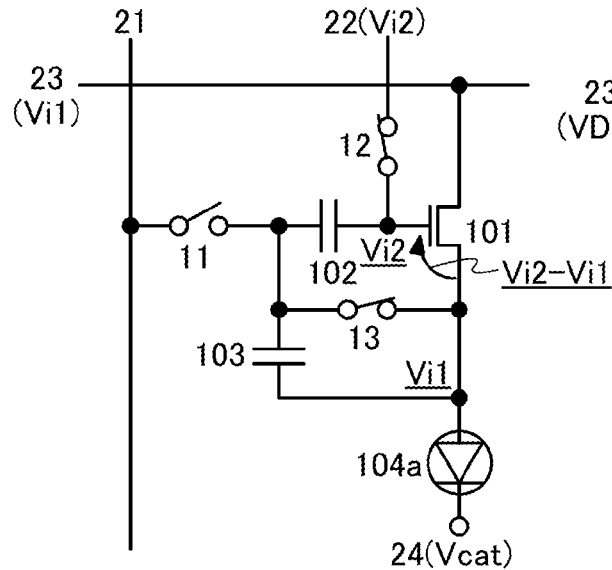
FIGS. 35A to 35D each illustrate the operation of a semiconductor device.

First, the first operation in the period T11 is described. In the period T11, as illustrated in FIG. 35A, the switch 11 is off, and the switch 12 and the switch 13 are on. Further, the potential Vi1 is supplied to the wiring 23. Thus, in the period T11, the potential of the anode of the light-emitting element 104a becomes the potential Vi1, and the gate-source voltage Vgs101 of the transistor 101 becomes the voltage Vi2−Vi1. In other words, the transistor 101 and the capacitor 102 are initialized.

Figure 35B:
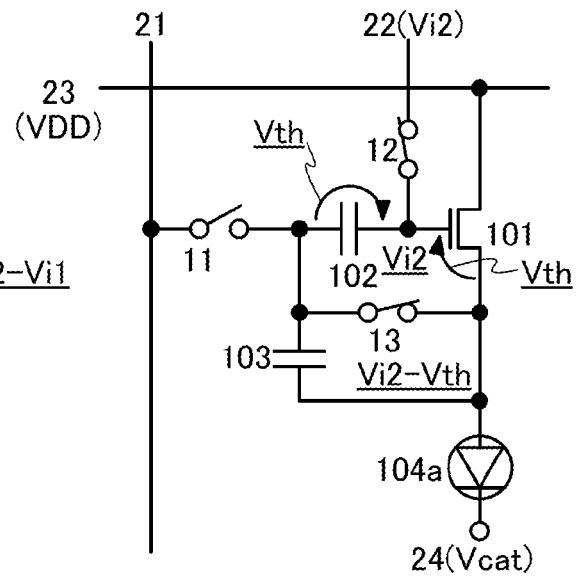

Next, the second operation in the period T12 is described. In the period T12, as illustrated in FIG. 35B, the switch 11 is off, and the switch 12 and the switch 13 are on. In addition, the potential VDD is supplied to the wiring 23. When the potential VDD is supplied to the wiring 23, electric charge accumulated in the capacitor 102 is released through the transistor 101, and the potential of the source of the transistor 101 is raised. Then, when the transistor 101 is turned off, the release of the electric charge from the capacitor 102 is stopped. The threshold voltage Vth of the transistor 101 is eventually held in the capacitor 102. Thus, in the period T12, the threshold voltage Vth is held in the capacitor 102, the potential of the anode of the light-emitting element 104a becomes the potential Vi2−Vth, and the gate-source voltage Vgs101 of the transistor 101 becomes the threshold voltage Vth. That is, the threshold voltage Vth of the transistor 101 can be acquired.

As described above, the first and second operations can be performed without the wiring 21; thus, the first and second operations can be performed for a long period. Therefore, the threshold voltage of the transistor 101 can be obtained more accurately, resulting in clear images with less unevenness.

Figure 35C:
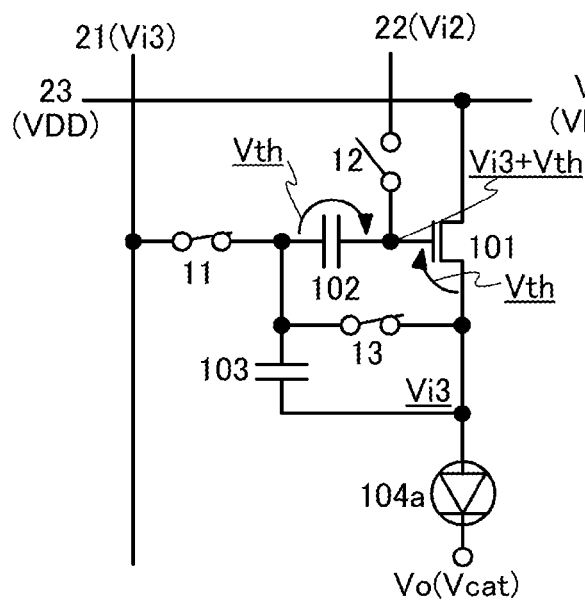

Next, the third operation in the period T13 is described. In the period T13, as illustrated in FIG. 35C, the switch 11 and the switch 13 are on, and the switch 12 is off. A predetermined potential, e.g., the potential VDD or Vi1 is supplied to the wiring 23. In addition, the potential Vi3 is supplied to the wiring 21. The potential Vi3 may be at the same level as the potential Vcat, the potential Vi2, or the potential Vi1. Thus, in the period T13, the threshold voltage Vth is held in the capacitor 102, the potential of the anode of the light-emitting element 104a becomes the potential Vi3, the potential of the gate of the transistor 101 becomes the potential Vi3+Vth, and the gate-source voltage Vgs101 of the transistor 101 becomes the voltage Vth.

Figure 35D:
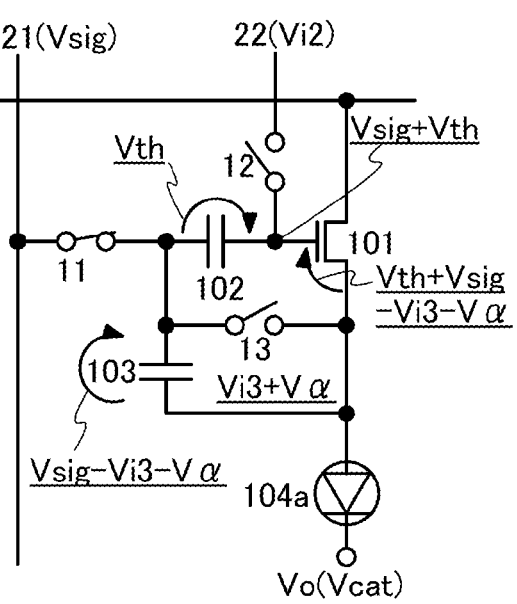

Next, the fourth operation in the period T14 is described. In the period T14, as illustrated in FIG. 35D, the switch 11 is on, and the switch 12 and the switch 13 are off. In addition, the potential Vsig is supplied to the wiring 21. Thus, in the period T14, the threshold voltage Vth is held in the capacitor 102, a voltage Vsig−Vi3−Vα is held in the capacitor 103, the potential of the anode of the light-emitting element 104a becomes a potential Vi3+Vα, the potential of the gate of the transistor 101 becomes the potential Vsig+Vth, and the gate-source voltage Vgs101 of the transistor 101 becomes a voltage Vsig+Vth−Vi3−Vα.

Figure 36:
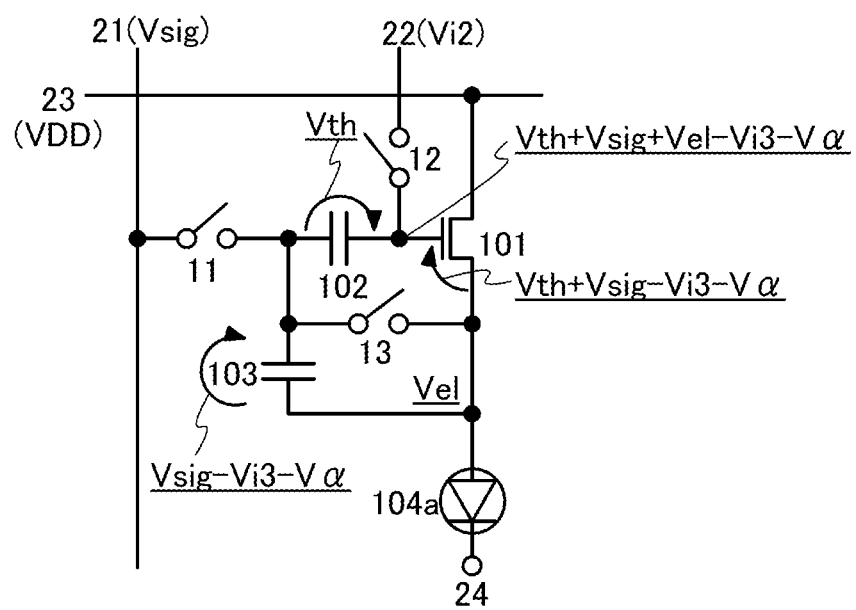
FIG. 36 illustrates the operation of a semiconductor device.

The fifth operation in the period T15 is described. In the period T15, as illustrated in FIG. 36, the switch 11, the switch 12, and the switch 13 are off. Thus, in the period T15, the threshold voltage Vth is held in the capacitor 102, the voltage Vsig−Vi3−Vα is held in the capacitor 103, the potential of the anode of the light-emitting element 104a becomes the potential Ve1, the potential of the gate of the transistor 101 becomes the potential Vsig+Vth−Vi3−Vα+Ve1 and the gate-source voltage Vgs101 of the transistor 101 becomes the voltage Vsig+Vth−Vi3−Vα. Thus, current based on the potential Vsig can flow to the light-emitting element 104a, so that the light-emitting element 104a can emit light at luminance based on the potential Vsig.

Note that the potential Ve1 occurs when current is fed to the light-emitting element 104a through the transistor 101. Specifically, the potential Ve1 is between the potential VDD and the potential Vcat.

In the fifth operation, the gate-source voltage Vgs101 of the transistor 101 can be set to the voltage Vsig+Vth−Vi3−Vα by taking the threshold voltage Vth of the transistor 101 into consideration. Consequently, variations in threshold voltage Vth between the transistors 101 can be prevented from adversely affecting the value of a current supplied to the light-emitting elements 104a. Alternatively, even if the transistor 101 deteriorates and the threshold voltage Vth is changed, the change in the threshold voltage Vth can be prevented from adversely affecting the value of a current supplied to the light-emitting element 104a. Therefore, high-quality images with less unevenness can be displayed.

Also in a part of the period T15, the potential of the wiring 23 may be controlled to prevent current from flowing into the light-emitting element 104a and the like, thereby providing a non-lighting period. For example, when the potential of the wiring 23 is equal to the potential of the wiring 24, current can be prevented from flowing.

Note that a switch 14 is not provided in the circuits in FIGS. 34A to 34D and FIGS. 35A to 35D, but the present invention is not limited thereto; a switch 14 may be provided in the circuits in FIGS. 34A to 34D and FIGS. 35A to 35D similarly to the circuits illustrated in FIGS. 11A to 16D, 17B to 18B, and 20B to 23B.

Note that a switch 914 is not provided in the circuits in FIGS. 34A to 34D and FIGS. 35A to 35D, but the present invention is not limited thereto; a switch 914 may be provided in the circuits in FIGS. 34A to 34D and FIGS. 35A to 35D similarly to the circuits illustrated in FIGS. 24A to 31D, 46A to 52D, 57A to 57D, 63B to 63D, 64B to 65A, 66A, 67A, 67C, 68A, 68C, 73A to 73D, and 87A to 87D.

In FIGS. 34A to 34D and FIGS. 35A to 35D, operation is performed by changing the potential of the wiring 23; however, operation can also be performed by controlling the potentials of a plurality of wirings. An example of such a case will be described. The description for FIGS. 34A to 34D, FIGS. 35A to 35D, FIGS. 5A to 5C, and FIGS. 17A to 17C can apply to one aspect of the semiconductor device of the present invention. FIGS. 32A to 32D each illustrate a structure example of a circuit 100. The circuits 100 in FIGS. 32A to 32D correspond to the circuits 100 in FIGS. 1A to 1D or FIGS. 34A to 34D, FIGS. 35A to 35D, and FIG. 36, to which a switch 814 and a switch 15 are added and which include a wiring 23a and a wiring 23b instead of the wiring 23. In FIGS. 32A to 32D, the switch 814 has a function of controlling conduction between the other of the source and the drain of a transistor 101 and the wiring 23a. Further, the switch 15 has a function of controlling conduction between the other of the source and the drain of a transistor 101 and the wiring 23b.

Note that the wiring 23a and/or the wiring 23b can be provided so as to intersect with the wiring 21 or provided in parallel to the wiring 21.

A semiconductor device according to one aspect of the present invention may include, for example, any circuit that supplies a constant voltage or a signal to the circuit 100, as well as any of the circuits 100 illustrated in FIGS. 32A to 32D.

Semiconductor devices illustrated in FIGS. 33A to 33D include, in addition to the circuits 100 in FIGS. 32A to 32D, a circuit 201 having a function of supplying a constant voltage or a signal to the wiring 21, a circuit 202 having a function of supplying a constant voltage or a signal to the wiring 22, a circuit 203a having a function of supplying a constant voltage or a signal to the wiring 23a, a circuit 203b having a function of supplying a constant voltage or a signal to the wiring 23b, and a circuit 204 having a function of supplying a constant voltage or a signal to the wiring 24. Specifically, the circuit 203a has a function of supplying the potential Vi1 to the wiring 23a. The circuit 203b has a function of supplying, for example, a supply voltage (a high supply potential or a low supply potential), e.g., the potential VDD or the potential VSS to the wiring 23b. Examples of the circuits 203a and 203b are power supply circuits.

Accordingly, the wiring 23a has a function of transmitting or supplying the potential Vi1. Alternatively, the wiring 23a functions as an initialization line. Note that the potential of the wiring 23a is preferably constant; however, one aspect of the embodiment of the present invention is not limited thereto. The potential of the wiring 23a may vary like a pulse signal.

Accordingly, the wiring 23b has a function of transmitting or supplying a power supply potential. Alternatively, the wiring 23b has a function of supplying current to the transistor 101. Alternatively, the wiring 23b has a function of supplying current to the load 104. The wiring 23b functions as a power supply line. Alternatively, the wiring 23b functions as a current supply line. Note that the potential of the wiring 23b is preferably constant; however, one aspect of the embodiment of the present invention is not limited thereto. The potential of the wiring 23b may vary like a pulse signal. For example, the potential of the wiring 23b may be a potential at which not only forward bias voltage but also reverse bias voltage is applied to the load 104.

Note that in FIGS. 33A to 33D, the semiconductor devices each include, in addition to the circuit 100, the circuits 201, 202, 203a, 203b, and 204, as an example. However, a semiconductor device according to one aspect of the present invention does not necessarily include all of the circuits 201, 202, 203a, 203b, and 204, and may include only one or some of these circuits.

Note that in the circuits 100 in FIGS. 32A to 32D and FIGS. 33A to 33D, as an example, the switch 11, the switch 12, the switch 13, the switch 814, and the switch 15 may be transistors.

The circuits 100 in FIGS. 32A to 32D and FIGS. 33A to 33D can operate in a similar way to the circuits 100 in FIGS. 34A to 34D, FIGS. 35A to 35D, and FIG. 36. Note that in the case of the circuits 100 in FIGS. 32A to 32D and FIGS. 33A to 33D, the switch 814 is on and the switch 15 is off in the period T11. Further, the switch 814 is off and the switch 15 is on in the periods T12 to T15.

Figure 32A:
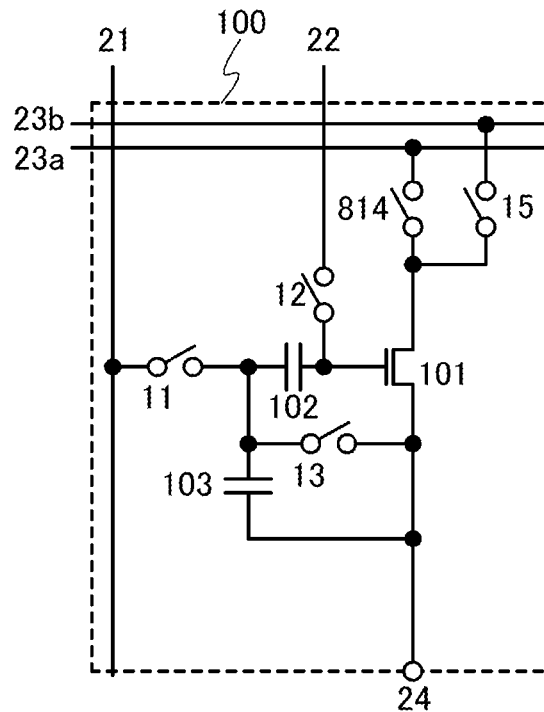
FIGS. 32A to 32D each illustrate the structure of a semiconductor device.
Figure 32B:
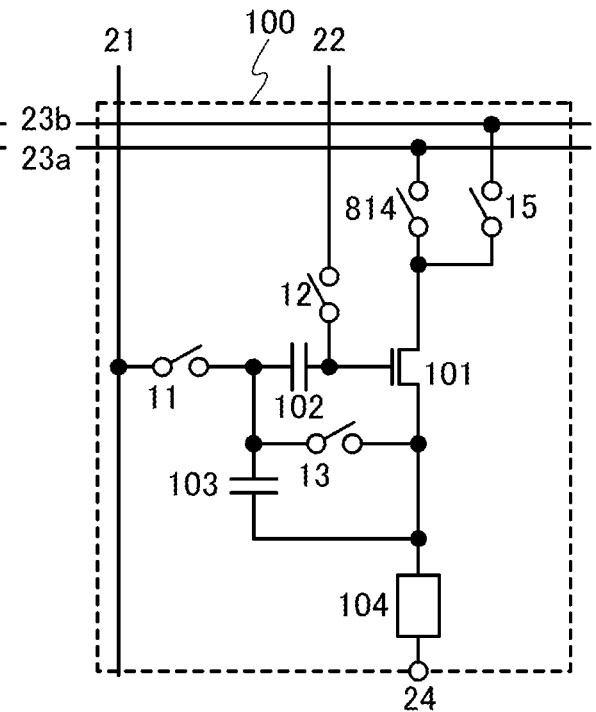
Figure 32C:
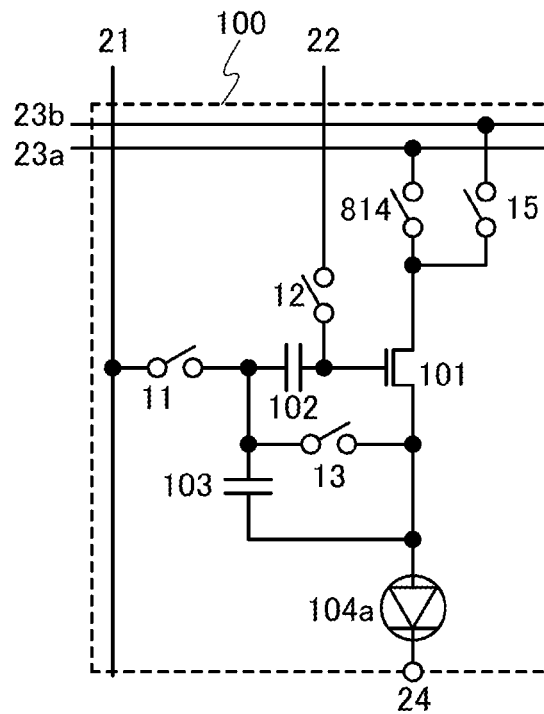
Figure 32D:
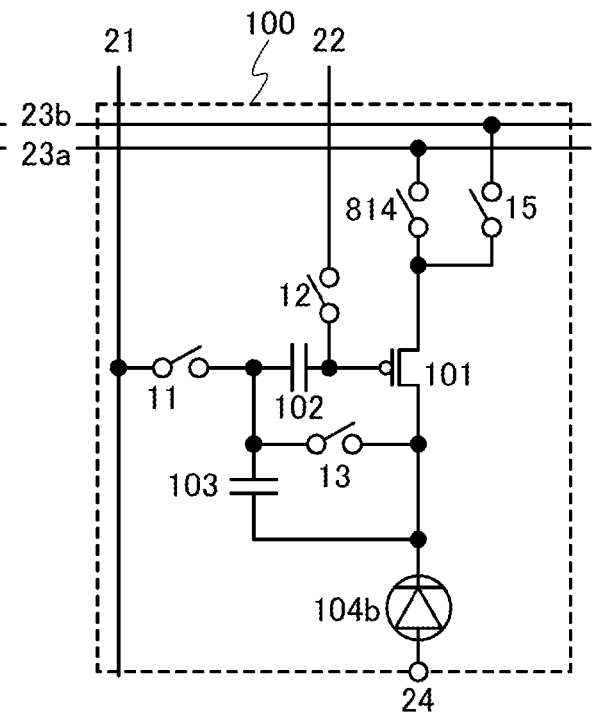
Figure 33A:
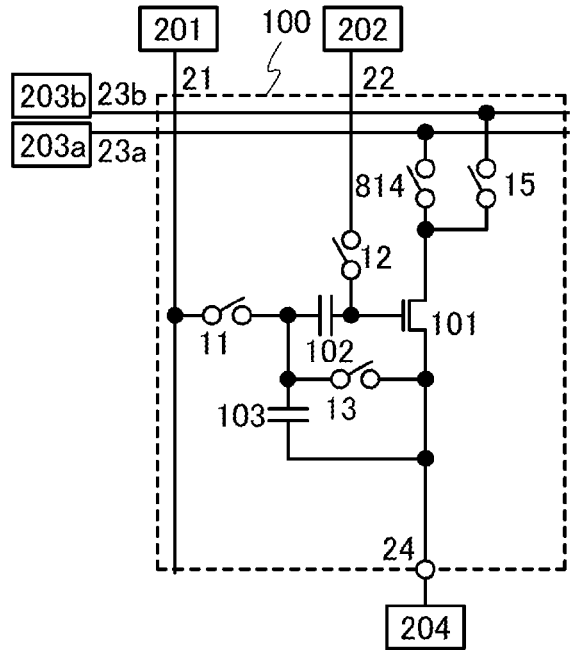
FIGS. 33A to 33D each illustrate the structure of a semiconductor device.
Figure 33B:
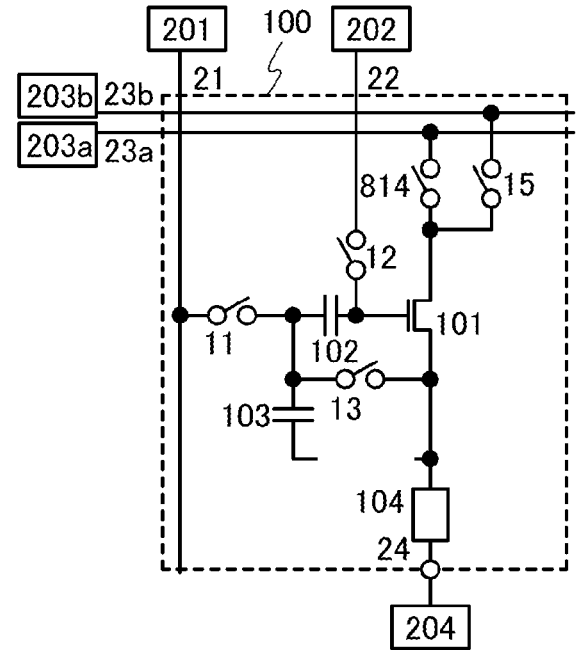

Note that the circuits 100 in FIG. 32B and FIG. 33B may each further include a capacitor 105 connected to the load 104 as in FIGS. 8A to 8D, FIGS. 9A to 9D, FIGS. 10A and 10B, FIGS. 21A to 21E, and FIGS. 22A to 22E. Similarly, the circuits 100 in FIG. 32C and FIG. 33C may each further include a capacitor 105 connected to the light-emitting element 104a. Similarly, the circuits 100 in FIG. 32D and FIG. 33D may each further include a capacitor 105 connected to the light-emitting element 104b. Specifically, one electrode of the capacitor 105 is connected to the other electrode of the capacitor 103 and the one of a source and a drain of the transistor 101. The other electrode of the capacitor 105 is connected to a wiring 26, 24, 23, or 22 which is additionally provided.

Figure 33C:
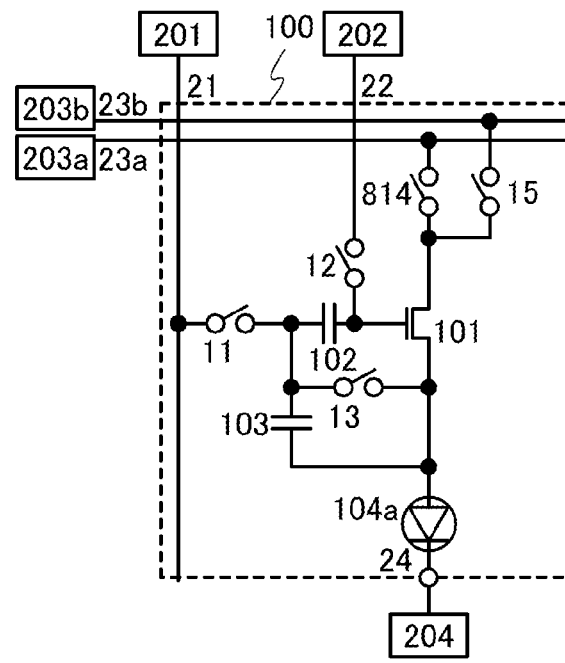
Figure 33D:
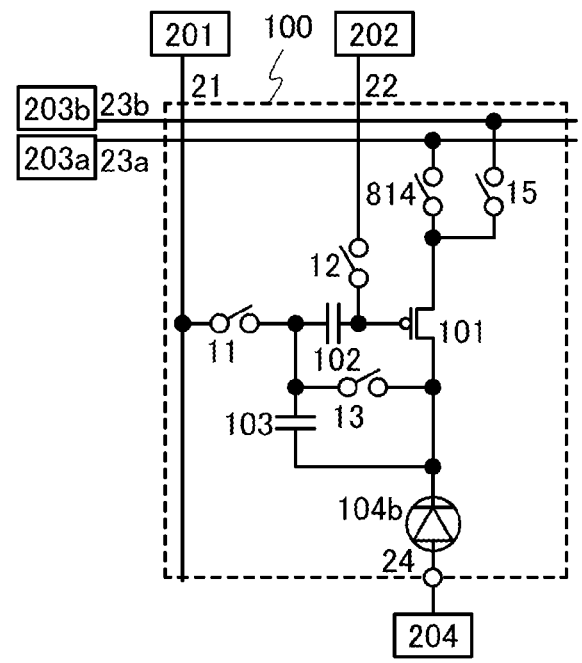

Any of the circuits 100 in FIGS. 32B to 32D and the circuits corresponding to the circuits 100 in FIGS. 33B to 33D to which the capacitor 105 is added may be used as a pixel of a display device. In the case where pixels for a plurality of hues are provided in the display device, the transistors 101 of pixels for different hues may differ in the ratio between the channel width and the channel length.

Note that a switch 14 is not provided in the circuits in FIGS. 32A to 32D and FIGS. 33A to 33D, but the present invention is not limited thereto; a switch 14 may be provided in the circuits in FIGS. 34A to 34D and FIGS. 35A to 35D as those in FIGS. 11A to 16D, 17B to 18B, and 20B to 23B.

Note that a switch 914 is not provided in the circuits in FIGS. 32A to 32D and FIGS. 33A to 33D, but the present invention is not limited thereto; a switch 914 may be provided in the circuits in FIGS. 32A to 32D and FIGS. 33A to 33D as those in FIGS. 24A to 31D, 46A to 52D, 57A to 57D, 63B to 63D, 64B to 65A, 66A, 67A, 67C, 68A, 68C, 73A to 73D, and 87A to 87D.

This embodiment is obtained by performing change, addition, modification, removal, application, superordinate conceptualization, or subordinate conceptualization on part or all of another embodiment. Thus, part or all of this embodiment can be freely combined with, applied to, or replaced with part or all of another embodiment.

(Embodiment 3)

In this embodiment, structure examples of the circuit 100 that is a semiconductor device according to one aspect of the present invention are described. In this embodiment, a switch or a wiring is added, connection is partly changed, a wiring is connected to a different wiring to be merged into one wiring, or a driving method is partly changed in the circuit described in Embodiments 1 and 2, for example. Thus, the contents described in Embodiments 1 and 2 can also be applied to this embodiment.

Figure 43A:
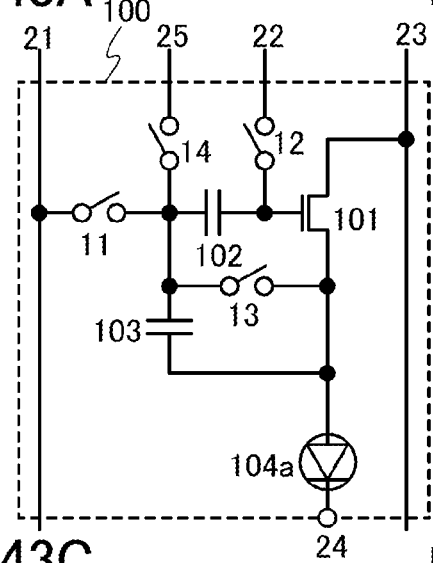
FIGS. 43A to 43F each illustrate the structure of a semiconductor device.

The structure of the circuit 100 in FIG. 43A corresponds to a structure where the position of the switch 14 is different from that in the circuit 100 in FIG. 11C or a structure where the switch 14 is added to the circuit 100 in FIG. 1C. In the circuit 100 in FIG. 43A, the switch 14 has a function of controlling conduction between one electrode of the capacitor 102 or 103 and the wiring 25.

Note that operations are similar to the operations in FIGS. 17A to 17C, FIGS. 18A and 18B, FIGS. 19A to 19D, and FIGS. 20A and 20B. In FIG. 18A, the switch 14 is on in the fourth operation; however, in FIG. 43A, the switch 14 is preferably off in the fourth operation. Note that one aspect of the embodiment of the present invention is not limited thereto.

Figure 43B:
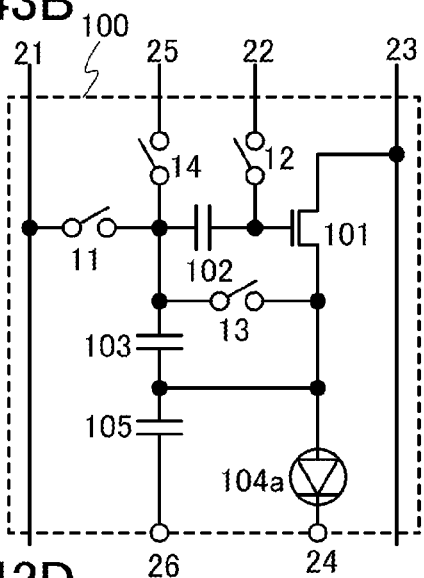
Figure 43C:
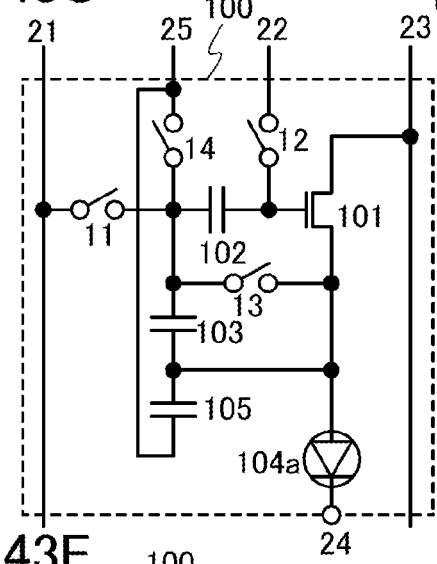

Note that in FIG. 43A, the switch 914 can be provided as in FIGS. 24A to 24D, FIGS. 25A to 25D, FIGS. 26A to 26D, FIGS. 27A to 27D, FIGS. 28A to 28D, FIGS. 29A to 29D, FIGS. 30A to 30D, FIGS. 31A to 31D, and the like. In FIG. 43A, the switch 814 and the switch 15 can be provided as in FIGS. 32A to 32D, FIGS. 33A to 33D, and the like. In FIG. 43A, the potential of the wiring 23 can be controlled as in FIGS. 34A to 34D and the like. FIG. 43F illustrates an example in which the switch 914 is provided in FIG. 43A as in FIGS. 30A to 30D.

As in FIGS. 8A to 8D, FIGS. 9A to 9D, FIGS. 21A to 21E, FIGS. 22A to 22E, and the like, the capacitor 105 can be added to the circuit 100 in FIG. 43A. For example, the structure of the circuit 100 in FIG. 43B corresponds to a structure where the capacitor 105 is added to the circuit 100 in FIG. 43A. One electrode of the capacitor 105 is connected to the other electrode of the capacitor 103. The other electrode of the capacitor 105 is connected to the wiring 26.

Note that as in FIGS. 8A to 8D, FIGS. 21A to 21E, and the like, the wiring 26 can be connected to a variety of wirings. The circuit 100 in FIG. 43C is an example in which the wiring 26 is connected to the wiring 25 in the circuit 100 in FIG. 43B. The wiring 26 can be connected to a variety of wirings, for example, the wiring 24, the wiring 22, the wiring 23, the gate signal line, or a wiring of another circuit 100 instead of the wiring 25.

Note that the wiring 25 can be connected to a variety of wirings. The circuit 100 in FIG. 43D is an example in which the wiring 25 is connected to the wiring 24 in the circuit 100 in FIG. 43A.

Figure 43D:
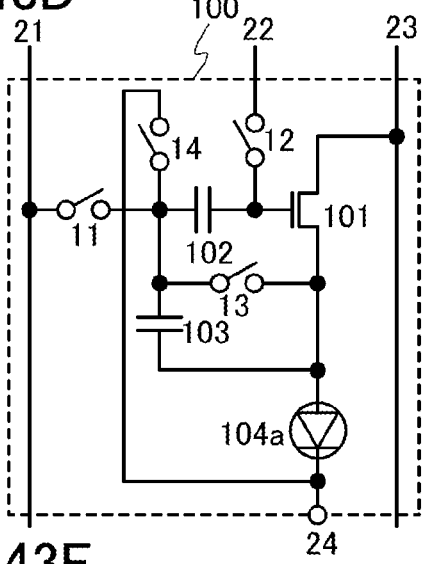
Figure 43E:
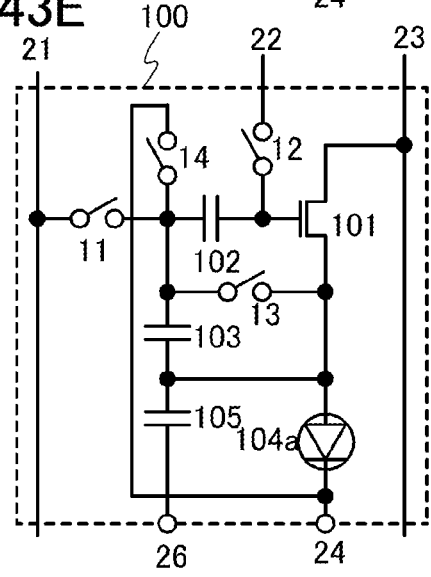
Figure 43F:
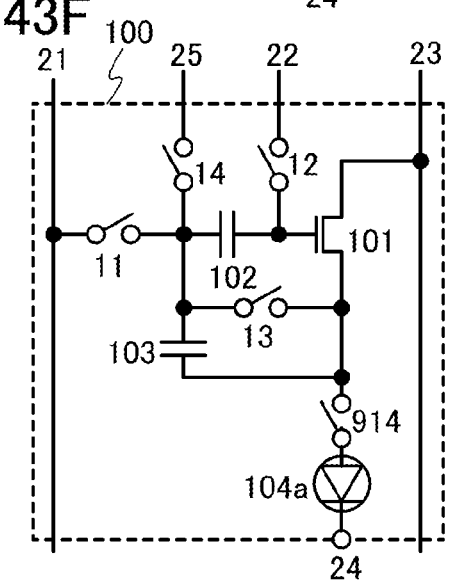
Figure 44A:
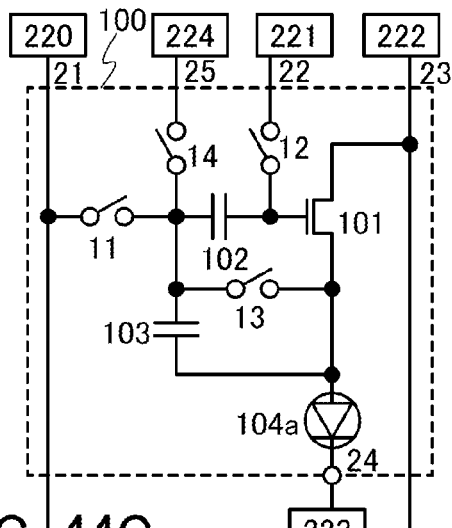
FIGS. 44A to 44F each illustrate the structure of a semiconductor device.
Figure 44B:
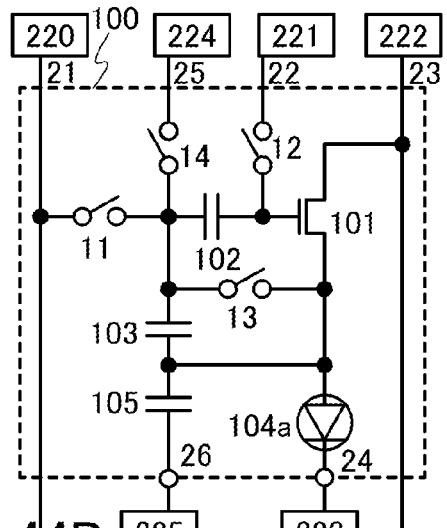
Figure 44C:
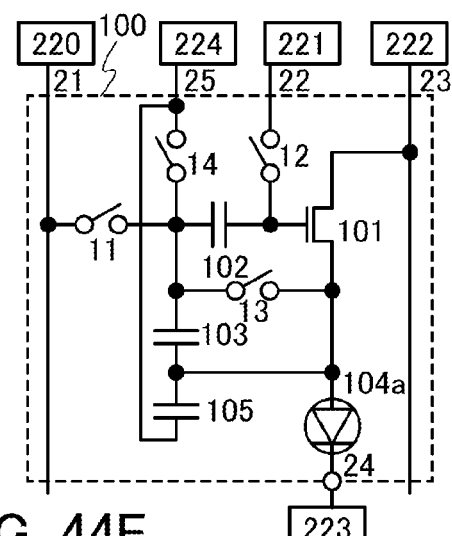
Figure 44D:
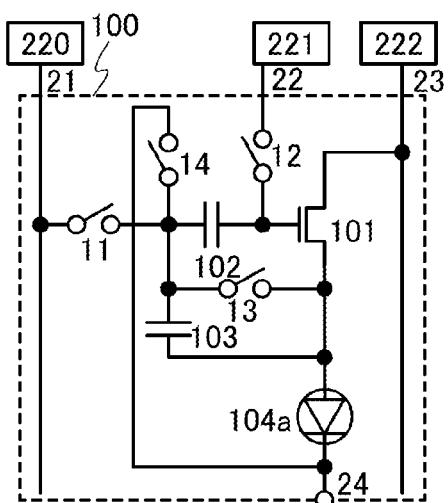
Figure 44E:
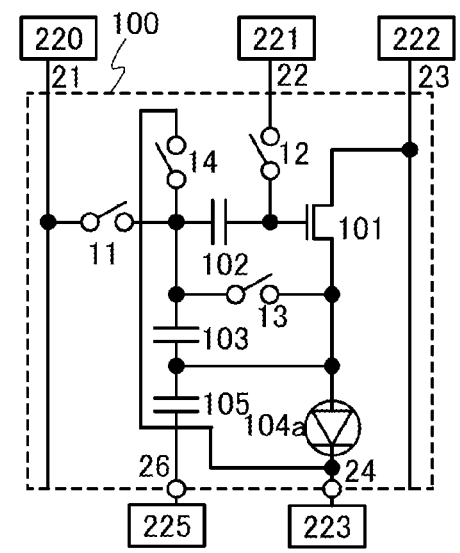
Figure 44F:
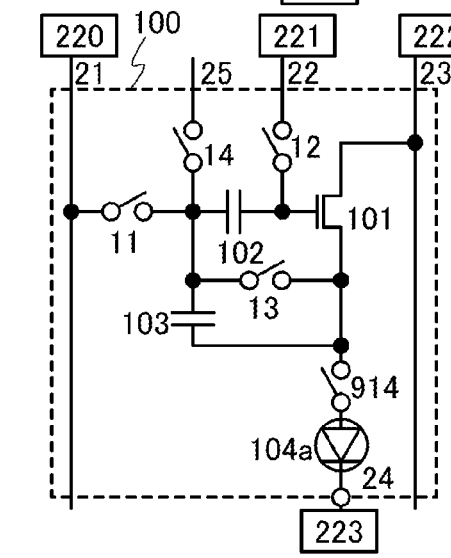

The structure of the circuit 100 in FIG. 43E corresponds to a structure where the capacitor 105 is added to the circuit 100 in FIG. 43D. One electrode of the capacitor 105 is connected to the other electrode of the capacitor 103. The other electrode of the capacitor 105 is connected to the wiring 26.

Semiconductor devices in FIGS. 44A to 44F include the circuit 220 having a function of supplying a constant voltage or a signal to the wiring 21, the circuit 221 having a function of supplying a constant voltage or a signal to the wiring 22, the circuit 222 having a function of supplying a constant voltage or a signal to the wiring 23, the circuit 223 having a function of supplying a constant voltage or a signal to the wiring 24, the circuit 224 having a function of supplying a constant voltage or a signal to the wiring 25, and the circuit 225 having a function of supplying a constant voltage or a signal to the wiring 26, in addition to the circuits 100 in FIGS. 43A to 43F.

Note that FIGS. 43A to 43F and FIGS. 44A to 44F each illustrate the structure of the circuit 100 using the light-emitting element 104a. However, the semiconductor device according to one aspect of the present invention may have a structure where the light-emitting element 104a is not provided or the load 104 or the light-emitting element 104b is provided instead of the light-emitting element 104a in the circuit 100 in each of FIGS. 43A to 43F and FIGS. 44A to 44F.

Note that as in FIG. 43D, the wiring 25 can be connected to a variety of wirings as in FIGS. 11A to 11D or the like. The circuit 100 in FIG. 45A is an example in which the wiring 25 is connected to the wiring 24 in the circuit 100 in FIG. 11C.

Figure 45A:
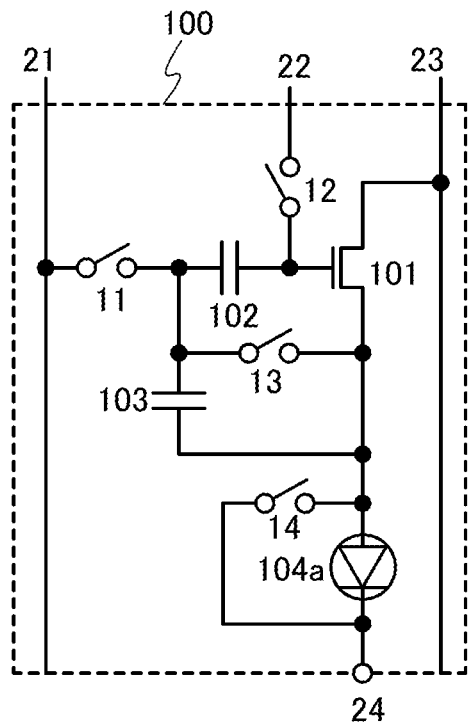
FIGS. 45A to 45D each illustrate the structure of a semiconductor device.

As in FIGS. 8A to 8D, FIGS. 9A to 9D, FIGS. 21A to 21E, FIGS. 22A to 22E, and the like, the capacitor 105 can be added or a wiring can be connected to the circuit 100 in FIG. 45A. For example, the structure of the circuit 100 in FIG. 45B corresponds to a structure where the capacitor 105 is added to the circuit 100 in FIG. 45A. One electrode of the capacitor 105 is connected to the other electrode of the capacitor 103. The other electrode of the capacitor 105 is connected to the wiring 26. Note that the wiring 25 can be connected not to the wiring 24 but to the wiring 26. Alternatively, the wiring 26 and the wiring 25 can be connected to the wiring 24.

Figure 45B:
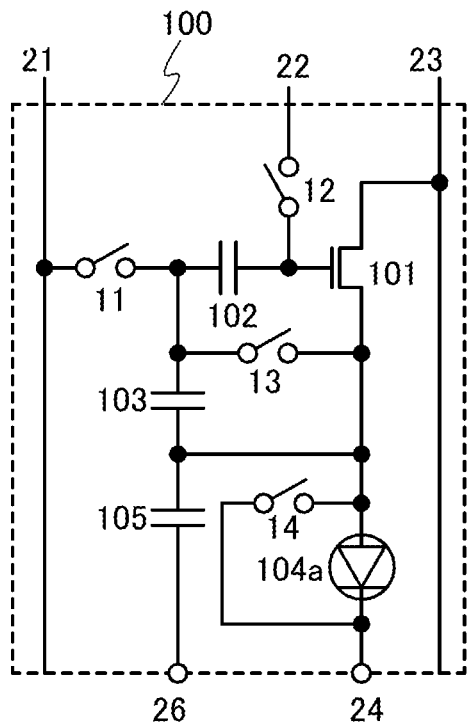
Figure 45C:
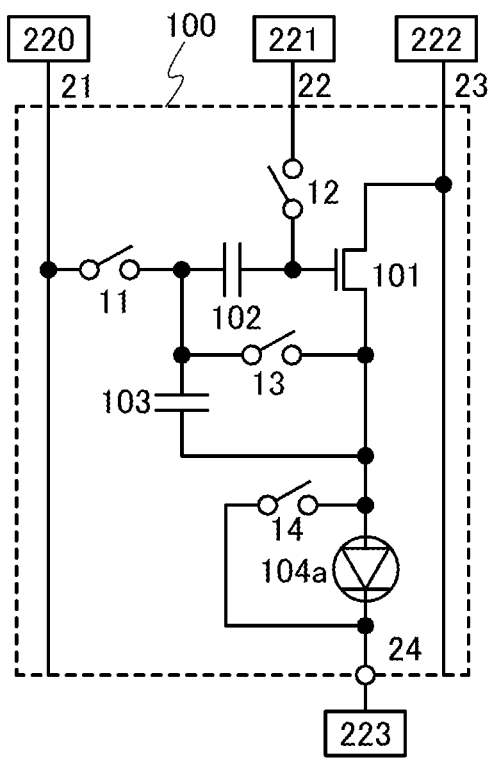
Figure 45D:
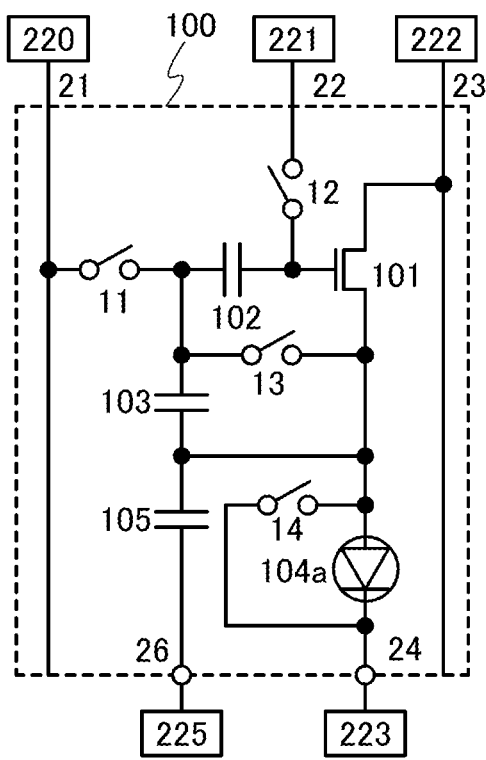

Semiconductor devices in FIGS. 45C and 45D include more than one of the circuit 220 having a function of supplying a constant voltage or a signal to the wiring 21, the circuit 221 having a function of supplying a constant voltage or a signal to the wiring 22, the circuit 222 having a function of supplying a constant voltage or a signal to the wiring 23, the circuit 223 having a function of supplying a constant voltage or a signal to the wiring 24, and the circuit 225 having a function of supplying a constant voltage or a signal to the wiring 26, in addition to the circuits 100 in FIGS. 45A and 45B.

Note that FIGS. 45A to 45D each illustrate the structure of the circuit 100 using the light-emitting element 104a. However, the semiconductor device according to one aspect of the present invention may have a structure where the light-emitting element 104a is not provided or the load 104 or the light-emitting element 104b is provided instead of the light-emitting element 104a in the circuit 100 in each of FIGS. 45A to 45D.

Note that in the circuit in FIGS. 1A to 1D or the like, both the switch 14 and the switch 914 can be provided by additional provision of the switch 14 or the switch 914 or both. In other words, the switch 914 can be added to FIGS. 11A to 11D, FIGS. 32A to 32D, FIGS. 34A to 34D, FIGS. 43A to 43F, FIGS. 45A to 45D, or the like or the switch 14 can be added to FIGS. 24A to 24D, FIGS. 26A to 26D, FIGS. 28A to 28D, FIGS. 30A to 30D, FIGS. 32A to 32D, FIGS. 34A to 34D, or the like. For example, the structure of the circuit 100 in FIG. 46A corresponds to a structure where the switch 914 is added to the circuit 100 in FIG. 11C or a structure where the switch 14 is added to the circuit 100 in FIG. 28C. In the circuit 100 in FIG. 46A, the switch 914 has a function of controlling conduction between the one of the source and the drain of the transistor 101 and the other electrode of the capacitor 103 or the anode of the light-emitting element 104a.

Figure 46A:
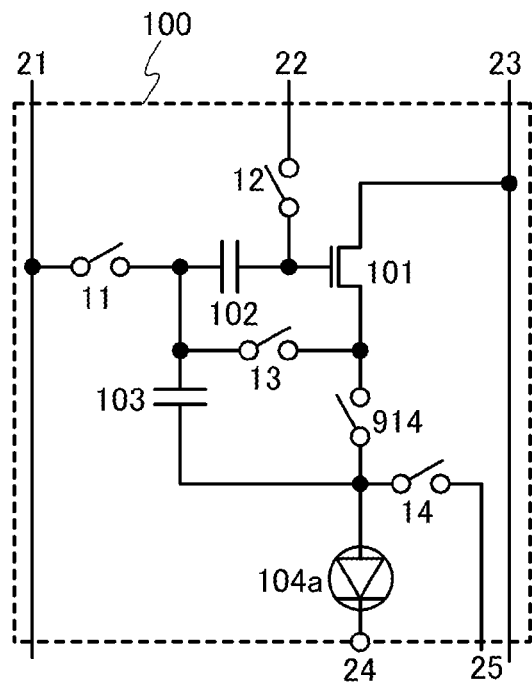
FIGS. 46A to 46D each illustrate the structure of a semiconductor device.
Figure 46B:
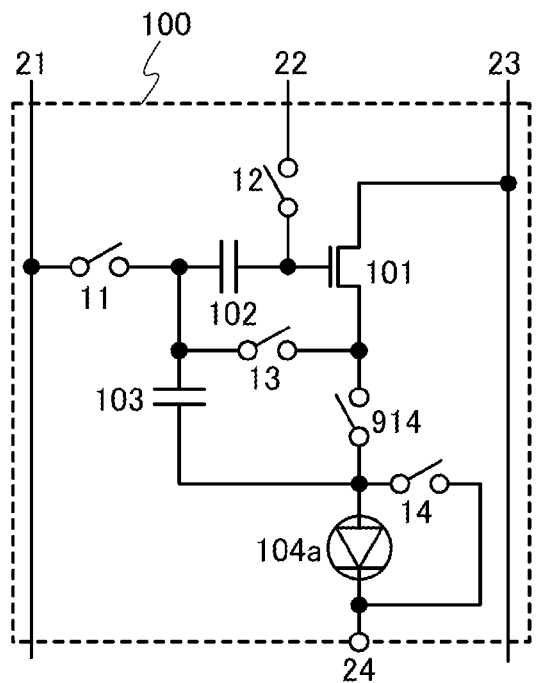
Figure 46C:
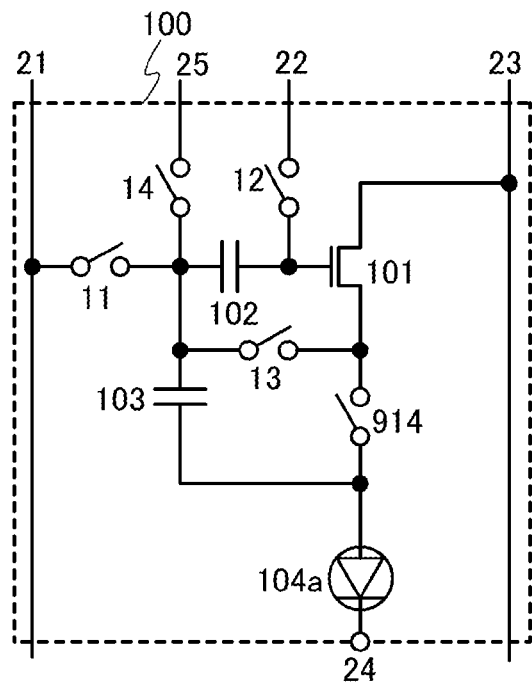
Figure 46D:
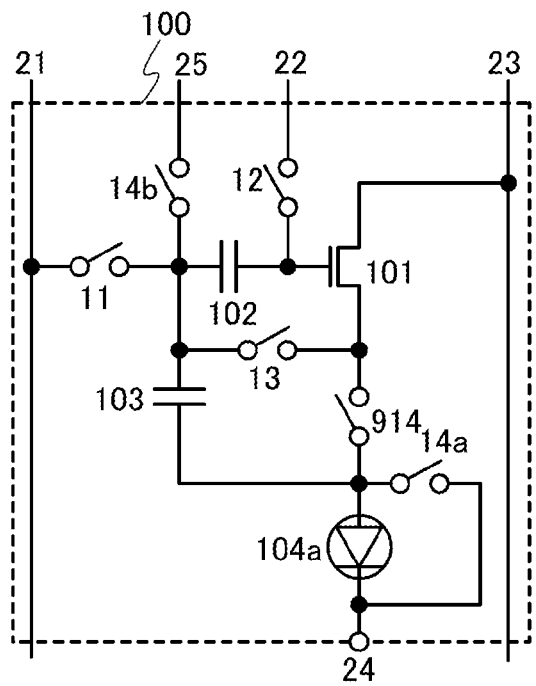
Figure 47A:
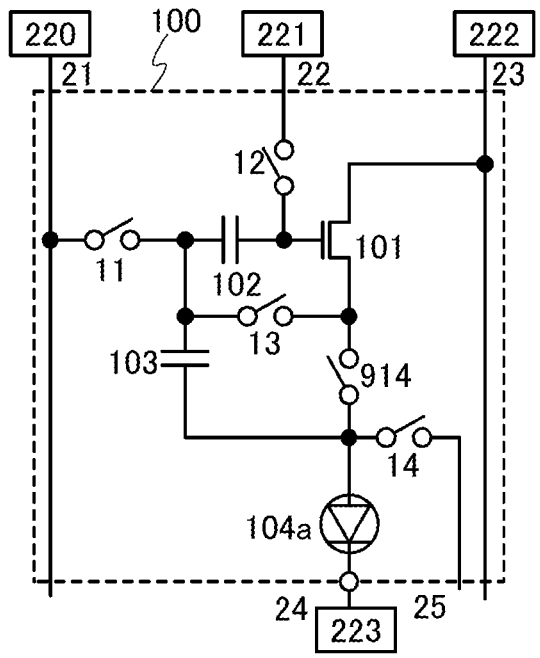
FIGS. 47A to 47D each illustrate the structure of a semiconductor device.
Figure 47B:
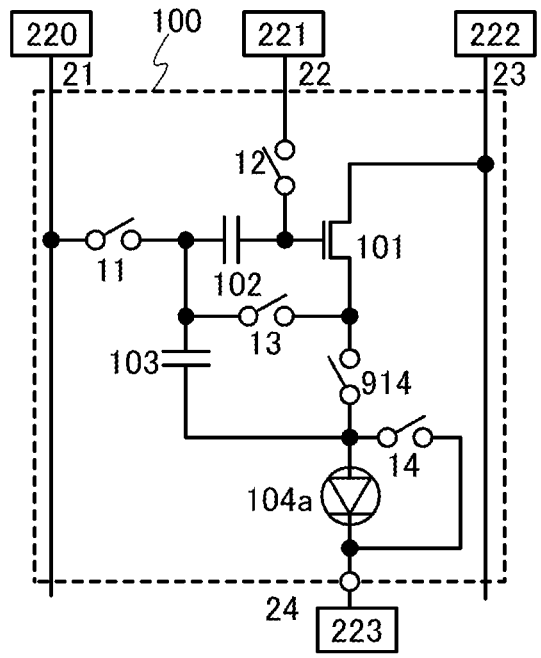
Figure 47C:
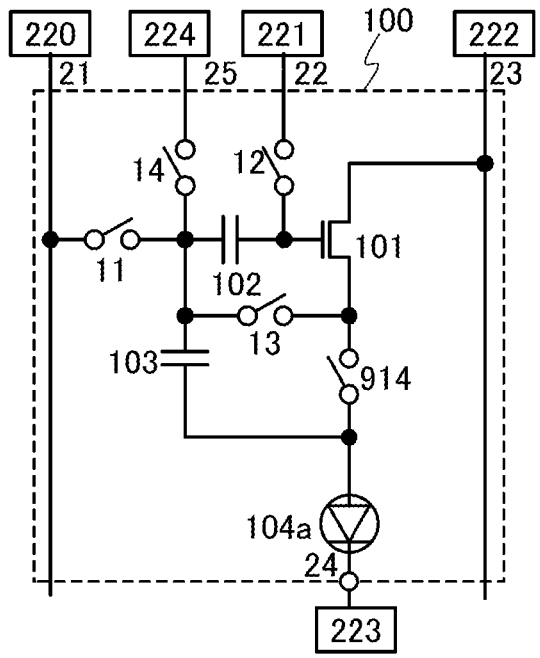
Figure 47D:
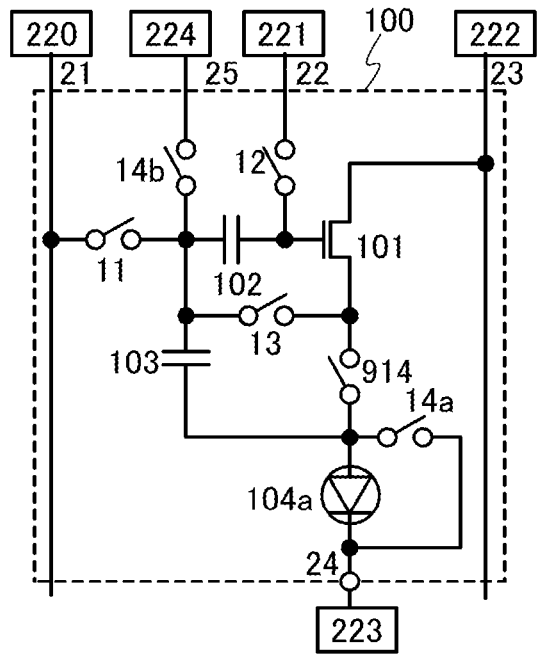

Note that as in FIG. 44D, FIGS. 45A to 45D, and the like, the wiring 25 can be connected to another wiring in FIG. 46A. FIG. 46B illustrates an example in which the wiring 25 is connected to the wiring 24 in the circuit 100 in FIG. 46A.

In addition, the position of the switch 14 is not limited to the position shown in FIG. 46A, and the switch 14 can be provided in another position as in FIGS. 43A to 43F. The structure of the circuit 100 in FIG. 46C corresponds to a structure where the switch 14 is provided in FIG. 46A as in FIG. 43A. The switch 14 has a function of controlling conduction between one electrode of the capacitor 102 and the wiring 25, and conduction between one electrode of the capacitor 103 and the wiring 25.

Further, the number of switches corresponding to the switch 14 is not limited to one and can be more than one. For example, the structure of the circuit 100 in FIG. 46D differs from the structure of the circuit 100 in FIG. 46A in that a switch 14a having a function of controlling conduction between the other electrode of the capacitor 103 and the wiring 24, and conduction between the anode of the light-emitting element 104a and the wiring 24 and a switch 14b having a function of controlling conduction between one electrode of the capacitor 102 and the wiring 25, and conduction between the one electrode of the capacitor 103 and the wiring 25 are provided instead of the switch 14. That is, the number of the switches 14 is two in FIG. 46D.

Semiconductor devices in FIGS. 47A to 47D include more than one of the circuit 220 having a function of supplying a constant voltage or a signal to the wiring 21, the circuit 221 having a function of supplying a constant voltage or a signal to the wiring 22, the circuit 222 having a function of supplying a constant voltage or a signal to the wiring 23, the circuit 223 having a function of supplying a constant voltage or a signal to the wiring 24, and the circuit 224 having a function of supplying a constant voltage or a signal to the wiring 25, in addition to the circuits 100 in FIGS. 46A to 46D.

Note that FIGS. 46A to 46D and FIGS. 47A to 47D each illustrate the structure of the circuit 100 using the light-emitting element 104a. However, the semiconductor device according to one aspect of the present invention may have a structure where the light-emitting element 104a is not provided or the load 104 or the light-emitting element 104b is provided instead of the light-emitting element 104a in the circuit 100 in each of FIGS. 46A to 46D and FIGS. 47A to 47D.

Note that the switch 14 and the switch 914 are not necessarily provided in the manner illustrated in FIGS. 46A to 46D and FIGS. 87A to 87D. The switch 14 and the switch 914 can be provided in a variety of ways. A driving method in that case can be similar to those in FIGS. 5A to 5C, FIGS. 6A to 6C, FIGS. 17A to 17C, FIGS. 18A and 18B, FIGS. 20A and 20B, FIGS. 35A to 35D, and FIG. 36. The structure of the circuit 100 in FIG. 48A corresponds to a structure where the position of the switch 14 is different from that in the circuit 100 in FIG. 46A. In the circuit 100 in FIG. 48A, the switch 14 has a function of controlling conduction between the one of the source and the drain of the transistor 101 and the wiring 25.

Figure 48A:
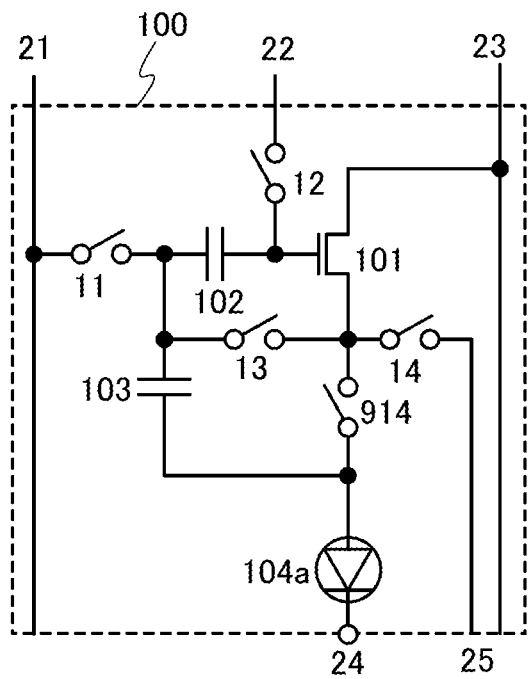
FIGS. 48A to 48D each illustrate the structure of a semiconductor device.

Further, in FIG. 48A, the wiring 25 can be connected to another wiring as in FIG. 44D and FIGS. 45A to 45D. The circuit 100 in FIG. 48B is an example in which the wiring 25 is connected to the wiring 24 in the circuit 100 in FIG. 46A.

Figure 48B:
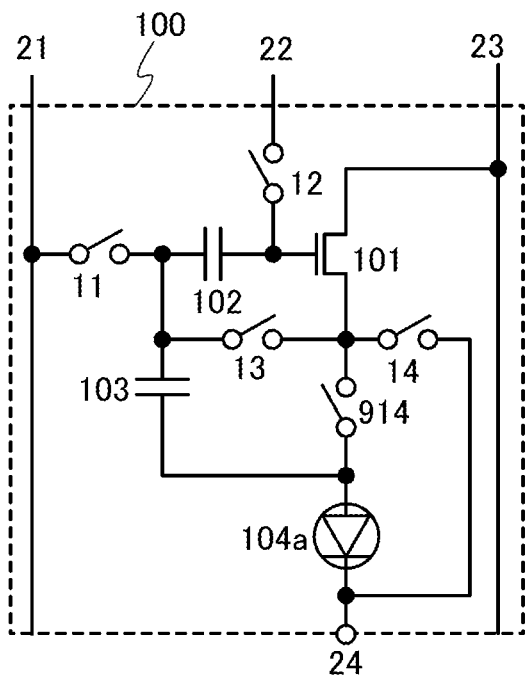
Figure 48C:
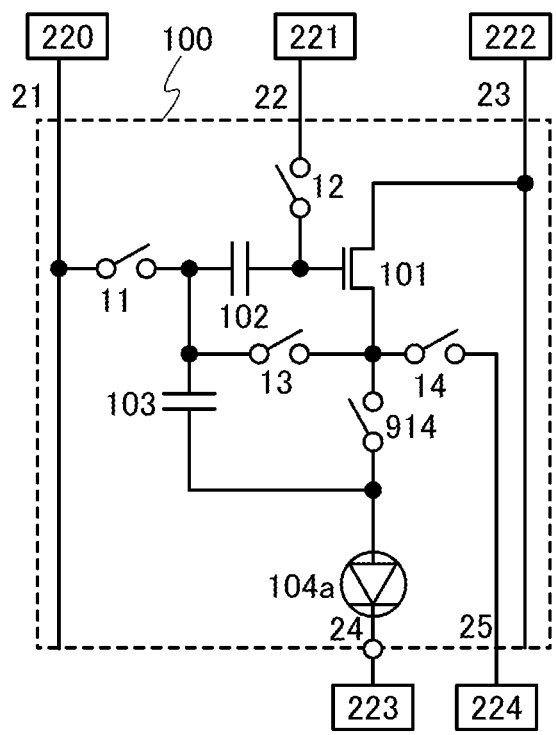
Figure 48D:
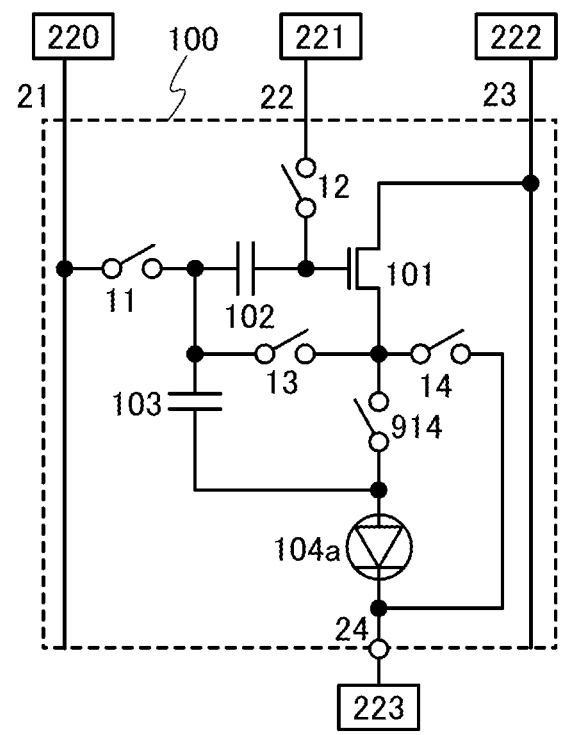

Semiconductor devices in FIGS. 48C and 48D include more than one of the circuit 220 having a function of supplying a constant voltage or a signal to the wiring 21, the circuit 221 having a function of supplying a constant voltage or a signal to the wiring 22, the circuit 222 having a function of supplying a constant voltage or a signal to the wiring 23, the circuit 223 having a function of supplying a constant voltage or a signal to the wiring 24, and the circuit 224 having a function of supplying a constant voltage or a signal to the wiring 25, in addition to the circuits 100 in FIGS. 48A and 48B.

Note that FIGS. 48A to 48D each illustrate the structure of the circuit 100 using the light-emitting element 104a. However, the semiconductor device according to one aspect of the present invention may have a structure where the light-emitting element 104a is not provided or the load 104 or the light-emitting element 104b is provided instead of the light-emitting element 104a in the circuit 100 in each of FIGS. 48A to 48D.

Figure 49A:
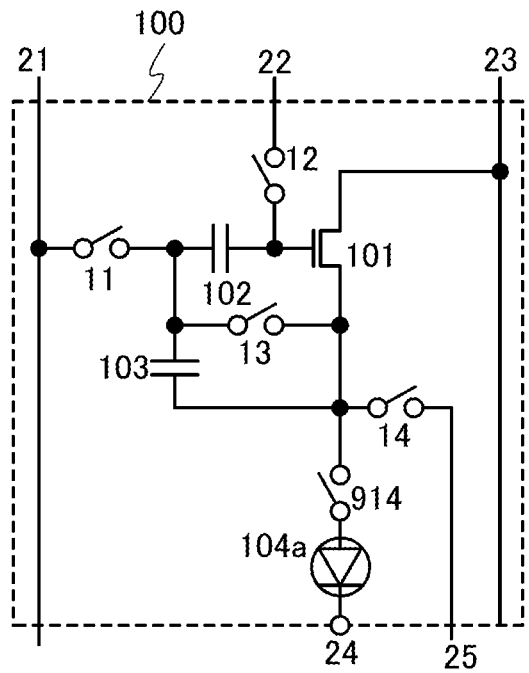
FIGS. 49A to 49D each illustrate the structure of a semiconductor device.

The structure of the circuit 100 in FIG. 49A is another example in which the switch 14 and the switch 914 are provided and corresponds to a structure where the switch 914 is added to the circuit 100 in FIG. 11C or a structure where the switch 14 is added to the circuit 100 in FIG. 30C. In the circuit 100 in FIG. 49A, the switch 914 has a function of controlling conduction between the one of the source and the drain of the transistor 101 and the anode of the light-emitting element 104a, and conduction between the other electrode of the capacitor 103 and the anode of the light-emitting element 104a.

A driving method in that case can be similar to those in FIGS. 5A to 5C, FIGS. 6A to 6C, FIGS. 17A to 17C, FIGS. 18A and 18B, FIGS. 20A and 20B, FIGS. 35A to 35D, and FIG. 36. An example of the driving method is described below.

First, first operation in the period T11 is described. In the period T11, the switch 11 and the switch 914 are off, and the switch 12, the switch 13, and the switch 14 are on. Thus, in the period T11, the voltage Vi2−Vi1 is supplied to the capacitor 102, the potential of the anode of the light-emitting element 104a becomes the potential Vi1, and the gate-source voltage Vgs101 of the transistor 101 becomes the voltage Vi2−Vi1. In other words, the transistor 101 and the capacitor 102 are initialized.

Note that in the case where the potential of the wiring 21 has no adverse effects on initialization of the transistor 101 and the capacitor 102, the switch 11 may be on. In that case, the switch 14 may be off.

Note that the switch 13 may be off.

Note that the switch 914 may be on.

Second operation in the period T12 is described. In the period T12, the switch 11, the switch 14, and the switch 914 are off, and the switch 12 and the switch 13 are on. When the switch 11, the switch 914, and the switch 14 are turned off, electric charge accumulated in the capacitor 102 is released through the transistor 101, and the potential of the source of the transistor 101 is raised. Then, when the transistor 101 is turned off, the release of the electric charge from the capacitor 102 is stopped. The threshold voltage Vth of the transistor 101 is eventually held in the capacitor 102. Thus, in the period T12, the threshold voltage Vth is held in the capacitor 102, the potential of the anode of the light-emitting element 104*a* becomes the potential Vi2−Vth, and the gate-source voltage Vgs101 of the transistor 101 becomes the threshold voltage Vth (or voltage based on Vth). That is, the threshold voltage Vth of the transistor 101 (or the voltage based on Vth) can be obtained.

Note that the second operation can be performed regardless of whether the value of the threshold voltage Vth of the transistor 101 is positive or negative. This is because the potential of the source of the transistor 101 can be raised until the transistor 101 is turned off. In other words, when the potential of the source of the transistor 101 becomes higher than the potential of the gate of the transistor 101, the transistor 101 can be finally turned off and Vgs101 can become Vth. Thus, the second operation can be performed correctly regardless of whether the transistor 101 is an enhancement (normally-off) transistor or a depletion (normally-on) transistor.

Note that when the potential of the anode of the light-emitting element 104*a* becomes high, it is preferable that current does not flow to the light-emitting element 104*a*. The potential Vi2 is preferably at a low value so that current does not flow to the light-emitting element 104*a*. Note that when the switch 914 is turned off, it is possible not to supply current to the light-emitting element 104*a*; thus, the potential Vi2 may be at a high value.

Note that the switch 914 may be on.

Third operation in the period T13 is described. In the period T13, the switch 11 and the switch 14 are on, and the switch 12, the switch 13, and the switch 914 are off. In addition, the potential Vsig is supplied to the wiring 21. Thus, in the period T13, the threshold voltage Vth (or the voltage based on Vth) is held in the capacitor 102, the voltage Vsig−Vi1 is held in the capacitor 103, the potential of the anode of the light-emitting element 104*a* becomes the potential Vi1, the potential of the gate of the transistor 101 becomes the potential Vsig+Vth, and the gate-source voltage Vgs101 of the transistor 101 becomes the voltage Vsig+Vth−Vi1. Thus, the potential Vsig can be input to the capacitor 103. Alternatively, the sum of voltage across the capacitor 102 and voltage across the capacitor 103 can be equal to the gate-source voltage of the transistor 101.

Note that in that case, the switch 14 can be turned off.

Note that the switch 914 may be on.

Fourth operation in the period T14 is described. In the period T14, the switch 11, the switch 12, the switch 13, and the switch 14 are off, and the switch 914 is on. Thus, in the period T14, the threshold voltage Vth is held in the capacitor 102, the voltage Vsig−Vi1 is held in the capacitor 103, the potential of the anode of the light-emitting element 104*a* becomes the potential Ve1, the potential of the gate of the transistor 101 becomes the potential Vsig+Vth+Ve1, and the gate-source voltage Vgs101 of the transistor 101 becomes the voltage Vsig+Vth−Vi1. Thus, current based on the potential Vsig can flow to the light-emitting element 104*a*, so that the light-emitting element 104*a* can emit light at luminance based on the potential Vsig.

Note that in part of the period in the fourth operation, it is possible to forcibly turn off the transistor 101 or not to supply current to the light-emitting element 104*a* so that the light-emitting element 104*a* does not emit light. In other words, a non-lighting period can be provided. For example, by turning on the switch 12, the transistor 101 can be turned off. Alternatively, by turning on the switch 14, it is possible not to supply current to the light-emitting element 104*a*. Alternatively, by turning off the switch 914, it is possible not to supply current to the light-emitting element 104*a*.

Note that the period T16 during which the sixth operation is performed may be provided after the period T13 during which the third operation is performed and before the period T14 during which the fourth operation is performed.

The sixth operation in the period T16 is described. In the period T16, the switch 12 is on, and the switch 11, the switch 13, the switch 914, and the switch 14 are off. Thus, in the period T16, the gate-source voltage Vgs101 of the transistor 101 becomes the voltage Vsig+Vth−Vi1−Vα.

The potential Vα in the sixth operation varies when the anode of the light-emitting element 104*a* enters into an electrically floating state. The value of the potential Vα depends on the ratio between the capacitance of the light-emitting element 104*a* and the capacitance of the capacitor 102 and the capacitor 103 if the transistor 101 is off. However, depending on the level of the potential Vsig, the transistor 101 might be turned on and electric charge flows into the anode of the light-emitting element 104*a* through the transistor 101. Thus, the value of the potential Vα depends not only on the capacitance ratio but also on the electric charge flowing into the anode of the light-emitting element 104*a*.

Note that the on/off state of the switch 12 and the on/off state of the switch 13 can be controlled at the same timing. Thus, in the case where the switch 12 and the switch 13 are transistors having the same polarity, gates of the transistors can be connected to each other as in FIGS. 15A to 15D.

Figure 49B:
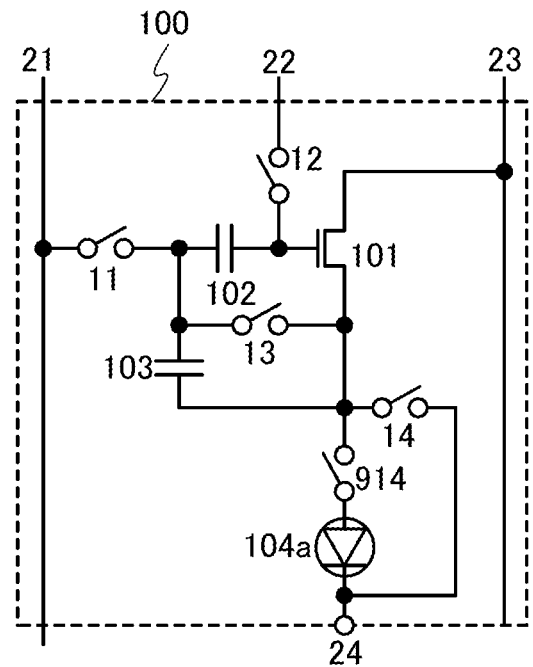

The wiring 22 or 25 can be connected to a variety of wirings. The circuit 100 in FIG. 49B is an example in which the wiring 25 is connected to the wiring 24 in the circuit 100 in FIG. 49A.

As in FIGS. 8A to 8D, FIGS. 9A to 9D, FIGS. 21A to 21E, FIGS. 22A to 22E, and the like, the capacitor 105 can be added. For example, the structure of the circuit 100 in FIG. 49C corresponds to a structure where the capacitor 105 is added to the circuit 100 in FIG. 49A. One electrode of the capacitor 105 is connected to the other electrode of the capacitor 103. The other electrode of the capacitor 105 is connected to the wiring 26.

Figure 49C:
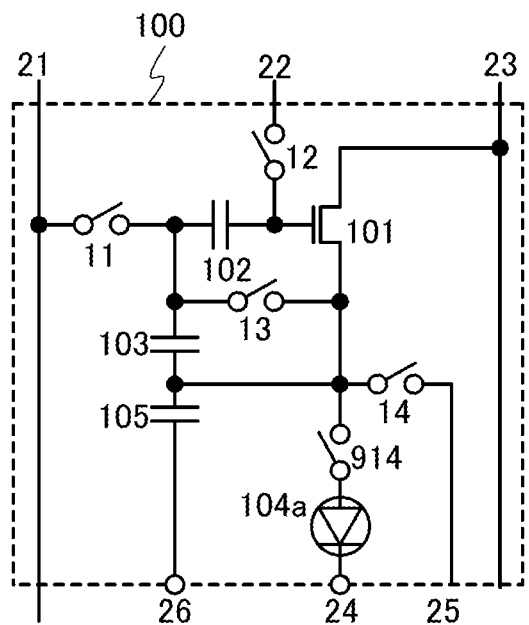
Figure 49D:
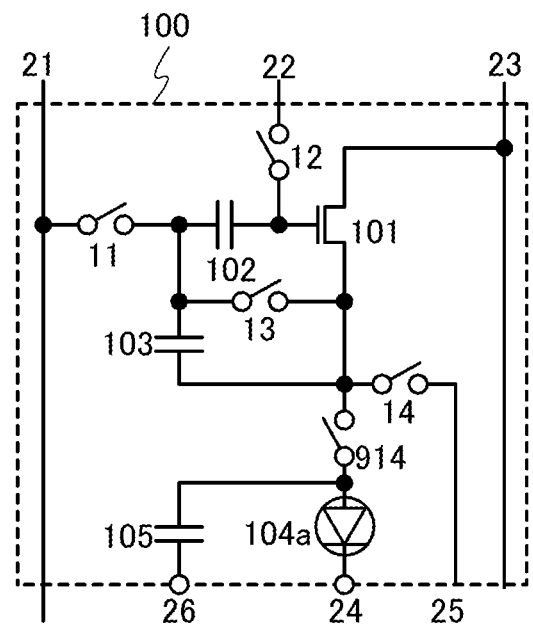

As an example in which the placement of the capacitor 105 is different from that in FIG. 49C, the structure of the circuit 100 in FIG. 49D corresponds to a structure where the capacitor 105 is added to the circuit 100 in FIG. 49A. One electrode of the capacitor 105 is connected to the anode of the light-emitting element 104*a*. The other electrode of the capacitor 105 is connected to the wiring 26.

Semiconductor devices in FIGS. 50A to 50D include more than one of the circuit 220 having a function of supplying a constant voltage or a signal to the wiring 21, the circuit 221 having a function of supplying a constant voltage or a signal to the wiring 22, the circuit 222 having a function of supplying a constant voltage or a signal to the wiring 23, the circuit 223 having a function of supplying a constant voltage or a signal to the wiring 24, the circuit 224 having a function of supplying a constant voltage or a signal to the wiring 25, and the circuit 225 having a function of supplying a constant voltage or a signal to the wiring 26, in addition to the circuits 100 in FIGS. 49A to 49D.

Note that FIGS. 49A to 49D and FIGS. 50A to 50D each illustrate the structure of the circuit 100 using the light-emitting element 104a. However, the semiconductor device according to one aspect of the present invention may have a structure where the light-emitting element 104a is not provided or the load 104 or the light-emitting element 104b is provided instead of the light-emitting element 104a in the circuit 100 in each of FIGS. 49A to 49D and FIGS. 50A to 50D.

Note that as in FIGS. 8A to 8D, FIGS. 21A to 21E, FIGS. 43A to 43F, FIGS. 45A to 45D, FIGS. 46A to 46D, and the like, the wiring 22, the wiring 23, the wiring 24, the wiring 25, the wiring 26, and the like can be connected to each other in FIGS. 49A to 49D.

Note that one capacitor 105 is added to each of FIGS. 49C and 49D; however, one aspect of the embodiment of the present invention is not limited thereto. More capacitors can be added to the circuit 100 to which the capacitor 105 is added. For example, the structure of the circuit 100 in FIG. 51A corresponds to a structure where a capacitor 105a and a capacitor 105b are added to the circuit 100 in FIG. 49A. One electrode of the capacitor 105a is connected to the other electrode of the capacitor 103. The other electrode of the capacitor 105a is connected to the wiring 26. One electrode of the capacitor 105b is connected to the anode of the light-emitting element 104a. The other electrode of the capacitor 105b is connected to a wiring 27.

The wiring 25 can be connected to another wiring. For example, the structure of the circuit 100 in FIG. 51B corresponds to a structure where the wiring 25 is connected to the wiring 24 in the circuit 100 in FIG. 50C.

Figure 50A:
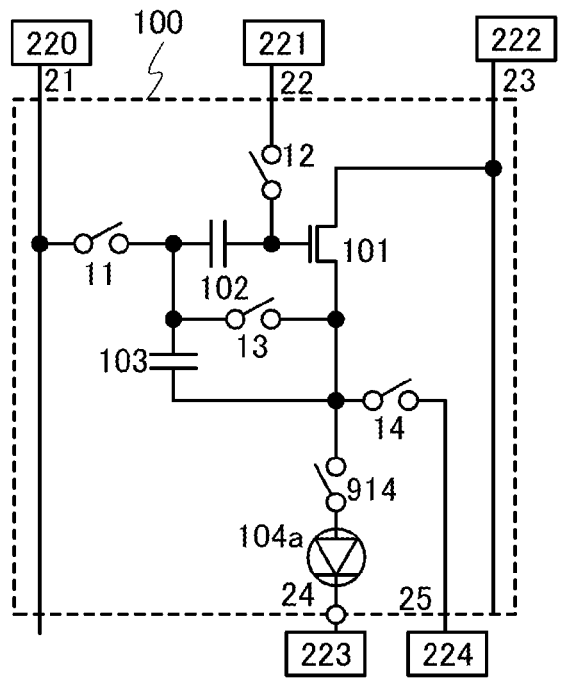
FIGS. 50A to 50D each illustrate the structure of a semiconductor device.
Figure 50B:
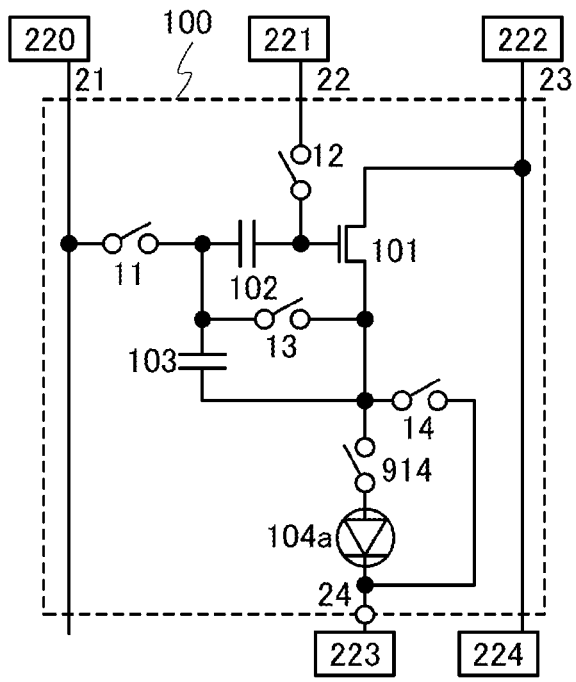
Figure 50C:
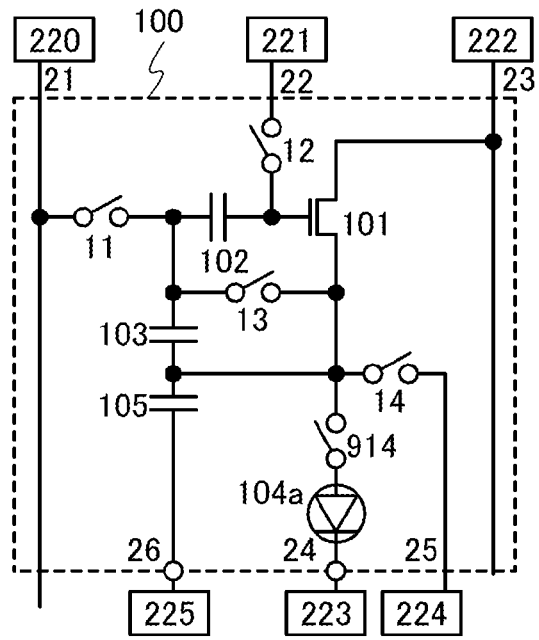
Figure 50D:
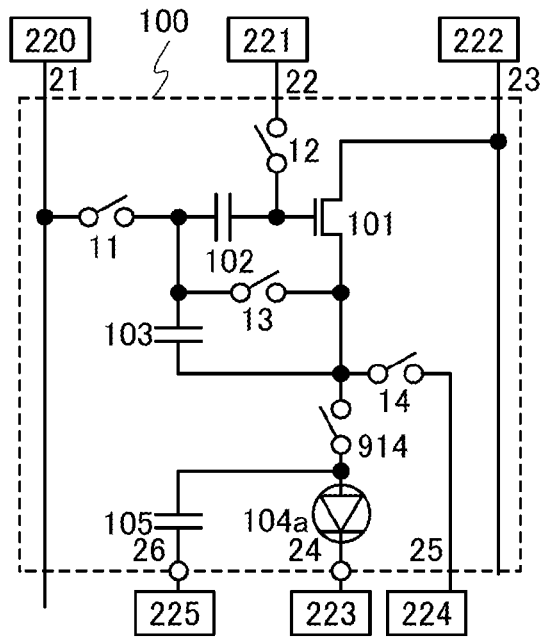
Figure 51A:
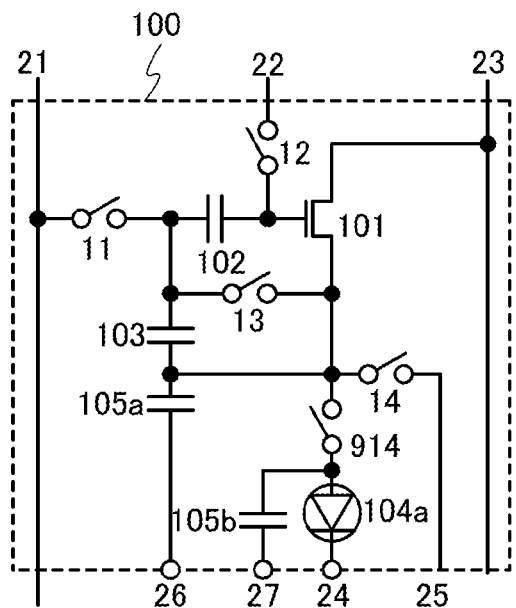
FIGS. 51A to 51D each illustrate the structure of a semiconductor device.
Figure 51B:
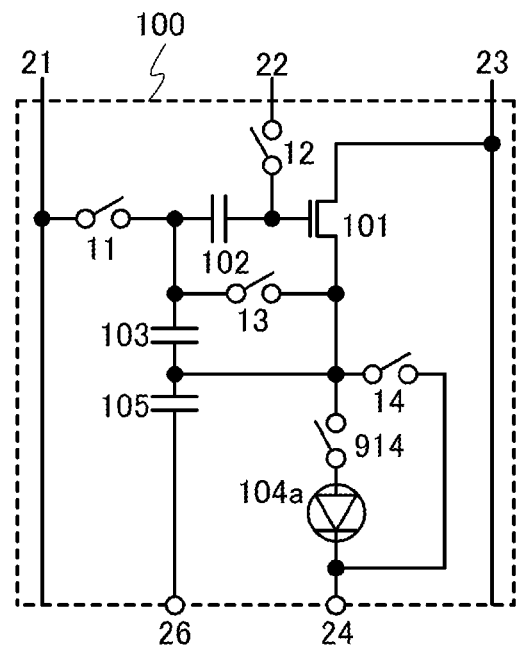
Figure 51C:
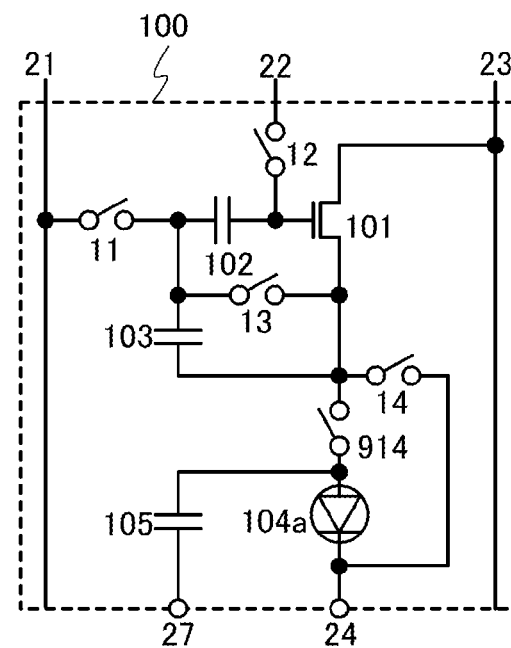

The structure of the circuit 100 in FIG. 51C corresponds to a structure where the wiring 25 is connected to the wiring 24 in the circuit 100 in FIG. 50D.

Figure 51D:
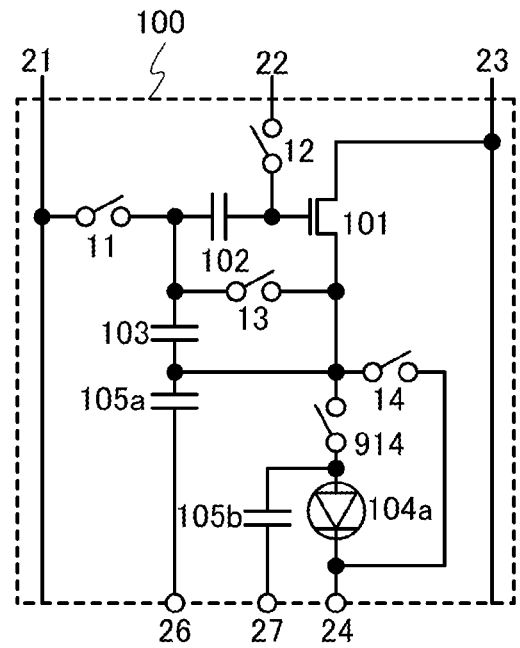
Figure 52A:
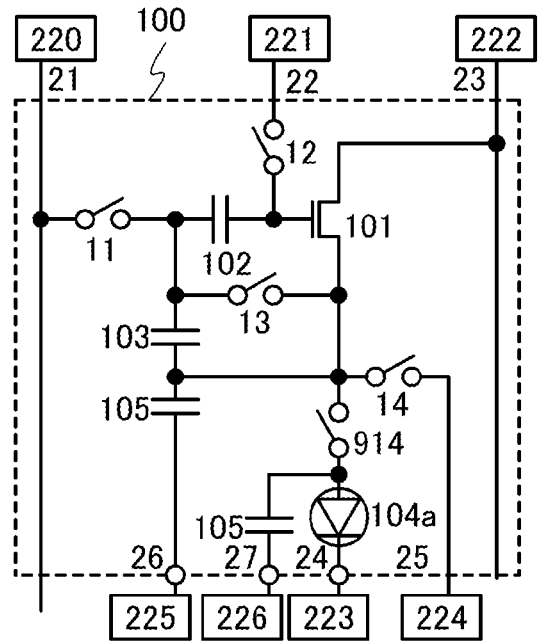
FIGS. 52A to 52D each illustrate the structure of a semiconductor device.
Figure 52B:
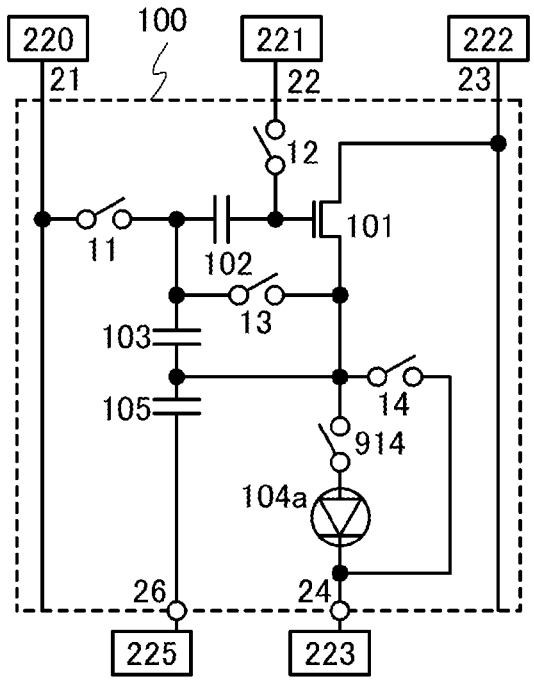
Figure 52C:
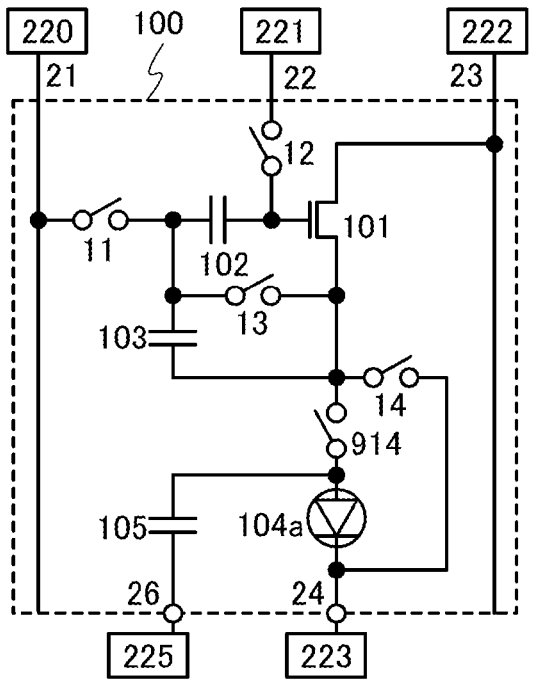
Figure 52D:
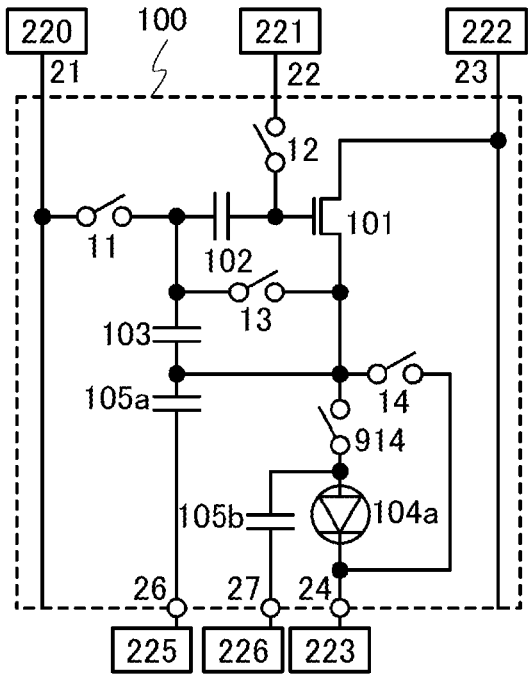

The structure of the circuit 100 in FIG. 51D corresponds to a structure where the wiring 25 is connected to the wiring 24 in the circuit 100 in FIG. 51A.

Semiconductor devices in FIGS. 52A to 52D include more than one of the circuit 220 having a function of supplying a constant voltage or a signal to the wiring 21, the circuit 221 having a function of supplying a constant voltage or a signal to the wiring 22, the circuit 222 having a function of supplying a constant voltage or a signal to the wiring 23, the circuit 223 having a function of supplying a constant voltage or a signal to the wiring 24, the circuit 224 having a function of supplying a constant voltage or a signal to the wiring 25, the circuit 225 having a function of supplying a constant voltage or a signal to the wiring 26, and a circuit 226 having a function of supplying a constant voltage or a signal to the wiring 27, in addition to the circuits 100 in FIGS. 51A to 51D.

An example of the circuit 226 is a power supply circuit. Accordingly, the wiring 27 has a function of capable of transmitting or supplying a predetermined potential. Alternatively, the wiring 27 functions as a capacitance line. Note that the potential of the wiring 27 is preferably constant; however, one aspect of the embodiment of the present invention is not limited thereto. The potential of the wiring 27 may vary like a pulse signal. The wiring 27 can be connected to another wiring. For example, the wiring 27 can be connected to a variety of wirings, for example, the wiring 25, the wiring 24, the wiring 22, the wiring 26, the wiring 23, the gate signal line, or a wiring of another circuit 100.

Note that FIGS. 51A to 51D and FIGS. 52A to 52D each illustrate the structure of the circuit 100 using the light-emitting element 104a. However, the semiconductor device according to one aspect of the present invention may have a structure where the light-emitting element 104a is not provided or the load 104 or the light-emitting element 104b is provided instead of the light-emitting element 104a in the circuit 100 in each of FIGS. 51A to 51D and FIGS. 52A to 52D.

Figure 53A:
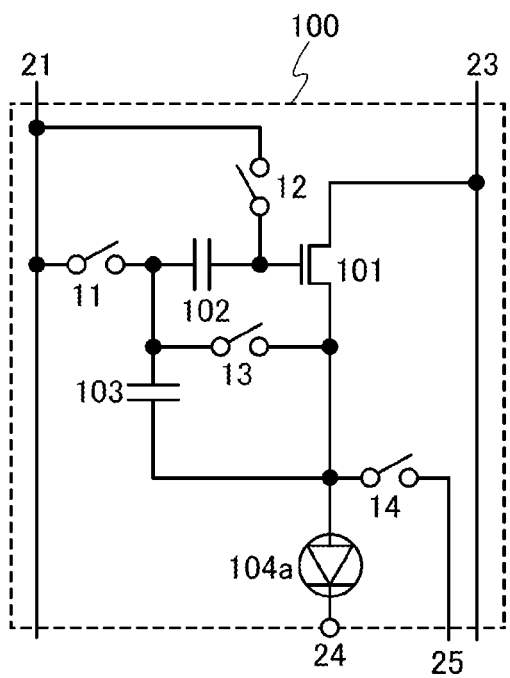
FIGS. 53A to 53D each illustrate the structure of a semiconductor device.

Note that in the variety of circuits, the wiring 22 can be connected to another wiring. Accordingly, the number of wirings can be reduced. For example, the wiring 22 can be connected to the wiring 21, the wiring 23, the wiring 23a, the wiring 23b, the wiring 24, the wiring 25, the wiring 26, the wiring 27, or the like. Alternatively, the wiring 22 can be connected to the scan line, the gate line, a wiring connected to the gate of the transistor, or the like. For example, the structure of the circuit 100 in FIG. 53A corresponds to a structure where the wiring 22 is connected to the wiring 21 in the circuit 100 in FIG. 11C.

Figure 53B:
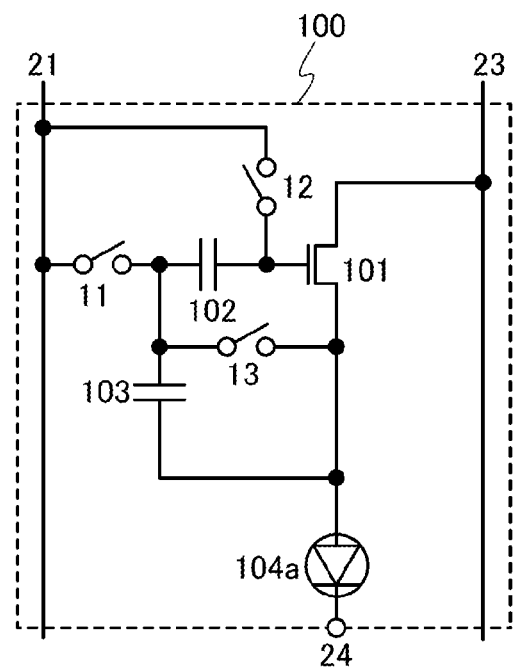

Similarly, the structure of the circuit 100 in FIG. 53B corresponds to a structure where the wiring 22 is connected to the wiring 21 in the circuit 100 in FIG. 1C.

Figure 53C:
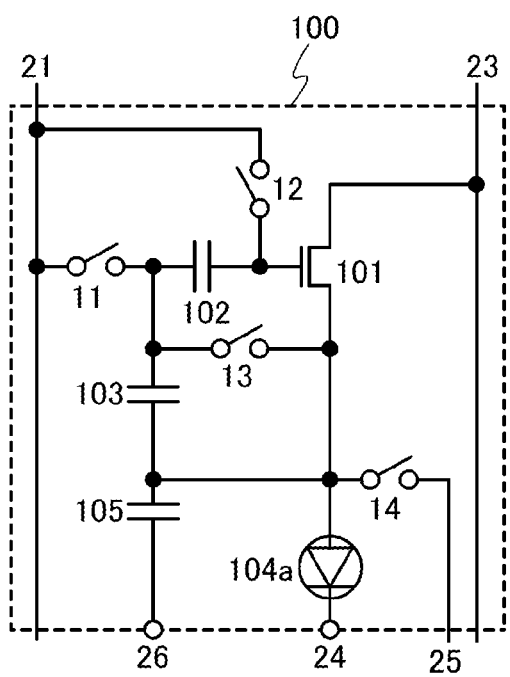

As in FIGS. 8A to 8D, FIGS. 9A to 9D, FIGS. 21A to 21E, FIGS. 22A to 22E, and the like, the capacitor 105 can be added. For example, the structure of the circuit 100 in FIG. 53C corresponds to a structure where the capacitor 105 is added to the circuit 100 in FIG. 53A or a structure where the wiring 22 is connected to the wiring 21 in the circuit 100 in FIG. 21A.

As in FIGS. 43A to 43F and the like, the wiring 22 can be connected to the wiring 21. For example, the structure of the circuit 100 in FIG. 53D corresponds to a structure where the wiring 22 is connected to the wiring 21 in the circuit 100 in FIG. 43B.

Semiconductor devices in FIGS. 54A to 54D include more than one of the circuit 220 having a function of supplying a constant voltage or a signal to the wiring 21, the circuit 222 having a function of supplying a constant voltage or a signal to the wiring 23, the circuit 223 having a function of supplying a constant voltage or a signal to the wiring 24, the circuit 224 having a function of supplying a constant voltage or a signal to the wiring 25, and the circuit 225 having a function of supplying a constant voltage or a signal to the wiring 26, in addition to the circuits 100 in FIGS. 53A to 53D.

Note that FIGS. 53A to 53D and FIGS. 54A to 54D each illustrate the structure of the circuit 100 using the light-emitting element 104a. However, the semiconductor device according to one aspect of the present invention may have a structure where the light-emitting element 104a is not provided or the load 104 or the light-emitting element 104b is provided instead of the light-emitting element 104a in the circuit 100 in each of FIGS. 53A to 53D and FIGS. 54A to 54D.

Note that in the case where one wiring is connected to a first wiring, a second wiring can be connected to the first wiring or a third wiring. For example, in the case where the wiring 22 is connected to one wiring, the wiring 25 can be connected to another wiring. For example, the structure of the circuit 100 in FIG. 55A corresponds to a structure where the wiring 22 is connected to the wiring 21 and the wiring 25 is connected to the wiring 24 in the circuit 100 in FIG. 11C, a structure where the wiring 25 is connected to the wiring 24 in the circuit 100 in FIG. 54A, or a structure where the wiring 22 is connected to the wiring 21 in the circuit 100 in FIG. 45A.

As in FIGS. 8A to 8D, FIGS. 9A to 9D, FIGS. 21A to 21E, FIGS. 22A to 22E, and the like, the capacitor 105 can be added. For example, the structure of the circuit 100 in FIG. 55B corresponds to a structure where the capacitor 105 is added to the circuit 100 in FIG. 55A or a structure where the wiring 22 is connected to the wiring 21 in the circuit 100 in FIG. 45B.

Further, the position of the switch 14 can be changed. The structure of the circuit 100 in FIG. 55C corresponds to a structure where the wiring 22 is connected to the wiring 21 in the circuit 100 in FIG. 43E.

Figure 55A:
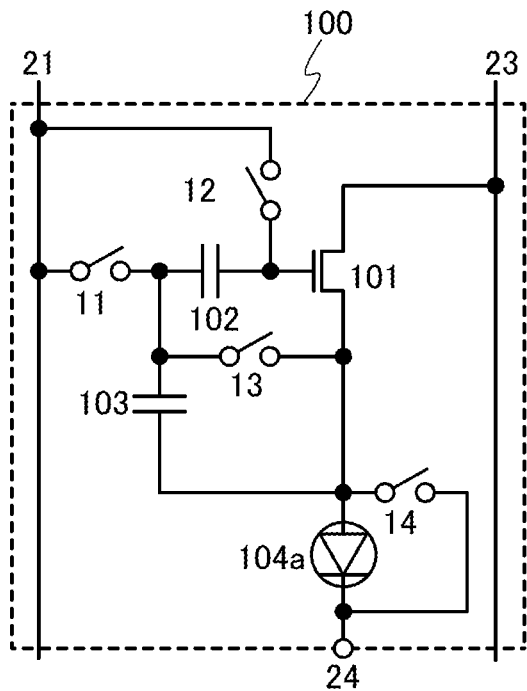
FIGS. 55A to 55C each illustrate the structure of a semiconductor device.
Figure 55B:
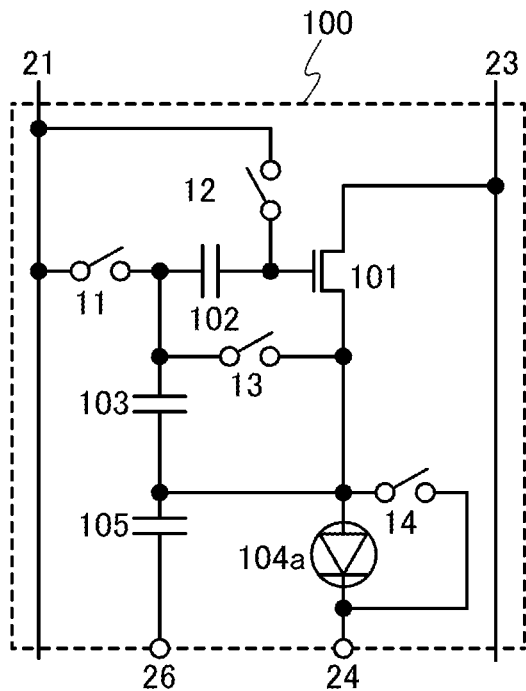
Figure 55C:
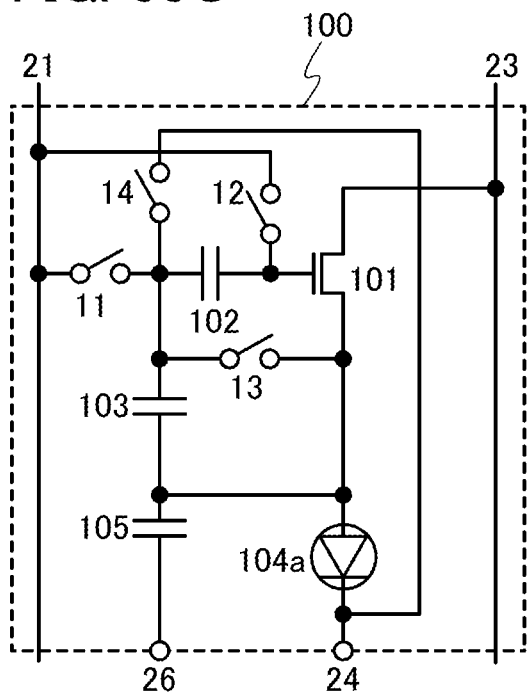
Figure 56A:
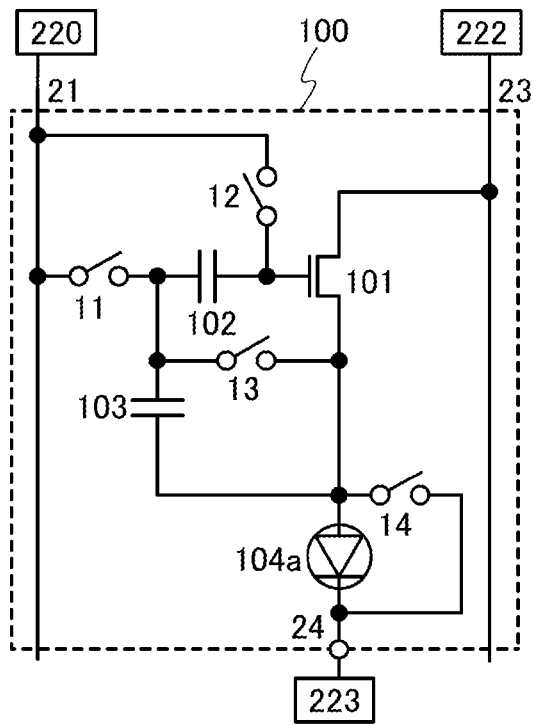
FIGS. 56A to 56C each illustrate the structure of a semiconductor device.
Figure 56B:
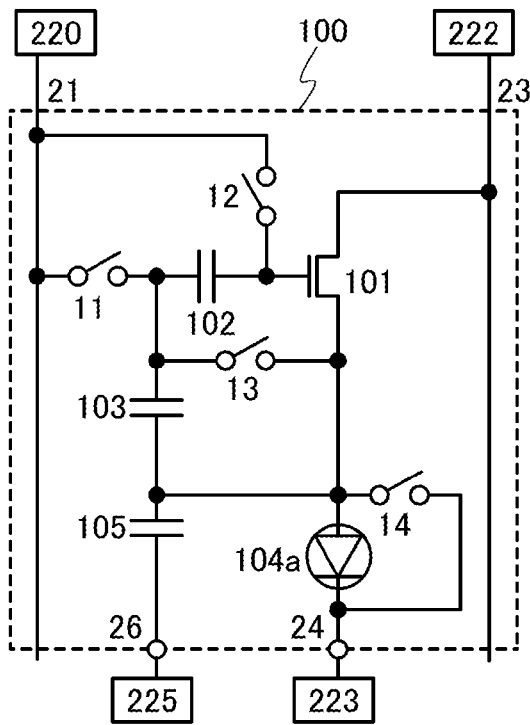
Figure 56C:
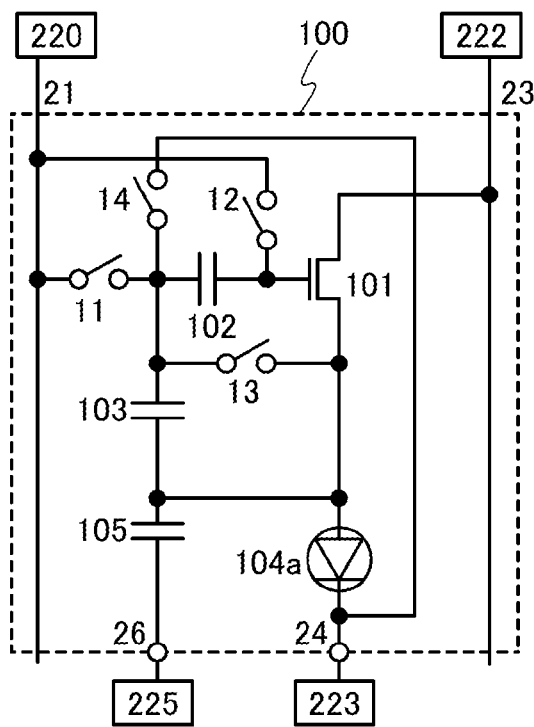

Semiconductor devices in FIGS. 56A to 56C include more than one of the circuit 220 having a function of supplying a constant voltage or a signal to the wiring 21, the circuit 222 having a function of supplying a constant voltage or a signal to the wiring 23, the circuit 223 having a function of supplying a constant voltage or a signal to the wiring 24, and the circuit 225 having a function of supplying a constant voltage or a signal to the wiring 26, in addition to the circuits 100 in FIGS. 55A to 55C.

Note that FIGS. 55A to 55C and FIGS. 56A to 56C each illustrate the structure of the circuit 100 using the light-emitting element 104a. However, the semiconductor device according to one aspect of the present invention may have a structure where the light-emitting element 104a is not provided or the load 104 or the light-emitting element 104b is provided instead of the light-emitting element 104a in the circuit 100 in each of FIGS. 55A to 55C and FIGS. 56A to 56C.

Figure 57A:
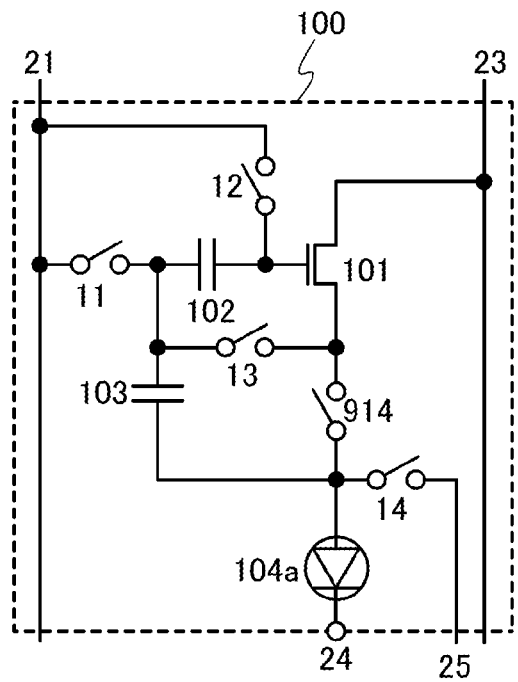
FIGS. 57A to 57D each illustrate the structure of a semiconductor device.

The structure of the circuit 100 in FIG. 57A corresponds to a structure where the wiring 22 is connected to the wiring 21 in the circuit 100 in FIG. 46A.

Figure 57B:
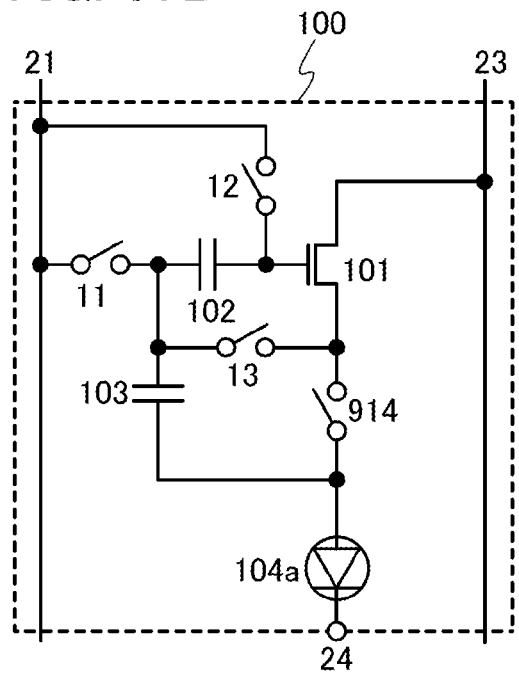

The structure of the circuit 100 in FIG. 57B corresponds to a structure where the wiring 22 is connected to the wiring 21 in the circuit 100 in FIG. 28C.

As in FIGS. 8A to 8D, FIGS. 9A to 9D, FIGS. 21A to 21E, FIGS. 22A to 22E, and the like, the switch 914 can be added. For example, the structure of the circuit 100 in FIG. 57C corresponds to a structure where the 914 is added to the circuit 100 in FIG. 53C.

Figure 53D:
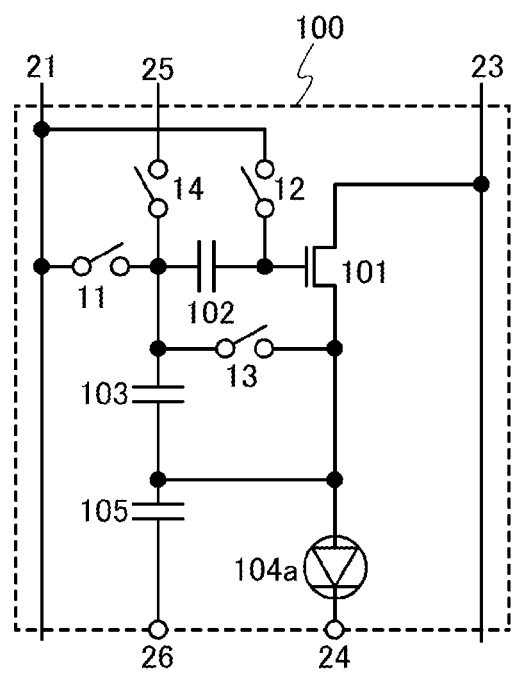
Figure 54A:
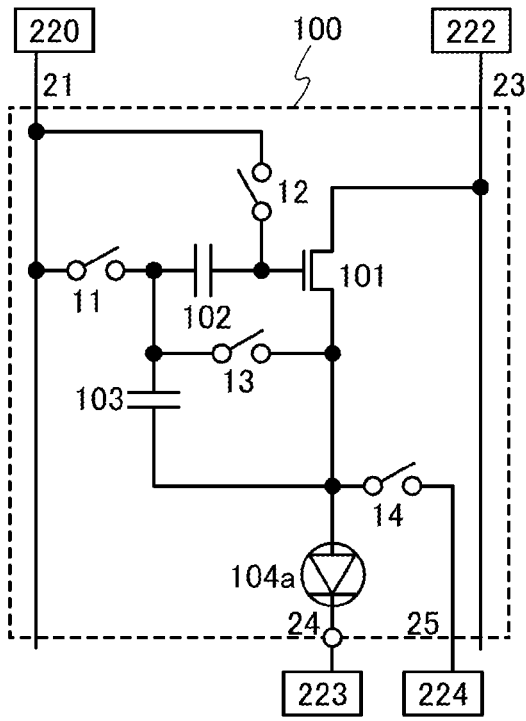
FIGS. 54A to 54D each illustrate the structure of a semiconductor device.
Figure 54B:
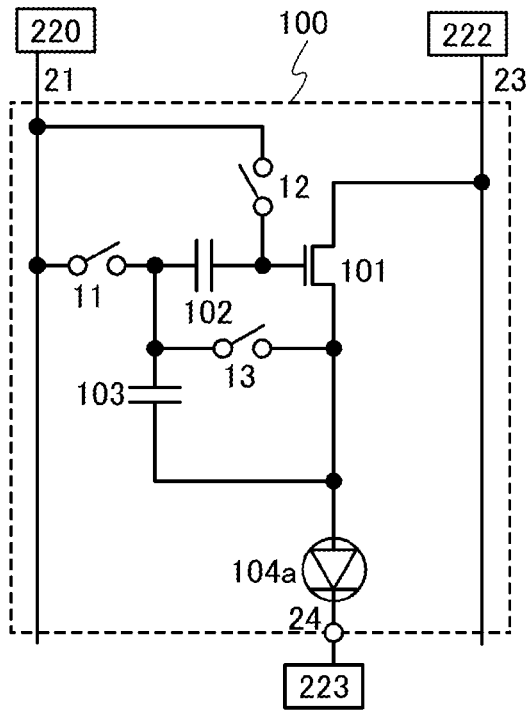
Figure 54C:
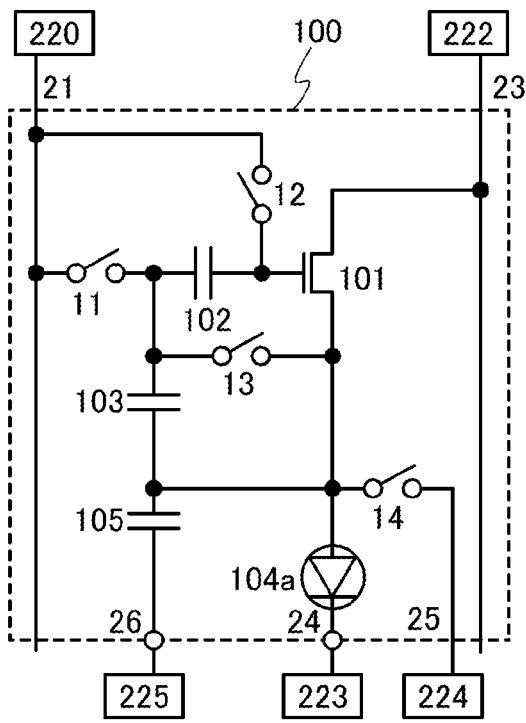
Figure 54D:
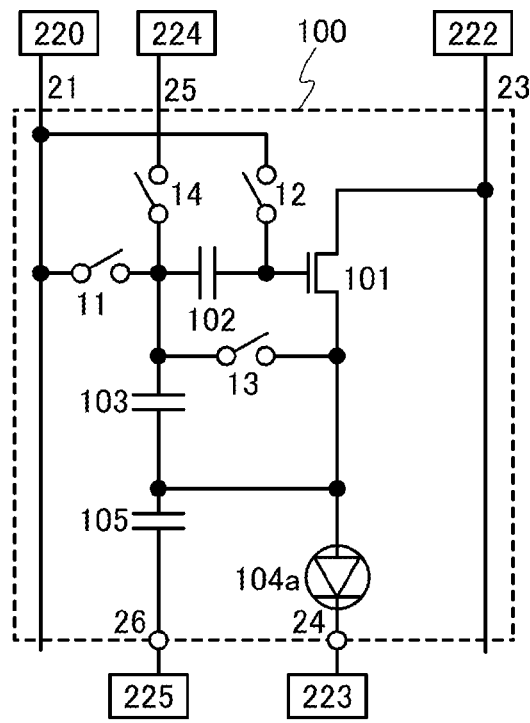
Figure 57C:
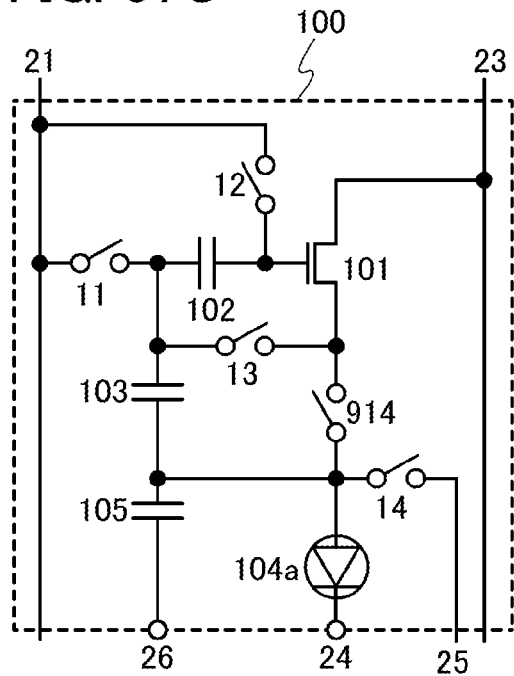
Figure 57D:
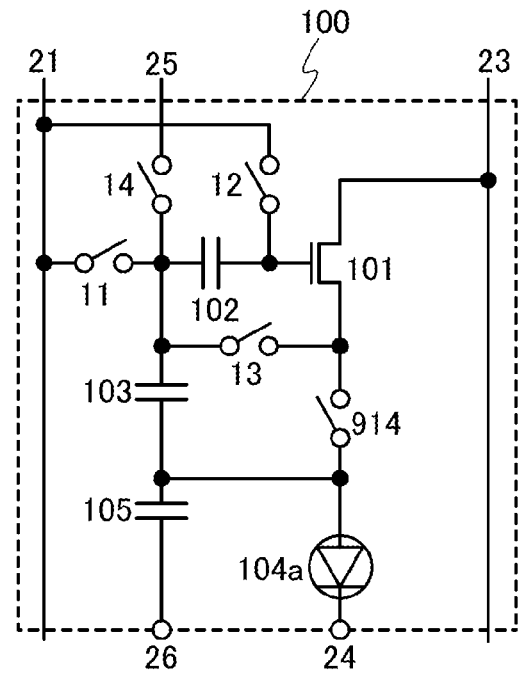
Figure 58A:
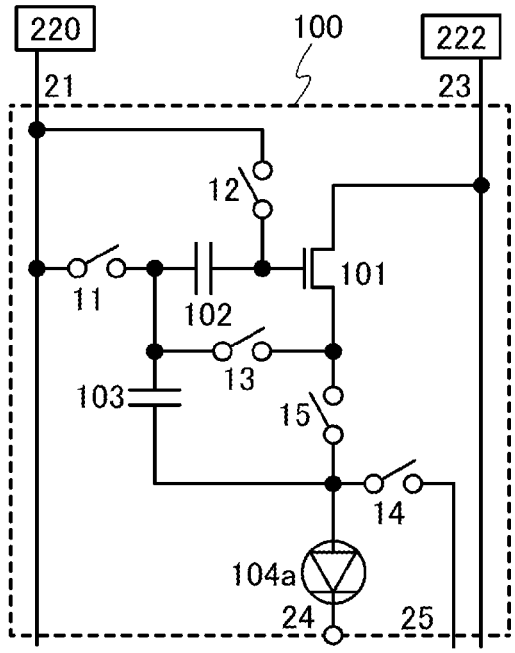
FIGS. 58A to 58D each illustrate the structure of a semiconductor device.
Figure 58B:
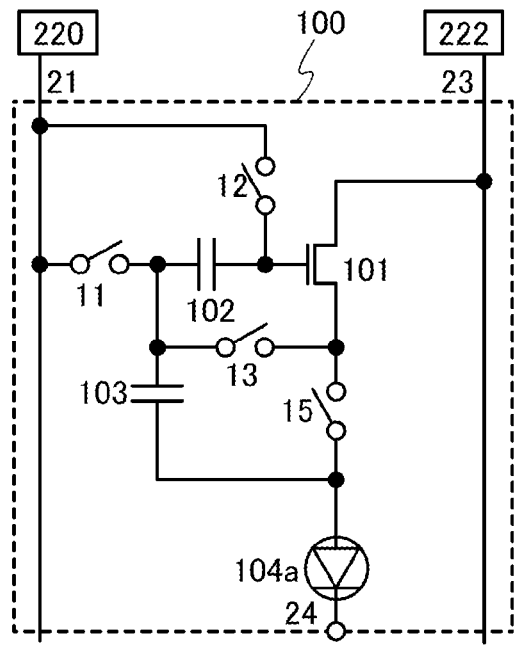
Figure 58C:
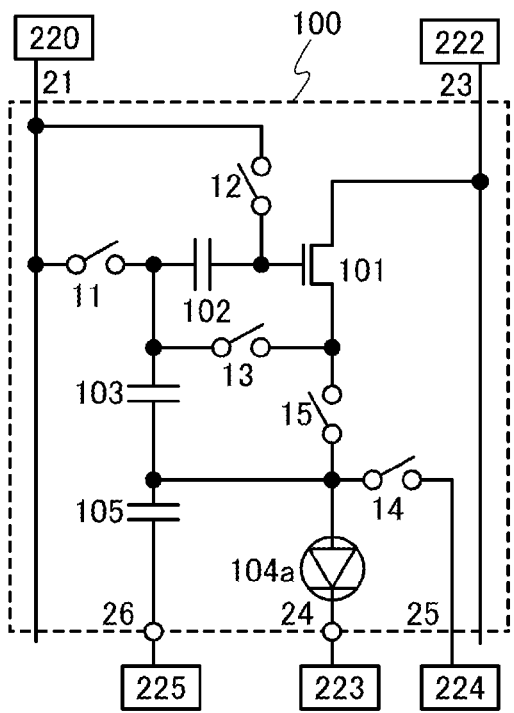
Figure 58D:
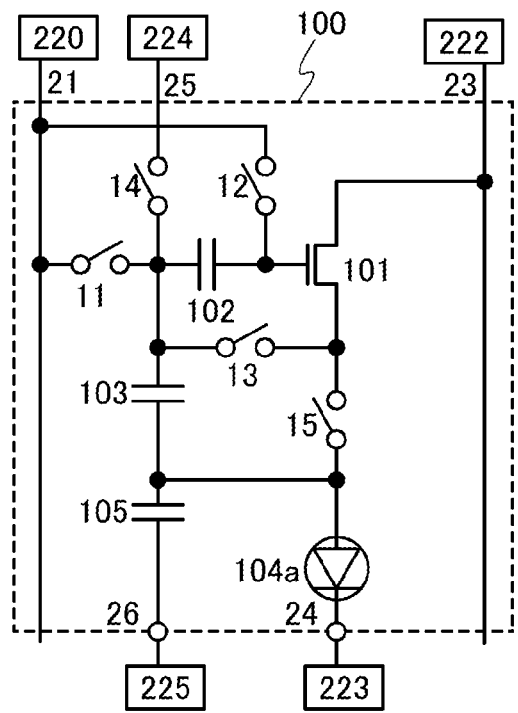

The structure of the circuit 100 in FIG. 57D corresponds to a structure where the switch 914 is added to the circuit 100 in FIG. 53D or a structure where the placement of the switch 14 in FIG. 57C is changed.

Semiconductor devices in FIGS. 58A to 58D include more than one of the circuit 220 having a function of supplying a constant voltage or a signal to the wiring 21, the circuit 222 having a function of supplying a constant voltage or a signal to the wiring 23, the circuit 223 having a function of supplying a constant voltage or a signal to the wiring 24, the circuit 224 having a function of supplying a constant voltage or a signal to the wiring 25, and the circuit 225 having a function of supplying a constant voltage or a signal to the wiring 26, in addition to the circuits 100 in FIGS. 57A to 57D.

Note that FIGS. 57A to 57D and FIGS. 58A to 58D each illustrate the structure of the circuit 100 using the light-emitting element 104a. However, the semiconductor device according to one aspect of the present invention may have a structure where the light-emitting element 104a is not provided or the load 104 or the light-emitting element 104b is provided instead of the light-emitting element 104a in the circuit 100 in each of FIGS. 57A to 57D and FIGS. 58A to 58D.

Figure 59A:
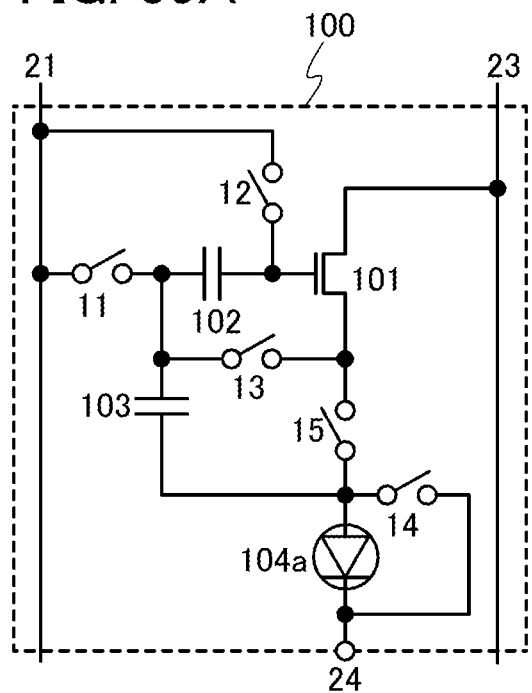
FIGS. 59A to 59C each illustrate the structure of a semiconductor device.

The structure of the circuit 100 in FIG. 59A corresponds to a structure where the wiring 25 is connected to the wiring 24 in the circuit 100 in FIG. 57A.

Figure 59B:
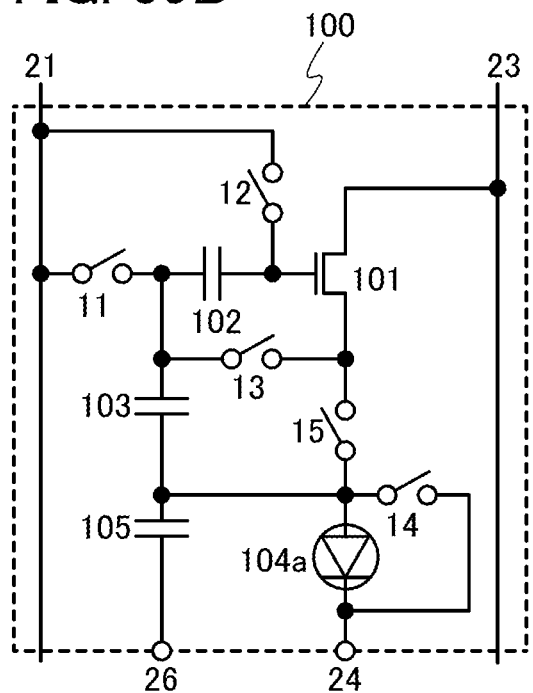

The structure of the circuit 100 in FIG. 59B corresponds to a structure where the wiring 25 is connected to the wiring 24 in the circuit 100 in FIG. 57C.

Figure 59C:
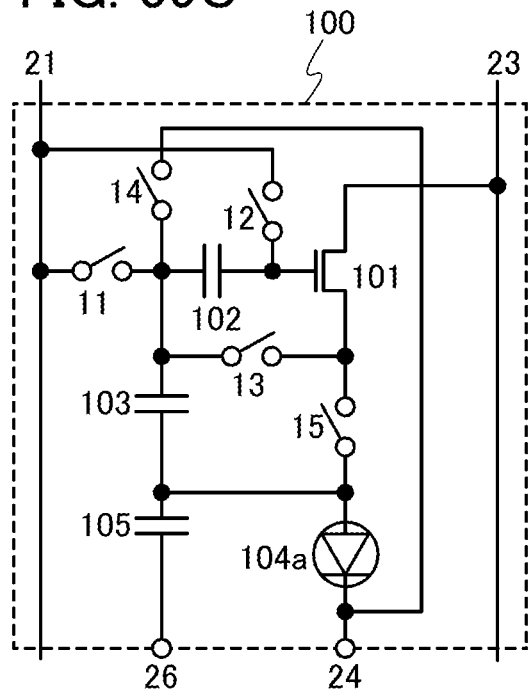

The structure of the circuit 100 in FIG. 59C corresponds to a structure where the wiring 25 is connected to the wiring 24 in the circuit 100 in FIG. 57D.

Figure 60A:
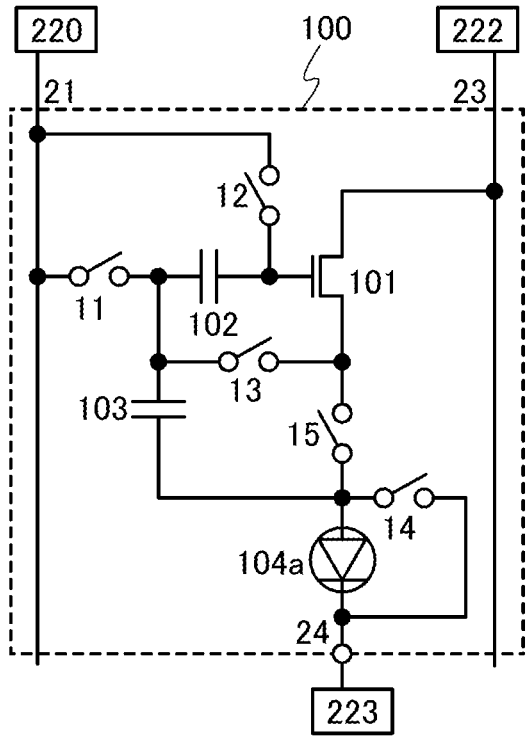
FIGS. 60A to 60C each illustrate the structure of a semiconductor device.
Figure 60B:
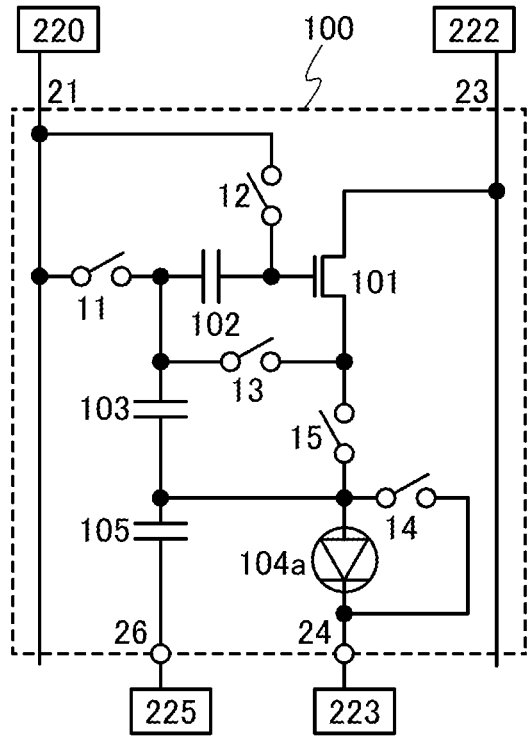
Figure 60C:
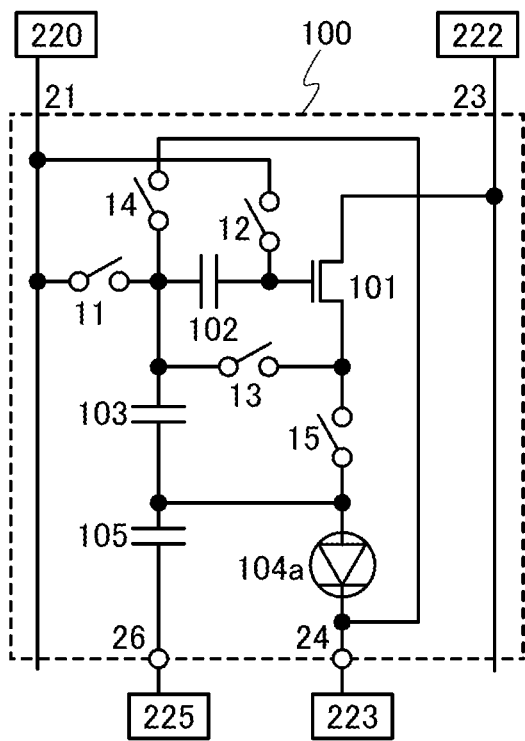

Semiconductor devices in FIGS. 60A to 60C include more than one of the circuit 220 having a function of supplying a constant voltage or a signal to the wiring 21, the circuit 222 having a function of supplying a constant voltage or a signal to the wiring 23, the circuit 223 having a function of supplying a constant voltage or a signal to the wiring 24, and the circuit 225 having a function of supplying a constant voltage or a signal to the wiring 26, in addition to the circuits 100 in FIGS. 59A to 59C.

Note that FIGS. 59A to 59C and FIGS. 60A to 60C each illustrate the structure of the circuit 100 using the light-emitting element 104a. However, the semiconductor device according to one aspect of the present invention may have a structure where the light-emitting element 104a is not provided or the load 104 or the light-emitting element 104b is provided instead of the light-emitting element 104a in the circuit 100 in each of FIGS. 59A to 59C and FIGS. 60A to 60C.

Note that the wiring 22 can be connected to a wiring other than the wiring 21. For example, the wiring 22 can be connected to the wiring 24. For example, the structure of the circuit 100 in FIG. 61A corresponds to a structure where the wiring 22 is connected to the wiring 24 in the circuit 100 in FIG. 11C.

Figure 61A:
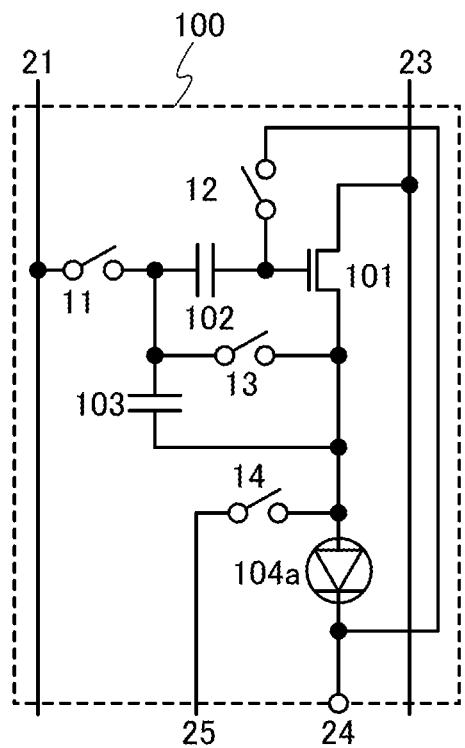
FIGS. 61A to 61D each illustrate the structure of a semiconductor device.
Figure 61B:
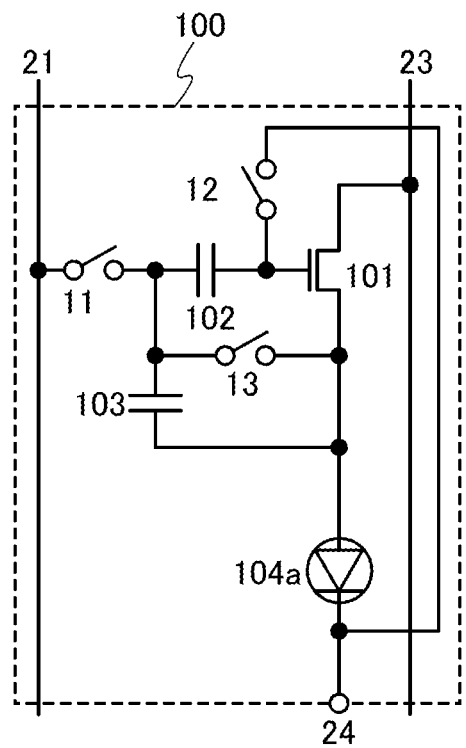

The structure of the circuit 100 in FIG. 61B corresponds to a structure where the wiring 22 is connected to the wiring 24 in the circuit 100 in FIG. 1C.

Figure 61C:
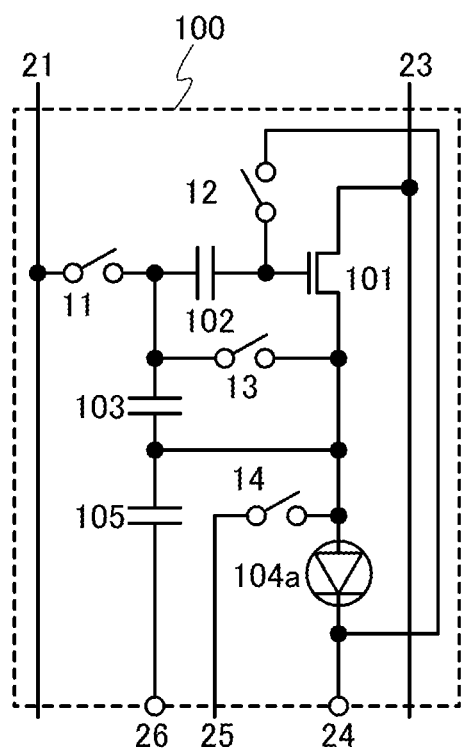

The structure of the circuit 100 in FIG. 61C corresponds to a structure where the wiring 22 is connected to the wiring 24 in the circuit 100 in FIG. 21A.

Figure 61D:
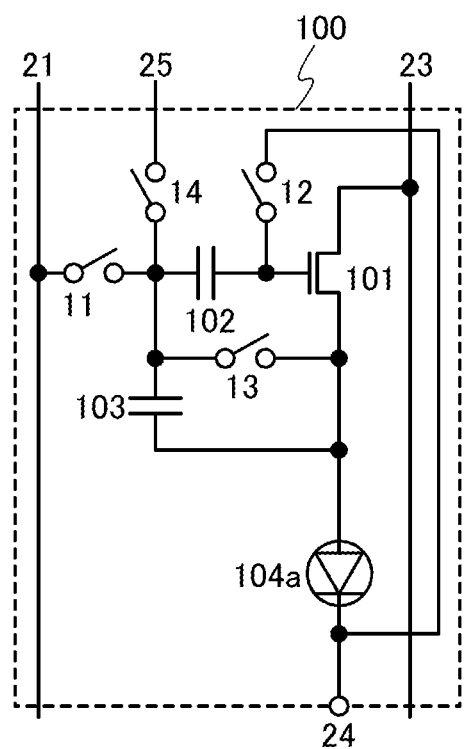
Figure 62A:
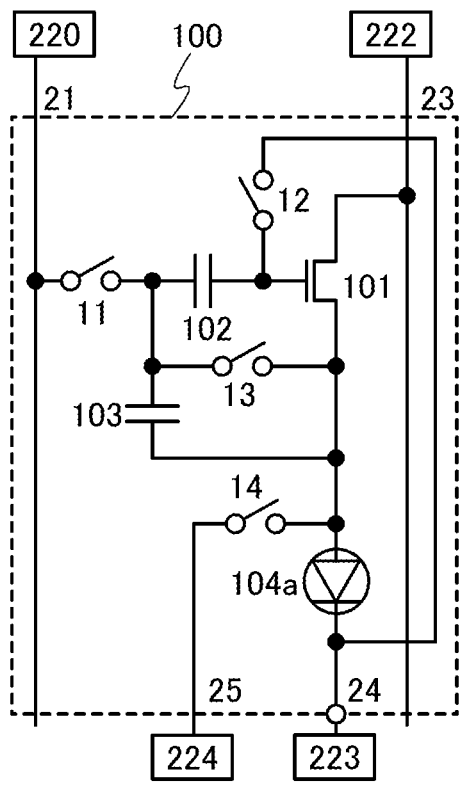
FIGS. 62A to 62D each illustrate the structure of a semiconductor device.
Figure 62B:
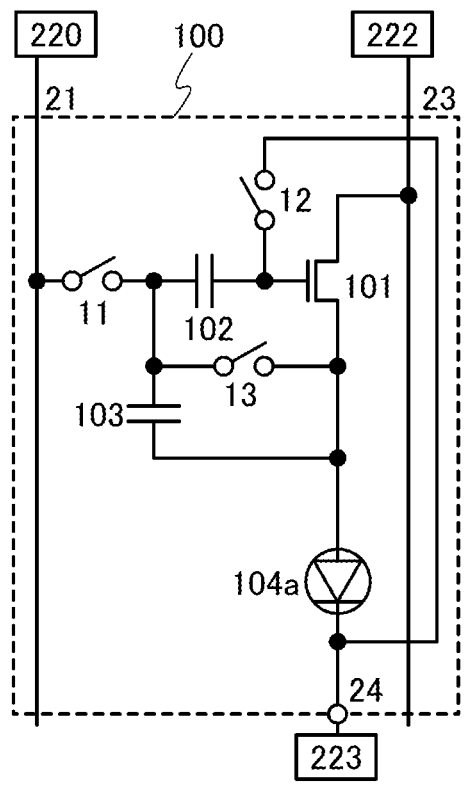
Figure 62C:
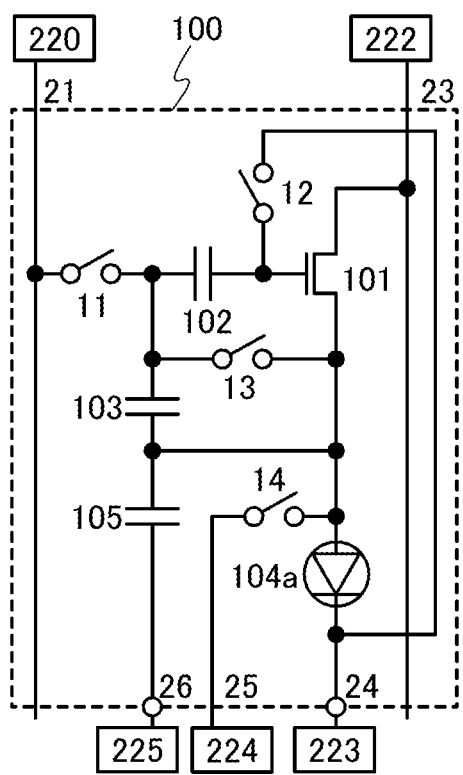
Figure 62D:
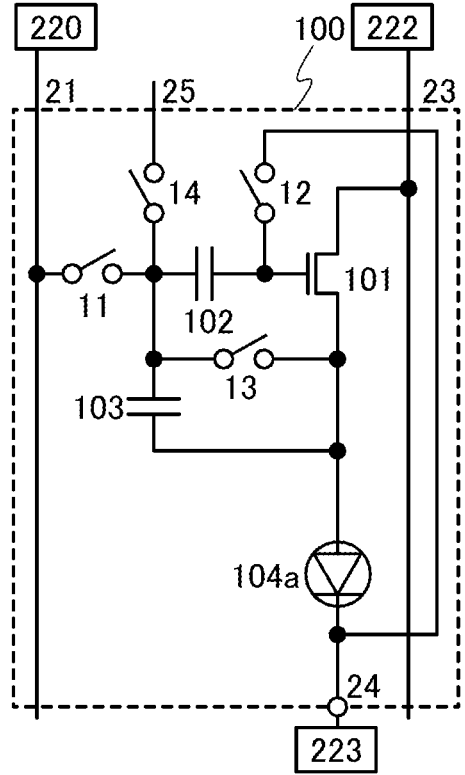

The structure of the circuit 100 in FIG. 61D corresponds to a structure where the wiring 22 is connected to the wiring 24 in the circuit 100 in FIG. 43A.

Semiconductor devices in FIGS. 62A to 62D include more than one of the circuit 220 having a function of supplying a constant voltage or a signal to the wiring 21, the circuit 222 having a function of supplying a constant voltage or a signal to the wiring 23, the circuit 223 having a function of supplying a constant voltage or a signal to the wiring 24, the circuit 224 having a function of supplying a constant voltage or a signal to the wiring 25, and the circuit 225 having a function of supplying a constant voltage or a signal to the wiring 26, in addition to the circuits 100 in FIGS. 61A to 61D.

Note that FIGS. 61A to 61D and FIGS. 62A to 62D each illustrate the structure of the circuit 100 using the light-emitting element 104a. However, the semiconductor device according to one aspect of the present invention may have a structure where the light-emitting element 104a is not provided or the load 104 or the light-emitting element 104b is provided instead of the light-emitting element 104a in the circuit 100 in each of FIGS. 61A to 61D and FIGS. 62A to 62D.

Figure 63A:
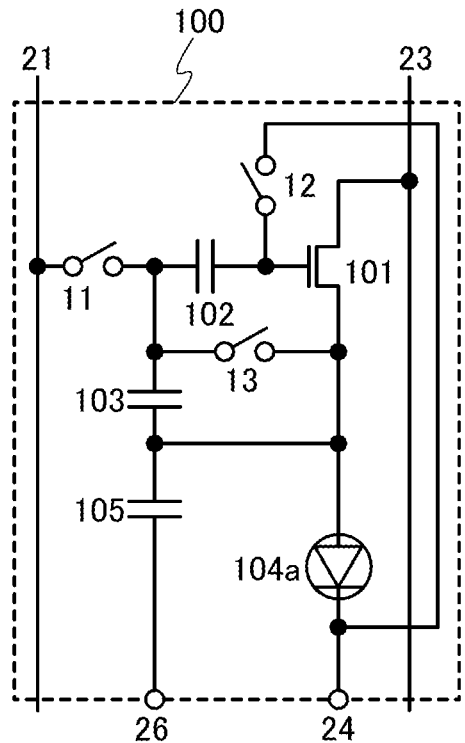
FIGS. 63A to 63D each illustrate the structure of a semiconductor device.

As in FIGS. 8A to 8D, FIGS. 9A to 9D, FIGS. 21A to 21E, FIGS. 22A to 22E, and the like, the capacitor 105 can be added. For example, the structure of the circuit 100 in FIG. 63A corresponds to a structure where the capacitor 105 is added to the circuit 100 in FIG. 61B or a structure where the wiring 22 is connected to the wiring 24 in the circuit 100 in FIG. 8A.

Figure 63B:
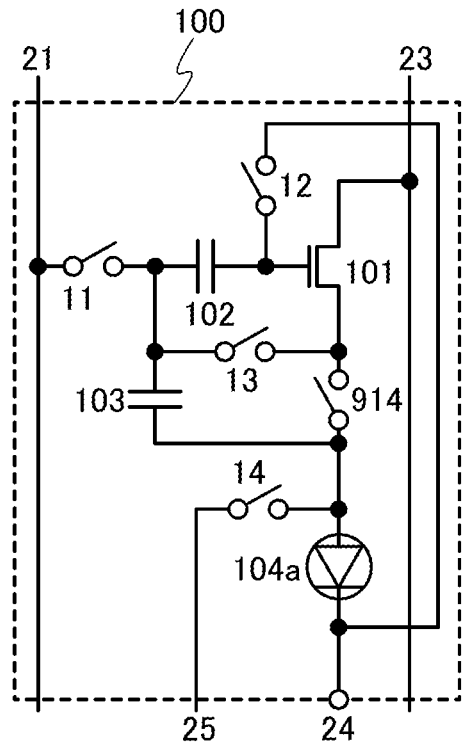

The structure of the circuit 100 in FIG. 63B corresponds to a structure where the wiring 22 is connected to the wiring 24 in the circuit 100 in FIG. 46A.

Figure 63C:
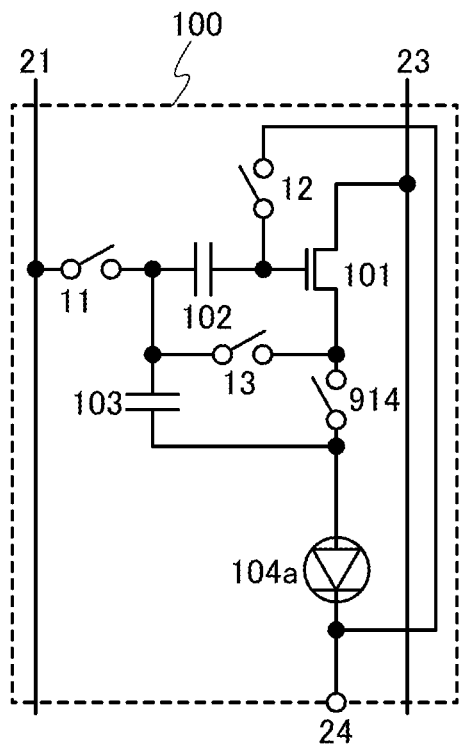

The structure of the circuit 100 in FIG. 63C corresponds to a structure where the wiring 22 is connected to the wiring 24 in the circuit 100 in FIG. 28C.

Figure 63D:
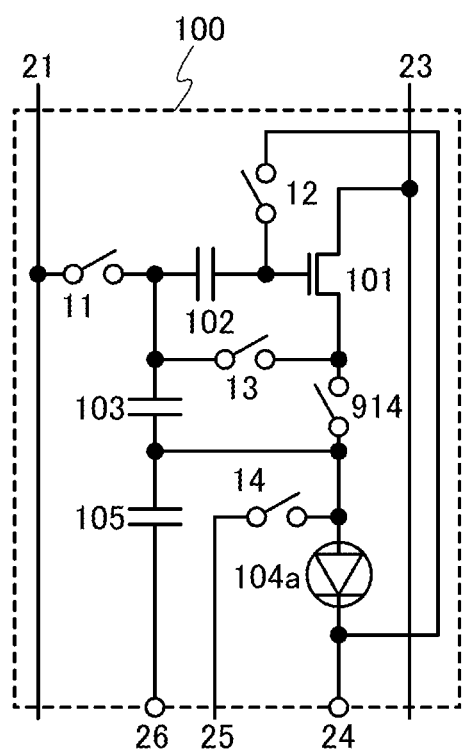
Figure 64A:
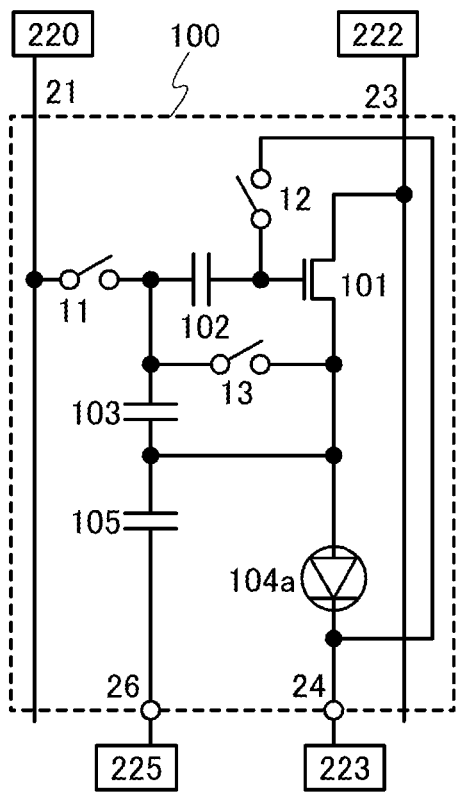
FIGS. 64A to 64D each illustrate the structure of a semiconductor device.
Figure 64B:
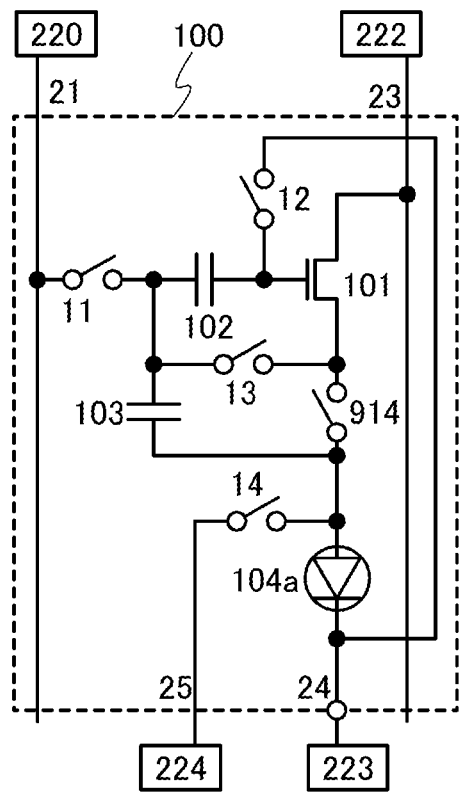
Figure 64C:
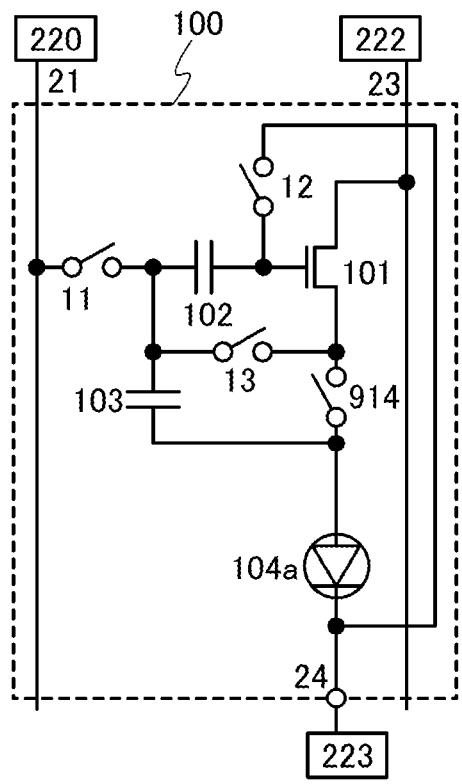
Figure 64D:
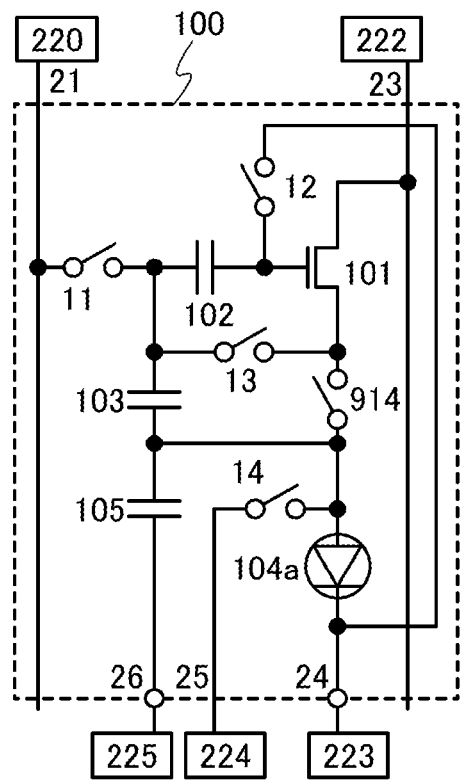

As in FIGS. 8A to 8D, FIGS. 9A to 9D, FIGS. 21A to 21E, FIGS. 22A to 22E, and the like, the structure of the circuit 100 in FIG. 63D corresponds to a structure where the capacitor 105 is added to the circuit 100 in FIG. 63C.

Semiconductor devices in FIGS. 64A to 64D include more than one of the circuit 220 having a function of supplying a constant voltage or a signal to the wiring 21, the circuit 222 having a function of supplying a constant voltage or a signal to the wiring 23, the circuit 223 having a function of supplying a constant voltage or a signal to the wiring 24, the circuit 224 having a function of supplying a constant voltage or a signal to the wiring 25, and the circuit 225 having a function of supplying a constant voltage or a signal to the wiring 26, in addition to the circuits 100 in FIGS. 63A to 63D.

Note that FIGS. 63A to 63D and FIGS. 64A to 64D each illustrate the structure of the circuit 100 using the light-emitting element 104a. However, the semiconductor device according to one aspect of the present invention may have a structure where the light-emitting element 104a is not provided or the load 104 or the light-emitting element 104b is provided instead of the light-emitting element 104a in the circuit 100 in each of FIGS. 63A to 63D and FIGS. 64A to 64D.

Figure 65A:
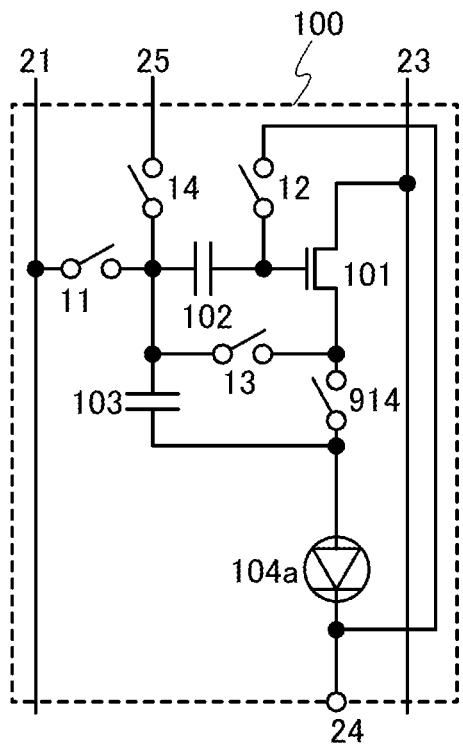
FIGS. 65A to 65D each illustrate the structure of a semiconductor device.

The structure of the circuit 100 in FIG. 65A corresponds to a structure where the switch 914 is added to the circuit 100 in FIG. 61D. In the circuit 100 in FIG. 65A, the switch 914 has a function of controlling conduction between the one of the source and the drain of the transistor 101 and the other electrode of the capacitor 103, and conduction between the one of the source and the drain of the transistor 101 and the anode of the light-emitting element 104a.

Figure 65B:
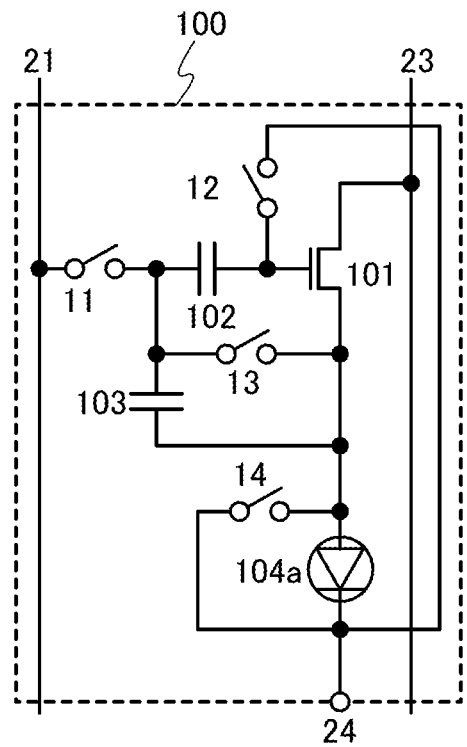

The structure of the circuit 100 in FIG. 65B corresponds to a structure where the wiring 25 is connected to the wiring 24 in the circuit 100 in FIG. 61A.

Figure 65C:
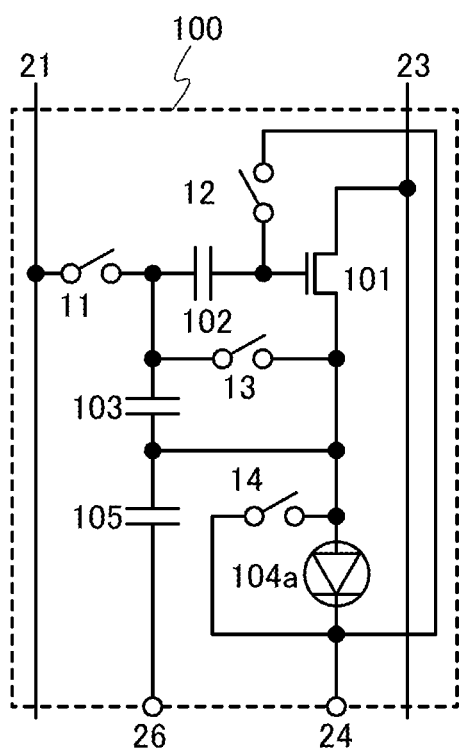

The structure of the circuit 100 in FIG. 65C corresponds to a structure where the wiring 25 is connected to the wiring 24 in the circuit 100 in FIG. 61C.

Figure 65D:
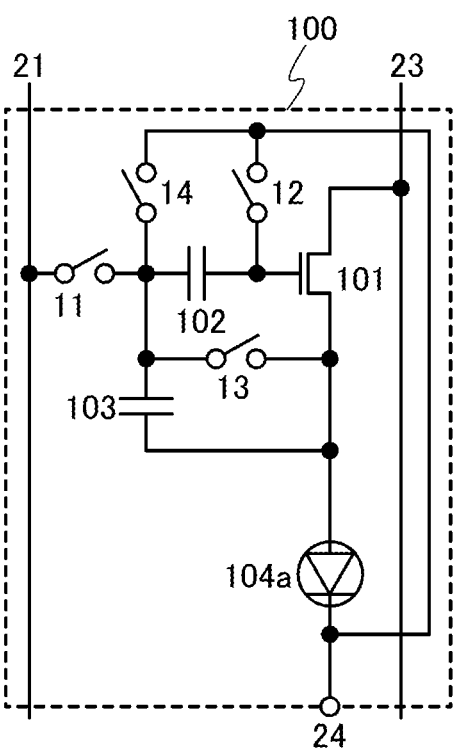
Figure 66A:
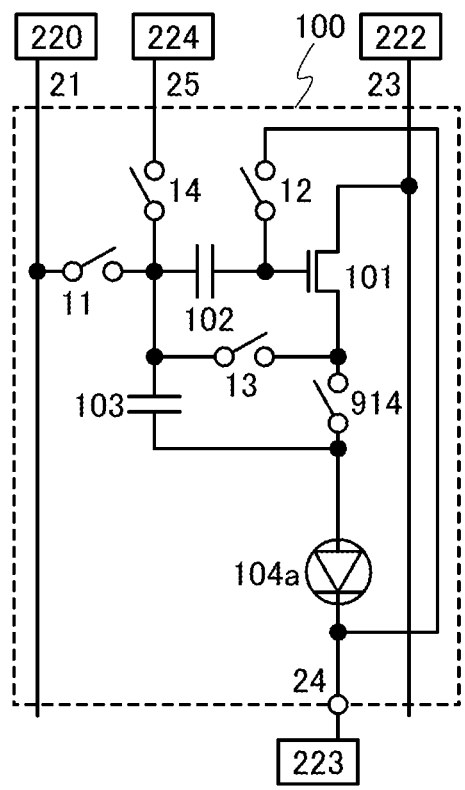
FIGS. 66A to 66D each illustrate the structure of a semiconductor device.
Figure 66B:
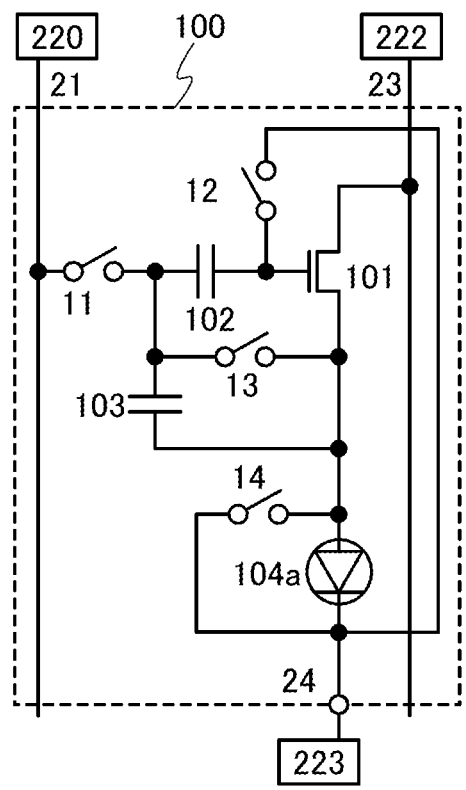
Figure 66C:
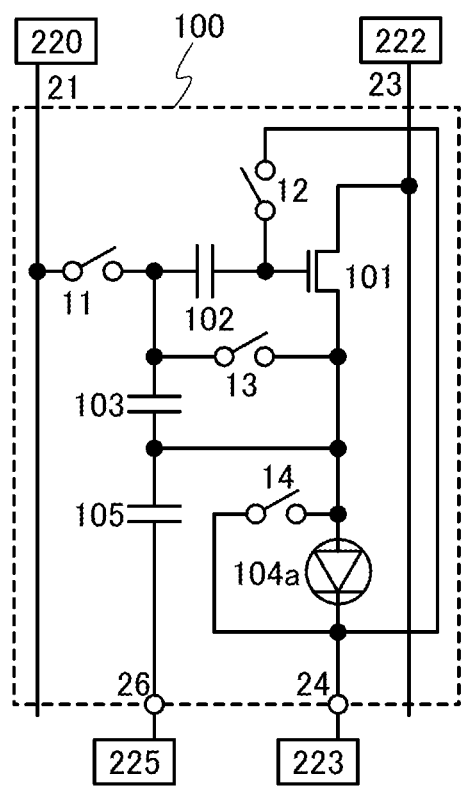
Figure 66D:
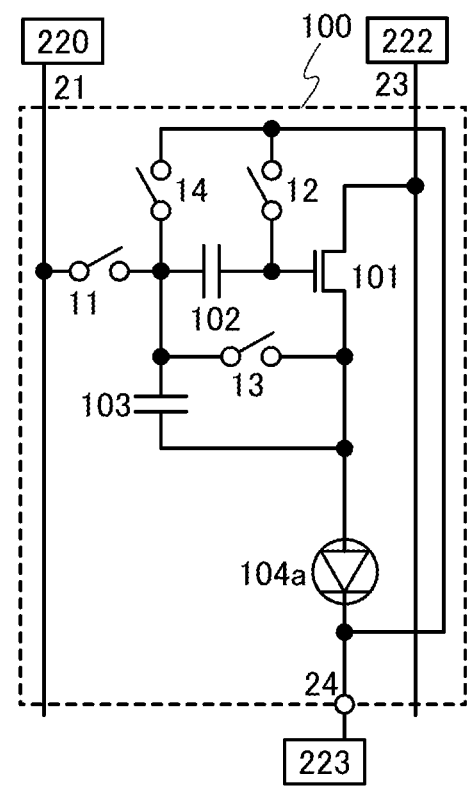

The structure of the circuit 100 in FIG. 65D corresponds to a structure where the wiring 25 is connected to the wiring 24 in the circuit 100 in FIG. 61D.

Semiconductor devices in FIGS. 66A to 66D include more than one of the circuit 220 having a function of supplying a constant voltage or a signal to the wiring 21, the circuit 222 having a function of supplying a constant voltage or a signal to the wiring 23, the circuit 223 having a function of supplying a constant voltage or a signal to the wiring 24, the circuit 224 having a function of supplying a constant voltage or a signal to the wiring 25, and the circuit 225 having a function of supplying a constant voltage or a signal to the wiring 26, in addition to the circuits 100 in FIGS. 65A to 65D.

Note that FIGS. 65A to 65D and FIGS. 66A to 66D each illustrate the structure of the circuit 100 using the light-emitting element 104a. However, the semiconductor device according to one aspect of the present invention may have a structure where the light-emitting element 104a is not provided or the load 104 or the light-emitting element 104b is provided instead of the light-emitting element 104a in the circuit 100 in each of FIGS. 65A to 65D and FIGS. 66A to 66D.

Figure 67A:
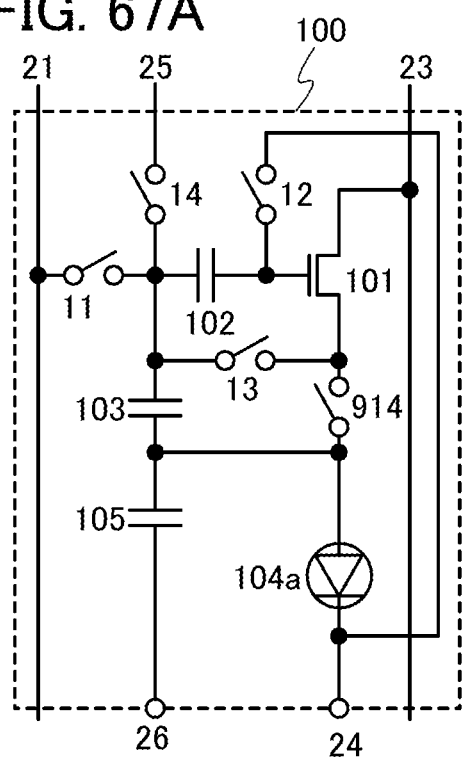
FIGS. 67A to 67C each illustrate the structure of a semiconductor device.

As in FIGS. 8A to 8D, FIGS. 9A to 9D, FIGS. 21A to 21E, FIGS. 22A to 22E, and the like, the structure of the circuit 100 in FIG. 67A corresponds to a structure where the capacitor 105 is added to the circuit 100 in FIG. 65A.

Figure 67B:
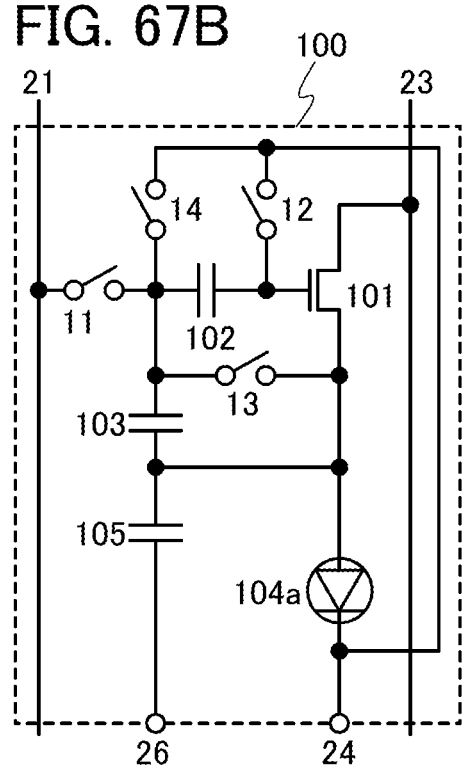

As in FIGS. 8A to 8D, FIGS. 9A to 9D, FIGS. 21A to 21E, FIGS. 22A to 22E, and the like, the structure of the circuit 100 in FIG. 67B corresponds to a structure where the capacitor 105 is added to the circuit 100 in FIG. 65D.

Figure 67C:
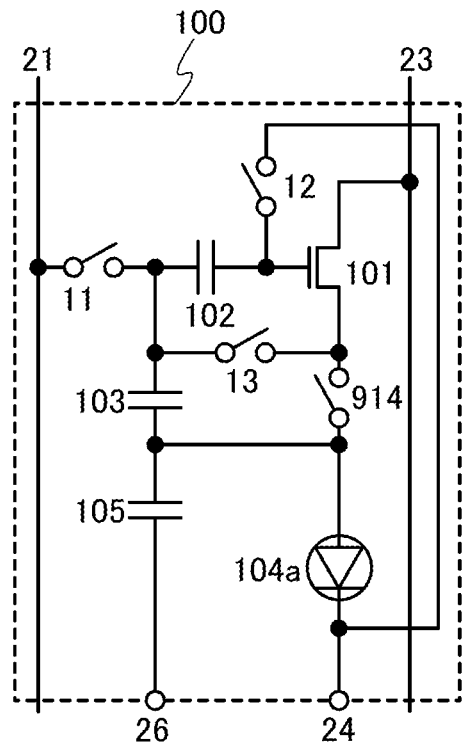

As in FIGS. 8A to 8D, FIGS. 9A to 9D, FIGS. 21A to 21E, FIGS. 22A to 22E, and the like, the structure of the circuit 100 in FIG. 67C corresponds to a structure where the capacitor 105 is added to the circuit 100 in FIG. 63C.

Figure 68A:
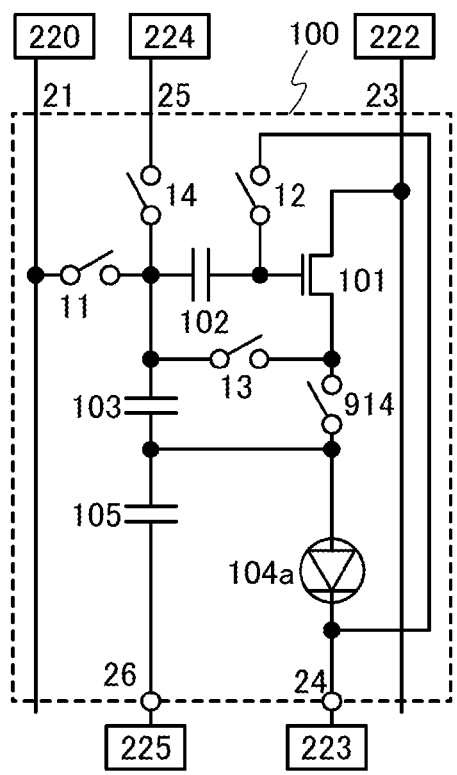
FIGS. 68A to 68C each illustrate the structure of a semiconductor device.
Figure 68B:
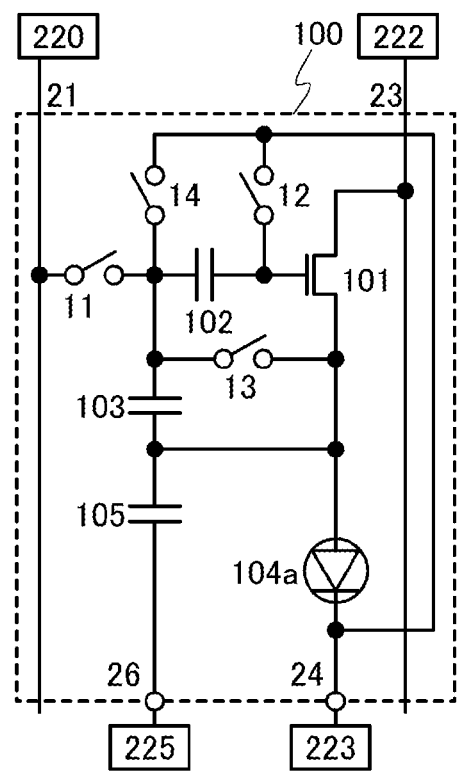
Figure 68C:
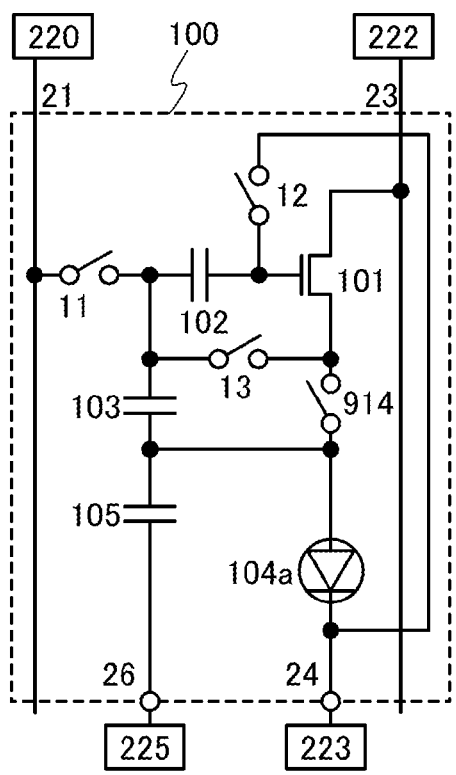

Semiconductor devices in FIGS. 68A to 68C include more than one of the circuit 220 having a function of supplying a constant voltage or a signal to the wiring 21, the circuit 222 having a function of supplying a constant voltage or a signal to the wiring 23, the circuit 223 having a function of supplying a constant voltage or a signal to the wiring 24, the circuit 224 having a function of supplying a constant voltage or a signal to the wiring 25, and the circuit 225 having a function of supplying a constant voltage or a signal to the wiring 26, in addition to the circuits 100 in FIGS. 67A to 67C.

Note that FIGS. 67A to 67C and FIGS. 68A to 68C each illustrate the structure of the circuit 100 using the light-emitting element 104a. However, the semiconductor device according to one aspect of the present invention may have a structure where the light-emitting element 104a is not provided or the load 104 or the light-emitting element 104b is provided instead of the light-emitting element 104a in the circuit 100 in each of FIGS. 67A to 67C and FIGS. 68A to 68C.

Note that as in the diagrams that have been described, the switch 14, the switch 914, the capacitor 105, or the like can be added to the circuit 100 in each of FIGS. 32A to 32D. Alternatively, in the circuits 100 in FIGS. 32A to 32D, the variety of wirings are connected to a variety of different wirings so that the number of wirings can be reduced. For example, as in FIGS. 11A to 11D, the structures of the circuits 100 in FIGS. 69A to 69D correspond to structures where the switches 14 are added to the circuits 100 in FIGS. 32A to 32D.

The semiconductor device according to one aspect of the present invention may further include a circuit for supplying a variety of constant voltage or signals to the circuit 100, in addition to the circuits 100 in FIGS. 69A to 69D.

Semiconductor devices in FIGS. 70A to 70D include the circuit 220 having a function of supplying a constant voltage or a signal to the wiring 21, the circuit 221 having a function of supplying a constant voltage or a signal to the wiring 22, a circuit 222a having a function of supplying a constant voltage or a signal to the wiring 23a, a circuit 222b having a function of supplying a constant voltage or a signal to the wiring 23b, the circuit 223 having a function of supplying a constant voltage or a signal to the wiring 24, and the circuit 224 having a function of supplying a constant voltage or a signal to the wiring 25, in addition to the circuits 100 in FIGS. 69A to 69D.

Note that FIGS. 70A to 70D each illustrate an example in which the semiconductor device includes the circuit 220, the circuit 221, the circuit 222a, the circuit 222b, the circuit 223, and the circuit 224 in addition to the circuit 100. However, the semiconductor device according to one aspect of the present invention does not necessarily include all the circuit 220, the circuit 221, the circuit 222a, the circuit 222b, the circuit 223, and the circuit 224 in addition to the circuit 100. The semiconductor device may include only one or more of these circuits.

Figure 73A:
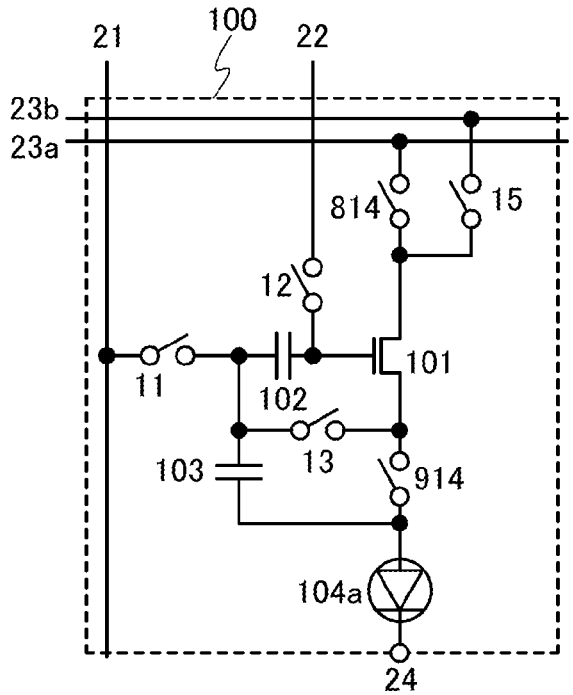
FIGS. 73A to 73D each illustrate the structure of a semiconductor device.

The structure of the circuit 100 in FIG. 73A corresponds to a structure where the switch 914 is added to the circuit 100 in FIG. 32C. The switch 914 has a function of controlling conduction between the one of the source and the drain of the transistor 101 and the other electrode of the capacitor 103, and conduction between the one of the source and the drain of the transistor 101 and the anode of the light-emitting element 104a.

Figure 69A:
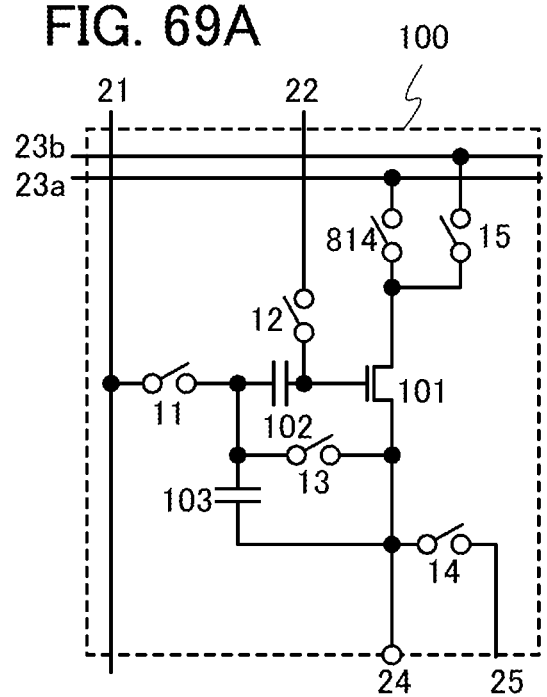
FIGS. 69A to 69D each illustrate the structure of a semiconductor device.
Figure 69B:
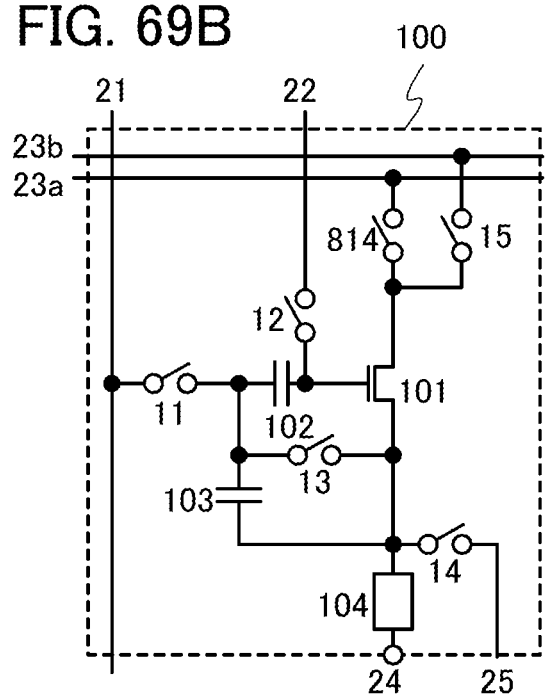
Figure 69C:
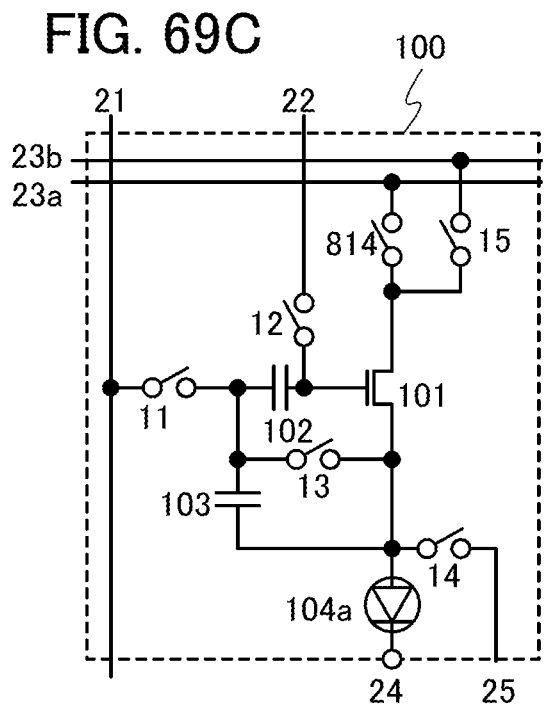
Figure 69D:
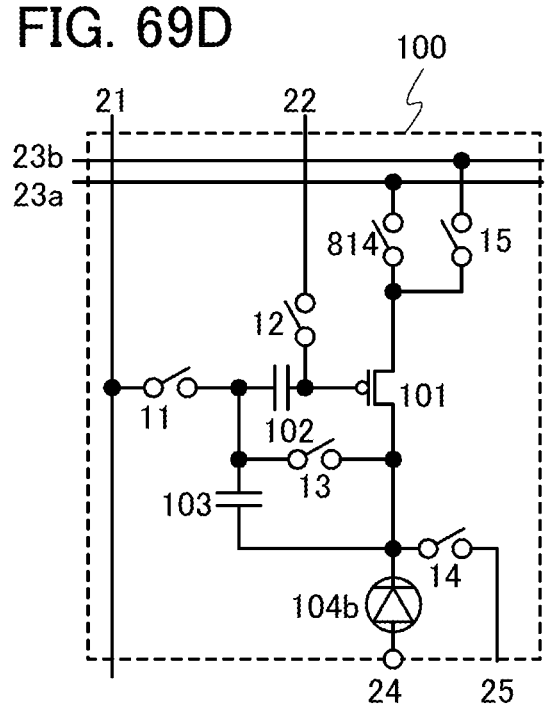
Figure 70A:
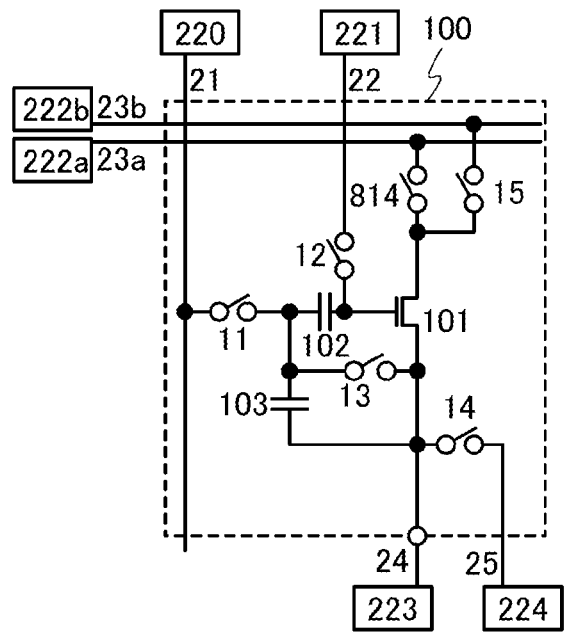
FIGS. 70A to 70D each illustrate the structure of a semiconductor device.
Figure 70B:
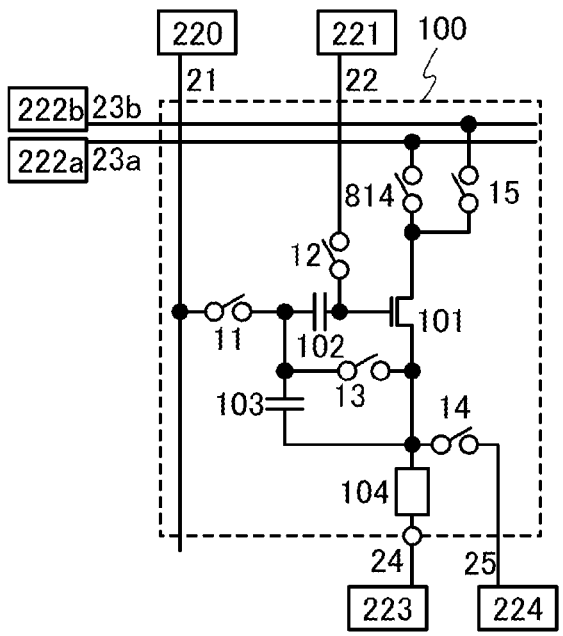
Figure 70C:
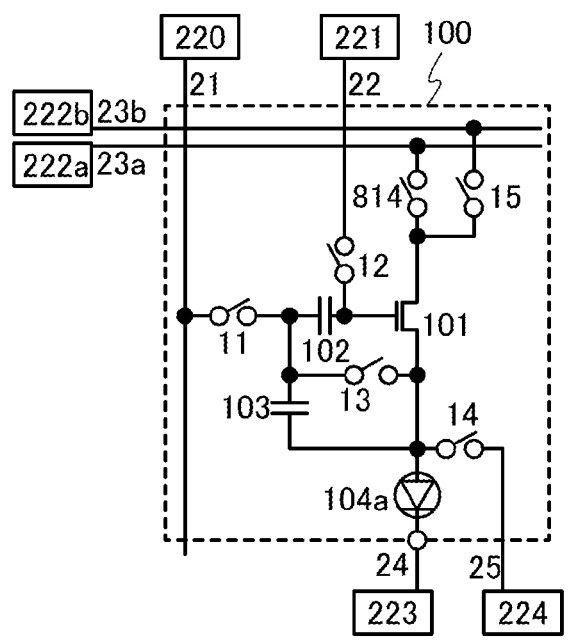
Figure 70D:
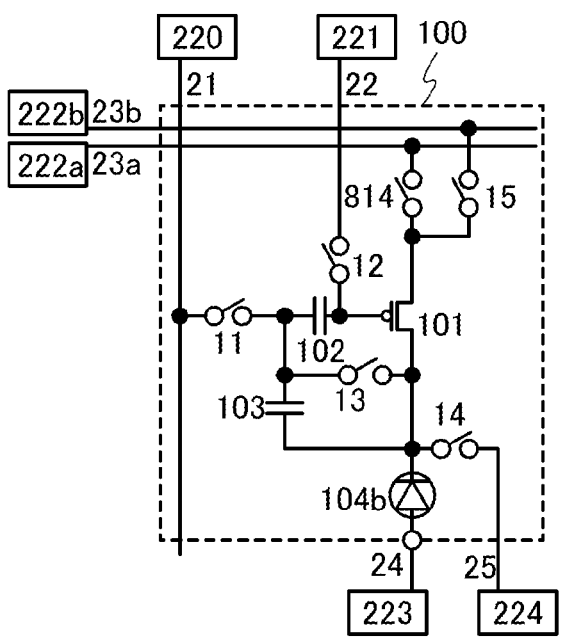
Figure 73B:
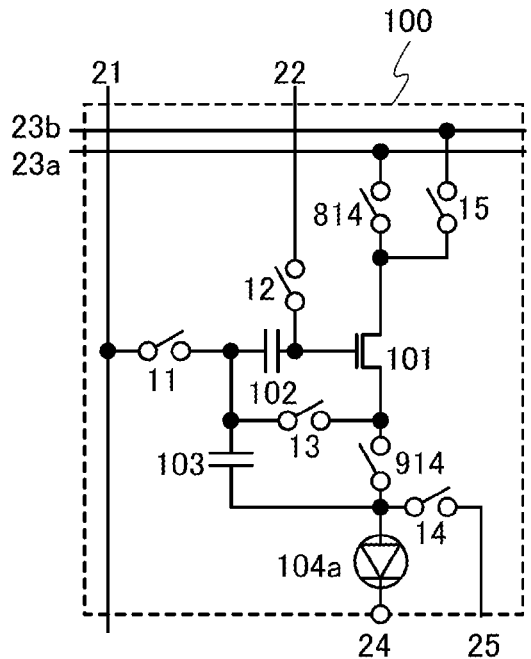

The structure of the circuit 100 in FIG. 73B corresponds to a structure where the switch 914 is added to the circuit 100 in FIG. 69C. The switch 914 has a function of controlling conduction between the one of the source and the drain of the transistor 101 and the other electrode of the capacitor 103, and conduction between the one of the source and the drain of the transistor 101 and the anode of the light-emitting element 104a.

The semiconductor device according to one aspect of the present invention may further include a circuit for supplying a variety of constant voltage or signals to the circuit 100, in addition to the circuits 100 in FIGS. 73A and 73B.

Figure 73C:
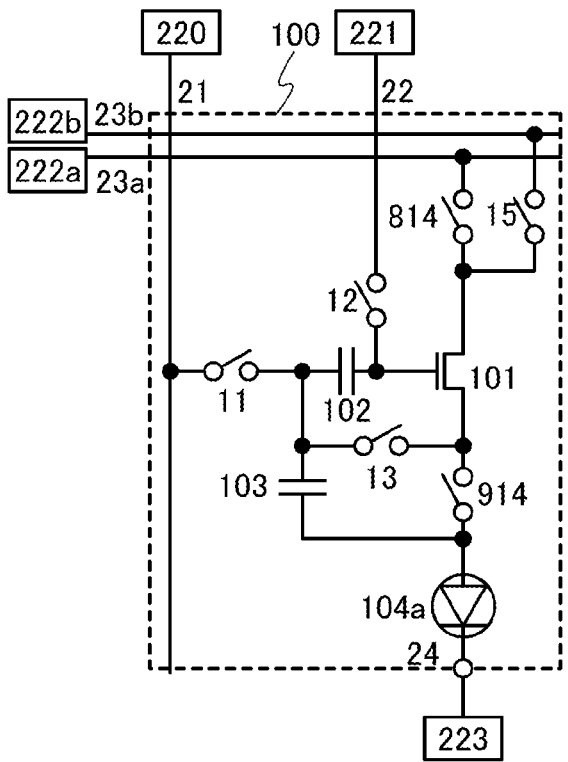
Figure 73D:
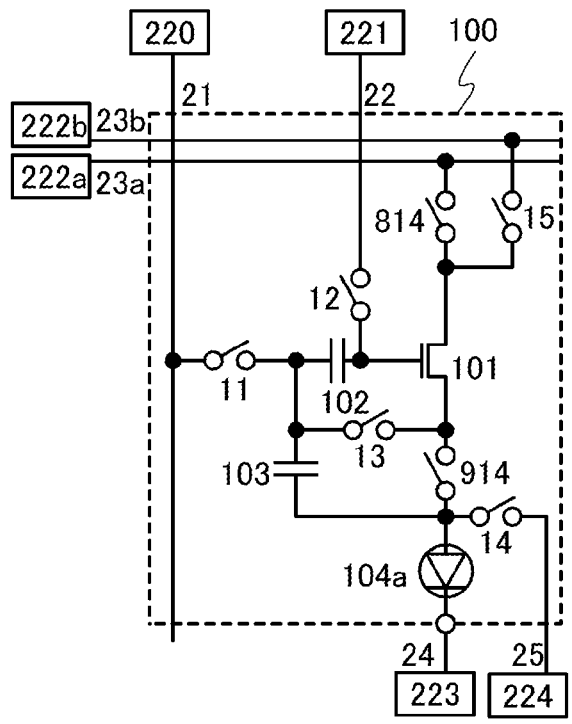

Semiconductor devices in FIGS. 73C and 73D include the circuit 220 having a function of supplying a constant voltage or a signal to the wiring 21, the circuit 221 having a function of supplying a constant voltage or a signal to the wiring 22, the circuit 222a having a function of supplying a constant voltage or a signal to the wiring 23a, the circuit 222b having a function of supplying a constant voltage or a signal to the wiring 23b, the circuit 223 having a function of supplying a constant voltage or a signal to the wiring 24, and the circuit 224 having a function of supplying a constant voltage or a signal to the wiring 25, in addition to the circuits 100 in FIGS. 73A and 73B.

Note that FIGS. 73C and 73D each illustrate an example in which the semiconductor device includes the circuit 220, the circuit 221, the circuit 222a, the circuit 222b, the circuit 223, and the circuit 224 in addition to the circuit 100. However, the semiconductor device according to one aspect of the present invention does not necessarily include all the circuit 220, the circuit 221, the circuit 222a, the circuit 222b, the circuit 223, and the circuit 224 in addition to the circuit 100. The semiconductor device may include only one or more of these circuits.

Note that as in the diagrams that have been described, the switch 14, the switch 914, the capacitor 105, or the like can be added to the circuit 100 in each of FIGS. 34A to 34D. Alternatively, in the circuits 100 in FIGS. 34A to 34D, the variety of wirings are connected to a variety of different wirings so that the number of wirings can be reduced. For example, FIGS. 71A to 71D illustrate examples of the placement of the circuits 100 in FIGS. 34A to 34D.

Figure 71A:
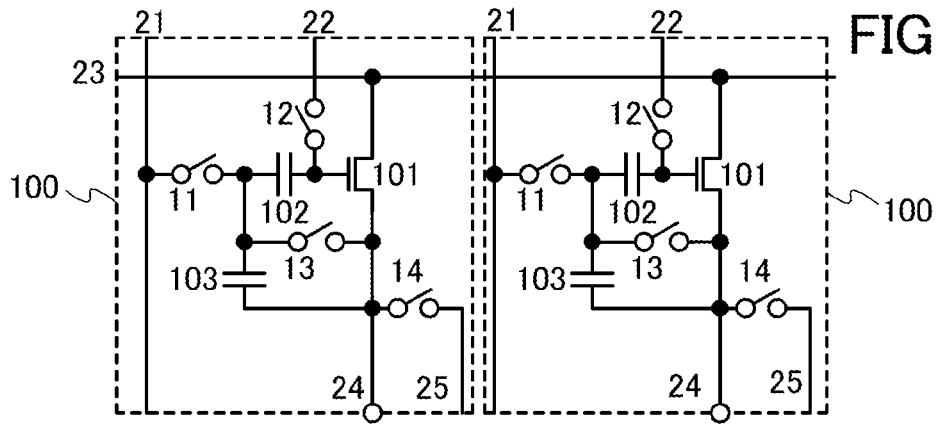
FIGS. 71A to 71D each illustrate the structure of a semiconductor device.
Figure 71B:
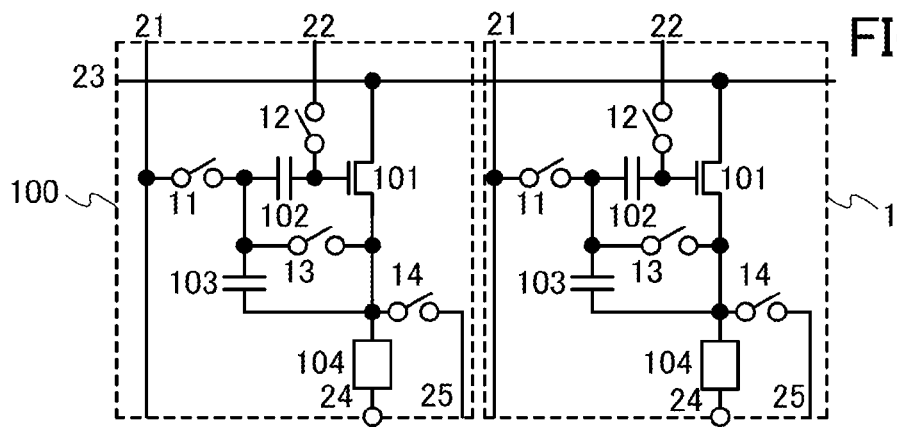
Figure 71C:
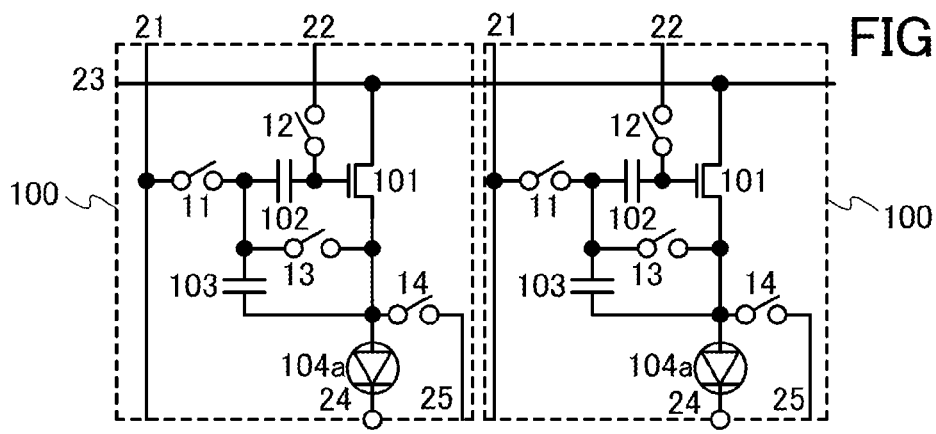
Figure 71D:
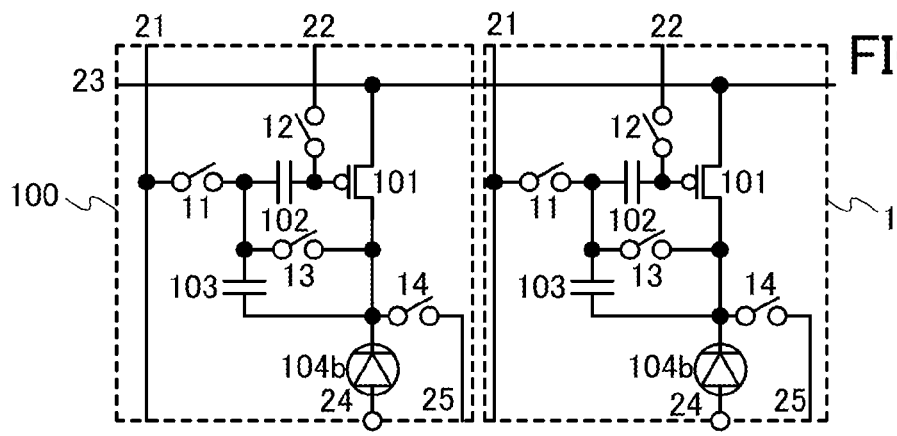

The operation of the semiconductor device according to one aspect of the present invention is described taking the circuit 100 in FIG. 71C as an example.

The operation of the circuit 100 in FIG. 71C can be mainly divided into first operation, second operation, third operation, and fourth operation. Note that the operation of the circuit 100 in FIG. 71C is not limited thereto, and another operation can be added or part of the operation can be omitted.

Figure 72A:
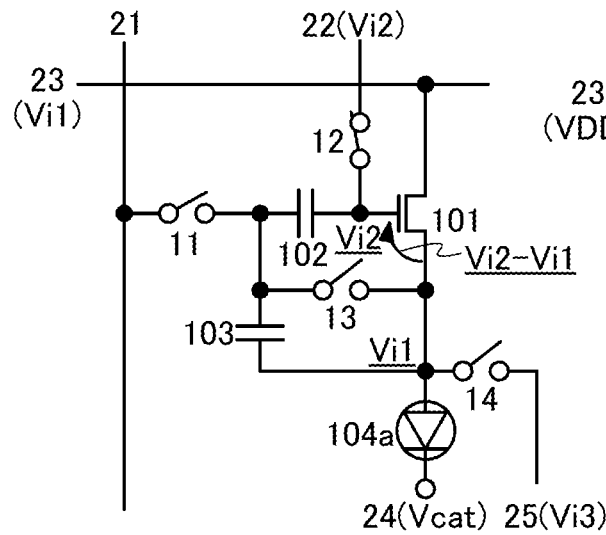
FIGS. 72A to 72D each illustrate the operation of a semiconductor device.

First, the first operation in the period T11 is described. In the period T11, as illustrated in FIG. 72A, the switch 11, the switch 13, and the switch 14 are off, and the switch 12 is on. The potential Vi1 is supplied to the wiring 23. Thus, in the period T11, the potential of the anode of the light-emitting element 104a becomes the potential Vi1, and the gate-source voltage Vgs101 of the transistor 101 becomes the voltage Vi2−Vi1.

Note that although FIG. 72A illustrates the example in which the switch 11 is off, the switch 11 may be on. In addition, although FIG. 72A illustrates the example in which the switch 14 is off, the switch 14 may be on. In that case, the potential Vi3 is supplied to the wiring 25. Thus, the potential of the anode of the light-emitting element 104a becomes the potential Vi3, and the gate-source voltage Vgs101 of the transistor 101 becomes voltage Vi2−Vi3. Further, the switch 13 may be on.

Figure 72B:
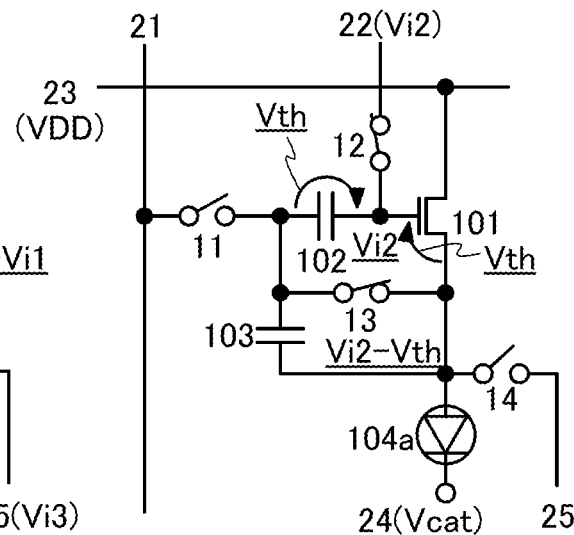

The second operation in the period T12 is described. In the period T12, as illustrated in FIG. 72B, the switch 11 and the switch 14 are off, and the switch 12 and the switch 13 are on. The potential VDD or a potential that is higher than the potential Vi1 is supplied to the wiring 23. By supply of the potential VDD to the wiring 23, electric charge accumulated in the capacitor 102 is released, and the threshold voltage Vth of the transistor 101 is eventually held in the capacitor 102. Thus, in the period T12, the threshold voltage Vth is held in the capacitor 102, the anode of the light-emitting element 104a becomes the potential Vi2−Vth, and the gate-source voltage Vgs101 of the transistor 101 becomes the threshold voltage Vth.

Figure 72C:
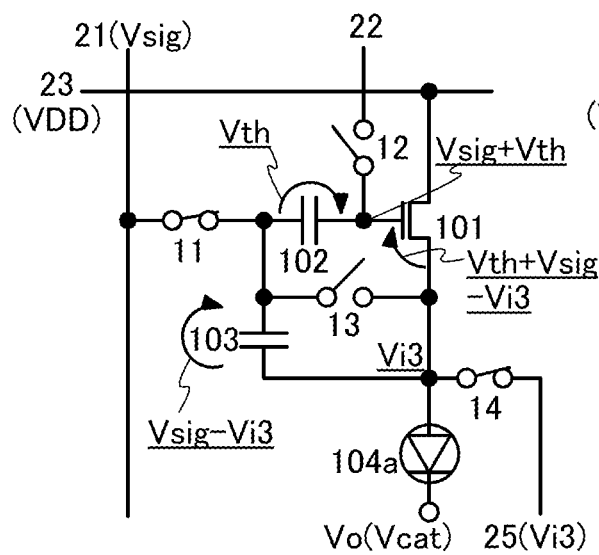

The third operation in the period T13 is described. In the period T13, as illustrated in FIG. 72C, the switch 11 and the switch 14 are on, and the switch 12 and the switch 13 are off. The potential Vsig is supplied to the wiring 21, the potential VDD is supplied to the wiring 23, and the potential Vi3 is supplied to the wiring 25. Thus, in the period T13, the threshold voltage Vth is held in the capacitor 102, voltage Vsig−Vi3 is held in the capacitor 103, the potential of the anode of the light-emitting element 104a becomes the potential Vi3, the potential of the gate of the transistor 101 becomes the potential Vsig+Vth, and the gate-source voltage Vgs101 of the transistor 101 becomes voltage Vsig+Vth−Vi3. Further, the switch 14 may be off.

Figure 72D:
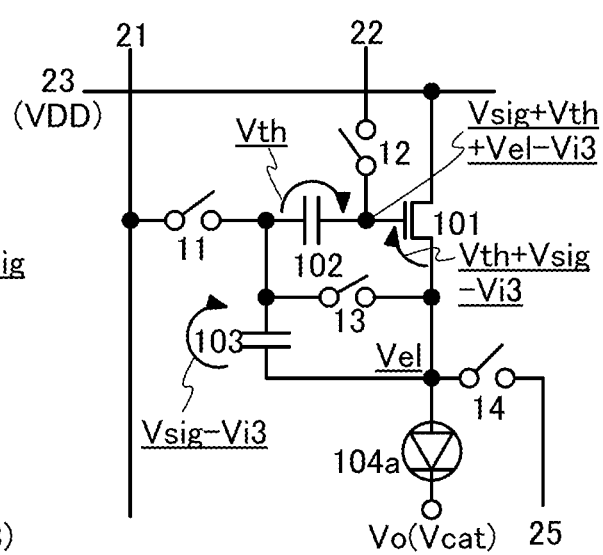

The fourth operation in the period T14 is described. In the period T14, as illustrated in FIG. 72D, the switch 11, the switch 12, the switch 13, and the switch 14 are off. The potential VDD is supplied to the wiring 23. Thus, in the period T14, the threshold voltage Vth is held in the capacitor 102, the voltage Vsig−Vi3 is held in the capacitor 103, the potential of the anode of the light-emitting element 104a becomes the potential Ve1, the potential of the gate of the transistor 101 becomes a potential Vsig+Vth−Vi3+Ve1, and the gate-source voltage Vgs101 of the transistor 101 becomes the voltage Vsig+Vth−Vi3.

Note that the potential Ve1 is set when current flows to the light-emitting element 104a through the transistor 101. Specifically, the potential Ve1 is set to a potential between the potential VDD and the potential Vcat.

In the fourth operation, the gate-source voltage Vgs101 of the transistor 101 can be set to the voltage Vsig+Vth−Vi3 by taking the threshold voltage Vth of the transistor 101 into consideration. Accordingly, variations in the threshold voltage Vth of the transistors 101 can be prevented from influencing the value of current supplied to the light-emitting elements 104a. Alternatively, even when the transistor 11 is degraded and the threshold voltage Vth is changed, the change in the threshold voltage Vth can be prevented from influencing the value of current supplied to the light-emitting element 104a. Thus, display unevenness can be reduced and high-quality images can be displayed.

Note that in the semiconductor device according to one aspect of the present invention, the gate of the transistor 101 is held at the potential Vi2 in the second operation. Accordingly, even when the transistor 101 is normally on, that is, even when the threshold voltage Vth is negative voltage, the electric charge accumulated in the capacitor 102 can be released until the potential of the source of the transistor 101 becomes higher than the potential Vi2 of the gate of the transistor 101. Thus, in the semiconductor device according to one aspect of the present invention, even when the transistor 101 is normally on, it is possible to set the gate-source voltage Vgs101 of the transistor 101 by taking the threshold voltage Vth of the transistor 101 into consideration in the fourth operation.

In this embodiment, one wiring is connected to a variety of different wirings, for example, the wiring 21, the wiring 22, the wiring 23, the wiring 24, the wiring 25, the wiring 26, the wiring 27, a wiring of another circuit 100, the scan line, the gate line, a wiring connected to the gate of the transistor, or the like. Thus, the number of wirings can be reduced. Further, another switch or another element, for example, the switch 914, the switch 814, the switch 14, or the capacitor 105 is added to the circuit 100. In other words, this embodiment is obtained by performing change, addition, modification, removal, application, superordinate conceptualization, or subordinate conceptualization on part or all of another embodiment. Thus, part or all of this embodiment can be freely combined with, applied to, or replaced with part or all of another embodiment.

(Embodiment 4)

FIGS. 74A to 74F, FIGS. 75A to 75E, and FIGS. 76A to 76G each illustrate examples of the placement of a variety of wirings in a semiconductor device according to one aspect of the present invention.

Figure 74A:
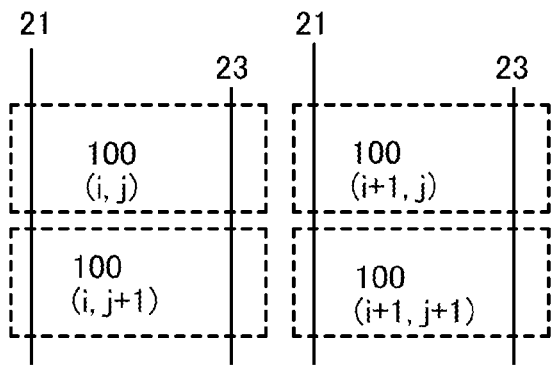
FIGS. 74A to 74F each illustrate the structure of a semiconductor device.

In FIG. 74A, a circuit 100 (i, j) in an i-th column and a j-th row and a circuit 100 (i, j+1) in the i-th column and a (j+1)th row share one wiring 21 and one wiring 23. In addition, a circuit 100 (i+1, j) in an (i+1)th column and the j-th row and a circuit 100 (i+1, j+1) in the (i+1)th column and the (j+1)th row share one wiring 21 and one wiring 23.

Figure 74B:
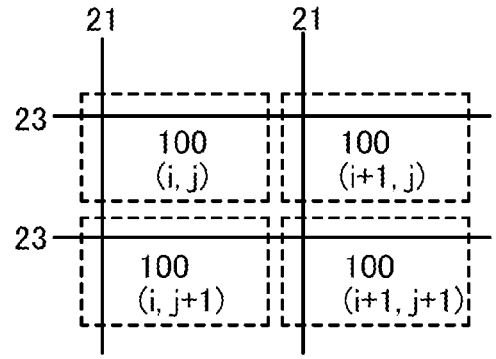

In FIG. 74B, the circuit 100 (i, j) in the i-th column and the j-th row and the circuit 100 (i, j+1) in the i-th column and the (j+1)th row share one wiring 21. In addition, the circuit 100 (i+1, j) in the (i+1)th column and the j-th row and the circuit 100 (i+1, j+1) in the (i+1)th column and the (j+1)th row share one wiring 21. Further, the circuit 100 (i, j) in the i-th column and the j-th row and the circuit 100 (i+1, j) in the (i+1)th column and the j-th row share one wiring 23. Furthermore, the circuit 100 (i, j+1) in the i-th column and the (j+1)th row and the circuit 100 (i+1, j+1) in the (i+1)th column and the (j+1)th row share one wiring 23.

Figure 74C:
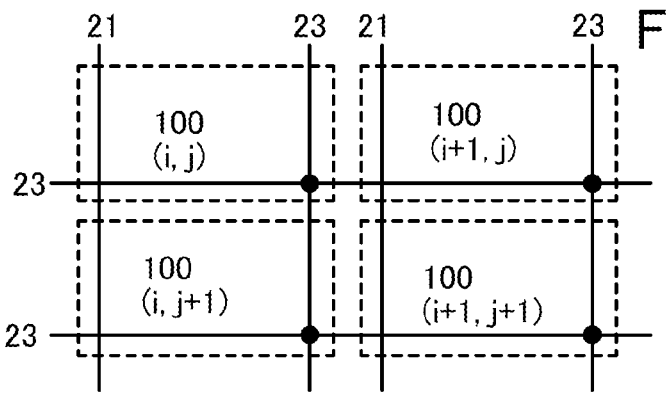

In FIG. 74C, the circuit 100 (i, j) in the i-th column and the j-th row and the circuit 100 (i, j+1) in the i-th column and the (j+1)th row share one wiring 21. In addition, the circuit 100 (i+1, j) in the (i+1)th column and the j-th row and the circuit 100 (i+1, j+1) in the (i+1)th column and the (j+1)th row share one wiring 21. Further, the circuit 100 (i, j) in the i-th column and the j-th row and the circuit 100 (i+1, j) in the (i+1)th column and the j-th row share one wiring 23. Furthermore, the circuit 100 (i, j+1) in the i-th column and the (j+1)th row and the circuit 100 (i+1, j+1) in the (i+1)th column and the (j+1)th row share one wiring 23. Further, the circuit 100 (i, j) in the i-th column and the j-th row and the circuit 100 (i, j+1) in the i-th column and the (j+1)th row share one wiring 23. Furthermore, the circuit 100 (i+1, j) in the (i+1)th column and the j-th row and the circuit 100 (i+1, j+1) in the (i+1)th column and the (j+1)th row share one wiring 23. These wirings 23 are connected to each other.

Figure 74D:
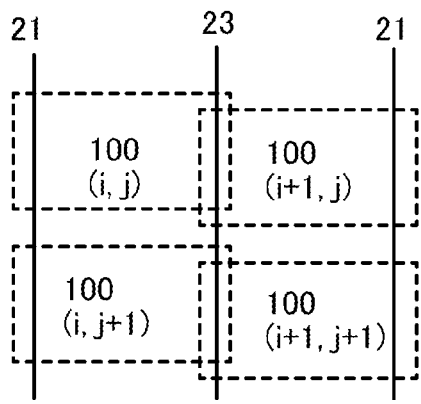

In FIG. 74D, the circuit 100 (i, j) in the i-th column and the j-th row and the circuit 100 (i, j+1) in the i-th column and the (j+1)th row share one wiring 21. In addition, the circuit 100 (i+1, j) in the (i+1)th column and the j-th row and the circuit 100 (i+1, j+1) in the (i+1)th column and the (j+1)th row share one wiring 21. Further, the circuit 100 (i, j) in the i-th column and the j-th row, the circuit 100 (i, j+1) in the i-th column and the (j+1)th row, the circuit 100 (i+1, j) in the (i+1)th column and the j-th row, and the circuit 100 (i+1, j+1) in the (i+1)th column and the (j+1)th row share one wiring 23. The wiring 23 is aligned with the wirings 21.

Figure 74E:
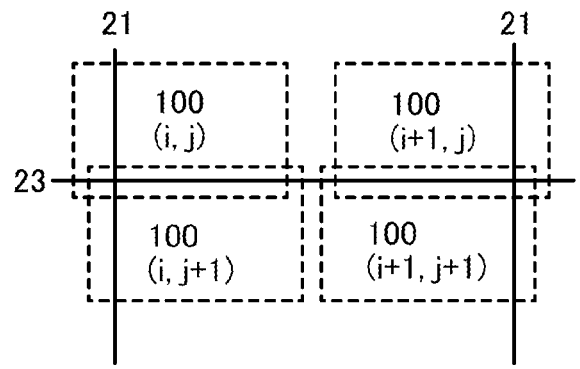

In FIG. 74E, the circuit 100 (i, j) in the i-th column and the j-th row and the circuit 100 (i, j+1) in the i-th column and the (j+1)th row share one wiring 21. In addition, the circuit 100 (i+1, j) in the (i+1)th column and the j-th row and the circuit 100 (i+1, j+1) in the (i+1)th column and the (j+1)th row share one wiring 21. Further, the circuit 100 (i, j) in the i-th column and the j-th row, the circuit 100 (i, j+1) in the i-th column and the (j+1)th row, the circuit 100 (i+1, j) in the (i+1)th column and the j-th row, and the circuit 100 (i+1, j+1) in the (i+1)th column and the (j+1)th row share one wiring 23. The wiring 23 intersects the wirings 21.

Figure 74F:
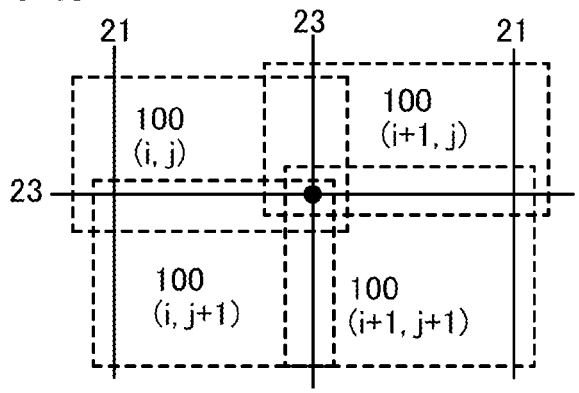

In FIG. 74F, the circuit 100 (i, j) in the i-th column and the j-th row and the circuit 100 (i, j+1) in the i-th column and the (j+1)th row share one wiring 21. In addition, the circuit 100 (i+1, j) in the (i+1)th column and the j-th row and the circuit 100 (i+1, j+1) in the (i+1)th column and the (j+1)th row share one wiring 21. Further, the circuit 100 (i, j) in the i-th column and the j-th row, the circuit 100 (i, j+1) in the i-th column and the (j+1)th row, the circuit 100 (i+1, j) in the (i+1)th column and the j-th row, and the circuit 100 (i+1, j+1) in the (i+1)th column and the (j+1)th row share two wirings 23. The two wirings 23 intersect and are connected to each other.

Figure 75A:
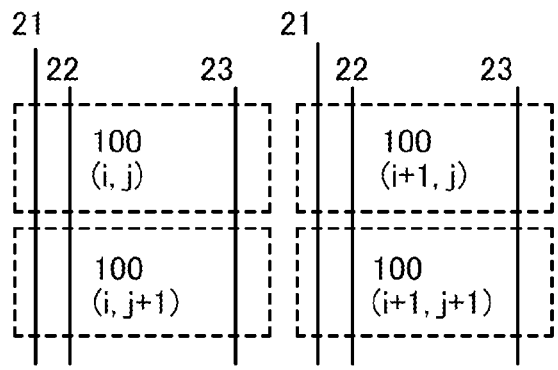
FIGS. 75A to 75E each illustrate the structure of a semiconductor device.

In FIG. 75A, the circuit 100 (i, j) in the i-th column and the j-th row and the circuit 100 (i, j+1) in the i-th column and the (j+1)th row share one wiring 21, one wiring 22, and one wiring 23. In addition, the circuit 100 (i+1, j) in the (i+1)th column and the j-th row and the circuit 100 (i+1, j+1) in the (i+1)th column and the (j+1)th row share one wiring 21, one wiring 22, and one wiring 23.

Figure 75B:
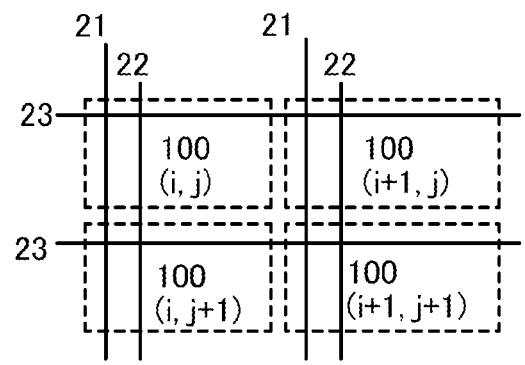

In FIG. 75B, the circuit 100 (i, j) in the i-th column and the j-th row and the circuit 100 (i, j+1) in the i-th column and the (j+1)th row share one wiring 21 and one wiring 22. In addition, the circuit 100 (i+1, j) in the (i+1)th column and the j-th row and the circuit 100 (i+1, j+1) in the (i+1)th column and the (j+1)th row share one wiring 21 and one wiring 22. Further, the circuit 100 (i, j) in the i-th column and the j-th row and the circuit 100 (i+1, j) in the (i+1)th column and the j-th row share one wiring 23. Furthermore, the circuit 100 (i, j+1) in the i-th column and the (j+1)th row and the circuit 100 (i+1, j+1) in the (i+1)th column and the (j+1)th row share one wiring 23.

Figure 75C:
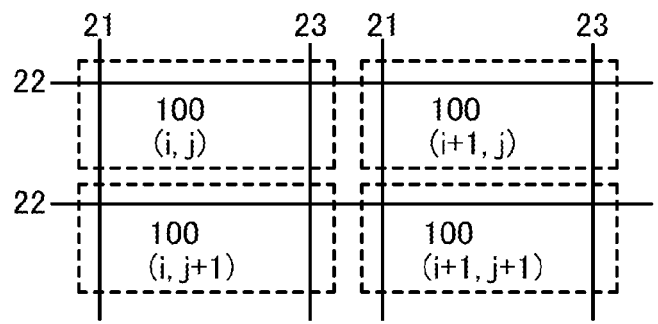

In FIG. 75C, the circuit 100 (i, j) in the i-th column and the j-th row and the circuit 100 (i, j+1) in the i-th column and the (j+1)th row share one wiring 21 and one wiring 23. In addition, the circuit 100 (i+1, j) in the (i+1)th column and the j-th row and the circuit 100 (i+1, j+1) in the (i+1)th column and the (j+1)th row share one wiring 21 and one wiring 23. Further, the circuit 100 (i, j) in the i-th column and the j-th row and the circuit 100 (i+1, j) in the (i+1)th column and the j-th row share one wiring 22. Furthermore, the circuit 100 (i, j+1) in the i-th column and the (j+1)th row and the circuit 100 (i+1, j+1) in the (i+1)th column and the (j+1)th row share one wiring 22.

Figure 75D:
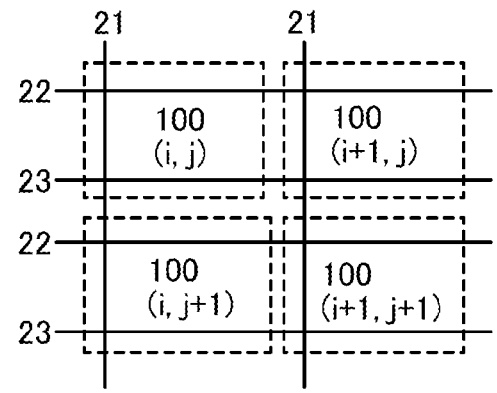

In FIG. 75D, the circuit 100 (i, j) in the i-th column and the j-th row and the circuit 100 (i, j+1) in the i-th column and the (j+1)th row share one wiring 21. In addition, the circuit 100 (i+1, j) in the (i+1)th column and the j-th row and the circuit 100 (i+1, j+1) in the (i+1)th column and the (j+1)th row share one wiring 21. Further, the circuit 100 (i, j) in the i-th column and the j-th row and the circuit 100 (i+1, j) in the (i+1)th column and the j-th row share one wiring 22 and one wiring 23. Furthermore, the circuit 100 (i, j+1) in the i-th column and the (j+1)th row and the circuit 100 (i+1, j+1) in the (i+1)th column and the (j+1)th row share one wiring 22 and one wiring 23.

Figure 75E:
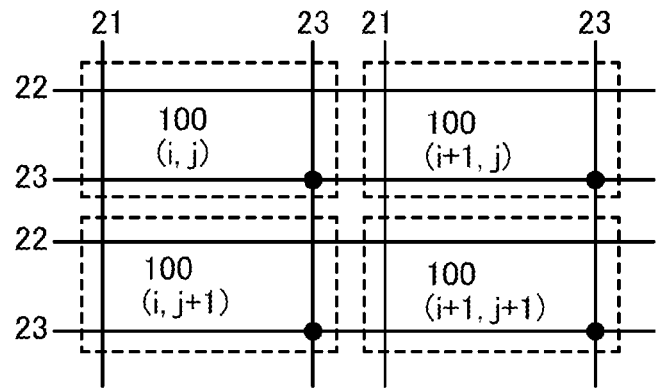

In FIG. 75E, the circuit 100 (i, j) in the i-th column and the j-th row and the circuit 100 (i, j+1) in the i-th column and the (j+1)th row share one wiring 21 and one wiring 23. In addition, the circuit 100 (i+1, j) in the (i+1)th column and the j-th row and the circuit 100 (i+1, j+1) in the (i+1)th column and the (j+1)th row share one wiring 21 and one wiring 23. Further, the circuit 100 (i, j) in the i-th column and the j-th row and the circuit 100 (i+1, j) in the (i+1)th column and the j-th row share one wiring 22 and one wiring 23. Furthermore, the circuit 100 (i, j+1) in the i-th column and the (j+1)th row and the circuit 100 (i+1, j+1) in the (i+1)th column and the (j+1)th row share one wiring 22 and one wiring 23. These wirings 23 are connected to each other.

Figure 76A:
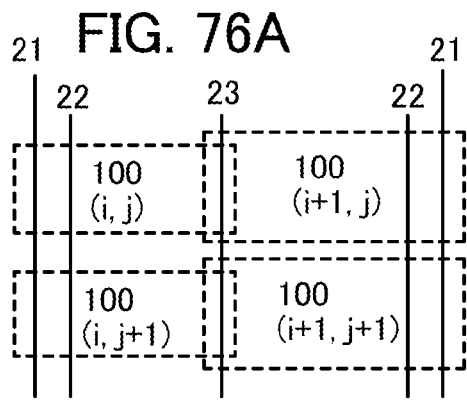
FIGS. 76A to 76G each illustrate the structure of a semiconductor device.

In FIG. 76A, the circuit 100 (i, j) in the i-th column and the j-th row and the circuit 100 (i, j+1) in the i-th column and the (j+1)th row share one wiring 21 and one wiring 22. In addition, the circuit 100 (i+1, j) in the (i+1)th column and the j-th row and the circuit 100 (i+1, j+1) in the (i+1)th column and the (j+1)th row share one wiring 21 and one wiring 22. Further, the circuit 100 (i, j) in the i-th column and the j-th row, the circuit 100 (i, j+1) in the i-th column and the (j+1)th row, the circuit 100 (i+1, j) in the (i+1)th column and the j-th row, and the circuit 100 (i+1, j+1) in the (i+1)th column and the (j+1)th row share one wiring 23. The wiring 23 is aligned with the wirings 21 and the wirings 22.

Figure 76B:
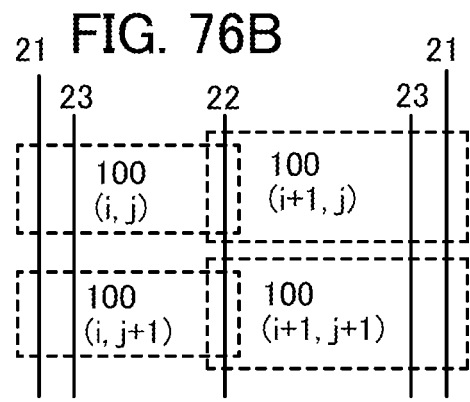

In FIG. 76B, the circuit 100 (i, j) in the i-th column and the j-th row and the circuit 100 (i, j+1) in the i-th column and the (j+1)th row share one wiring 21 and one wiring 23. In addition, the circuit 100 (i+1, j) in the (i+1)th column and the j-th row and the circuit 100 (i+1, j+1) in the (i+1)th column and the (j+1)th row share one wiring 21 and one wiring 23. Further, the circuit 100 (i, j) in the i-th column and the j-th row, the circuit 100 (i, j+1) in the i-th column and the (j+1)th row, the circuit 100 (i+1, j) in the (i+1)th column and the j-th row, and the circuit 100 (i+1, j+1) in the (i+1)th column and the (j+1)th row share one wiring 22. The wiring 22 is aligned with the wirings 21 and the wirings 23.

Figure 76C:
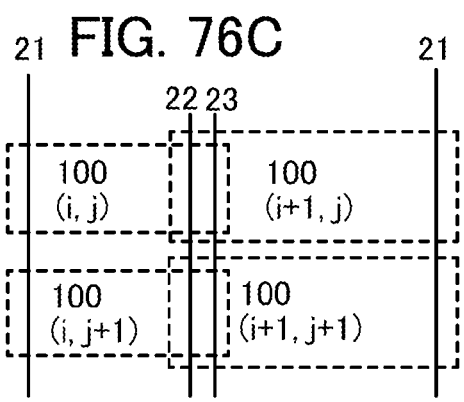

In FIG. 76C, the circuit 100 (i, j) in the i-th column and the j-th row and the circuit 100 (i, j+1) in the i-th column and the (j+1)th row share one wiring 21. In addition, the circuit 100 (i+1, j) in the (i+1)th column and the j-th row and the circuit 100 (i+1, j+1) in the (i+1)th column and the (j+1)th row share one wiring 21. Further, the circuit 100 (i, j) in the i-th column and the j-th row, the circuit 100 (i, j+1) in the i-th column and the (j+1)th row, the circuit 100 (i+1, j) in the (i+1)th column and the j-th row, and the circuit 100 (i+1, j+1) in the (i+1)th column and the (j+1)th row share one wiring 22 and one wiring 23. The wiring 22 and the wiring 23 are aligned with the wirings 21.

Figure 76D:
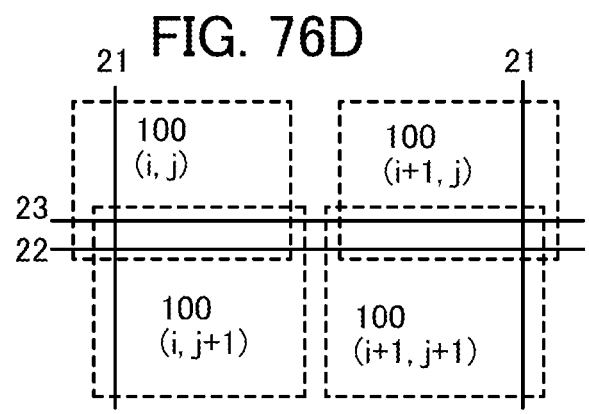

In FIG. 76D, the circuit 100 (i, j) in the i-th column and the j-th row and the circuit 100 (i, j+1) in the i-th column and the (j+1)th row share one wiring 21. In addition, the circuit 100 (i+1, j) in the (i+1)th column and the j-th row and the circuit 100 (i+1, j+1) in the (i+1)th column and the (j+1)th row share one wiring 21. Further, the circuit 100 (i, j) in the i-th column and the j-th row, the circuit 100 (i, j+1) in the i-th column and the (j+1)th row, the circuit 100 (i+1, j) in the (i+1)th column and the j-th row, and the circuit 100 (i+1, j+1) in the (i+1)th column and the (j+1)th row share one wiring 22 and one wiring 23. The wiring 22 and the wiring 23 intersect the wirings 21.

Figure 76E:
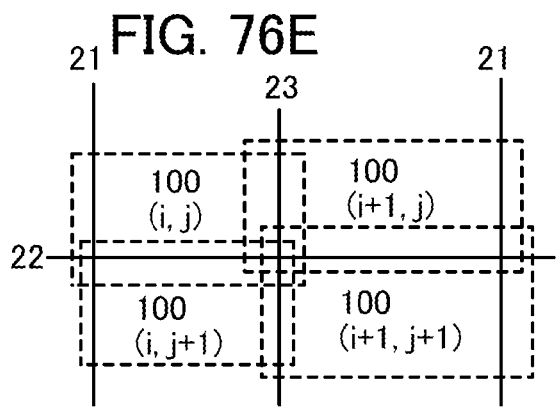

In FIG. 76E, the circuit 100 (i, j) in the i-th column and the j-th row and the circuit 100 (i, j+1) in the i-th column and the (j+1)th row share one wiring 21. In addition, the circuit 100 (i+1, j) in the (i+1)th column and the j-th row and the circuit 100 (i+1, j+1) in the (i+1)th column and the (j+1)th row share one wiring 21. Further, the circuit 100 (i, j) in the i-th column and the j-th row, the circuit 100 (i, j+1) in the i-th column and the (j+1)th row, the circuit 100 (i+1, j) in the (i+1)th column and the j-th row, and the circuit 100 (i+1, j+1) in the (i+1)th column and the (j+1)th row share one wiring 22 and one wiring 23. The wiring 22 intersects the wirings 21. The wiring 23 is aligned with the wirings 21.

Figure 76F:
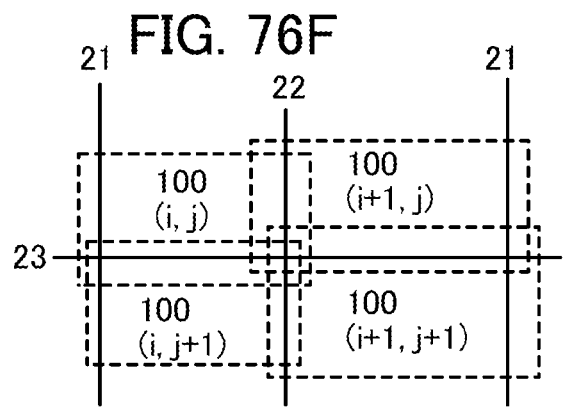

In FIG. 76F, the circuit 100 (i, j) in the i-th column and the j-th row and the circuit 100 (i, j+1) in the i-th column and the (j+1)th row share one wiring 21. In addition, the circuit 100 (i+1, j) in the (i+1)th column and the j-th row and the circuit 100 (i+1, j+1) in the (i+1)th column and the (j+1)th row share one wiring 21. Further, the circuit 100 (i, j) in the i-th column and the j-th row, the circuit 100 (i, j+1) in the i-th column and the (j+1)th row, the circuit 100 (i+1, j) in the (i+1)th column and the j-th row, and the circuit 100 (i+1, j+1) in the (i+1)th column and the (j+1)th row share one wiring 22 and one wiring 23. The wiring 23 intersects the wirings 21. The wiring 22 is aligned with the wirings 21.

Figure 76G:
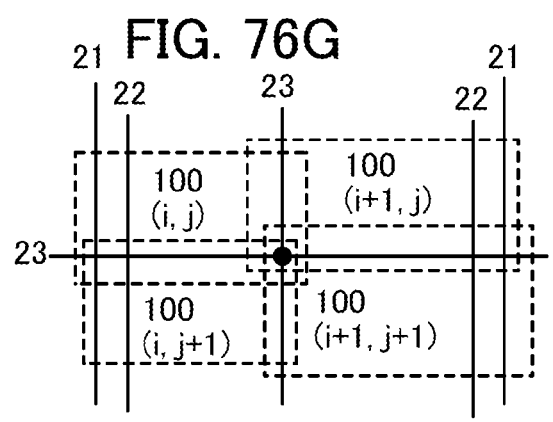

In FIG. 76G, the circuit 100 (i, j) in the i-th column and the j-th row and the circuit 100 (i, j+1) in the i-th column and the (j+1)th row share one wiring 21 and one wiring 22. In addition, the circuit 100 (i+1, j) in the (i+1)th column and the j-th row and the circuit 100 (i+1, j+1) in the (i+1)th column and the (j+1)th row share one wiring 21 and one wiring 22. Further, the circuit 100 (i, j) in the i-th column and the j-th row, the circuit 100 (i, j+1) in the i-th column and the (j+1)th row, the circuit 100 (i+1, j) in the (i+1)th column and the j-th row, and the circuit 100 (i+1, j+1) in the (i+1)th column and the (j+1)th row share two wirings 23. The two wirings 23 intersect and are connected to each other.

This embodiment is obtained by performing change, addition, modification, removal, application, superordinate conceptualization, or subordinate conceptualization on part or all of another embodiment. Thus, part or all of this embodiment can be freely combined with, applied to, or replaced with part or all of another embodiment.

(Embodiment 5)

Figure 77:
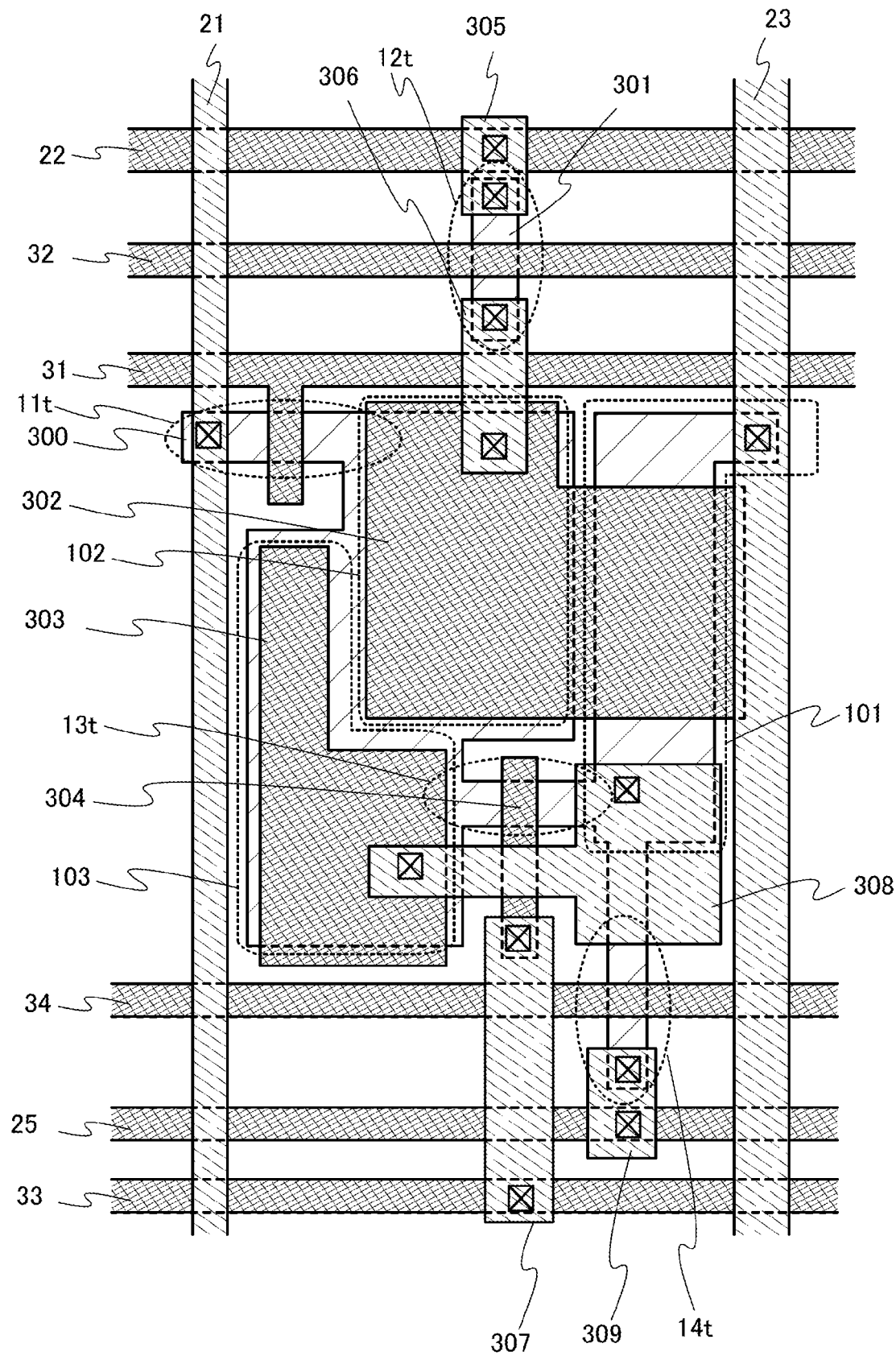
FIG. 77 illustrates the structure of a semiconductor device.

An example of a top view of the circuit 100 in FIG. 13A is illustrated in FIG. 77.

In FIG. 77, a semiconductor film 300 functions as an active layer of the transistor 11t, one electrode of the capacitor 102, one electrode of the capacitor 103, an active layer of the transistor 13t, an active layer of the transistor 14t, and an active layer of the transistor 101. A semiconductor film 301 functions as an active layer of the transistor 12t. A conductive film 302 functions as the other electrode of the capacitor 102. A conductive film 303 functions as the other electrode of the capacitor 103. A conductive film 304 functions as the gate of the transistor 13t.

A conductive film 305 is connected to the wiring 22 and one of the source and the drain of the transistor 12t. A conductive film 306 is connected to the other of the source and the drain of the transistor 12t and the conductive film 302. A conductive film 307 is connected to the conductive film 304 and the wiring 33. A conductive film 308 is connected to the conductive film 303, one of the source and the drain of the transistor 101, one of a source and a drain of the transistor 13t, and one of a source and a drain of the transistor 14t. A conductive film 309 is connected to the other of the source and the drain of the transistor 14t and the wiring 25.

Figure 13D:
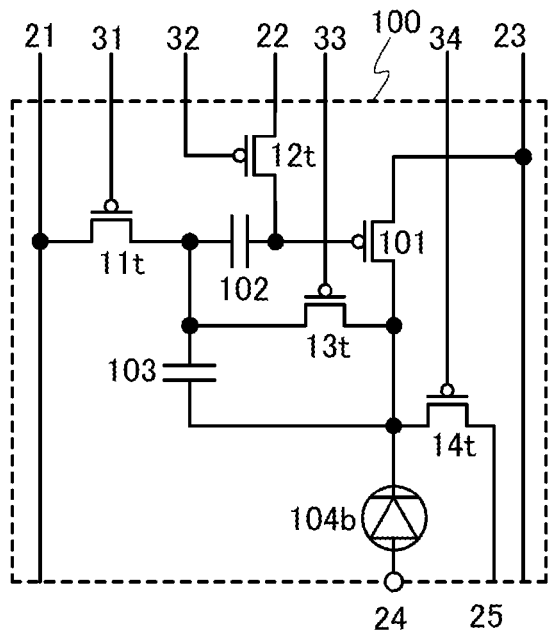

Note that in FIG. 13B, the load 104 may be connected to the conductive film 308. In FIG. 13C, the anode of the light-emitting element 104a may be connected to the conductive film 308. In FIG. 13D, the cathode of the light-emitting element 104b may be connected to the conductive film 308.

Figure 78:
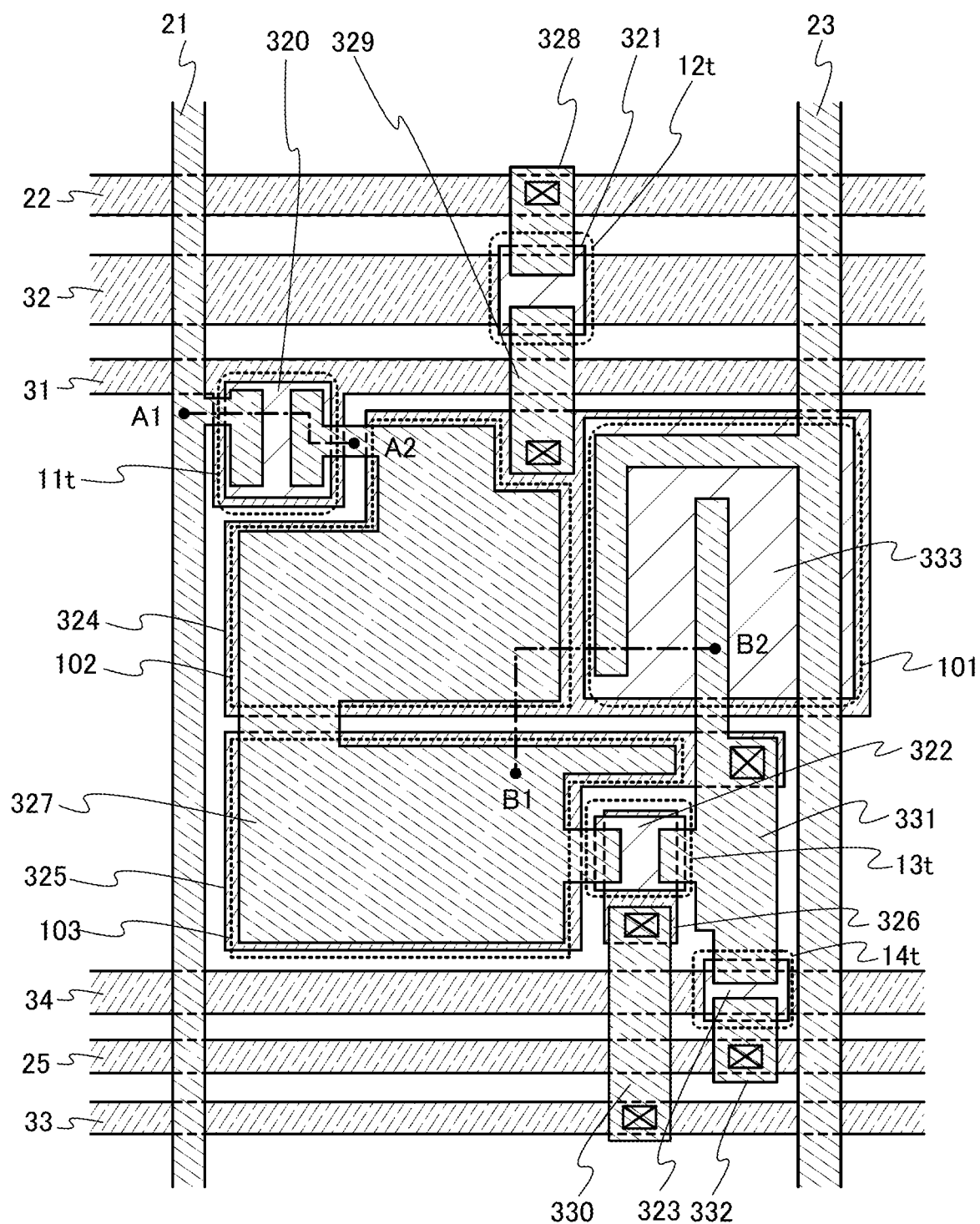
FIG. 78 illustrates the structure of a semiconductor device.

Next, another example of the top view of the circuit 100 in FIG. 13A is illustrated in FIG. 78.

In FIG. 78, a semiconductor film 320 functions as the active layer of the transistor 11t. A semiconductor film 321 functions as the active layer of the transistor 12t. A semiconductor film 322 functions as the active layer of the transistor 13t. A semiconductor film 323 functions as the active layer of the transistor 14t. A semiconductor film 333 functions as the active layer of the transistor 101.

A conductive film 324 functions as the other electrode of the capacitor 102 and the gate of the transistor 101. A conductive film 325 functions as the other electrode of the capacitor 103. A conductive film 326 functions as the gate of the transistor 13t.

A conductive film 327 functions as the one electrode of the capacitor 102 and the one electrode of the capacitor 103, and is connected to one of a source and a drain of the transistor 11t. A conductive film 328 is connected to the wiring 22 and one of a source and a drain of the transistor 12t. A conductive film 329 is connected to the other of the source and the drain of the transistor 12t and the conductive film 324. A conductive film 330 is connected to the conductive film 326 and the wiring 33. A conductive film 331 is connected to the conductive film 325, the one of the source and the drain of the transistor 101, one of the source and the drain of the transistor 13t, and one of the source and the drain of the transistor 14t. A conductive film 332 is connected to the other of the source and the drain of the transistor 14t and the wiring 25.

Note that in FIG. 13B, the load 104 may be connected to the conductive film 331. In FIG. 13C, the anode of the light-emitting element 104a may be connected to the conductive film 331. In FIG. 13D, the cathode of the light-emitting element 104b may be connected to the conductive film 331.

Figure 80A:
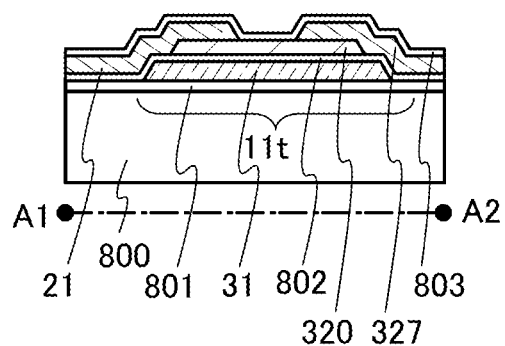
FIGS. 80A and 80B illustrate the structure of a semiconductor device.
Figure 80B:
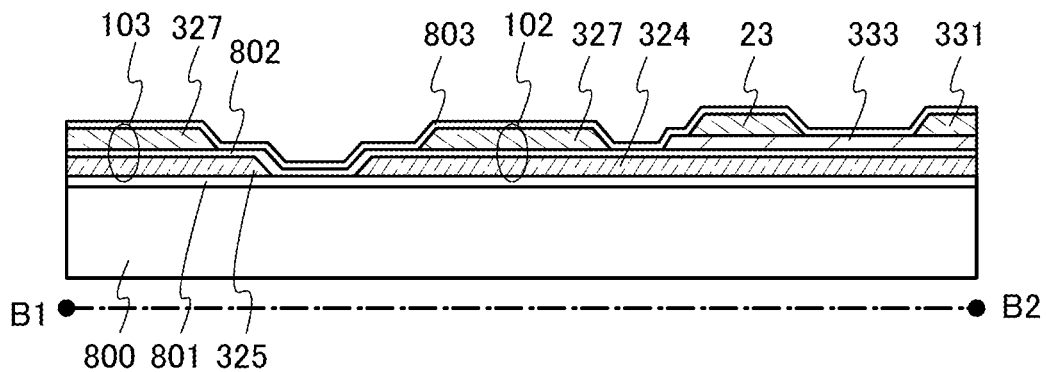

FIG. 80A is an example of a cross-sectional view taken along broken line A1-A2 in FIG. 78. FIG. 80B is an example of a cross-sectional view taken along broken line B1-B2 in FIG. 78. In FIGS. 80A and 80B, an insulating film 801 is formed over a substrate 800, and the wiring 31, the conductive film 324, and the conductive film 325 are formed over the insulating film 801. An insulating film 802 is formed over the wiring 31, the conductive film 324, and the conductive film 325.

The conductive film 327 is formed over the insulating film 802 to overlap with the conductive film 325. A portion where the conductive film 325, the insulating film 802, and the conductive film 327 overlap with each other functions as the capacitor 103. The conductive film 327 is also formed over the insulating film 802 to overlap with the conductive film 324. A portion where the conductive film 324, the insulating film 802, and the conductive film 327 overlap with each other functions as the capacitor 102. The semiconductor film 333 is formed over the insulating film 802 to overlap with the conductive film 324. The wiring 23 and the conductive film 331 are formed over the semiconductor film 333.

The insulating film 803 is formed to cover the insulating film 802 and the conductive film 327, the semiconductor film 333, the wiring 23, and the conductive film 331 that are formed over the insulating film 802.

Figure 79:
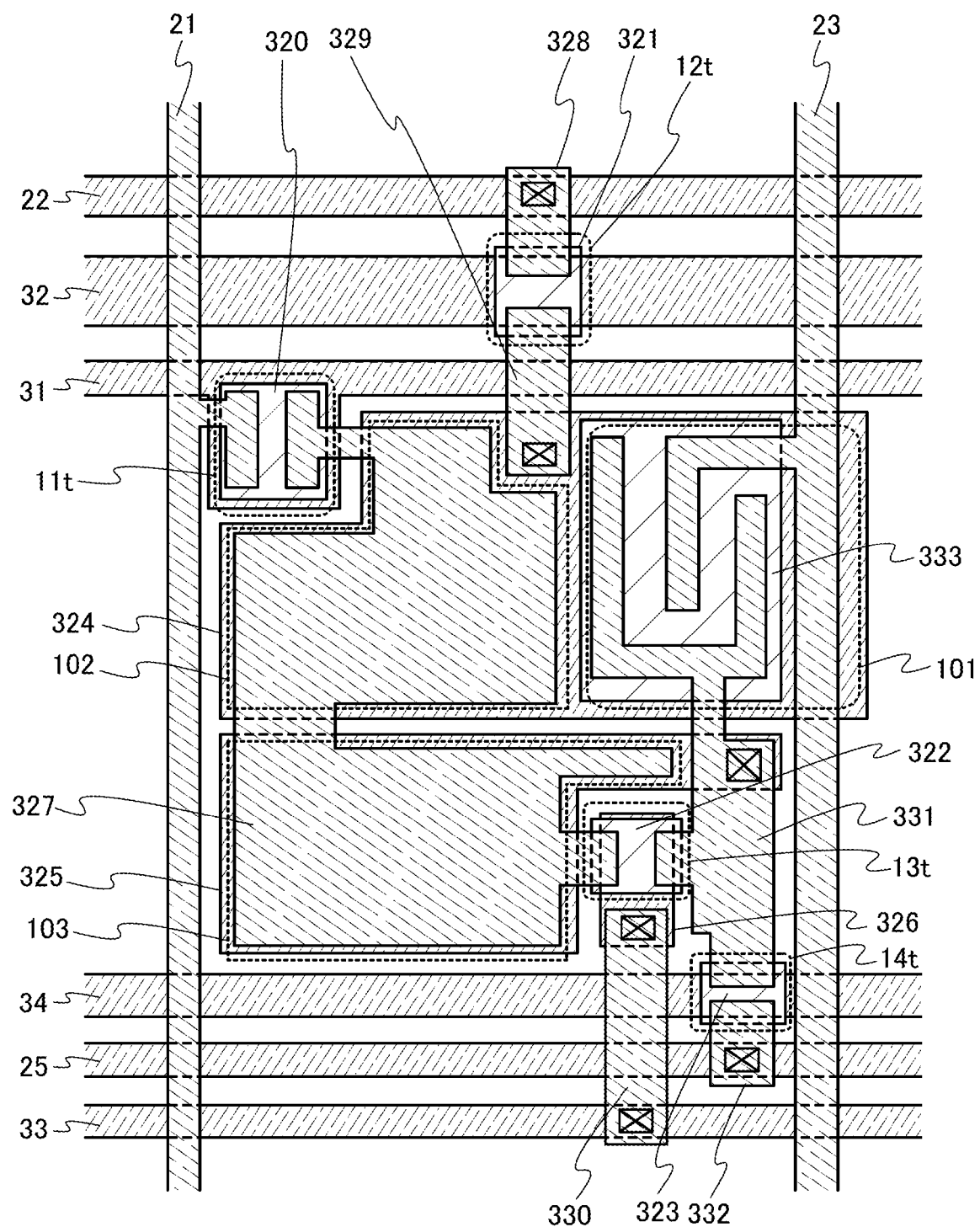
FIG. 79 illustrates the structure of a semiconductor device.

Next, another example of the top view of the circuit 100 in FIG. 13A is illustrated in FIG. 79. The top view of FIG. 79 is different from the top view of FIG. 78 in the shape of part of the wiring 23 that overlaps with the semiconductor film 333 and the shape of part of the conductive film 331 that overlaps with the semiconductor film 333. Specifically, in FIG. 78, the part of the wiring 23 that overlaps with the semiconductor film 333 has a U-shape. In addition, the part of the conductive film 331 that overlaps with the semiconductor film 333 is positioned inside a curved portion of the U-shape of the wiring 23 to be partly surrounded by the wiring 23. In FIG. 79, the part of the conductive film 331 that overlaps with the semiconductor film 333 has a U-shape. In addition, the part of the wiring 23 that overlaps with the semiconductor film 333 is positioned inside a curved portion of the U-shape of the conductive film 331 to be partly surrounded by the conductive film 331.

In the case where the conductive film or the wiring that is in contact with the source or the drain of the transistor 101 has a U-shape, large channel width can be obtained even when the area of the semiconductor film 333 is small. Thus, on-state current can be increased while the area of the semiconductor film 333 is small.

Note that a transistor can be formed using a variety of substrates, without limitation to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used. As a glass substrate, a barium borosilicate glass substrate, an aluminoborosilicate glass substrate, a soda-lime glass substrate, or the like can be used. For a flexible substrate, a flexible synthetic resin such as plastics typified by polyethylene terephthalate (PET), polyethylene naphthalate (PEN), or polyether sulfone (PES), or acrylic can be used. For an attachment film, polypropylene, polyester, vinyl, polyvinyl fluoride, polyvinyl chloride, or the like can be used. For a base material film, polyester, polyamide, polyimide, an inorganic vapor deposition film, paper, or the like can be used. In particular, by forming transistors with the use of a semiconductor substrate, a single crystal substrate, an SOI substrate, or the like, transistors with fewer variations in characteristics, sizes, shapes, or the like, with high current supply capability, and with small sizes can be formed. By forming a circuit with the use of such a transistor, the power consumption of the circuit can be reduced or the circuit can be highly integrated.

Note that the transistor may be formed using one substrate, and then, the transistor may be transferred to another substrate. In addition to the above substrates over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, or the like can be used as a substrate to which the transistor is transferred. With the use of such a substrate, a transistor with excellent properties or a transistor with low power consumption can be formed, a device with high durability and high heat resistance can be provided, or a reduction in weight or thickness can be achieved.

This embodiment is obtained by performing change, addition, modification, removal, application, superordinate conceptualization, or subordinate conceptualization on part or all of another embodiment. Thus, part or all of this embodiment can be freely combined with, applied to, or replaced with part or all of another embodiment.

(Embodiment 6)

In this embodiment, specific structure examples of transistors used in a semiconductor device according to one aspect of the present invention are described.

Figure 81A:
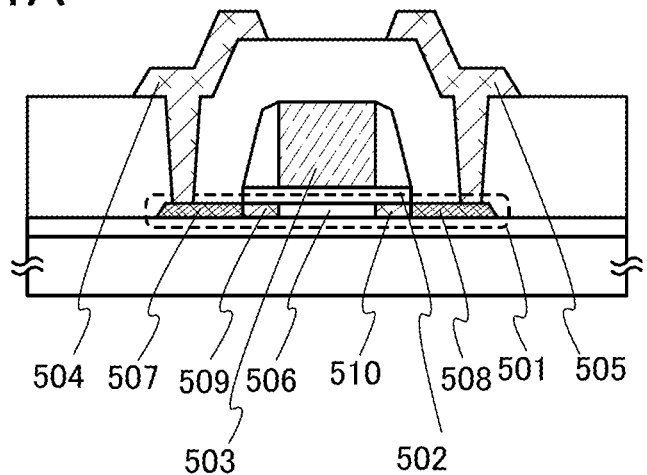
FIGS. 81A to 81C each illustrate the structure of a semiconductor device.

A transistor in FIG. 81A includes a semiconductor film 501, an insulating film 502 over the semiconductor film 501, an electrode 503 that functions as a gate and overlaps with the semiconductor film 501 with the insulating film 502 provided therebetween, and conductive films 504 and 505 that are in contact with the semiconductor film 501. The semiconductor film 501 includes a first region 506 functioning as a channel formation region and second regions 507 and 508 functioning as a source and a drain. The first region 506 is provided between the second regions 507 and 508. Note that FIG. 81A illustrates an example in which the semiconductor film 501 includes third regions 509 and 510 functioning as LDD regions between the first region 506 and the second regions 507 and 508.

Note that although FIG. 81A illustrates the transistor including the thin semiconductor film 501, in one aspect of the present invention, a transistor including a channel formation region in a bulk semiconductor substrate may be used. For the thin semiconductor film, for example, an amorphous semiconductor, a polycrystalline semiconductor, or a single crystal semiconductor can be used. Further, for the semiconductor film 501, a variety of semiconductors such as silicon, germanium, silicon germanium, or an oxide semiconductor can be used.

Figure 81B:
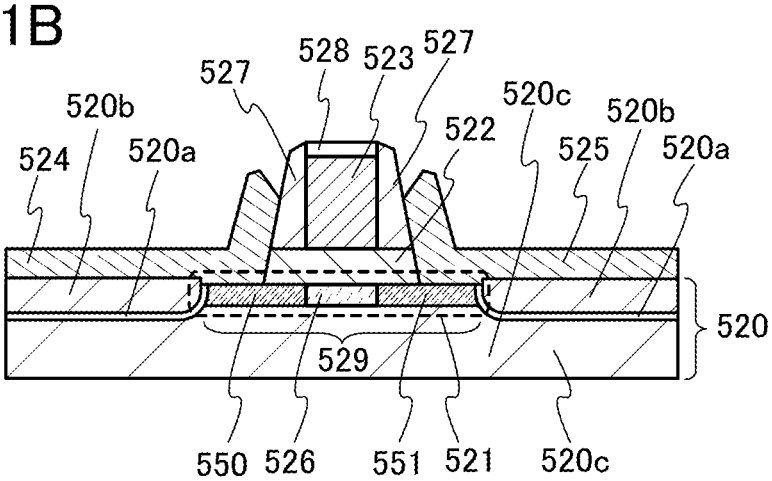

A transistor in FIG. 81B is formed on an insulating film 520 that includes first oxide insulating films 520a, second oxide insulating films 520b, and a third oxide insulating film 520c.

The first oxide insulating film 520a and the third oxide insulating film 520c are each formed using an oxide insulating film from which part of oxygen is released by heating. As such an oxide insulating film from which part of oxygen is released by heating, an insulating film which contains oxygen at a proportion higher than the stoichiometric proportion is preferably used. Silicon oxide, silicon oxynitride, silicon nitride oxide, gallium oxide, hafnium oxide, yttrium oxide, or the like can be used for the first oxide insulating film 520a and the third oxide insulating film 520c.

The second oxide insulating film 520b is formed using an oxide insulating film which prevents diffusion of oxygen. The second oxide insulating film 520b is formed using aluminum oxide or aluminum oxynitride, for example. As aluminum oxide, aluminum oxide containing oxygen at a proportion satisfying the stoichiometric proportion or aluminum oxide containing oxygen at a proportion higher than the stoichiometric proportion ($AlO_x$, where x is greater than or equal to 3/2) is preferably used. In addition, in aluminum oxynitride, part of oxygen in aluminum oxide containing oxygen at a proportion satisfying the stoichiometric proportion is replaced with nitrogen.

The transistor includes a semiconductor film 521, an insulating film 522 over the semiconductor film 521, an electrode 523 that functions as a gate and overlaps with the semiconductor film 521 with the insulating film 522 provided therebetween, and conductive films 524 and 525 that are in contact with the semiconductor film 521. The semiconductor film 521 includes a first region 526 which overlaps with the electrode 523 and at least part of which functions as a channel formation region, and second regions 550 and 551 which function as a source and a drain and sandwich the first region 526.

For the semiconductor film 521, for example, an amorphous semiconductor, a polycrystalline semiconductor, or a single crystal semiconductor can be used. Further, for the semiconductor film 521, a variety of semiconductors such as silicon, germanium, silicon germanium, or an oxide semiconductor can be used.

In the transistor, sidewalls 527 including an insulating film are provided on side portions of the electrode 523, and an insulating film 528 is provided over the electrode 523. Further, part of the conductive film 524 and part of the conductive film 525 are in contact with the sidewalls 527. The conductive films 524 and 525 are not necessarily in contact with the sidewalls 527. However, when the conductive films 524 and 525 are in contact with the sidewalls 527, the area where the semiconductor film 521 is in contact with the conductive films 524 and 525 can be prevented from changing even in the case where the conductive films 524 and 525 deviate from appropriate positions. Accordingly, a change in on-state current of the transistor due to deviation of positions of the conductive films 524 and 525 can be prevented.

Note that the insulating film 528 over the electrode 523 is not necessarily provided. However, when the insulating film 528 is provided, conduction between the conductive film 524 and the electrode 523 and conduction between the conductive film 525 and the electrode 523 can be prevented even in the case where the conductive films 524 and 525 deviate from appropriate positions and are formed over the electrode 523.

In the insulating film 520, the first oxide insulating film 520a and the second oxide insulating film 520b are stacked in that order over the third oxide insulating film 520c positioned in the lowermost layer. An opening 529 is formed in the first oxide insulating film 520a and the second oxide insulating film 520b, and the semiconductor film 521 of the transistor is provided in the opening 529. The first oxide insulating film 520a is provided around the semiconductor film 521 to be in contact with an end portion of the semiconductor film 521. The second oxide insulating film 520b is provided around the semiconductor film 521 with the first oxide insulating film 520a provided therebetween. The third oxide insulating film 520c is provided below the semiconductor film 521.

In the case where the semiconductor film 521 is formed using an oxide semiconductor, the use of the insulating film 520 with the above structure can prevent oxygen released from the first oxide insulating film 520a by heating from passing through the second oxide insulating film 520b; thus, oxygen is efficiently supplied to end portions of the semiconductor film 521 in the first region 526. Further, oxygen released from the third oxide insulating film 520c is supplied to a lower portion of the semiconductor film 521. Note that oxygen vacancies due to release of oxygen easily occur at an end portion of the semiconductor film 521 in a transistor in which an oxide semiconductor is used for a channel formation region because of etching treatment for etching the semiconductor film 521 into a desired shape, exposure of the end portion of the semiconductor film 521 to a reduced-pressure atmosphere, or the like. Since oxygen vacancies become a path through which carriers move, a parasitic channel is formed when oxygen vacancies occur at the end portion of the semiconductor film 521. Consequently, the off-state current of the transistor is increased. However, with the above structure, oxygen vacancies are prevented from occurring at the end portion of the semiconductor film 521 in the first region 526. Consequently, the off-state current can be decreased.

Note that "to release part of oxygen by heating" means that the amount of released oxygen is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis on an oxygen atom basis.

A method for measuring the amount of released oxygen on an oxygen atom basis in TDS analysis is described below.

The amount of a released gas in the TDS analysis is proportional to the integral value of a spectrum. Thus, the amount of a released gas can be calculated from the ratio between the integral value of a spectrum of an insulating film and the reference value of a standard sample. The reference value of a standard sample is the ratio of the density of a predetermined atom contained in a sample to the integral value of a spectrum.

For example, the amount of released oxygen molecules ($N_{O2}$) from an insulating film can be calculated from Formula 1 with the TDS analysis results of a silicon wafer containing hydrogen at predetermined density that is the standard sample and the TDS analysis results of the insulating film. $CH_3OH$, which is a gas having a mass number of 32, is unlikely to be present in the insulating film. Thus, all spectra having a mass number of 32 that are obtained by the TDS analysis are assumed to originate from an oxygen molecule. Further, an oxygen molecule including an oxygen atom having a mass number of 17 or 18 that is an isotope of an oxygen atom is assumed not to be present because the proportion of such a molecule in the natural world is minimal $$N_{O2}=N_{H2}/S_{H2} \times S_{O2} \times \alpha \quad \text{(Formula 1)}$$

$N_{H2}$ is the value obtained by conversion of the amount of hydrogen molecules released from the standard sample into density. $S_{H2}$ is the integral value of a spectrum of the standard sample which is analyzed by TDS. The reference value of the standard sample is set to $N_{H2}/S_{H2}$. $S_{O2}$ is the integral value of a spectrum of the insulating film which is analyzed by TDS. $\alpha$ is a coefficient influencing the intensity of the spectrum in the TDS analysis. Refer to Japanese Published Patent Application No. 6-275697 for details of Formula 1. Note that the amount of released oxygen from the insulating film is measured with a thermal desorption spectroscopy apparatus produced by ESCO Ltd., EMD-WA1000S/W, using a silicon wafer containing hydrogen atoms at $1 \times 10^{16}$ atoms/cm$^3$ as the standard sample.

Further, in the TDS analysis, part of oxygen is detected as an oxygen atom. The ratio between oxygen molecules and oxygen atoms can be calculated from the ionization rate of the oxygen molecules. Note that since $\alpha$ includes the ionization rate of oxygen molecules, the amount of released oxygen atoms can also be estimated through evaluation of the amount of released oxygen molecules.

Note that $N_{O2}$ is the amount of released oxygen molecules. For the insulating film, the amount of released oxygen on an oxygen atom basis is twice the amount of released oxygen molecules.

In the above structure, the insulating film from which oxygen is released by heating may be oxygen-excess silicon oxide ($SiO_X$ (X>2)). In oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

Figure 81C:
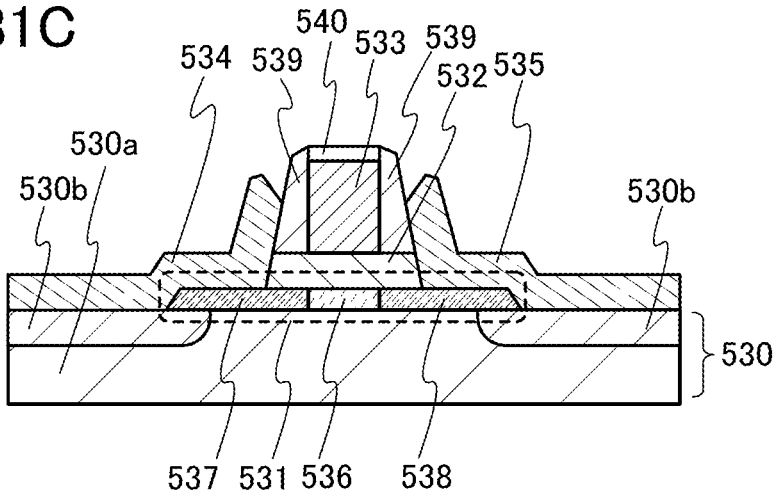

A transistor in FIG. 81C is formed on an insulating film 530 that includes a first oxide insulating film 530a and second oxide insulating films 530b.

The first oxide insulating film 530a is formed using an oxide insulating film from which part of oxygen is released by heating. As such an oxide insulating film from which part of oxygen is released by heating, an insulating film which contains oxygen at a proportion higher than the stoichiometric proportion is preferably used. Silicon oxide, silicon oxynitride, silicon nitride oxide, gallium oxide, hafnium oxide, yttrium oxide, or the like can be used for the first oxide insulating film 530a.

The second oxide insulating film 530b is formed using an oxide insulating film which prevents diffusion of oxygen. The second oxide insulating film 530b is formed using aluminum oxide or aluminum oxynitride, for example. As aluminum oxide, aluminum oxide containing oxygen at a proportion satisfying the stoichiometric proportion or aluminum oxide containing oxygen at a proportion higher than the stoichiometric proportion ($AlO_x$, where x is greater than or equal to 3/2) is preferably used. In addition, in aluminum oxynitride, part of oxygen in aluminum oxide containing oxygen at a proportion satisfying the stoichiometric proportion is replaced with nitrogen.

The transistor includes a semiconductor film 531 over the insulating film 530, an insulating film 532 over the semiconductor film 531, an electrode 533 that functions as a gate and overlaps with the semiconductor film 531 with the insulating film 532 provided therebetween, and conductive films 534 and 535 that are connected to the semiconductor film 531. The semiconductor film 531 includes a first region 536 which overlaps with the electrode 533 and at least part of which functions as a channel formation region, and second regions 537 and 538 which function as a source and a drain and sandwich the first region 536.

For the semiconductor film 531, for example, an amorphous semiconductor, a polycrystalline semiconductor, or a single crystal semiconductor can be used. Further, for the semiconductor film 531, a variety of semiconductors such as silicon, germanium, silicon germanium, or an oxide semiconductor can be used.

In the transistor, sidewalls 539 including an insulating film are provided on side portions of the electrode 533, and an insulating film 540 is provided over the electrode 533. Further, part of the conductive film 534 and part of the conductive film 535 are in contact with the sidewalls 539. The conductive films 534 and 535 are not necessarily in contact with the sidewalls 539. However, when the conductive films 534 and 535 are in contact with the sidewalls 539, the area where the semiconductor film 531 is in contact with the conductive films 534 and 535 can be prevented from changing even in the case where the conductive films 534 and 535 deviate from appropriate positions. Accordingly, a change in on-state current of the transistor due to deviation of positions of the conductive films 534 and 535 can be prevented.

Note that the insulating film 540 over the electrode 533 is not necessarily provided. However, when the insulating film 540 is provided, conduction between the conductive film 534 and the electrode 533 and conduction between the conductive film 535 and the electrode 533 can be prevented even in the case where the conductive films 534 and 535 deviate from appropriate positions and are formed over the electrode 533.

Further, in the insulating film 530, the second oxide insulating film 530b is provided around the first oxide insulating film 530a. The first region 536 of the semiconductor film 531 is in contact with the first oxide insulating film 530a, and the second regions 537 and 538 of the semiconductor film 531 are in contact with the first oxide insulating film 530a and the second oxide insulating film 530b.

In the case where the semiconductor film 531 is formed using an oxide semiconductor, the above structure can prevent oxygen released from the first oxide insulating film 530a by heating from passing through the second oxide insulating film 530b; thus, oxygen is efficiently supplied to end portions of the semiconductor film 531 in the first region 536. Note that oxygen vacancies due to release of oxygen easily occur at an end portion of the semiconductor film 531 in a transistor in which an oxide semiconductor is used for a channel formation region because of etching treatment for etching the semiconductor film 531 into a desired shape, exposure of the end portion of the semiconductor film 531 to a reduced-pressure atmosphere, or the like. Since oxygen vacancies become a path through which carriers move, a parasitic channel is formed when oxygen vacancies occur at the end portion of the semiconductor film 531. Consequently, the off-state current of the transistor is increased. However, in one aspect of the present invention, with the above structure, oxygen vacancies are prevented from being occurring at the end portion of the semiconductor film 531 in the first region 536. Consequently, the off-state current can be decreased.

Note that a highly-purified oxide semiconductor (a purified oxide semiconductor) obtained by a reduction of impurities such as moisture or hydrogen that serve as electron donors (donors) and a reduction of oxygen vacancies is an intrinsic (i-type) semiconductor or a substantially intrinsic semiconductor. Thus, a transistor including the oxide semiconductor has extremely low off-state current. Further, the band gap of the oxide semiconductor is 2 eV or more, preferably 2.5 eV or more, more preferably 3 eV or more. With the use of an oxide semiconductor film that is highly purified by a sufficient decrease in concentration of impurities such as moisture or hydrogen and a reduction of oxygen vacancies, the off-state current of the transistor can be decreased.

Specifically, various experiments can prove low off-state current of a transistor including a highly-purified oxide semiconductor film for a channel formation region. For example, even when an element has a channel width of $1\times10^6$ μm and a channel length of 10 μm, off-state current can be lower than or equal to the measurement limit of a semiconductor parameter analyzer, i.e., lower than or equal to $1\times10^{-13}$ A, at a voltage (drain voltage) between a source electrode and a drain electrode of 1 to 10 V. In that case, it can be seen that off-state current standardized on the channel width of the transistor is lower than or equal to 100 zA/μm. In addition, a capacitor and a transistor were connected to each other and off-state current was measured using a circuit in which electrical charge flowing to or from the capacitor is controlled by the transistor. In the measurement, a highly-purified oxide semiconductor film was used for a channel formation region of the transistor, and the off-state current of the transistor was measured from a change in the amount of electrical charge of the capacitor per unit hour. As a result, it can be seen that, in the case where the voltage between the source electrode and the drain electrode of the transistor is 3 V, a lower off-state current of several tens of yoctoamperes per micrometer (yA/μm) is obtained. Accordingly, the transistor including the highly-purified oxide semiconductor film for a channel formation region has much lower off-state current than a crystalline silicon transistor.

Note that as the oxide semiconductor, preferably an oxide containing In or Zn, more preferably an oxide containing In and Ga or an oxide containing In and Zn is used. In order to obtain an intrinsic (i-type) oxide semiconductor film, dehydration or dehydrogenation to be described later is effective. As a stabilizer for reducing variations in electrical characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, indium oxide; tin oxide; zinc oxide; a binary metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a ternary metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a quaternary metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used as an oxide semiconductor. The oxide semiconductor may contain silicon.

Note that, for example, an In—Ga—Zn-based oxide means an oxide containing In, Ga, and Zn, and there is no limitation on the ratio of In, Ga, and Zn. In addition, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

An oxide semiconductor film can be single crystal, polycrystalline (also referred to as polycrystal), or amorphous, for example. The oxide semiconductor film is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where a crystal part with a size of several nanometers to several tens of nanometers is included in an amorphous phase. Note that with a transmission electron microscope (TEM), a boundary between an amorphous part and a crystal part in the CAAC-OS film is not clear. Further, a grain boundary is not found in the CAAC-OS film. Since the CAAC-OS film does not have a grain boundary, a decrease in electron mobility due to a grain boundary does not easily occur.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic order which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85 to 95°. In addition, a simple term "parallel" includes a range from −5 to 5°.

Note that the proportions of the amorphous parts and the crystal parts in the CAAC-OS film are not necessarily uniform. For example, in the case where crystal growth occurs from a surface side of the CAAC-OS film, in some cases, the proportion of the crystal parts in the vicinity of the surface of the CAAC-OS is high and the proportion of the amorphous parts in the vicinity of the surface where the CAAC-OS film is formed is high. Further, when an impurity is added to the CAAC-OS film, the crystal part in a region to which the impurity is added becomes amorphous in some cases.

Since the c-axes of the crystal parts included in the CAAC-OS film are aligned in the direction parallel to the normal vector of the surface where the CAAC-OS film is formed or the normal vector of the surface of the CAAC-OS film, the directions of the c-axes of the crystal parts may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal part is the direction parallel to the normal vector of the surface where the CAAC-OS film is formed or the normal vector of the surface of the CAAC-OS film. The crystal part is formed by deposition or by performing treatment for crystallization such as heat treatment after deposition.

With the use of the CAAC-OS film, a change in electrical characteristics of the transistor due to irradiation with visible light or ultraviolet light can be reduced, so that a highly reliable transistor can be obtained.

For example, a CAAC-OS film is deposited by sputtering with a polycrystalline oxide semiconductor sputtering target. When ions collide with the sputtering target, a crystal region included in the sputtering target may be separated from the target along the a-b plane, and a sputtered particle having a plane parallel to the a-b plane (a flat-plate-like sputtered particle or a pellet-like sputtered particle) might be separated from the sputtering target. In that case, the flat-plate-like sputtered particle reaches a substrate while maintaining its crystal state, so that the CAAC-OS film can be deposited.

For the deposition of the CAAC-OS film, the following conditions are preferably employed.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the treatment chamber may be reduced. Further, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle occurs after the sputtered particle reaches the substrate. Specifically, the substrate heating temperature during the deposition is 100° C. or higher and 740° C. or lower, preferably 200° C. or higher and 500° C. or lower. By increasing the substrate heating temperature during the deposition, when the flat-plate-like sputtered particle reaches the substrate, migration occurs on the substrate, so that a flat plane of the sputtered particle is attached to the substrate.

Further, it is preferable to reduce plasma damage during the deposition by increasing the proportion of oxygen in the deposition gas and optimizing power. The proportion of oxygen in the deposition gas is 30 vol % or higher, preferably 100 vol %.

As an example of the sputtering target, an In—Ga—Zn—O compound target is described below.

A polycrystalline In—Ga—Zn—O compound target is made by mixing $InO_X$ powder, $GaO_Y$ powder, and $ZnO_Z$ powder in a predetermined mole ratio, applying pressure, and performing heat treatment at 1000° C. or higher and 1500° C. or lower. Note that X, Y, and Z are each a given positive number. Here, the predetermined mole ratio of the $InO_X$ powder, the $GaO_Y$ powder, and the $ZnO_Z$ powder is, for example, 2:2:1, 8:4:3, 3:1:1, 1:1:1, 4:2:3, or 3:1:2. The kinds of powder and the mole ratio for mixing powder may be changed as appropriate depending on a sputtering target to be formed.

For example, the oxide semiconductor film can be formed by sputtering using a target including indium (In), gallium (Ga), and zinc (Zn). In the case where an In—Ga—Zn-based oxide semiconductor film is formed by sputtering, it is preferable to use a target of an In—Ga—Zn-based oxide with an atomic ratio of In:Ga:Zn=1:1:1, 4:2:3, 3:1:2, 1:1:2, 2:1:3, or 3:1:4. When an oxide semiconductor film is formed using a target of an In—Ga—Zn-based oxide having the above atomic ratio, a polycrystal or CAAC-OS is easily formed. The relative density of the target including In, Ga, and Zn is higher than or equal to 90% and lower than or equal to 100%, preferably higher than or equal to 95% and lower than 100%. With the use of the target with high relative density, a dense oxide semiconductor film is formed.

In the case where an In—Zn-based material is used for the oxide semiconductor, a target used has an atomic ratio of In:Zn=50:1 to 1:2 ($In_2O_3$:ZnO=25:1 to 1:4 in a mole ratio), preferably In:Zn=20:1 to 1:1 ($In_2O_3$:ZnO=10:1 to 1:2 in a mole ratio), more preferably In:Zn=15:1 to 1.5:1 ($In_2O_3$:ZnO=15:2 to 3:4 in a mole ratio). For example, when a target used for deposition of an oxide semiconductor film formed using an In—Zn-based oxide has an atomic ratio of In:Zn:O=X:Y:Z, Z>1.5X+Y. The mobility can be increased by keeping the ratio of Zn within the above range.

Specifically, the oxide semiconductor film may be deposited in such a manner that the substrate is held in a treatment chamber kept in a reduced pressure state, moisture remaining in the treatment chamber is removed, a sputtering gas from which hydrogen and moisture are removed is introduced, and the target is used. The substrate temperature may be 100 to 600° C., preferably 200 to 400° C. during deposition. By deposition of the oxide semiconductor film while the substrate is heated, the concentration of impurities included in the deposited oxide semiconductor film can be lowered. In addition, damage by sputtering can be reduced. In order to remove moisture remaining in the treatment chamber, an adsorption vacuum pump is preferably used. For example, a cryopump, an ion pump, or a titanium sublimation pump is preferably used. A turbo pump to which a cold trap is added may be used as an exhaustion means. For example, a hydrogen atom, a compound containing a hydrogen atom, such as water (preferably a compound containing a carbon atom), and the like are exhausted from the treatment chamber with the use of a cryopump. Thus, the concentration of impurities contained in the oxide semiconductor film deposited in the treatment chamber can be lowered.

Note that the oxide semiconductor film formed by sputtering or the like contains a large amount of moisture or hydrogen (including a hydroxyl group) as an impurity in some cases. Moisture and hydrogen easily form donor levels and thus serve as impurities in the oxide semiconductor. Thus, in one embodiment of the present invention, in order to reduce impurities such as moisture or hydrogen in the oxide semiconductor film (in order to perform dehydration or dehydrogenation), the oxide semiconductor film is subjected to heat treatment in a reduced-pressure atmosphere, an inert gas atmosphere of nitrogen, a rare gas, or the like, an oxygen gas atmosphere, or ultra dry air (the moisture amount is 20 ppm (−55° C. by conversion into a dew point) or less, preferably 1 ppm or less, more preferably 10 ppb or less, in the case where measurement is performed by a dew point meter in a cavity ring-down laser spectroscopy (CRDS) method).

By performing heat treatment on the oxide semiconductor film, moisture or hydrogen in the oxide semiconductor film can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 to 6 minutes. When RTA is used for the heat treatment, dehydration or dehydrogenation can be performed in a short time; thus, treatment can be performed even at a temperature higher than the strain point of a glass substrate.

Note that in some cases, the heat treatment makes oxygen released from the oxide semiconductor film and oxygen vacancies occur in the oxide semiconductor film. Thus, in one embodiment of the present invention, an insulating film containing oxygen is used as an insulating film that is in contact with the oxide semiconductor film, such as a gate insulating film. Then, heat treatment is performed after formation of the insulating film containing oxygen, so that oxygen is supplied from the insulating film to the oxide semiconductor film. With this structure, oxygen vacancies that serve as donors can be reduced and the stoichiometric proportion of the oxide semiconductor included in the oxide semiconductor film can be satisfied. It is preferable that the proportion of oxygen in the oxide semiconductor film be higher than the stoichiometric proportion. As a result, the oxide semiconductor film can be substantially intrinsic and variations in electrical characteristics of the transistor due to oxygen vacancies can be reduced, which results in an improvement of electrical characteristics.

Note that the heat treatment for supplying oxygen to the oxide semiconductor film is performed in an atmosphere of nitrogen, ultra dry air, or a rare gas (e.g., argon or helium) preferably at 200 to 400° C., for example, 250 to 350° C. It is preferable that the water content in the gas be 20 ppm or less, preferably 1 ppm or less, more preferably 10 ppb or less.

Figure 82A:
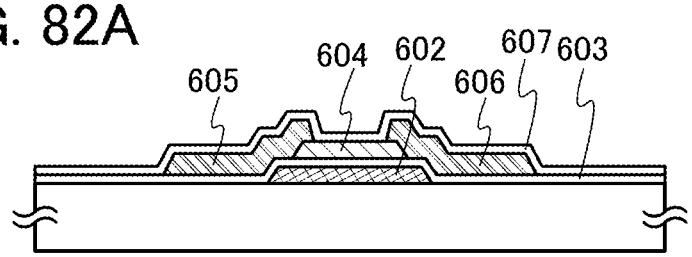
FIGS. 82A to 82D each illustrate the structure of a semiconductor device.

A transistor illustrated in FIG. 82A is a bottom-gate transistor with a channel-etched structure.

The transistor illustrated in FIG. 82A includes a gate electrode 602 formed over an insulating surface, a gate insulating film 603 over the gate electrode 602, a semiconductor film 604 over the gate insulating film 603 that overlaps with the gate electrode 602, and conductive films 605 and 606 formed over the semiconductor film 604. The transistor may further include an insulating film 607 formed over the semiconductor film 604 and the conductive films 605 and 606.

Note that the transistor illustrated in FIG. 82A may further include a back-gate electrode formed over the insulating film 607 in a portion that overlaps with the semiconductor film 604.

Figure 82B:
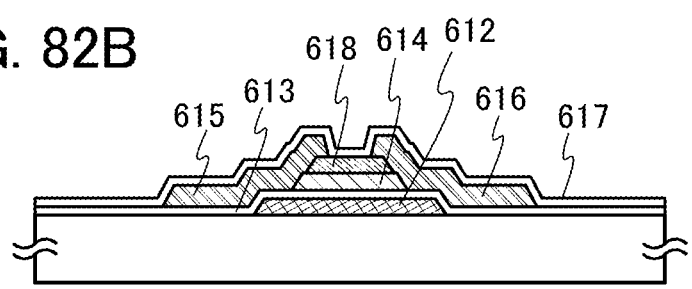

A transistor illustrated in FIG. 82B is a bottom-gate transistor with a channel-protective structure.

The transistor illustrated in FIG. 82B includes a gate electrode 612 formed over an insulating surface, a gate insulating film 613 over the gate electrode 612, a semiconductor film 614 over the gate insulating film 613 that overlaps with the gate electrode 612, a channel protective film 618 formed over the semiconductor film 614, and conductive films 615 and 616 formed over the semiconductor film 614. The transistor may further include an insulating film 617 formed over the channel protective film 618 and the conductive films 615 and 616.

Note that the transistor illustrated in FIG. 82B may further include a back-gate electrode formed over the insulating film 617 in a portion that overlaps with the semiconductor film 614.

The channel protective film 618 can prevent a portion of the semiconductor film 614 that serves as a channel formation region from being damaged in a later step, for example, a reduction in thickness due to plasma or an etchant during etching. Thus, the reliability of the transistor can be improved.

Figure 82C:
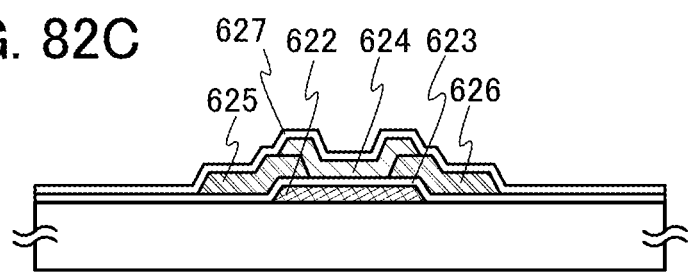

A transistor illustrated in FIG. 82C is a bottom-gate transistor with a bottom-contact structure.

The transistor illustrated in FIG. 82C includes a gate electrode 622 formed over an insulating surface, a gate insulating film 623 over the gate electrode 622, conductive films 625 and 626 over the gate insulating film 623, and a semiconductor film 624 over the gate insulating film 623 that overlaps with the gate electrode 622 and is formed over the conductive films 625 and 626. Further, the transistor may include an insulating film 627 formed over the conductive films 625 and 626 and the semiconductor film 624.

Note that the transistor illustrated in FIG. 82C may further include a back-gate electrode formed over the insulating film 627 in a portion that overlaps with the semiconductor film 624.

Figure 82D:
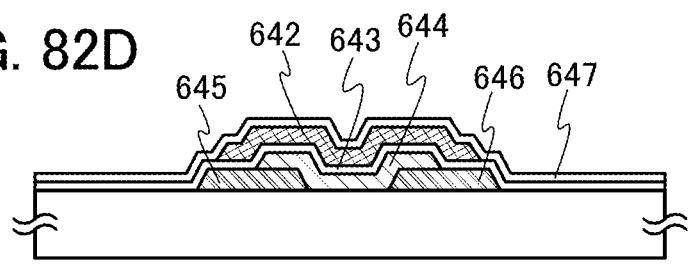

A transistor illustrated in FIG. 82D is a top-gate transistor with a bottom-contact structure.

The transistor illustrated in FIG. 82D includes conductive films 645 and 646 formed over an insulating surface, a semiconductor film 644 formed over the conductive films 645 and 646, a gate insulating film 643 formed over the semiconductor film 644 and the conductive films 645 and 646, and a gate electrode 642 over the gate insulating film 643 that overlaps with the semiconductor film 644. Further, the transistor may include an insulating film 647 formed over the gate electrode 642.

This embodiment is obtained by performing change, addition, modification, removal, application, superordinate conceptualization, or subordinate conceptualization on part or all of another embodiment. Thus, part or all of this embodiment can be freely combined with, applied to, or replaced with part or all of another embodiment.

(Embodiment 7)

Figure 83A:
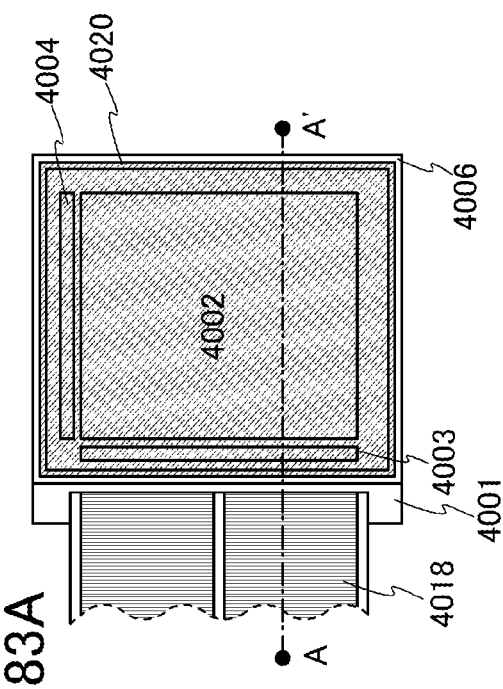
FIGS. 83A and 83B illustrate the structure of a semiconductor device.
Figure 83B:
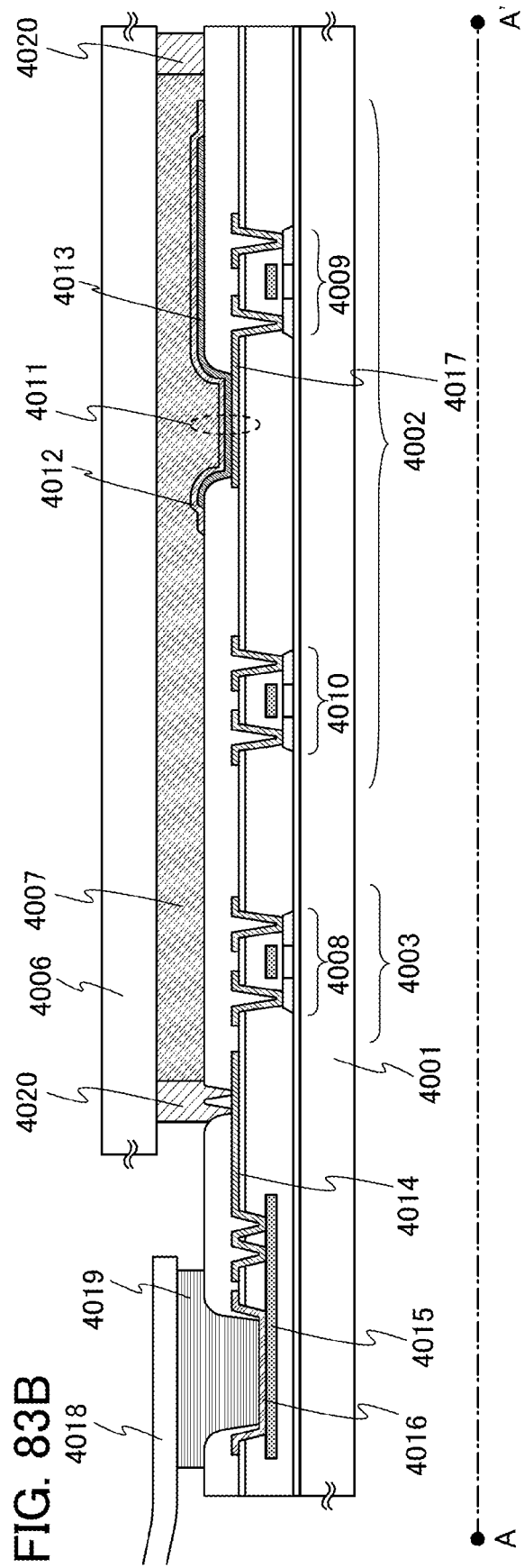

In this embodiment, a light-emitting device that is one aspect of a semiconductor device of the present invention is given as an example, and the appearance of the light-emitting device is described with reference to FIGS. 83A and 83B. FIG. 83A is a top view of a panel in which a transistor and a light-emitting element that are formed over a first substrate are sealed between the first substrate and a second substrate with a sealant. FIG. 83B corresponds to a cross-sectional view taken along line A-A' in FIG. 83A.

A sealant 4020 is formed to surround a pixel area 4002, a circuit 4003, and a circuit 4004 that are provided over a first substrate 4001. In addition, a second substrate 4006 is formed over the pixel area 4002, the circuit 4003, and the circuit 4004. Thus, the pixel area 4002, the circuit 4003, and the circuit 4004 are sealed together with a filler 4007 between the first substrate 4001 and the second substrate 4006 with the sealant 4020.

Each of the pixel area 4002 and the circuits 4003 and 4004 for supplying signals to the pixel area 4002 is formed over the first substrate 4001 and has a plurality of transistors. In FIG. 83B, a transistor 4008 included in the circuit 4003, and transistors 4009 and 4010 included in the pixel area 4002 are illustrated.

In addition, part of a wiring 4017 which is connected to a source or a drain of the transistor 4009 is used as a pixel electrode of a light-emitting element 4011. Further, the light-emitting element 4011 includes a counter electrode 4012 and a light-emitting layer 4013 in addition to the pixel electrode. Note that the structure of the light-emitting element 4011 is not limited to the structure described in this embodiment. The structure of the light-emitting element 4011 can be changed as appropriate depending on the direction of light extracted from the light-emitting element 4011, the polarity of the transistor 4009, or the like.

Although a variety of signals and voltage supplied to the circuit 4003, the circuit 4004, or the pixel area 4002 are not illustrated in the cross-sectional view of FIG. 83B, the variety of signals and voltage are supplied from a connection terminal 4016 through lead wirings 4014 and 4015.

In this embodiment, the connection terminal 4016 is formed using the same conductive film as the counter electrode 4012 of the light-emitting element 4011. The lead wiring 4014 is formed using the same conductive film as the wiring 4017. Further, the lead wiring 4015 is formed using the same conductive film as gate electrodes of the transistors 4009, 4010, and 4008.

The connection terminal 4016 is electrically connected to a terminal of an FPC 4018 through an anisotropic conductive film 4019.

The first substrate 4001 and the second substrate 4006 can be formed using glass, metal (typically, stainless steel), ceramics, or plastics. Note that the second substrate 4006 positioned in a direction from which light from the light-emitting element 4011 is extracted should have a light-transmitting property. Thus, a light-transmitting material such as a glass plate, a plastic plate, a polyester film, or an acrylic film is preferably used for the second substrate 4006.

In addition, an ultraviolet curable resin or a thermosetting resin as well as an inert gas such as nitrogen or argon can be used for the filler 4007. In this embodiment, an example in which nitrogen is used for the filler 4007 is illustrated.

This embodiment is obtained by performing change, addition, modification, removal, application, superordinate conceptualization, or subordinate conceptualization on part or all of another embodiment. Thus, part or all of this embodiment can be freely combined with, applied to, or replaced with part or all of another embodiment.

(Embodiment 8)

The circuit 100 according to one aspect of the present invention can be used for a pixel area of a display device. Alternatively, the circuit 100 according to one aspect of the present invention can be used for a driver circuit of a display device.

Figure 84A:
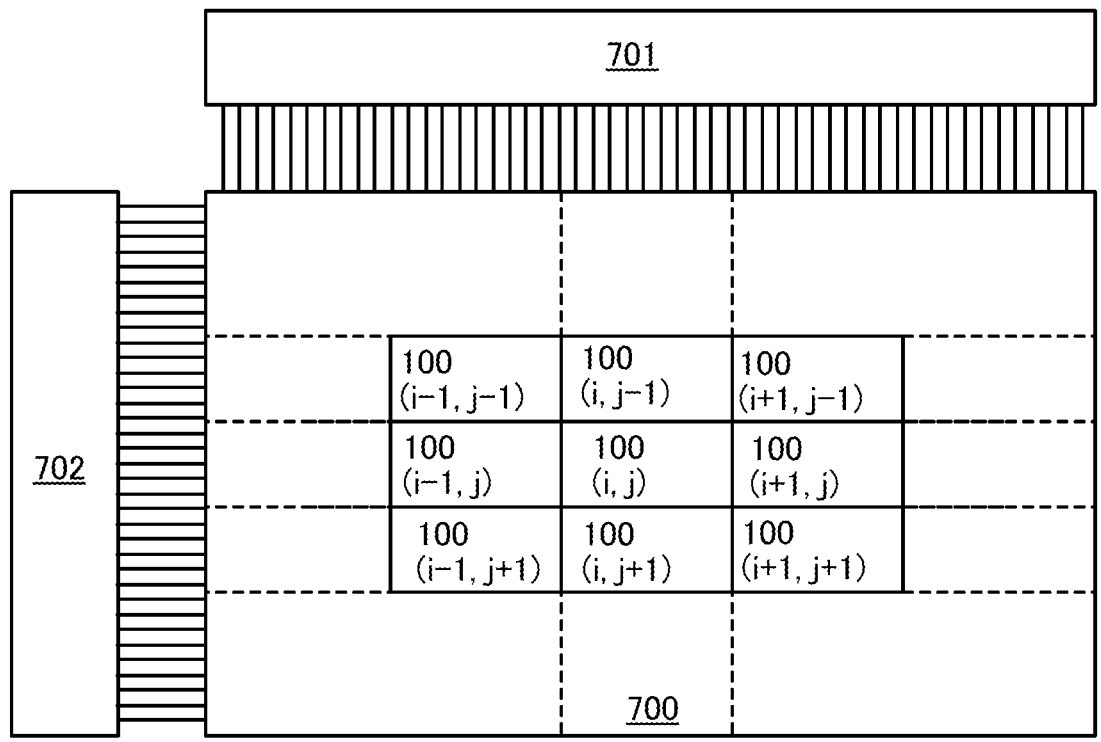
FIGS. 84A and 84B each illustrate the structure of a semiconductor device.

FIG. 84A is a block diagram of a display device that is a semiconductor device according to one aspect of the present invention. The display device in FIG. 84A includes a pixel area 700, a driver circuit 701, and a driver circuit 702. The pixel area 700 includes the plurality of circuits 100 functioning as pixels. The driver circuit 701 and the driver circuit 702 have a function of supplying a variety of constant voltage or signals to the circuits 100.

Figure 84B:
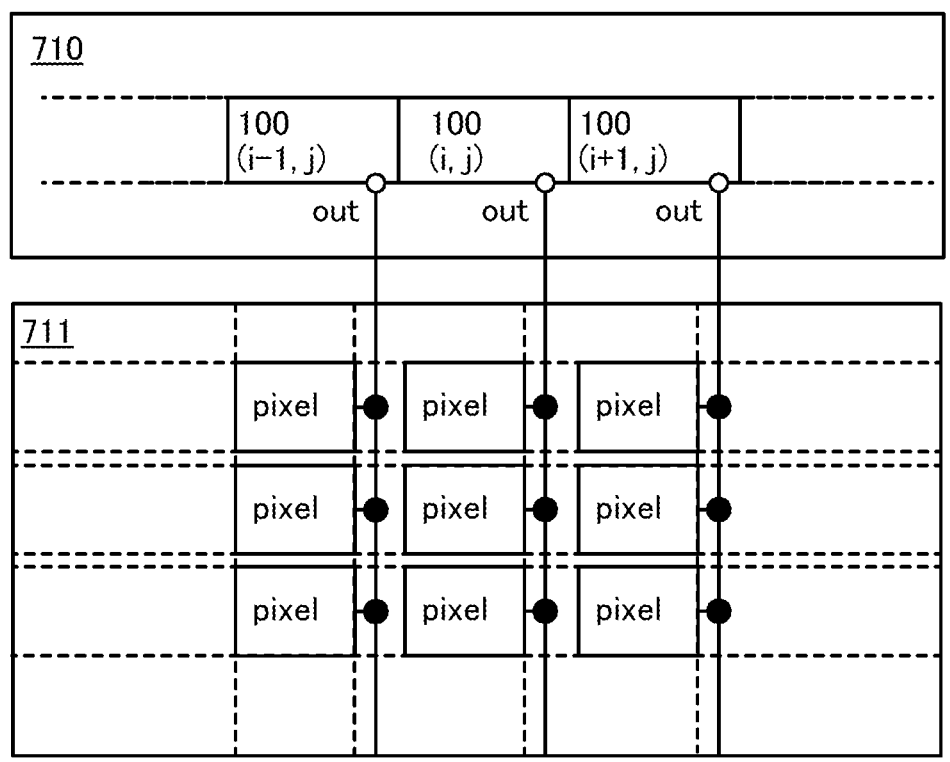

FIG. 84B is a block diagram of a display device that is a semiconductor device according to one aspect of the present invention. The display device in FIG. 84B includes a pixel area 711 and a driver circuit 710. The driver circuit 710 includes the plurality of circuits 100 functioning as current sources. Current output from the circuit 100 is supplied to a pixel included in the pixel area 711.

This embodiment is obtained by performing change, addition, modification, removal, application, superordinate conceptualization, or subordinate conceptualization on part or all of another embodiment. Thus, part or all of this embodiment can be freely combined with, applied to, or replaced with part or all of another embodiment.

(Embodiment 9)

A semiconductor device according to one embodiment of the present invention can be used for display devices, personal computers, or image reproducing devices provided with recording media (typically, devices that reproduce the content of recording media such as digital versatile discs (DVDs) and have displays for displaying the reproduced images). Further, as electronic devices that can include the semiconductor device according to one embodiment of the present invention, cellular phones, game machines (including portable game machines), personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), vending machines, and the like can be given. FIGS. 85A to 85F and FIG. 91 illustrate specific examples of these electronic devices.

Figure 85A:
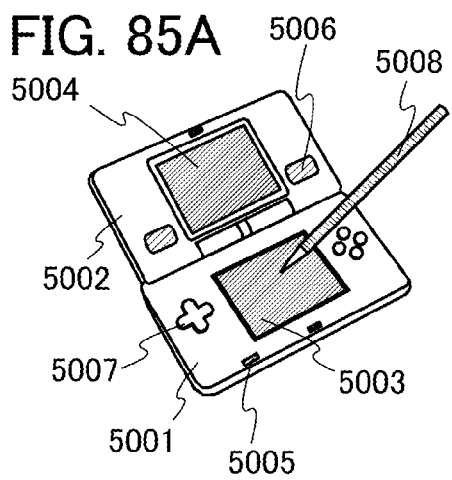
FIGS. 85A to 85F each illustrate an electronic device.

FIG. 85A illustrates a portable game machine, which includes a housing 5001, a housing 5002, a display portion 5003, a display portion 5004, a microphone 5005, speakers 5006, a control key 5007, a stylus 5008, and the like. The semiconductor device according to one aspect of the present invention can be used for an integrated circuit for controlling driving of the portable game machine or the display portion 5003 or 5004. Note that although the portable game machine in FIG. 85A has the two display portions 5003 and 5004, the number of display portions included in the portable game machine is not limited thereto.

Figure 85B:
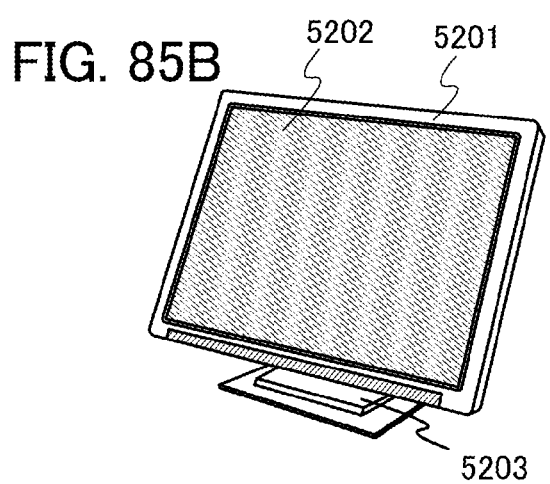

FIG. 85B illustrates a display device, which includes a housing 5201, a display portion 5202, a support 5203, and the like. The semiconductor device according to one aspect of the present invention can be used for an integrated circuit for controlling driving of the display device or the display portion 5202. Note that the display device means all display devices for displaying information, such as display devices for personal computers, for receiving TV broadcast, and for displaying advertisements.

Figure 85C:
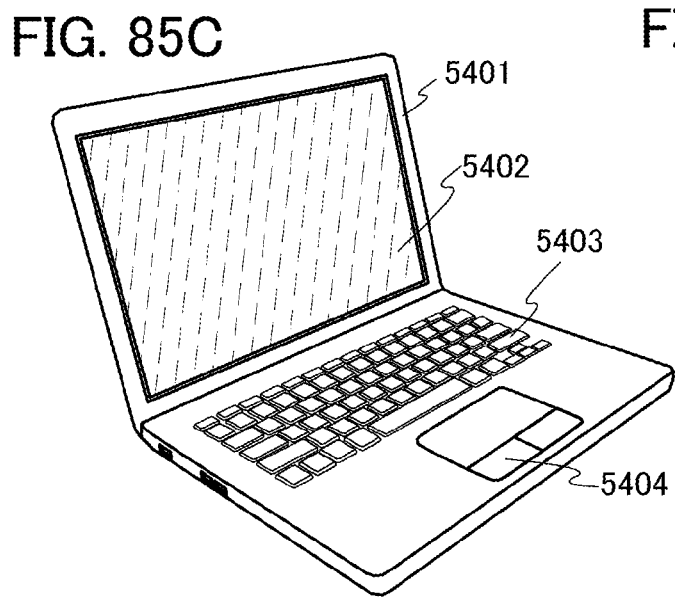

FIG. 85C illustrates a laptop, which includes a housing 5401, a display portion 5402, a keyboard 5403, a pointing device 5404, and the like. The semiconductor device according to one aspect of the present invention can be used for an integrated circuit for controlling driving of the laptop or the display portion 5402.

Figure 85D:
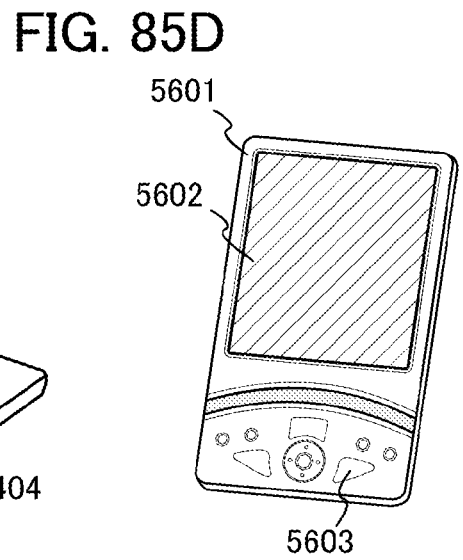

FIG. 85D illustrates a personal digital assistant, which includes a housing 5601, a display portion 5602, control keys 5603, and the like. In the personal digital assistant in FIG. 85D, a modem may be incorporated in the housing 5601. The semiconductor device according to one aspect of the present invention can be used for an integrated circuit for controlling driving of the personal digital assistant or the display portion 5602.

Figure 85E:
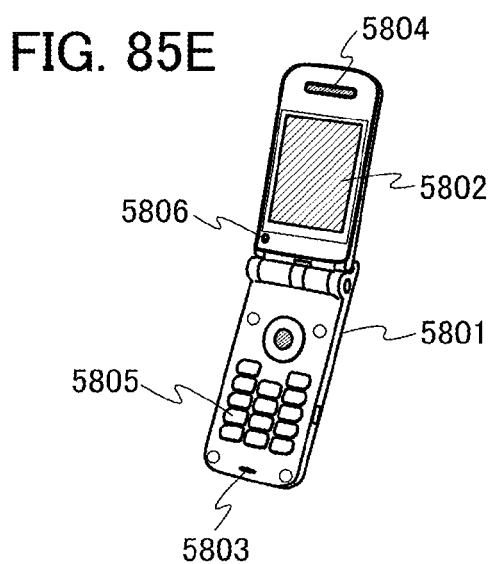

FIG. 85E illustrates a cellular phone, which includes a housing 5801, a display portion 5802, an audio input portion 5803, an audio output portion 5804, control keys 5805, a light-receiving portion 5806, and the like. Light received in the light-receiving portion 5806 is converted into electrical signals, so that external images can be loaded. The semiconductor device according to one aspect of the present invention can be used for an integrated circuit for controlling driving of the cellular phone or the display portion 5802.

Figure 85F:
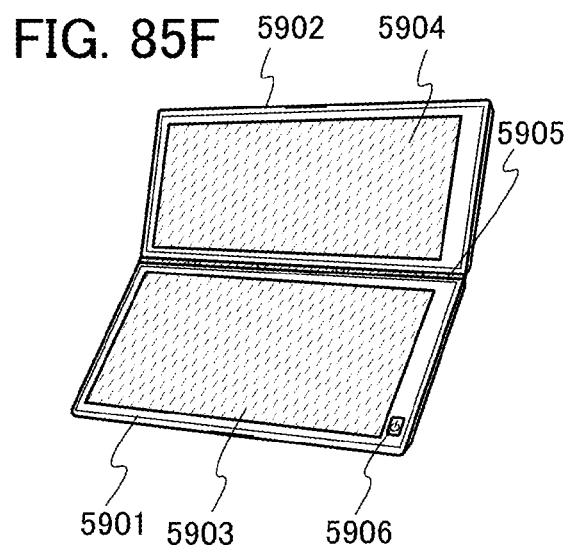

FIG. 85F illustrates a personal digital assistant, which includes a first housing 5901, a second housing 5902, a first display portion 5903, a second display portion 5904, a joint 5905, a control key 5906, and the like. The first display portion 5903 is provided in the first housing 5901, and the second display portion 5904 is provided in the second housing 5902. The first housing 5901 and the second housing 5902 are connected to each other with the joint 5905, and an angle between the first housing 5901 and the second housing 5902 can be changed with the joint 5905. An image on the first display portion 5903 may be switched depending on the angle between the first housing 5901 and the second housing 5902 at the joint 5905. The semiconductor device according to one aspect of the present invention can be used for an integrated circuit for controlling driving of the personal digital assistant, the first display portion 5903, or the second display portion 5904. A display device with a position input function may be used as at least one of the first display portion 5903 and the second display portion 5904. Note that the position input function can be added by provision of a touch panel in a display device. Alternatively, the position input function can be added by provision of a photoelectric conversion element called a photosensor in a pixel area of a display device.

Figure 91:
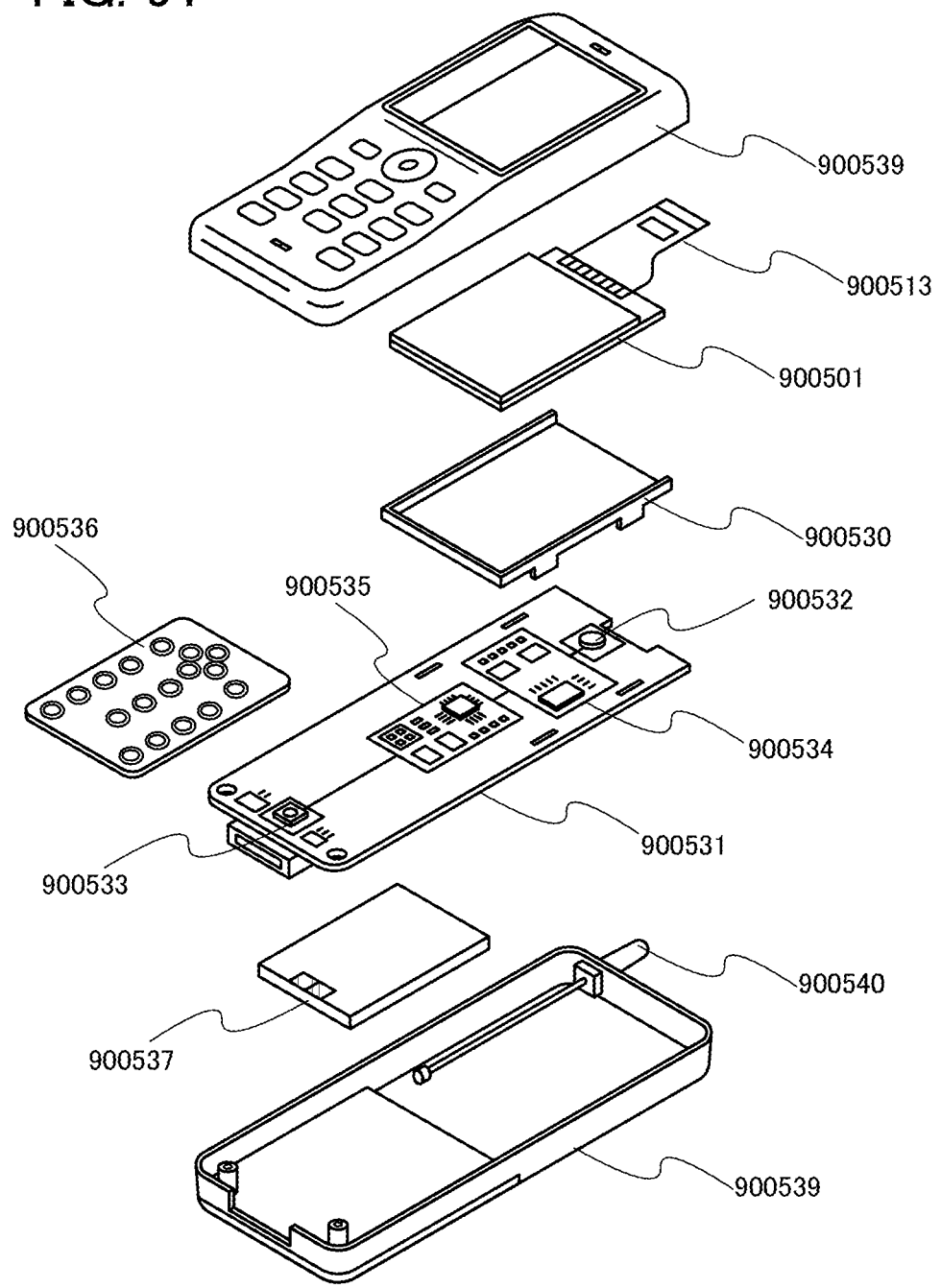
FIG. 91 illustrates an electronic device.

Next, a structure example of a cellular phone according to the present invention is described with reference to FIG. 91.

A display panel 900501 is detachably incorporated in a housing 900530. The shape or size of the housing 900530 can be changed as appropriate depending on the size of the display panel 900501. The housing 900530 to which the display panel 900501 is fixed is fitted in a printed board 900531 to be assembled as a module.

By provision of a touch panel, an FPC, a printed board, a frame, a radiator plate, an optical film, a polarizing plate, a retardation film, a prism sheet, a diffusion plate, a backlight, a light guide plate, an LED, a CFL, a front light, a controller, a driver circuit, a signal processing circuit, or the like, the display panel 900501 can be used as a display module. Further, a counter substrate (a sealing substrate) of the display panel 900501 can function as a touch panel.

The display panel 900501 is connected to the printed board 900531 through an FPC 900513. The printed board 900531 is provided with a speaker 900532, a microphone 900533, a transmission/reception circuit 900534, and a signal processing circuit 900535 including a CPU, a controller, and the like. Such a module, an input means 900536, and a battery 900537 are combined and stored in a housing 900539. A pixel area of the display panel 900501 is provided to be seen from an opening window formed in the housing 900539.

In the display panel 900501, the pixel area and part of peripheral driver circuits (a driver circuit having low operation frequency among a plurality of driver circuits) may be formed over one substrate by using TFTs, and another part of the peripheral driver circuits (a driver circuit having high operation frequency among the plurality of driver circuits) may be formed over an IC chip. Then, the IC chip may be mounted on the display panel 900501 by chip on glass (COG). Alternatively, the IC chip may be connected to a glass substrate by using tape automated bonding (TAB) or a printed board. With such a structure, the power consumption of a display device can be reduced, and the operation time of the cellular phone per charge can be extended. Further, the cost of the cellular phone can be reduced.

This embodiment is obtained by performing change, addition, modification, removal, application, superordinate conceptualization, or subordinate conceptualization on part or all of another embodiment. Thus, part or all of this embodiment can be freely combined with, applied to, or replaced with part or all of another embodiment.

Note that in a diagram or a text described in one embodiment, part of the diagram or the text is taken out, and one embodiment of the invention can be constituted. Thus, in the case where a diagram or a text related to a certain portion is described, the context taken out from part of the diagram or the text is also disclosed as one embodiment of the invention, and one embodiment of the invention can be constituted. Therefore, for example, in a diagram or a text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, M circuit elements (e.g., transistors or capacitors) (M is an integer, where M<N) are taken out from a circuit diagram in which N circuit elements (e.g., transistors or capacitors) (N is an integer) are provided, and one embodiment of the invention can be constituted. As another example, M layers (M is an integer, where M<N) are taken out from a cross-sectional view in which N layers (N is an integer) are provided, and one embodiment of the invention can be constituted. As another example, M elements (M is an integer, where M<N) are taken out from a flow chart in which N elements (N is an integer) are provided, and one embodiment of the invention can be constituted.

Note that in a diagram or a text described in one embodiment, in the case where at least one specific example is described, it will be readily appreciated by those skilled in the art that a broader concept of the specific example can be derived. Thus, in the diagram or the text described in one embodiment, in the case where at least one specific example is described, a broader concept of the specific example is disclosed as one embodiment of the invention, and one embodiment of the invention can be constituted.

Note that a content described in at least a diagram (or may be part of the diagram) is disclosed as one embodiment of the invention, and one embodiment of the invention can be constituted. Thus, when a certain content is described in a diagram, the content is disclosed as one embodiment of the invention even when the content is not described with a text, and one embodiment of the invention can be constituted. Similarly, part of a diagram that is taken out from the diagram is disclosed as one embodiment of the invention, and one embodiment of the invention can be constituted.

(Embodiment 10)

Figure 88A:
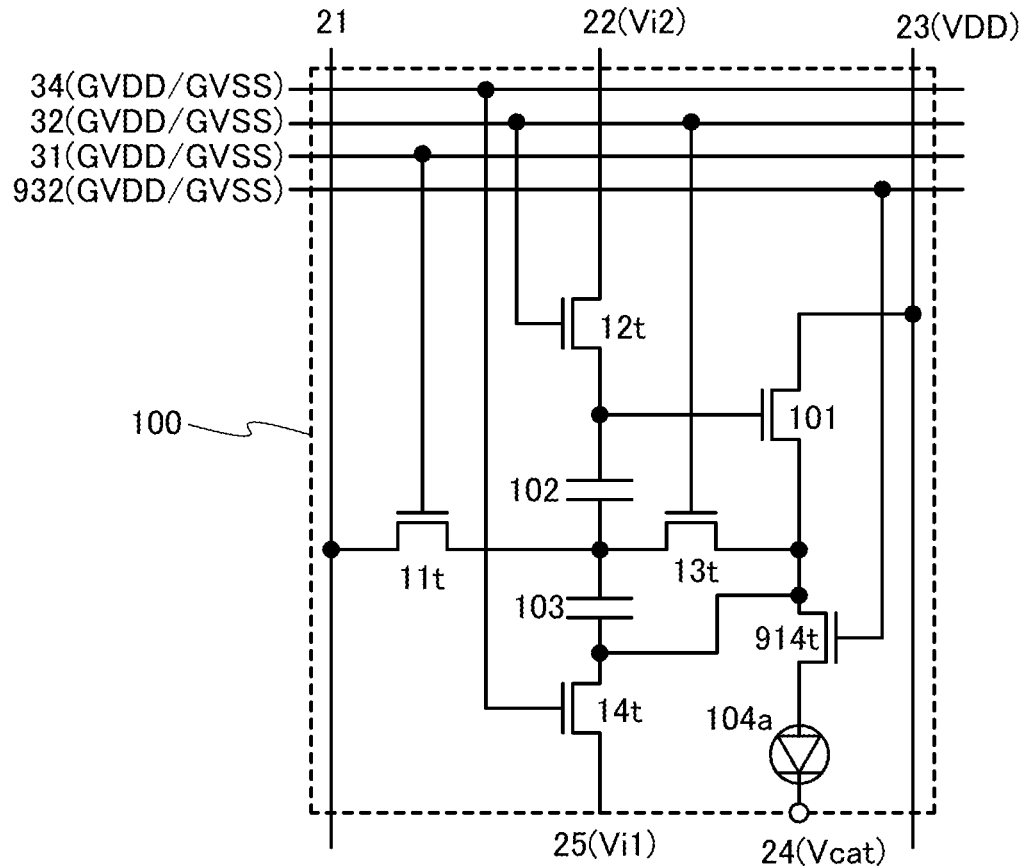
FIG. 88A illustrates the structure of a semiconductor device.

FIG. 88A illustrates a structure example of the circuit 100, in which transistors are used as the switch 11, the switch 12, the switch 13, the switch 14, and the switch 914 in FIG. 49A.

In the circuit 100 in FIG. 88A, the transistor 11*t*, the transistor 12*t*, the transistor 13*t*, the transistor 14*t*, and the transistor 914*t* are used as the switch 11, the switch 12, the switch 13, the switch 14, and the switch 914, respectively.

FIG. 88A illustrates the example in which the transistor 11*t*, the transistor 12*t*, the transistor 13*t*, the transistor 14*t*, and the transistor 914*t* are all n-channel transistors. When the transistor 11*t*, the transistor 12*t*, the transistor 13*t*, the transistor 14*t*, and the transistor 914*t* have the same polarity, these transistors can be manufactured in a small number of steps. However, one aspect of the embodiment of the present invention is not limited thereto, and these transistors can have different polarities.

In FIG. 88A, the gate of the transistor 11*t* is connected to the wiring 31. The transistor 11*t* is turned on or off in response to a potential supplied to the wiring 31. The gate of the transistor 12*t* is connected to the wiring 32. The transistor 12*t* is turned on or off in response to a potential supplied to the wiring 32. The gate of the transistor 13*t* is connected to the wiring 32. The transistor 13*t* is turned on or off in response to the potential supplied to the wiring 32. The gate of the transistor 14*t* is connected to the wiring 34. The transistor 14*t* is turned on or off in response to a potential supplied to the wiring 34. Thus, it is preferable that the potentials of the wirings 31, 32, and 34 be pulsed potentials and not constant; however, one aspect of the embodiment of the present invention is not limited thereto. Alternatively, the wirings 31, 32, and 34 each function as a gate signal line, a selection signal line, or a scan line.

Note that in FIG. 88A, the gate of the transistor 12*t* and the gate of the transistor 13*t* are connected to the wiring 32. In one aspect of the present invention, the gate of the transistor 12*t* may be connected to the wiring 32, and the gate of the transistor 13t may be connected to the wiring 33.

At least two of the wirings 31, 32, and 34 can be connected to each other. Alternatively, at least one of the wirings 31, 32, and 34 can be connected to at least one of the wirings 31, 32, and 34 in another circuit 100.

The semiconductor device according to one aspect of the present invention may further include a circuit for supplying a variety of constant voltage or signals to the circuit 100, in addition to the circuit 100 in FIG. 88A.

The value of the gate-source voltage Vgs101 of the transistor 101 in the period T14 during which the light-emitting element 104a emits light at luminance based on the potential Vsig was calculated. The circuit 100 in FIG. 88A was used in the calculation.

Figure 88B:
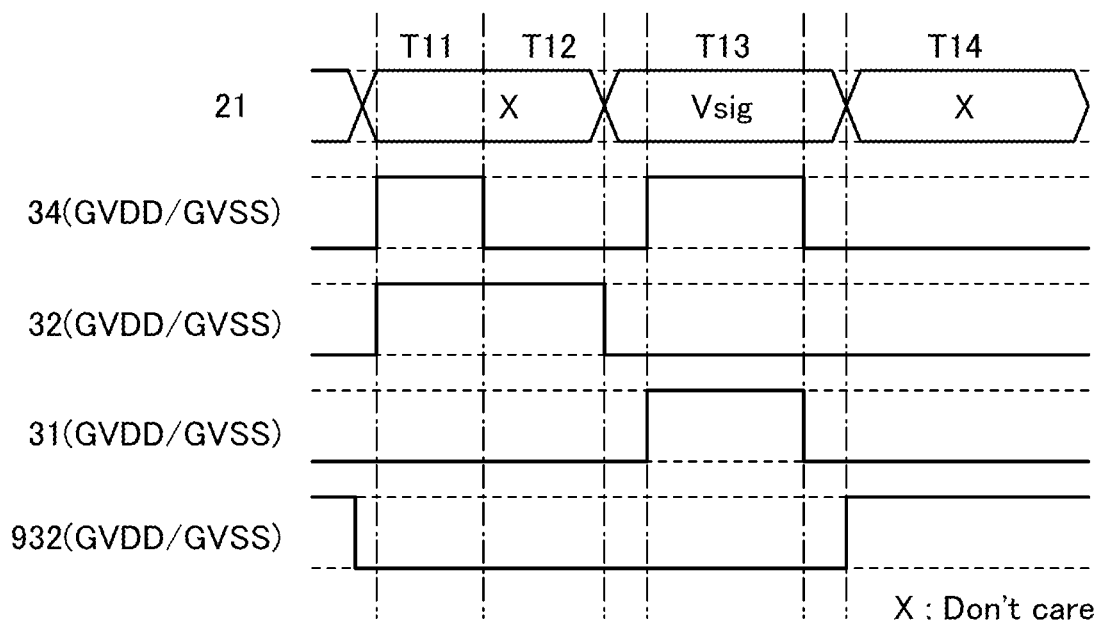
FIG. 88B is a timing chart.

FIG. 88B is a timing chart illustrating the potentials of the wirings included in the circuit 100 in FIG. 88A in the calculation. Specifically, FIG. 88B illustrates time changes of the potential of the wiring 21, the potential of the wiring 34, the potential of the wiring 32, the potential of the wiring 31, and the potential of the wiring 932. Note that in FIG. 88B, a high potential GVDD or a low potential GVSS is applied to the wiring 34, the wiring 32, the wiring 31, and the wiring 932.

The calculation was performed under Condition A and Condition B with different values of the potential Vi2 of the wiring 22. Table 1 shows specific potentials of the wirings under Condition A and Condition B. Note that in Table 1, the potential Vcat of the wiring 24 is 0 V, and the values of the potential Vsig, the potential Vi1, the potential VDD, the potential Vi2, the potential GVDD, and the potential GVSS are represented by a potential difference with respect to the potential Vcat.

TABLE 1

|  | Condition A | Condition B |
|---|---|---|
| Vth | −3 V to 3 V | −3 V to 3 V |
| Vsig | 4 V to 9 V | 4 V to 9 V |
| Vi1 | 4 V | 4 V |
| VDD | 14 V | 14 V |
| Vi2 | 8 V | 14 V |
| Vcat | 0 V | 0 V |
| GVDD/GVSS | 17 V/−5 V | 20 V/−5 V |

As for the channel length L to channel width W ratio of the transistors in the calculation, L/W of the transistor 101 was 10 μm/10 μm, L/W of the transistors 12t and 13t were each 6 μm/5 μm, and L/W of the transistors 11t, 14t, and 914t were each 6 μm/9 μm. Assuming that a region A is a region where the semiconductor film is in contact with the source electrode or the drain electrode in all the transistors included in the circuit 100 in FIG. 88A, the length (Lov) in the channel length direction of a region where the region A overlaps with the gate electrode was 2.0 μm.

In the period T14 in FIG. 88B, the gate-source voltage Vgs101 of the transistor 101 becomes the voltage Vsig+Vth−Vi1. Thus, Vgs101−Vth equals Vsig−Vi1 in the circuit 100 in FIG. 88A, so that Vgs101−Vth is ideally constant regardless of the value of the threshold voltage Vth.

Figure 89:
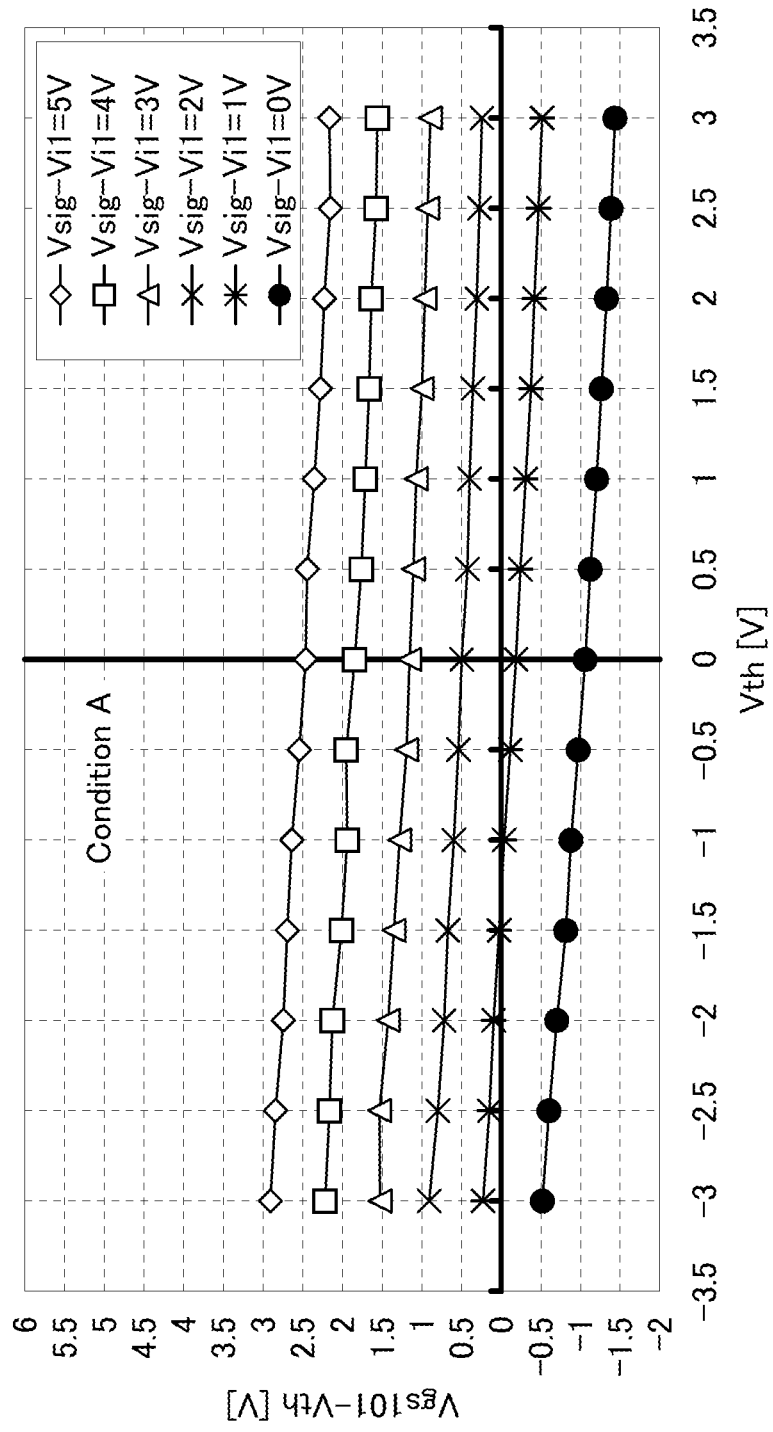
FIG. 89 shows calculation results.

FIG. 89 shows the value of Vgs101−Vth obtained by the calculation under Condition A. In FIG. 89, the horizontal axis represents the value of the threshold voltage Vth (V) and the vertical axis represents the value of Vgs101−Vth (V). FIG. 89 shows that the value of Vgs101−Vth is almost constant even when the value of the threshold voltage Vth is changed, and the variation in Vgs101−Vth is less than about 10 to 15%.

Figure 90:
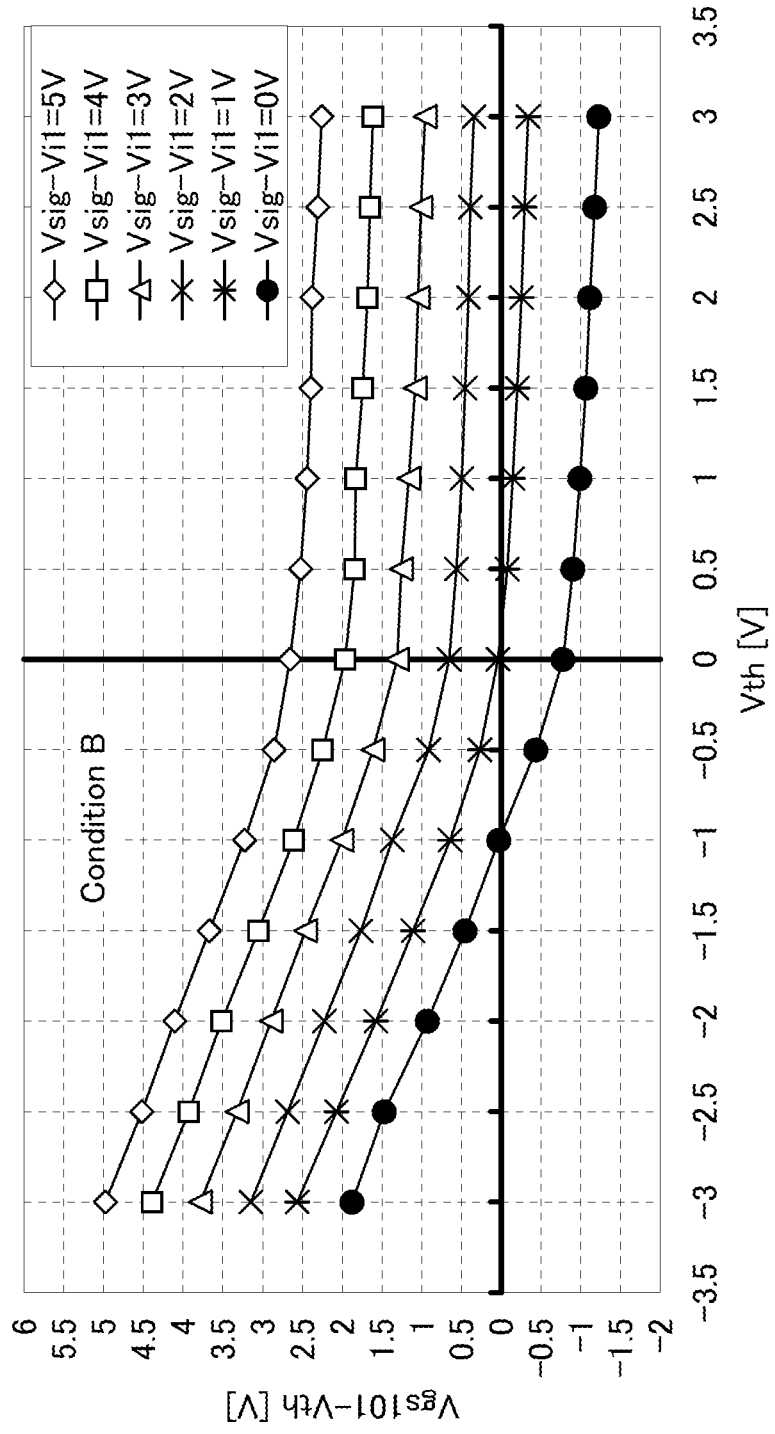
FIG. 90 shows calculation results.

FIG. 90 shows the value of Vgs101−Vth obtained by the calculation under Condition B. In FIG. 90, the horizontal axis represents the value of the threshold voltage Vth (V) and the vertical axis represents the value of Vgs101−Vth (V). In FIG. 90, the value of Vgs100−Vth is almost constant when the threshold voltage Vth is positive voltage. In contrast, when the threshold voltage Vth is negative voltage, the value of Vgs101−Vth is larger as the threshold voltage Vth of negative polarity is higher, which means the value of Vgs100−Vth depends on the value of the threshold voltage Vth.

The calculation results prove that in the semiconductor device according to one aspect of the present invention, the gate-source voltage Vgs101 of the transistor 101 can be set by taking the threshold voltage Vth of the transistor 11 into consideration, even when the transistor 101 is normally on, that is, even when the threshold voltage Vth is negative voltage.

This embodiment is obtained by performing change, addition, modification, removal, application, superordinate conceptualization, or subordinate conceptualization on part or all of another embodiment. Thus, part or all of this embodiment can be freely combined with, applied to, or replaced with part or all of another embodiment.

REFERENCE NUMERALS

11: switch, 11t: transistor, 12: switch, 12t: transistor, 13: switch, 13t: transistor, 14: switch, 14a: switch, 14b: switch, 14t: transistor, 15: switch, 21: wiring, 22: wiring, 23: wiring, 23a: wiring, 23b: wiring, 24: wiring, 25: wiring, 26: wiring, 27: wiring, 31: wiring, 32: wiring, 33: wiring, 34: wiring, 100: circuit, 101: transistor, 102: capacitor, 103: capacitor, 104: load, 104a: light-emitting element, 104b: light-emitting element, 105: capacitor, 105a: capacitor, 105b: capacitor, 201: circuit, 202: circuit, 203: circuit, 203a: circuit, 203b: circuit, 204: circuit, 205: circuit, 206: circuit, 207: circuit, 208: circuit, 220: circuit, 221: circuit, 222: circuit, 222a: circuit, 222b: circuit, 223: circuit, 224: circuit, 225: circuit, 226: circuit, 230: circuit, 231: circuit, 232: circuit, 233: circuit, 300: semiconductor film, 301: semiconductor film, 302: conductive film, 303: conductive film, 304: conductive film, 305: conductive film, 306: conductive film, 307: conductive film, 308: conductive film, 309: conductive film, 320: semiconductor film, 321: semiconductor film, 322: semiconductor film, 323: semiconductor film, 324: conductive film, 325: conductive film, 326: conductive film, 327: conductive film, 328: conductive film, 329: conductive film, 330: conductive film, 331: conductive film, 332: conductive film, 333: semiconductor film, 501: semiconductor film, 502: insulating film, 503: electrode, 504: conductive film, 505: conductive film, 506: first region, 507: second region, 508: second region, 509: third region, 510: third region, 520: insulating film, 520a: first oxide insulating film, 520b: second oxide insulating film, 520c: third oxide insulating film, 521: semiconductor film, 522: insulating film, 523: electrode, 524: conductive film, 525: conductive film, 526: first region, 527: sidewall, 528: insulating film, 529: opening, 530: insulating film, 530a: first oxide insulating film, 530b: second oxide insulating film, 531: semiconductor film, 532: insulating film, 533: electrode, 534: conductive film, 535: conductive film, 536: first region, 537: second region, 538: second region, 539: sidewall, 540: insulating film, 550: second region, 551: second region, 602: gate electrode, 603: gate insulating film, 604: semiconductor film, 605: conductive film, 606: conductive film, 607: insulating film, 612: gate electrode, 613: gate insulating film, 614: semiconductor film, 615: conductive film, 616: conductive film, 617: insulating film, 618: channel protective film, 622:

gate electrode, 623: gate insulating film, 624: semiconductor film, 625: conductive film, 626: conductive film, 627: insulating film, 642: gate electrode, 643: gate insulating film, 644: semiconductor film, 645: conductive film, 646: conductive film, 647: insulating film, 700: pixel area, 701: driver circuit, 702: driver circuit, 710: driver circuit, 711: pixel area, 800: substrate, 801: insulating film, 802: insulating film, 803: insulating film, 814: switch, 914: switch, 914*t*: transistor, 932: wiring, 4001: substrate, 4002: pixel area, 4003: circuit, 4004: circuit, 4006: substrate, 4007: filler, 4008: transistor, 4009: transistor, 4010: transistor, 4011: light-emitting element, 4012: counter electrode, 4013: light-emitting layer, 4014: wiring, 4015: wiring, 4016: connection terminal, 4017: wiring, 4018: FPC, 4019: anisotropic conductive film, 4020: sealant, 5001: housing, 5002: housing, 5003: display portion, 5004: display portion, 5005: microphone, 5006: speaker, 5007: control key, 5008: stylus, 5201: housing, 5202: display portion, 5203: support, 5401: housing, 5402: display portion, 5403: keyboard, 5404: pointing device, 5601: housing, 5602: display portion, 5603: control key, 5801: housing, 5802: display portion, 5803: audio input portion, 5804: audio output portion, 5805: control key, 5806: light-receiving portion, 5901: housing, 5902: housing, 5903: display portion, 5904: display portion, 5905: joint, 5906: control key, 9206: circuit, 900501: display panel, 900513: FPC, 900530: housing, 900531: printed board, 900532: speaker, 900533: microphone, 900534: transmission/reception circuit, 900535: signal processing circuit, 900536: input unit, 900537: battery, and 900539: housing.

This application is based on Japanese Patent Application serial No. 2011-228418 filed with Japan Patent Office on Oct. 18, 2011 and Japanese Patent Application serial No. 2011-261317 filed with Japan Patent Office on Nov. 30, 2011, the entire contents of which are hereby incorporated by reference.

The invention claimed is:

1. A semiconductor device comprising:
a transistor comprising a gate electrode, a first terminal, and a second terminal;
a first wiring;
a second wiring;
a first switch;
a second switch;
a third switch;
a first capacitor; and
a second capacitor,
wherein the first switch has a function of selecting conduction or non-conduction between the first wiring and a first electrode of the first capacitor,
wherein the first electrode of the first capacitor is electrically connected to a first electrode of the second capacitor,
wherein a second electrode of the first capacitor is electrically connected to the gate electrode of the transistor,
wherein a second electrode of the second capacitor is electrically connected to the first terminal of the transistor,
wherein the second switch has a function of selecting conduction or non-conduction between the second wiring and the gate electrode of the transistor, and
wherein the third switch has a function of selecting conduction or non-conduction between the first electrode of the first capacitor and the first terminal of the transistor.

2. The semiconductor device according to claim 1, further comprising:
a fourth wiring; and
a load electrically connected between the first terminal of the transistor and the fourth wiring and between the second electrode of the second capacitor and the fourth wiring.

3. The semiconductor device according to claim 2, wherein each of the switches is a transistor.

4. The semiconductor device according to claim 1, further comprising:
a third wiring;
a fourth wiring; and
a fourth switch having a function of selecting conduction or non-conduction between the third wiring and the fourth wiring.

5. The semiconductor device according to claim 1, further comprising:
a fifth wiring; and
a fifth switch having a function of selecting conduction or non-conduction between the first terminal of the transistor and the fifth wiring.

6. The semiconductor device according to claim 1, wherein each of the switches is a transistor.

7. The semiconductor device according to claim 1, further comprising:
a fifth wiring; and
a third capacitor comprising a first electrode and a second electrode,
wherein the first electrode of the third capacitor is electrically connected to the second electrode of the second capacitor and the second electrode of the third capacitor is electrically connected to the fifth wiring.

8. The semiconductor device according to claim 1, wherein the transistor is an n-channel transistor.

9. The semiconductor device according to claim 1, wherein the transistor comprises a semiconductor film that comprises an oxide semiconductor.

10. The semiconductor device according to claim 1, wherein the transistor and each of the switches are n-channel transistors.

11. A display device including the semiconductor device according to claim 1.

12. A semiconductor device comprising:
a transistor comprising a gate electrode, a first terminal, and a second terminal;
a first wiring, a second wiring, a third wiring, and a fourth wiring;
a first switch, a second switch, and a third switch each comprising a first terminal and a second terminal; and
a first capacitor and a second capacitor each comprising a first electrode and a second electrode;
wherein the first terminal of the first switch is electrically connected to the first wiring, and the second terminal of the first switch is electrically connected to each of the first electrode of the first capacitor and the first electrode of the second capacitor,
wherein the second electrode of the first capacitor is electrically connected to the gate electrode of the transistor,
wherein the second electrode of the second capacitor is electrically connected to the first terminal of the transistor and to the fourth wiring,
wherein the first terminal of the second switch is electrically connected to the second wiring and the second terminal of the second switch is electrically connected to the gate electrode of the transistor,
wherein the first terminal of the third switch is electrically connected to the first electrode of the first capacitor, and the second terminal of the third switch is electrically connected to the first terminal of the transistor, and wherein the second terminal of the transistor is electrically connected to the third wiring.

13. The semiconductor device according to claim 12, further comprising:
a load electrically connected between the first terminal of the transistor and the fourth wiring and between the second electrode of the second capacitor and the fourth wiring.

14. The semiconductor device according to claim 12, further comprising:
a fourth switch comprising a first terminal and a second terminal, the first terminal and the second terminal of the fourth switch being connected in series with the first terminal and the second terminal of the transistor between the third wiring and the fourth wiring.

15. The semiconductor device according to claim 12, further comprising:
a fifth wiring; and
a fifth switch comprising a first terminal and a second terminal,
wherein the first terminal of the fifth switch is electrically connected to the first terminal of the transistor, and the second terminal of the fifth switch is electrically connected to the fifth wiring.

16. The semiconductor device according to claim 12, wherein each of the switches is a transistor.

17. The semiconductor device according to claim 12, further comprising:
a fifth wiring; and
a third capacitor comprising a first electrode and a second electrode,
wherein the first electrode of the third capacitor is electrically connected to the second electrode of the second capacitor and the second electrode of the third capacitor is electrically connected to the fifth wiring.

18. The semiconductor device according to claim 12, wherein the transistor is an n-channel transistor.

19. The semiconductor device according to claim 12, wherein the transistor comprises a semiconductor film that comprises an oxide semiconductor.

20. The semiconductor device according to claim 12, wherein the transistor and each of the switches are n-channel transistors.

21. A display device including the semiconductor device according to claim 12.

22. A semiconductor device comprising:
a transistor comprising a gate electrode, a first terminal, and a second terminal;
a first wiring, a second wiring, a third wiring, and a fourth wiring;
a first switch, a second switch, and a third switch each comprising a first terminal and a second terminal;
a first capacitor and a second capacitor each comprising a first electrode and a second electrode; and
a light-emitting element comprising a first electrode and a second electrode,
wherein the first terminal of the first switch is electrically connected to the first wiring, and the second terminal of the first switch is electrically connected to each of the first electrode of the first capacitor and the first electrode of the second capacitor,
wherein the second electrode of the first capacitor is electrically connected to the gate electrode of the transistor,
wherein the second electrode of the second capacitor is electrically connected to the first terminal of the transistor and to the first electrode of the light-emitting element,
wherein the first terminal of the second switch is electrically connected to the second wiring and the second terminal of the second switch is electrically connected to the gate electrode of the transistor,
wherein the first terminal of the third switch is electrically connected to the first electrode of the first capacitor, and the second terminal of the third switch is electrically connected to the first terminal of the transistor, and
wherein the second terminal of the transistor is electrically connected to the third wiring, and
wherein the second electrode of the light-emitting element is electrically connected to the fourth wiring.

23. The semiconductor device according to claim 22, further comprising:
a fourth switch comprising a first terminal and a second terminal, the first terminal and the second terminal of the fourth switch being connected in series with the first terminal and the second terminal of the transistor between the third wiring and the fourth wiring.

24. The semiconductor device according to claim 22, further comprising:
a fifth wiring; and
a fifth switch comprising a first terminal and a second terminal,
wherein the first terminal of the fifth switch is electrically connected to the first terminal of the transistor, and the second terminal of the fifth switch is electrically connected to the fifth wiring.

25. The semiconductor device according to claim 22, further comprising:
a fifth wiring; and
a third capacitor comprising a first electrode and a second electrode,
wherein the first electrode of the third capacitor is electrically connected to the second electrode of the second capacitor and the second electrode of the third capacitor is electrically connected to the fifth wiring.

26. The semiconductor device according to claim 22, wherein the transistor is an n-channel transistor.

27. The semiconductor device according to claim 22, wherein the transistor comprises a semiconductor film that comprises an oxide semiconductor.

28. The semiconductor device according to claim 22, wherein the transistor and each of the switches are n-channel transistors.

29. A display device including the semiconductor device according to claim 22.

30. A semiconductor device comprising:
a transistor comprising a gate electrode, a first terminal, and a second terminal;
a first wiring, a second wiring, a third wiring, a fourth wiring, and a fifth wiring;
a first switch, a second switch, a third switch, a fourth switch, and a fifth switch each comprising a first terminal and a second terminal;
a first capacitor and a second capacitor each comprising a first electrode and a second electrode; and
a light-emitting element comprising a first electrode and a second electrode,
wherein the first terminal of the first switch is electrically connected to the first wiring, and the second terminal of the first switch is electrically connected to each of the first electrode of the first capacitor and the first electrode of the second capacitor,
wherein the second electrode of the first capacitor is electrically connected to the gate electrode of the transistor, wherein the second electrode of the second capacitor is electrically connected to the first terminal of the transistor, wherein the first terminal of the second switch is electrically connected to the second wiring and the second terminal of the second switch is electrically connected to the gate electrode of the transistor, wherein the first terminal of the third switch is electrically connected to the first electrode of the first capacitor, and the second terminal of the third switch is electrically connected to the first terminal of the transistor, wherein the second terminal of the transistor is electrically connected to the third wiring, wherein the first terminal of the fourth switch is electrically connected to the first terminal of the transistor, and the second terminal of the fourth switch is electrically connected to the first electrode of the light-emitting element, wherein the second electrode of the light-emitting element is electrically connected to the fourth wiring, and wherein the first terminal of the fifth switch is electrically connected to the first terminal of the transistor, and the second terminal of the fifth switch is electrically connected to the fifth wiring.

31. The semiconductor device according to claim 30, wherein each of the switches is a transistor.

32. The semiconductor device according to claim 30, further comprising:
a sixth wiring; and
a third capacitor comprising a first electrode and a second electrode,
wherein the first electrode of the third capacitor is electrically connected to the second electrode of the second capacitor and the second electrode of the third capacitor is electrically connected to the sixth wiring.

33. The semiconductor device according to claim 30, wherein the transistor is an n-channel transistor.

34. The semiconductor device according to claim 30, wherein the transistor comprises a semiconductor film that comprises an oxide semiconductor.

35. The semiconductor device according to claim 30, wherein the transistor and each of the switches are n-channel transistors.

36. A display device including the semiconductor device according to claim 30.

37. A semiconductor device comprising:
a transistor comprising a gate electrode, a first terminal, and a second terminal;
a first wiring, a second wiring, a third wiring, a fourth wiring, and a fifth wiring;
a first switch transistor, a second switch transistor, a third switch transistor, a fourth switch transistor, and a fifth switch transistor each comprising a gate electrode, a first terminal, and a second terminal;
a first gate line, a second gate line, a third gate line, and a fourth gate line;
a first capacitor and a second capacitor each comprising a first electrode and a second electrode; and
a light-emitting element comprising a first electrode and a second electrode,
wherein the first terminal of the first switch transistor is electrically connected to the first wiring, and the second terminal of the first switch transistor is electrically connected to each of the first electrode of the first capacitor and the first electrode of the second capacitor, wherein the second electrode of the first capacitor is electrically connected to the gate electrode of the transistor, wherein the second electrode of the second capacitor is electrically connected to the first terminal of the transistor, wherein the first terminal of the second switch transistor is electrically connected to the second wiring and the second terminal of the second switch transistor is electrically connected to the gate electrode of the transistor, wherein the first terminal of the third switch transistor is electrically connected to the first electrode of the first capacitor, and the second terminal of the third switch transistor is electrically connected to the first terminal of the transistor, wherein the second terminal of the transistor is electrically connected to the third wiring, wherein the first terminal of the fourth switch transistor is electrically connected to the first terminal of the transistor, and the second terminal of the fourth switch transistor is electrically connected to the first electrode of the light-emitting element, wherein the second electrode of the light-emitting element is electrically connected to the fourth wiring, wherein the first terminal of the fifth switch transistor is electrically connected to the first terminal of the transistor, and the second terminal of the fifth switch transistor is electrically connected to the fifth wiring, wherein the gate electrode of the first switch transistor is electrically connected to the first gate line, wherein the gate electrode of the second switch transistor and the gate electrode of the third switch transistor are electrically connected to the second gate line, wherein the gate electrode of the fourth switch transistor is electrically connected to the third gate line, and wherein the gate electrode of the fifth switch transistor is electrically connected to the fourth gate line.

38. The semiconductor device according to claim 37, further comprising:
a sixth wiring; and
a third capacitor comprising a first electrode and a second electrode,
wherein the first electrode of the third capacitor is electrically connected to the second electrode of the second capacitor and the second electrode of the third capacitor is electrically connected to the sixth wiring.

39. The semiconductor device according to claim 37, wherein the transistor is an n-channel transistor.

40. The semiconductor device according to claim 37, wherein the transistor comprises a semiconductor film that comprises an oxide semiconductor.

41. The semiconductor device according to claim 37, wherein the transistor and each of the switch transistors are n-channel transistors.

42. A display device including the semiconductor device according to claim 37.

* * * * *